(12) United States Patent
Negishi et al.

(10) Patent No.: US 8,872,214 B2
(45) Date of Patent: Oct. 28, 2014

(54) ROD-LIKE LIGHT-EMITTING DEVICE, METHOD OF MANUFACTURING ROD-LIKE LIGHT-EMITTING DEVICE, BACKLIGHT, ILLUMINATING DEVICE, AND DISPLAY DEVICE

(75) Inventors: Tetsu Negishi, Osaka (JP); Akihide Shibata, Osaka (JP); Satoshi Morishita, Osaka (JP); Kenji Komiya, Osaka (JP); Hiroshi Iwata, Osaka (JP); Akira Takahashi, Osaka (JP)

(73) Assignee: Sharp Kabushiki Kaisha, Osaka-shi (JP)

( * ) Notice: Subject to any disclaimer, the term of this patent is extended or adjusted under 35 U.S.C. 154(b) by 263 days.

(21) Appl. No.: 12/904,773

(22) Filed: Oct. 14, 2010

(65) Prior Publication Data

US 2011/0254043 A1 Oct. 20, 2011

(30) Foreign Application Priority Data

| Oct. 19, 2009 | (JP) | 2009-240318 |
| Oct. 19, 2009 | (JP) | 2009-240405 |
| Oct. 19, 2009 | (JP) | 2009-240407 |
| Nov. 19, 2009 | (JP) | 2009-264076 |
| Dec. 3, 2009 | (JP) | 2009-275460 |
| Dec. 3, 2009 | (JP) | 2009-275548 |
| Dec. 7, 2009 | (JP) | 2009-277905 |
| Aug. 5, 2010 | (JP) | 2010-176107 |

(51) Int. Cl.

| H01L 33/00 | (2010.01) |
| H01L 33/20 | (2010.01) |
| H01L 33/38 | (2010.01) |
| H01L 33/62 | (2010.01) |
| H01L 33/32 | (2010.01) |

(52) U.S. Cl.
CPC .............. *H01L 33/20* (2013.01); *H01L 33/38* (2013.01); *H01L 33/62* (2013.01); *H01L 2224/48463* (2013.01); *H01L 33/007* (2013.01); *H01L 33/32* (2013.01)
USPC .......................................................... 257/99

(58) Field of Classification Search
CPC ................................ H01L 33/20; H01L 33/24
USPC .......................................................... 257/99
See application file for complete search history.

(56) References Cited

U.S. PATENT DOCUMENTS

| 6,818,465 B2 | 11/2004 | Biwa et al. |
| 6,882,051 B2 | 4/2005 | Majumdar et al. |

(Continued)

FOREIGN PATENT DOCUMENTS

| CN | 1604154 | 4/2005 |
| JP | 61-138259 | 8/1986 |

(Continued)

OTHER PUBLICATIONS

Shibata et al., U.S. Office Action mailed May 19, 2014, directed to U.S. Appl. No. 12/904,788; 16 pages.

(Continued)

*Primary Examiner* — Shaun Campbell
(74) *Attorney, Agent, or Firm* — Morrison & Foerster LLP

(57) ABSTRACT

To facilitate electrode connections and achieve a high light emitting efficiency, a rod-like light-emitting device includes a semiconductor core of a first conductivity type having a rod shape, and a semiconductor layer of a second conductivity type formed to cover the semiconductor core. The outer peripheral surface of part of the semiconductor core is exposed.

16 Claims, 127 Drawing Sheets

(56) References Cited

U.S. PATENT DOCUMENTS

| | | |
|---|---|---|
| 6,924,500 B2 | 8/2005 | Okuyama et al. |
| 2002/0117677 A1 | 8/2002 | Okuyama et al. |
| 2003/0189829 A1 | 10/2003 | Shimizu et al. |
| 2004/0187917 A1* | 9/2004 | Pichler .......... 136/263 |
| 2005/0088087 A1 | 4/2005 | Ogawa |
| 2005/0253151 A1 | 11/2005 | Sakai et al. |
| 2006/0273328 A1* | 12/2006 | Niu et al. .......... 257/79 |
| 2007/0041214 A1 | 2/2007 | Ha et al. |
| 2007/0048477 A1 | 3/2007 | Oh |
| 2007/0159072 A1* | 7/2007 | Oh .......... 313/504 |
| 2008/0185595 A1 | 8/2008 | Moon et al. |
| 2008/0251381 A1 | 10/2008 | Shibata et al. |
| 2008/0277676 A1 | 11/2008 | Hong et al. |
| 2009/0075468 A1* | 3/2009 | Buretea et al. .......... 438/602 |
| 2009/0108285 A1* | 4/2009 | Nakata .......... 257/103 |
| 2009/0160370 A1 | 6/2009 | Tai et al. |
| 2009/0294780 A1 | 12/2009 | Chou et al. |
| 2010/0006867 A1 | 1/2010 | Lee et al. |
| 2010/0155767 A1* | 6/2010 | Lee et al. .......... 257/99 |
| 2011/0089850 A1 | 4/2011 | Shibata et al. |

FOREIGN PATENT DOCUMENTS

| | | |
|---|---|---|
| JP | 2000-101136 | 4/2000 |
| JP | 2001-44515 | 2/2001 |
| JP | 2002-100805 | 4/2002 |
| JP | 2003-282942 | 10/2003 |
| JP | 2004-532133 | 10/2004 |
| JP | 2006-507692 | 3/2006 |
| JP | 2006-253725 | 9/2006 |
| JP | 2006-332650 | 12/2006 |
| JP | 2007-501525 | 1/2007 |
| JP | 2007-39683 | 2/2007 |
| JP | 2007-59930 | 3/2007 |
| JP | 2007-134430 | 5/2007 |
| JP | 2007-531321 | 11/2007 |
| JP | 2008-235443 | 10/2008 |
| JP | 2008-235444 | 10/2008 |
| JP | 2008-260073 | 10/2008 |
| JP | 2008-283191 | 11/2008 |
| JP | 2009-10204 | 1/2009 |
| JP | 2009-49282 | 3/2009 |
| JP | 2009-542560 | 12/2009 |
| KR | 10-0558454 | 2/2006 |
| KR | 10-2007-0067308 | 6/2007 |
| KR | 10-0765385 | 10/2007 |
| KR | 10-2008-0073462 | 8/2008 |
| WO | WO-2004/032193 | 4/2004 |
| WO | WO-2005/017962 | 2/2005 |
| WO | WO-2005/099310 A2 | 10/2005 |
| WO | WO-2005/099310 A3 | 3/2007 |
| WO | WO-2008/048232 | 4/2008 |
| WO | WO-2008/048704 | 4/2008 |
| WO | WO-2008/060455 | 5/2008 |
| WO | WO-2008/085129 | 7/2008 |

OTHER PUBLICATIONS

Shibata et al., U.S. Office Action mailed Sep. 9, 2014, directed to U.S. Appl. No. 12/904,788; 16 pages.

* cited by examiner

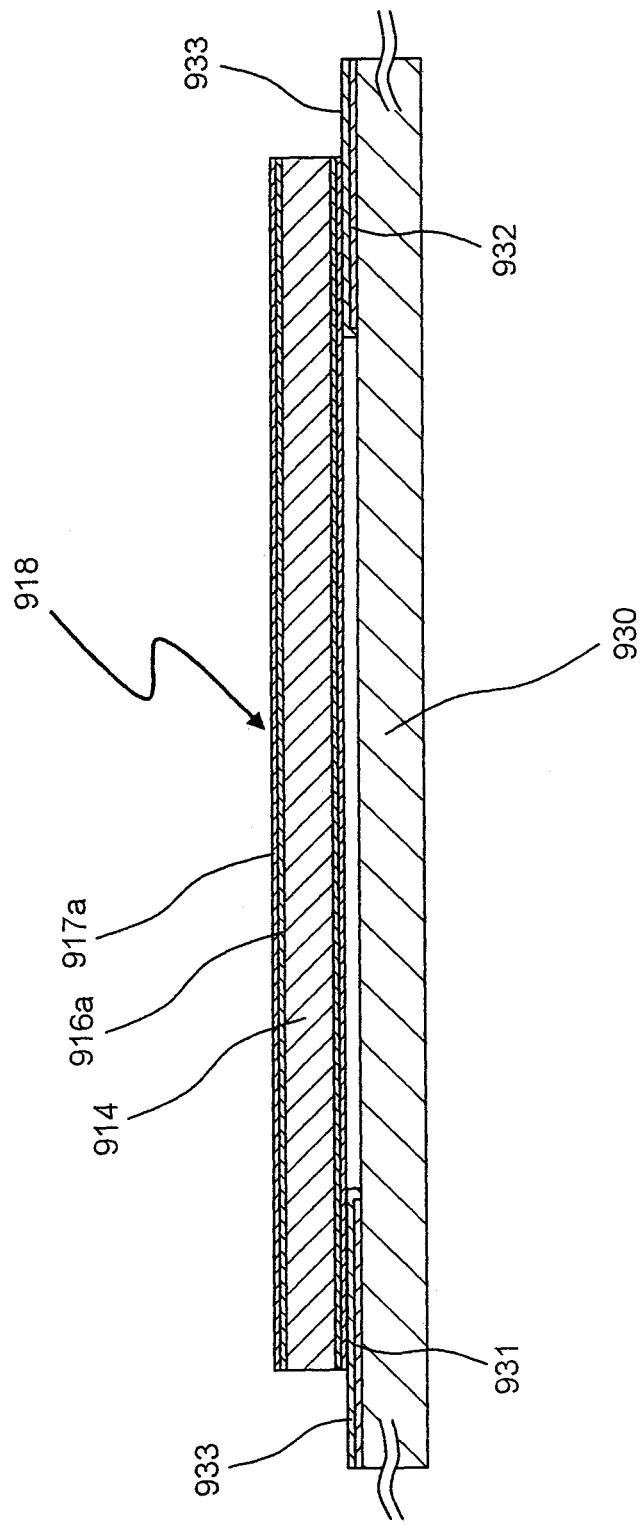

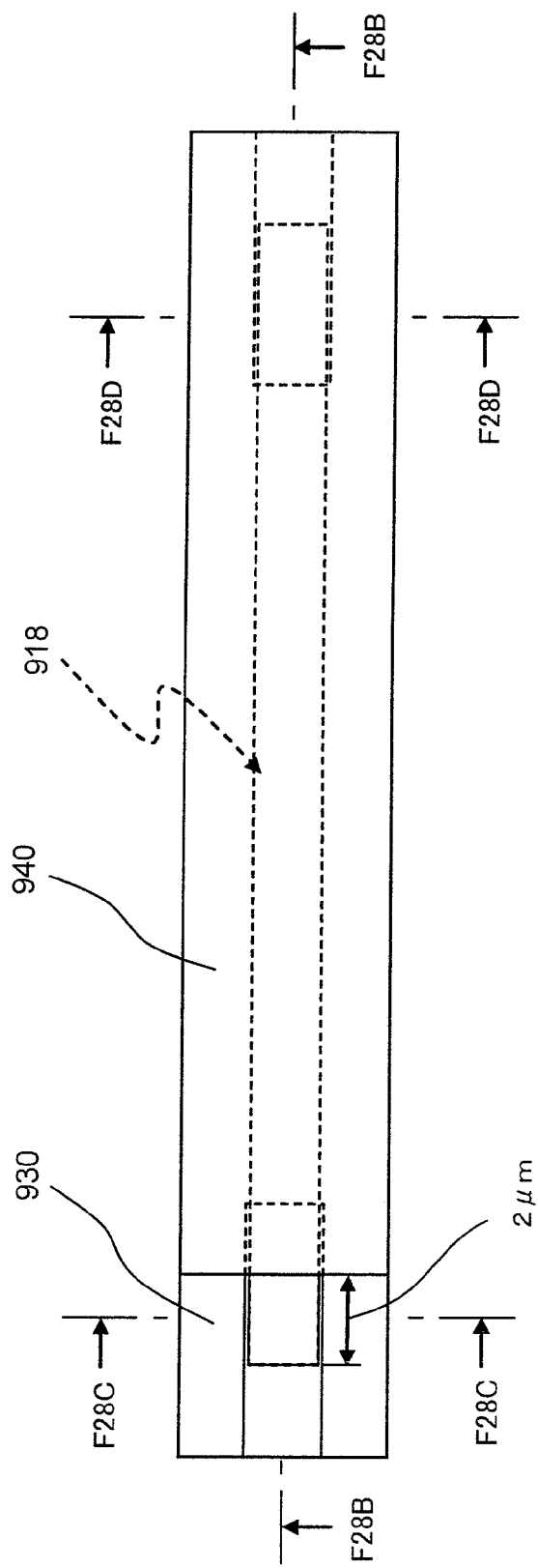

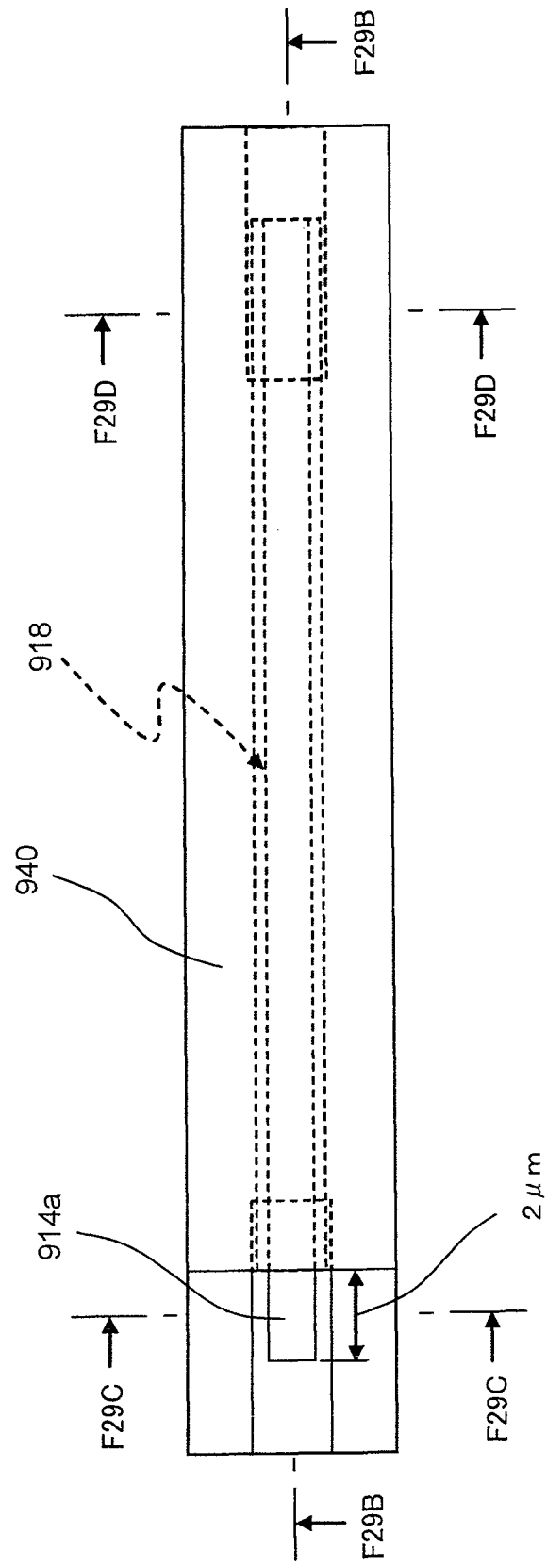

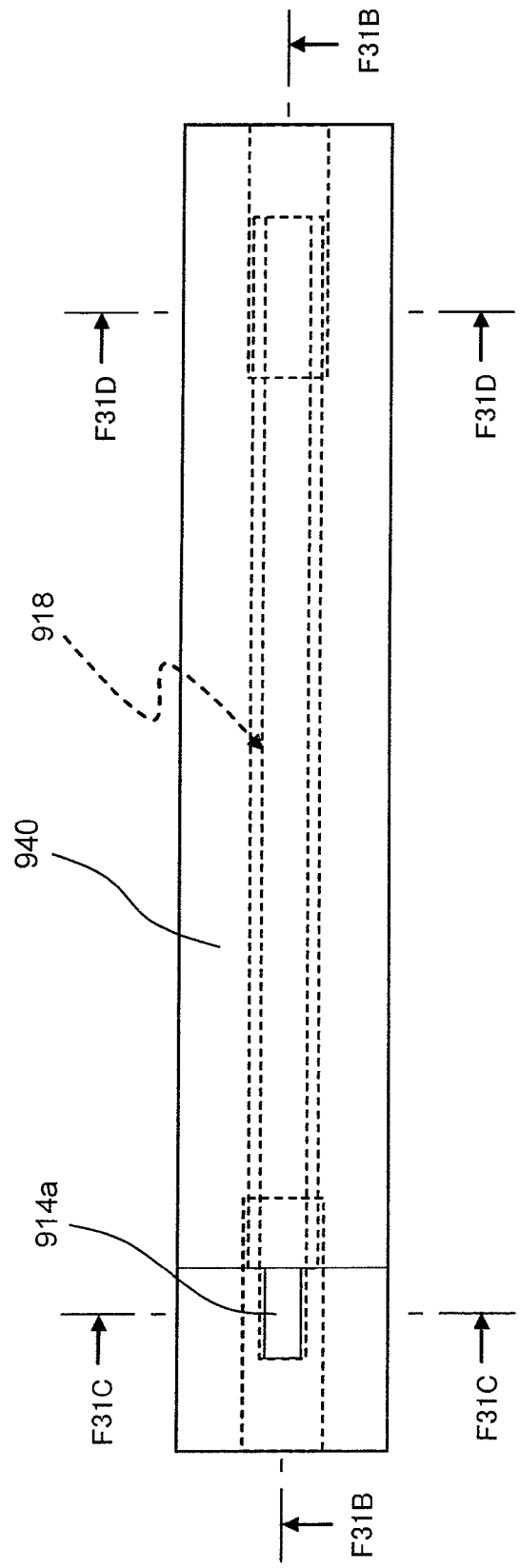

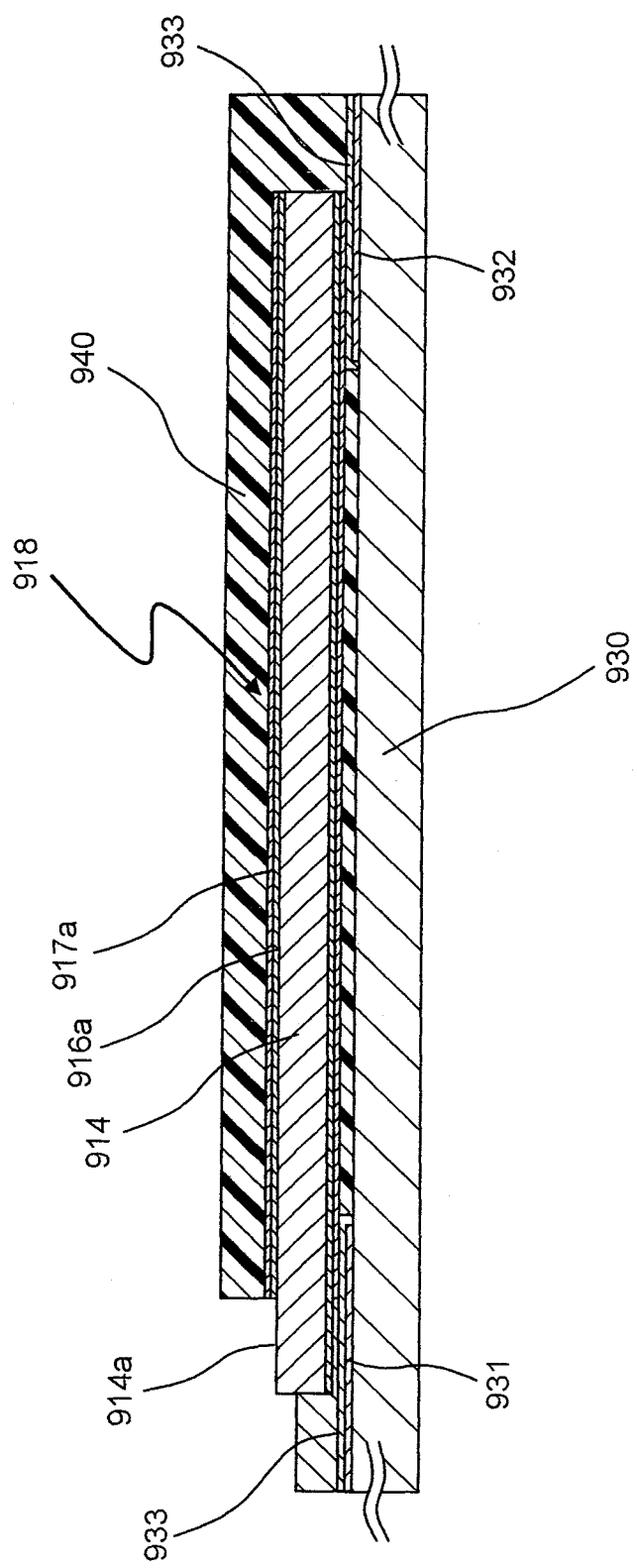

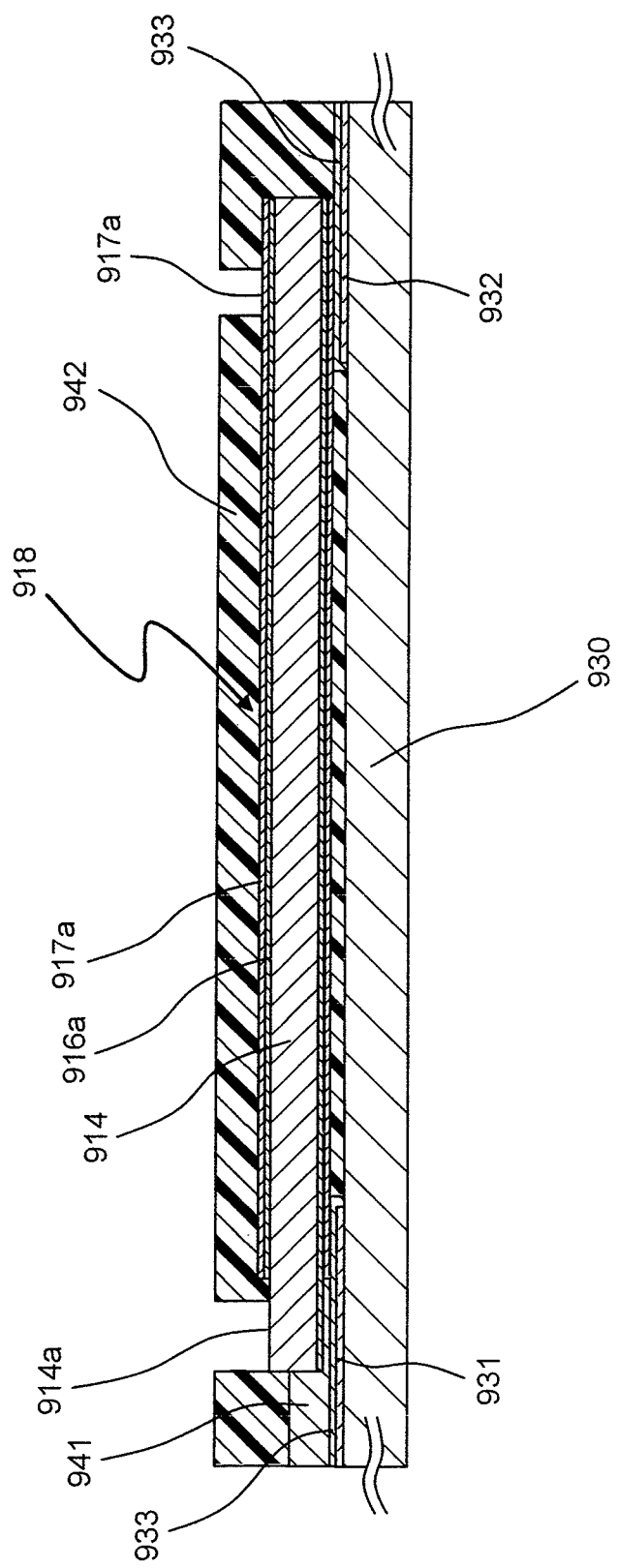

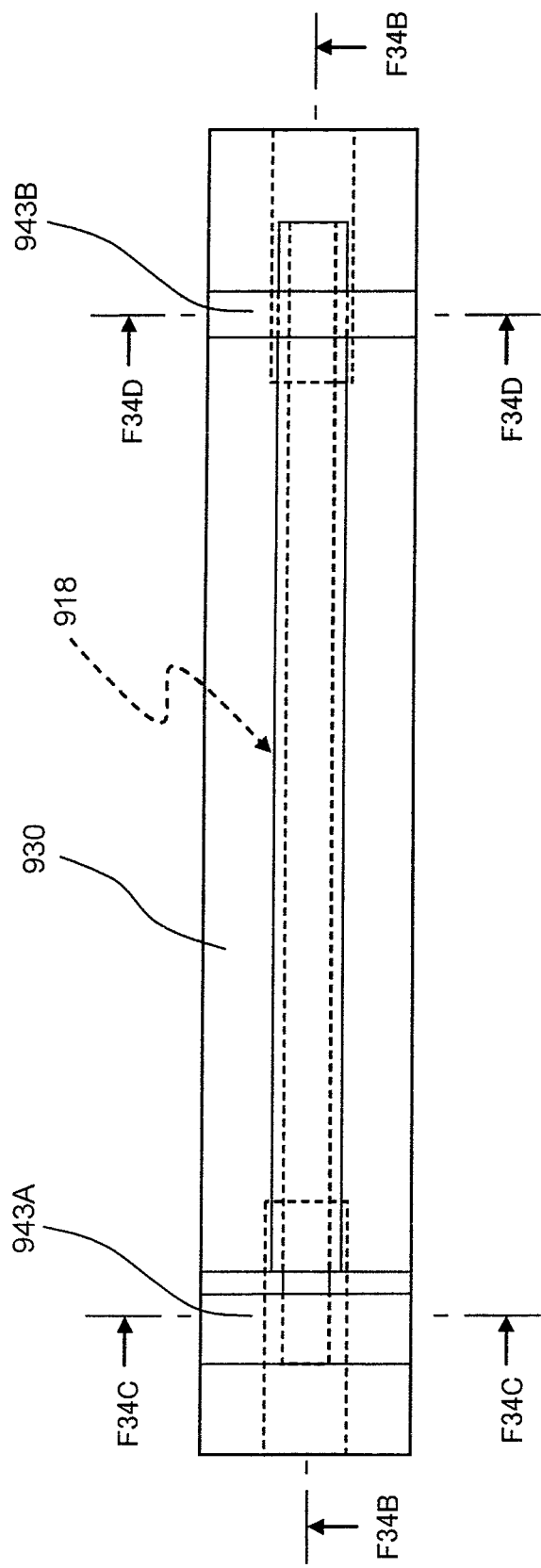

ROD-LIKE LIGHT-EMITTING DEVICE, METHOD OF MANUFACTURING ROD-LIKE LIGHT-EMITTING DEVICE, BACKLIGHT, ILLUMINATING DEVICE, AND DISPLAY DEVICE

TECHNICAL FIELD

This invention relates to a rod-like light-emitting device, a method of manufacturing the rod-like light-emitting device, a backlight, an illuminating device and a display device.

BACKGROUND OF THE INVENTION

Conventionally, there has been a light-emitting device in a rod-like structure having a size of the order of nanometers in which a rod-like core portion made of a compound semiconductor and a cylindrical shell portion made of a compound semiconductor surrounding the core portion form a heterostructure (see, for example, JP-A-2008-235443). In the light-emitting device, the core portion itself serves as an active layer, and electrons and holes injected from the outer peripheral surface recombine in the core portion to emit light.

In the case where using a manufacturing method similar to that for the above light-emitting device, a rod-like light-emitting device is manufactured that has a core portion made of an n-type semiconductor and a shell portion made of a p-type semiconductor and in which electrons and holes recombine at a pn junction between the outer peripheral surface of the core portion and the inner peripheral surface of the shell portion to emit light, the core portion is exposed only on its both end surfaces, and therefore there arises a problem in that connecting the core portion and an electrode is difficult.

There has been a method of manufacturing a rod-like light-emitting device. In the method, after a flat first polarity layer is formed on a substrate, a plurality of light-emitting nanoscale rods, which corresponds to the active layer to emit light, are formed on the first polarity layer, and further a second polarity layer wrapping around each of the rods is formed (see, for example, JP-A-2006-332650). In this rod-like light-emitting device, light is emitted from the plurality of rods serving as the active layer.

However, the above rod-like light-emitting device is used together with the substrate on which the plurality of nanoscale rods are provided, and is subjected to the constraints of the substrate when incorporated into an illuminating device or a display device. Therefore, the rod-like light-emitting device has a problem in that there is less freedom in installing into an apparatus.

Furthermore, a light-emitting apparatus including the above rod-like light-emitting device has a problem in that the light-extraction efficiency decreases because, under the condition in which the plurality of rods erect on a substrate, most light is emitted laterally to be absorbed into the adjacent rods. In the above rod-like light-emitting device, the plurality of rods erect on the substrate, and therefore there is a problem in that the heat dissipation efficiency is poor.

SUMMARY OF THE INVENTION

Technical Problem

Accordingly, an object of this invention is to provide a microscopic rod-like light-emitting device that allows electrode connections to be easily made with a simple configuration and that has a high light emitting efficiency, and a method of manufacturing such a rod-like light-emitting device.

Another object of this invention is to provide a backlight, an illuminating device and a display device in which their thicknesses and weights can be reduced, and high light emitting efficiencies and low power consumption are achieved, by using the above rod-like light-emitting devices.

Another object of this invention is to provide a method of manufacturing a rod-like light-emitting device that has great freedom in installing into an apparatus and is microscopic, and a method of manufacturing a display device including the rod-like light-emitting device.

Another object of this invention is to provide a light-emitting apparatus having a high light-extraction efficiency and good heat dissipation.

Another object of this invention is to provide a backlight, an illuminating device and a display device in which high light emitting efficiencies, good heat dissipation and low power consumption are achieved by using the above light-emitting devices.

Solution to Problem

A rod-like light-emitting device according to a first aspect of the present invention comprises:

a semiconductor core of a first conductivity type having a rod shape; and a semiconductor layer of a second conductivity type covering the semiconductor core, wherein an outer peripheral surface of a part of the semiconductor core is exposed.

According to this configuration, the semiconductor layer of a second conductivity type is formed to cover the semiconductor core of the first conductivity type having a rod shape and to expose the outer peripheral surface of part of the semiconductor core. The formation of the semiconductor layer enables an exposed portion of the semiconductor core to be connected to one electrode and enables the other electrode to be connected to a portion covering the semiconductor core of the semiconductor layer even in the case of a microscopic rod-like light-emitting device with a size of the order of micrometers or in the order of nanometers. In the rod-like light-emitting device, with one electrode connected to the exposed portion of the semiconductor core and with the other electrode connected to the semiconductor layer, a current is caused to flow between the electrodes so that electrons and holes recombine at a pn junction between the outer peripheral surface of the semiconductor core and the inner peripheral surface of the semiconductor layer. As a result, light is emitted from the pn junction. In the rod-like light-emitting device, light is emitted from the whole periphery of the semiconductor core covered with the semiconductor layer. This results in expansion of the light emitting region, and therefore the light emitting efficiency is high. Accordingly, it is possible to implement a microscopic rod-like light-emitting device that allows electrode connections to be easily made with a simple configuration and that has a high light emitting efficiency. The rod-like light-emitting device is not integral with the substrate, which allows great freedom in installing into an apparatus.

The term "microscopic rod-like light-emitting device" as used herein refers to a device, for example, with the size of the order of micrometers in which the diameter is 1 µm and the length is 10 µm, or with the size in the order of nanometers in which at least the diameter of the diameter and the length is less than 1 µm. The rod-like light-emitting device mentioned above allows a decrease in the amount of semiconductor used. This makes it possible to reduce the thickness and weight of an apparatus using the light-emitting device, and to implement a backlight, an illuminating device and a display device that have high light emitting efficiencies and low power consumption.

In one embodiment, an outer peripheral surface of one of two ends of the semiconductor core is exposed.

In one embodiment, an end surface of the other end of the semiconductor core is covered with the semiconductor layer.

In one embodiment, the semiconductor layer has a thickness in an axial direction of a portion covering the end surface of the other end of the semiconductor core larger than a thickness in a radial direction of a portion covering the outer peripheral surface of the semiconductor core.

In one embodiment, the outer peripheral surface of an exposed region of the semiconductor core is coincident or substantially coincident with an extension of an outermost peripheral surface of a region of the semiconductor core where the semiconductor core is covered with the semiconductor layer.

In one embodiment, the rod-like light-emitting device has a quantum well layer formed between the semiconductor core and the semiconductor layer.

In one embodiment, an outer peripheral surface of one of two ends of the semiconductor core is exposed, and an end surface of the other end of the semiconductor core is covered with the semiconductor layer. Also, the rod-like light-emitting device comprises a quantum well layer formed between the semiconductor core and the semiconductor layer, and the quantum well layer has a thickness in an axial direction of a portion covering the end surface of the other end of the semiconductor core larger than a thickness in a radial direction of a portion covering an outer peripheral surface of the semiconductor core.

In one embodiment, the rod-like light-emitting device has a transparent electrode covering the semiconductor layer.

In one embodiment, the semiconductor core is made of an n-type semiconductor, the semiconductor layer is made of a p-type semiconductor, and the transparent electrode is formed to cover the whole or nearly whole of the semiconductor layer.

A method of manufacturing a rod-like light-emitting device according to a second aspect of the invention comprises steps of:

forming a catalyst metal island layer on a substrate of a first conductivity type;

forming a semiconductor core of the first conductivity type having a rod shape on the substrate by crystal growth of a semiconductor of the first conductivity type from an interface between the catalyst metal island layer and the substrate;

forming a semiconductor layer of a second conductivity type covering a surface of the semiconductor core by performing, under a condition where the catalyst metal island layer is held at a tip of the semiconductor core, crystal growth from an outer peripheral surface of the semiconductor core and an interface between the catalyst metal island layer and the semiconductor core;

exposing a substrate-side portion of the outer peripheral surface of the semiconductor core; and separating from the substrate the semiconductor core including the exposed portion exposed in the step of exposing.

The term "substrate of a first conductivity type" as used herein may be a substrate made of a semiconductor of the first conductivity type, and may also be a substrate in which a semiconductor film of the first conductivity type is formed on the surface of an underlying substrate.

With the configuration mentioned above, the catalyst metal island layer is formed on the substrate of the first conductivity type. Then, on the substrate on which the catalyst metal island layer is formed, the semiconductor core of the first conductivity type shaped like a rod is formed by crystal growth of a semiconductor of the first conductivity type from an interface between the catalyst metal island layer and the substrate. Thereafter, under the condition where the catalyst metal island layer held at a tip of the semiconductor core, a semiconductor layer of the second conductivity type that covers the surface of the semiconductor core is formed by crystal growth from the outer peripheral surface of the semiconductor core and an interface between the catalyst metal island layer and the semiconductor core. At this point, crystal growth from the interface between the catalyst metal layer and the semiconductor core is promoted rather than crystal growth from the outer peripheral surface of the semiconductor core. As a result, in the semiconductor layer, the thickness in the axial direction of a portion covering the end surface of the other end of the semiconductor core is larger than the thickness in the radial direction of a portion covering the outer peripheral surface of the semiconductor core.

Next, the outer peripheral surface on the substrate side of the semiconductor core is exposed, and then the semiconductor core including the exposed portion is separated from the substrate, for example, by vibrating the substrate by means of ultrasonic waves, or using a cutting tool. In the rod-like light-emitting device separated from the substrate in such a way, with one electrode connected to the exposed portion of the semiconductor core, and with the other electrode connected to the semiconductor layer, an electric current is caused to flow between the electrodes, so that electrons and holes recombine in a pn junction between the outer peripheral surface of the semiconductor core and the inner peripheral surface of the semiconductor layer. Thus, light is emitted from the pn junction.

The semiconductor layer of the second conductivity type is formed to cover the surface of the semiconductor core under the condition where the catalyst metal island layer is held at a tip of the semiconductor core, without removing the catalyst metal island layer. Due to the catalyst metal layer, crystal growth is promoted. This makes it possible to easily form the semiconductor layer in which the thickness in the axial direction of a portion that covers the end surface of the other end of the semiconductor core is larger than the thickness in the radial direction of a portion that covers the outer peripheral surface of the semiconductor core.

In this way, a microscopic rod-like light-emitting device having great freedom in installing in an apparatus can be manufactured. The term "microscopic rod-like light-emitting device" as used herein refers to a device, for example, with the size of the order of micrometers in which the diameter is 1 μm and the length is 10 μm, or with the size in the order of nanometers in which at least the diameter of the diameter and the length is less than 1 μm. The rod-like light-emitting device mentioned above allows a decrease in the amount of semiconductor used. This makes it possible to reduce the thickness and weight of an apparatus using the light-emitting device. Also because light is emitted from the whole periphery of the semiconductor core covered with the semiconductor layer, the light-emitting device is allowed to have an expanded light emitting region. This makes it possible to implement a backlight, an illuminating device and a display device that have high light emitting efficiencies and low power consumption.

A method of manufacturing a rod-like light-emitting device according to a third aspect of the invention comprises steps of:

forming a catalyst metal island layer on a substrate of a first conductivity type;

forming a semiconductor core of the first conductivity type having a rod shape on the substrate by crystal growth of a semiconductor of the first conductivity type from an interface between the catalyst metal island layer and the substrate;

forming a quantum well layer covering a surface of the semiconductor core by performing, under a condition where the catalyst metal island layer is held at a tip of the semiconductor core, crystal growth from an outer peripheral surface of the semiconductor core and an interface between the catalyst metal island layer and the semiconductor core;

forming a semiconductor layer of a second conductivity type covering a surface of the quantum well layer;

exposing a substrate-side portion of the outer peripheral surface of the semiconductor core; and separating from the substrate the semiconductor core including the exposed portion exposed in the step of exposing.

With the configuration mentioned above, the catalyst metal island layer is formed on the substrate of the first conductivity type. Then, on the substrate on which the catalyst metal island layer is formed, the semiconductor core of the first conductivity type shaped like a rod is formed by crystal growth of a semiconductor of the first conductivity type from an interface between the catalyst metal island layer and the substrate. Thereafter, under the condition where the catalyst metal island layer held at a tip of the semiconductor core, a quantum well layer that covers the surface of the semiconductor core is formed by crystal growth from the outer peripheral surface of the semiconductor core and from an interface between the catalyst metal island layer and the semiconductor core. At this point, crystal growth from the interface between the catalyst metal layer and the semiconductor core is promoted rather than crystal growth from the outer peripheral surface of the semiconductor core. As a result, in the semiconductor layer, the thickness in the axial direction of a portion covering the end surface of the other end of the semiconductor core is larger than the thickness in the radial direction of a portion covering the outer peripheral surface of the semiconductor core.

Next, the semiconductor layer of the second conductivity type covering the surface of the quantum well layer is formed to expose the outer peripheral surface on the substrate side of the semiconductor core. The outer peripheral surface on the substrate side of the semiconductor core is exposed, and then the semiconductor core including the exposed portion is separated from the substrate, for example, by vibrating the substrate by means of ultrasonic waves, or using a cutting tool. In the rod-like light-emitting device separated from the substrate in such a way, with one electrode connected to the exposed portion of the semiconductor core, and with the other electrode connected to the semiconductor layer, an electric current is caused to flow between the electrodes, so that electrons and holes recombine in a pn junction between the outer peripheral surface of the semiconductor core and the inner peripheral surface of the semiconductor layer. Thus, light is emitted from the pn junction.

The quantum well layer is formed to cover the surface of the semiconductor core under the condition where the catalyst metal island layer is held at a tip of the semiconductor core, without removing the catalyst metal island layer. Due to the catalyst metal layer, crystal growth is promoted. This makes it possible to easily form the quantum well layer in which the thickness in the axial direction of a portion that covers the end surface of the other end of the semiconductor core is larger than the thickness in the radial direction of a portion that covers the outer peripheral surface of the semiconductor core.

In this way, a microscopic rod-like light-emitting device having great freedom in installing in an apparatus can be manufactured by the manufacturing method according to the third aspect of the invention. The term "microscopic rod-like light-emitting device" as used herein refers to a device, for example, with the size of the order of micrometers in which the diameter is 1 μm and the length is 10 μm, or with the size in the order of nanometers in which at least the diameter of the diameter and the length is less than 1 μm. The rod-like light-emitting device mentioned above allows a decrease in the amount of semiconductor used. This makes it possible to reduce the thickness and weight of an apparatus using the light-emitting device. Also because light is emitted from the whole periphery of the semiconductor core covered with the semiconductor layer, the light-emitting device is allowed to have an expanded light emitting region. This makes it possible to implement a backlight, an illuminating device and a display device that have high light emitting efficiencies and low power consumption.

A rod-like light-emitting device according to a fourth aspect of the invention comprises:

a semiconductor core of a first conductivity type having a rod shape;

a cap layer covering an end surface of one of two ends of the semiconductor core; and a semiconductor layer of a second conductivity type covering an outer peripheral surface of a portion of the semiconductor core other than an exposed portion, the exposed portion of the semiconductor core being a portion opposite from a portion covered with the cap layer of the semiconductor core, wherein the cap layer is made of a material having a higher electric resistance than the semiconductor layer.

According to the above configuration, the end surface of one end of the semiconductor core of the first conductivity type shaped like a rod is covered with the cap layer, and the outer peripheral surface of a portion other than an exposed portion of the semiconductor core is covered with the semiconductor layer of the second conductivity type such that a portion opposite to the portion of the semiconductor core covered with the cap layer is not covered, so that the exposed portion is provided. Therefore, even with the microscopic rod-like light-emitting device having a size of the order of micrometers or the order of nanometers, it becomes possible to connect the exposed portion of the semiconductor core to one electrode and to connect the other electrode to the portion of the semiconductor layer that covers the semiconductor core. In the rod-like light-emitting device, with one electrode connected to an exposed portion of the semiconductor core and with the other electrode connected to the semiconductor layer, a current is caused to flow between the electrodes so that electrons and holes recombine in an interface (pn junction) between the outer peripheral surface of the semiconductor core and the inner peripheral surface of the semiconductor layer. As a result, light is emitted from the interface (pn junction) between the outer peripheral surface of the semiconductor core and the inner peripheral surface of the semiconductor layer. In the rod-like light-emitting device, light is emitted from the whole side surface of the semiconductor core covered with the semiconductor layer. The light emitting region therefore becomes larger, which results in a high light emitting efficiency. Note that a quantum well layer may be provided between the outer peripheral surface of the semiconductor core and the inner peripheral surface of the semiconductor layer.

Moreover, one end surface of the semiconductor core is covered with the cap layer made of a material having an electric resistance larger than the semiconductor layer. This, on the one hand, prevents a current from flowing between the electrode connected on the cap layer side of the semiconductor core and the semiconductor core through the cap layer, and on the other hand, allows a current to flow between the electrode and the outer peripheral surface side of the semiconductor core through the semiconductor layer having a lower resistance than the cap layer. This eliminates or reduces current concentration to the end surface on the side having the cap layer thereon of the semiconductor core is provided. As a result, without concentration of light emission to the end surface of the semiconductor core, the efficiency of extracting light from the side surface of the semiconductor core is improved.

Accordingly, it is possible to implement a microscopic rod-like light-emitting device that allows electrode connections to be easily made with a simple configuration and that has a high light emitting efficiency. The rod-like light-emitting device is not integral with the substrate, which allows great freedom in installing into an apparatus.

In one embodiment, the outer peripheral surface of the semiconductor core except for the exposed portion and an outer peripheral surface of the cap layer are covered with the semiconductor layer that is continuous.

In one embodiment, the cap layer is made of an insulating material.

In one embodiment, the cap layer is made of an intrinsic semiconductor.

In one embodiment, the cap layer is made of a semiconductor of the first conductivity type.

In one embodiment, the cap layer is made of a semiconductor of the second conductivity type.

In one embodiment, a quantum well layer is provided between the end surface of the semiconductor core and the cap layer.

In one embodiment, a quantum well layer is provided between the outer peripheral surface of the semiconductor core and the semiconductor layer.

In one embodiment, the outer peripheral surface of the semiconductor core except for the exposed portion and the outer peripheral surface of the cap layer are covered with the quantum well layer that is continuous.

In one embodiment, a conductive layer having a lower electric resistance than the semiconductor layer is formed to cover the semiconductor layer.

In one embodiment, a first electrode is connected to the exposed portion at the one end of the semiconductor core, and a second electrode is connected to the semiconductor layer at the other end of the semiconductor core on which the cap layer is provided.

In one embodiment, a first electrode is connected to the exposed portion at the one end of the semiconductor core, and a second electrode is connected to at least the conductive layer of the semiconductor layer and the conductive layer on the other side of the semiconductor core on which the cap layer is provided.

In one embodiment, the semiconductor core has a diameter of 500 nm or more and 100 µm or less.

A light-emitting apparatus according to a fifth aspect of the invention comprises:

a rod-like light-emitting device of any of the above-mentioned types; and a substrate on which the rod-like light-emitting device is mounted such that a longitudinal direction of the rod-like light-emitting device is parallel to a mounting surface of the substrate, wherein electrodes are formed, with a predetermined spacing therebetween, on the substrate, and wherein the exposed portion at the one end of the semiconductor core of the rod-like light-emitting device is connected to one of the electrodes on the substrate, and the semiconductor layer at the other end of the semiconductor core on which the cap layer is provided is connected to another one of the electrodes on the substrate.

With the above configuration, with a rod-like light-emitting device mounted on a substrate in such a manner that the longitudinal direction of the device is parallel to the mounting surface of the substrate, the outer peripheral surface of the semiconductor layer is in contact with the mounting surface of the substrate. Therefore, heat generated in the rod-like light-emitting device can be dissipated with a good efficiency from the semiconductor layer to the substrate. Accordingly, it is possible to implement a light-emitting apparatus in which the light emitting efficiency is high and the heat dissipation is good. In the above light-emitting apparatus, the rod-like light-emitting device is arranged to lie on its side on the substrate. This allows the whole thickness of the rod-like light-emitting device including the substrate to be decreased. In the above light-emitting apparatus, using the microscopic rod-like light-emitting device, for example, with the size of the order of micrometers in which the diameter is 1 µm and the length is 10 µm, or with the size in the order of nanometers in which at least the diameter of the diameter and the length is less than 1 µm enables the amount of semiconductors used to be decreased. Using this light-emitting apparatus makes it possible to implement a backlight, an illuminating device, a display device and the like whose thicknesses and weights can be reduced.

A light-emitting apparatus according to a sixth aspect of the invention comprises:

at least one rod-like light-emitting device in which a conductive layer having a lower electric resistance than the semiconductor layer is formed to cover the semiconductor layer; and a substrate on which the rod-like light-emitting device is mounted such that a longitudinal direction of the rod-like light-emitting device is parallel to a mounting surface of the substrate, wherein electrodes are formed, with a predetermined spacing therebetween, on the substrate, and wherein the exposed portion at the one end of the semiconductor core of the rod-like light-emitting device is connected to one of the electrodes on the substrate, and the conductive layer on the other side of the semiconductor core on which the cap layer is provided is connected to another one of the electrodes on the substrate.

With the above configuration, with a rod-like light-emitting device mounted on a substrate in such a manner that the longitudinal direction of the device is parallel to the mounting surface of the substrate, the outer peripheral surface of the conductive layer is in contact with the mounting surface of the substrate. Therefore, heat generated in the rod-like light-emitting device can be dissipated with a good efficiency from the conductive layer to the substrate. Accordingly, it is possible to implement a light-emitting apparatus in which the light emitting efficiency is high and the heat dissipation is good. In the above light-emitting apparatus, the rod-like light-emitting device is arranged to lie on its side on the substrate. This allows the whole thickness of the rod-like light-emitting device including the substrate to be decreased. In the above light-emitting apparatus, using the microscopic rod-like light-emitting device, for example, with the size of the order of micrometers in which the diameter is 1 µm and the length is 10 µm, or with the size in the order of nanometers in which at least the diameter of the diameter and the length is less than 1 µm enables the amount of semiconductors used to be decreased. Using this light-emitting apparatus makes it possible to implement a backlight, an illuminating device, a display device and the like whose thicknesses and weights can be reduced.

In one embodiment, the light-emitting apparatus further has a second conductive layer formed on a substrate-side portion of the said conductive layer and having a lower electric resistance than the semiconductor layer.

In one embodiment, the light-emitting apparatus has a metal portion formed between the electrodes on the substrate and below the rod-like light-emitting device.

In one embodiment, there are a plurality of the rod-like light-emitting devices which each are associated with respective ones of metal portions formed on the substrate, and the metal portions associated with adjacent ones of the rod-like light-emitting devices are electrically insulated from each other.

A method of manufacturing a light-emitting apparatus according to a seventh aspect of the invention is a manufacturing method for a light-emitting apparatus including at least one rod-like light-emitting device of any of the above-mentioned types, and the method comprises steps of:

producing an insulating substrate formed with an alignment region having as a unit at least two electrodes to which independent voltages are respectively to be applied;

applying a liquid containing the rod-like light-emitting device in nanometer order size or micrometer order size onto the insulating substrate; and applying the independent voltages respectively to the at least two electrodes to align the rod-like light-emitting device at a position defined by the at least two electrodes.

With the above configuration, the insulating substrate where an alignment region having as a unit at least two electrodes to which independent potentials are respectively to be provided is produced, and a liquid containing the rod-like light-emitting devices with the size of the order of nanometers or of the order of micrometers is applied onto the insulating substrate. Thereafter, independent voltages are respectively applied to the at least two electrodes to align the microscopic rod-like light-emitting devices at positions defined by the at least two electrodes. Thus, the above rod-like light-emitting devices can be easily aligned on the predetermined insulating substrate.

In the above method of manufacturing a light-emitting apparatus, using only microscopic rod-like light-emitting devices makes it possible to decrease the amount of semiconductors used, and to manufacture a light-emitting apparatus whose thickness and weight can be reduced. In the above rod-like light-emitting device, light is emitted from the whole side surface of the semiconductor core covered with the semiconductor layer, and therefore the light emitting region becomes larger. This makes it possible to implement a light-emitting apparatus that has a high light emitting efficiency and achieves low power consumption.

A rod-like light-emitting device according to an eighth aspect of the invention comprises:

a semiconductor core of a first conductivity type having a rod shape; and a semiconductor layer of a second conductivity type covering an outer peripheral surface of a portion of the semiconductor core other than an exposed portion, the exposed portion of the semiconductor core being one end portion of the semiconductor core, wherein a step portion is provided between an outer peripheral surface of the exposed portion not covered with the semiconductor layer of the semiconductor core and an outer peripheral surface of a covered portion covered with the semiconductor layer of the semiconductor core.

With the above configuration, the outer peripheral surface of a portion other than an exposed portion of the semiconductor core is covered with the semiconductor layer of the second conductivity type such that a portion opposite to the portion covered with the cap layer of the semiconductor core is not covered, so that the exposed portion is provided. Therefore, even with the microscopic rod-like light-emitting device having a size of the order of micrometers or the order of nanometers, it becomes possible to connect the exposed portion of the semiconductor core to one electrode and to connect the other electrode to the portion of the semiconductor layer that covers the semiconductor core. In the rod-like light-emitting device, with one electrode connected to an exposed portion of the semiconductor core and with the other electrode connected to the semiconductor layer, a current is caused to flow between the electrodes so that electrons and holes recombine in an interface (pn junction) between the outer peripheral surface of the semiconductor core and the inner peripheral surface of the semiconductor layer. As a result, light is emitted from the interface (pn junction) between the outer peripheral surface of the semiconductor core and the inner peripheral surface of the semiconductor layer. In the rod-like light-emitting device, light is emitted from the whole side surface of the semiconductor core covered with the semiconductor layer. The light emitting region therefore becomes larger, which results in a high light emitting efficiency. Note that a quantum well layer may be provided between the outer peripheral surface of the semiconductor core and the inner peripheral surface of the semiconductor layer.

Accordingly, it is possible to implement a microscopic rod-like light-emitting device that allows electrode connections to be easily made with a simple configuration and that has a high light emitting efficiency. The rod-like light-emitting device is not integral with the substrate, which allows great freedom in installing into an apparatus.

Moreover, a step portion, i.e., a level difference, is provided between the outer peripheral surface of the exposed portion not covered with the semiconductor layer of the semiconductor core, and the outer peripheral surface of a covered portion covered with the semiconductor layer of the semiconductor core. Therefore, compared to a case in which the outer peripheral surface of an exposed portion of a semiconductor core is coincident or flush with the outer peripheral surface of a covered portion such that there exists no step, the position of the end surface of the semiconductor layer is determined depending on the step portion formed at the boundary between the exposed portion of the semiconductor core and the semiconductor layer. This can eliminate or reduce variations of the boundary position during manufacturing. Here, the exposed portion of the semiconductor core may have a smaller diameter or a larger diameter than the covered portion. The step portion allows the distance between the outer peripheral surface of exposed portion of the semiconductor core and the semiconductor layer to be increased. Therefore, when an electrode is connected to the exposed portion of the semiconductor core, short-circuiting and occurrence of a leakage current between the electrode and the semiconductor layer can be eliminated or reduced. Light is easily extracted to the outside from the step portion formed at the boundary between the outer peripheral surface of the exposed portion of the semiconductor core and the outer peripheral surface of the covered portion, and therefore the light-extraction efficiency is improved. Moreover, in cases where the exposed portion of the semiconductor core has a larger diameter than the covered portion, a large contact surface with the electrode connected to the exposed portion of the semiconductor core can be taken. Therefore, the contact resistance can be decreased.

The term "microscopic rod-like light-emitting device" as used herein refers to a device, for example, with the size of the order of micrometers in which the diameter is 1 μm and the length is 10 μm, or with the size in the order of nanometers in which at least the diameter of the diameter and the length is less than 1 μm. The rod-like light-emitting device mentioned above allows a decrease in the amount of semiconductor used. This makes it possible to reduce the thickness and weight of an apparatus using the light-emitting device, and to implement a light emitting apparatus, a backlight, an illuminating device, and a display device that have high light emitting efficiencies and low power consumption.

In one embodiment, a perimeter of a cross section of the exposed portion perpendicular to a longitudinal direction of the semiconductor core is shorter than a perimeter of a cross section of the covered portion perpendicular to the longitudinal direction of the semiconductor core.

In one embodiment, the cross section of the covered portion perpendicular to the longitudinal direction of the semiconductor core is polygonal.

In one embodiment, a shape of the cross section of the exposed portion perpendicular to the longitudinal direction of the semiconductor core differs from a shape of the cross section of the covered portion perpendicular to the longitudinal direction of the semiconductor core.

In one embodiment, the cross section of the exposed portion perpendicular to the longitudinal direction of the semiconductor core is nearly circular.

In one embodiment, the rod-like light-emitting device has an insulating layer formed to cover the step portion of the semiconductor core and a step portion-side end surface of the semiconductor layer and also to cover a step portion-side portion of the exposed portion of the semiconductor core.

In one embodiment, the rod-like light-emitting device has a conductive layer formed to cover the semiconductor layer and made of a material having a lower electric resistance than the semiconductor layer.

In one embodiment, the rod-like light-emitting device has a quantum well layer formed between the semiconductor core and the semiconductor layer.

In one embodiment, the rod-like light-emitting device has a cap layer formed to cover an end surface opposite to the exposed portion of the semiconductor core, the cap layer being made of a material having a higher electric resistance than the semiconductor layer.

In one embodiment, the semiconductor core has a diameter of 500 nm or more and 100 μm or less.

A light-emitting apparatus according to a ninth aspect of the invention comprises:

a rod-like light-emitting device of any of the above-mentioned types; and a substrate on which the rod-like light-emitting device is mounted such that a longitudinal direction of the rod-like light-emitting device is parallel to a mounting surface of the substrate, wherein electrodes are formed, with a predetermined spacing therebetween, on the substrate, and wherein the exposed portion at the one end of the semiconductor core of the rod-like light-emitting device is connected to one of the electrodes on the substrate, and the semiconductor layer at the other end of the semiconductor core is connected to another one of the electrodes on the substrate.

With the above configuration, with a rod-like light-emitting device mounted on a substrate in such a manner that the longitudinal direction of the device is parallel to the mounting surface of the substrate, the outer peripheral surface of the semiconductor layer is in contact with the mounting surface of the substrate. Therefore, heat generated in the rod-like light-emitting device can be dissipated with a good efficiency from the semiconductor layer to the substrate. Accordingly, it is possible to implement a light-emitting apparatus in which the light emitting efficiency is high and the heat dissipation is good. In the above light-emitting apparatus, the rod-like light-emitting device is arranged to lie on its side on the substrate. This allows the whole thickness of the rod-like light-emitting device including the substrate to be decreased. In the above light-emitting apparatus, using the microscopic rod-like light-emitting device, for example, with the size of the order of micrometers in which the diameter is 1 μm and the length is 10 μm, or with the size in the order of nanometers in which at least the diameter of the diameter and the length is less than 1 μm enables the amount of semiconductors used to be decreased. Using this light-emitting apparatus makes it possible to implement a backlight, an illuminating device, a display device and the like whose thicknesses and weights can be reduced.

A light-emitting apparatus according to a tenth aspect of the invention comprises:

a rod-like light-emitting device of any of the above-mentioned types; and a substrate on which the rod-like light-emitting device is mounted such that a longitudinal direction of the rod-like light-emitting device is parallel to a mounting surface of the substrate, wherein electrodes are formed, with a predetermined spacing therebetween, on the substrate, and wherein the exposed portion at the one end of the semiconductor core of the rod-like light-emitting device is connected to one of the electrodes on the substrate, and the conductive layer on the other side of the semiconductor core is connected to another one of the electrodes on the substrate.

With the above configuration, with a rod-like light-emitting device mounted on a substrate in such a manner that the longitudinal direction of the device is parallel to the mounting surface of the substrate, the outer peripheral surface of the conductive layer is in contact with the mounting surface of the substrate. Therefore, heat generated in the rod-like light-emitting device can be dissipated with a good efficiency from the conductive layer to the substrate. Accordingly, it is possible to implement a light-emitting apparatus in which the light emitting efficiency is high and the heat dissipation is good. In the above light-emitting apparatus, the rod-like light-emitting device is arranged to lie on its side on the substrate. This allows the whole thickness of the rod-like light-emitting device including the substrate to be decreased. In the above light-emitting apparatus, using the microscopic rod-like light-emitting device, for example, with the size of the order of micrometers in which the diameter is 1 μm and the length is 10 μm, or with the size in the order of nanometers in which at least the diameter of the diameter and the length is less than 1 μm enables the amount of semiconductors used to be decreased. Using this light-emitting apparatus makes it possible to implement a backlight, an illuminating device, a display device and the like whose thicknesses and weights can be reduced.

In one embodiment, the light-emitting apparatus has a second conductive layer formed on a substrate-side portion of the said conductive layer and made of a material having a lower electric resistance than the semiconductor layer.

In one embodiment, the light-emitting apparatus has a metal portion formed between the electrodes on the substrate and below the rod-like light-emitting device.

In one embodiment, there are a plurality of the rod-like light-emitting devices which each are associated with respective ones of metal portions formed on the substrate, and the metal portions associated with adjacent ones of the rod-like light-emitting devices are electrically insulated from each other.

A method according to an eleventh aspect of the invention is a manufacturing method for a light-emitting apparatus including a rod-like light-emitting device of any of the above-mentioned types, and the method comprises steps of:

producing an insulating substrate formed with an alignment region having as a unit at least two electrodes to which independent voltages are respectively to be applied;

applying a liquid containing the rod-like light-emitting device in nanometer order size or micrometer order size onto the insulating substrate; and applying the independent voltages respectively to the at least two electrodes to align the rod-like light-emitting device at a position defined by the at least two electrodes.

With the above configuration, the insulating substrate where an alignment region having as a unit at least two electrodes to which independent potentials are respectively to be provided is produced, and a liquid containing one or more rod-like light-emitting devices with the size of the order of nanometers or of the order of micrometers is applied onto the insulating substrate. Thereafter, independent voltages are respectively applied to the at least two electrodes to align the microscopic rod-like light-emitting devices at positions defined by the at least two electrodes. Thus, the above rod-like light-emitting devices can be easily aligned on the predetermined insulating substrate.

In the above method of manufacturing a light-emitting apparatus, using only microscopic rod-like light-emitting devices makes it possible to decrease the amount of semiconductors used, and to manufacture a light-emitting apparatus whose thickness and weight can be reduced. In the above rod-like light-emitting device, light is emitted from the whole side surface of the semiconductor core covered with the semiconductor layer, and therefore the light emitting region becomes larger. This makes it possible to implement a light-emitting apparatus that has a high light emitting efficiency and achieves low power consumption.

A backlight according to a twelfth aspect of the invention comprises a rod-like light-emitting device according to any one of the first, fourth, and eighth aspects of the invention.

With the above configuration, use of the above rod-like light-emitting devices makes it possible to implement a backlight whose thickness and weight can be reduced and that has a high light emitting efficiency and achieves low power consumption.

An illuminating device according to a thirteenth aspect of the invention comprises a rod-like light-emitting device according to any one of the first, fourth, and eighth aspects of the invention.

With the above configuration, use of the above rod-like light-emitting devices makes it possible to implement an illuminating device whose thickness and weight can be reduced and that has a high light emitting efficiency and achieves low power consumption.

A display device according to a fourteenth aspect of the invention comprises a rod-like light-emitting device according to any one of the first, fourth, and eighth aspects of the invention.

With the above configuration, use of the above rod-like light-emitting devices makes it possible to implement a display device whose thickness and weight can be reduced and that has a high light emitting efficiency and achieves low power consumption.

A method of manufacturing a rod-like light-emitting device according to a fifteenth aspect of the invention, comprising:

a semiconductor core forming step of forming a rod-shaped semiconductor core of a first conductivity type on a substrate;

a semiconductor layer forming step of forming a cylindrical semiconductor layer of a second conductivity type to cover a surface of the semiconductor core;

a separating step of separating from the substrate the semiconductor core having the cylindrical semiconductor layer of the second conductivity type formed in the semiconductor layer forming step; and an exposing step of, after the semiconductor layer forming step and before the separating step, or after the separating step, exposing part of an outer peripheral surface of the semiconductor core.

According to the above configuration, the semiconductor core of the first conductivity type having a rod shape is formed on the substrate, and then the semiconductor layer of the second conductivity type having a cylindrical shape is formed to cover the surface of the semiconductor core. Here, the end surface of the semiconductor core opposite to the substrate may be covered with the semiconductor layer or may be exposed. Next, part of the outer peripheral surface of the semiconductor core is exposed, and then the semiconductor core including the exposed portion is separated from the substrate, for example, by vibrating the substrate by means of ultrasonic waves, or by the use of a cutting tool. Alternatively, the semiconductor core having the semiconductor layer is separated from the substrate, for example, by vibrating the substrate by means of ultrasonic waves, or by the use of a cutting tool, and then part of the outer peripheral surface of the semiconductor core is exposed. In the rod-like light-emitting device separated from the substrate in such a way, with one electrode connected to the exposed portion of the semiconductor core, and with the other electrode connected to the semiconductor layer, a current is caused to flow between the electrodes, so that electrons and holes recombine in a pn junction between the outer peripheral surface of the semiconductor core and the inner peripheral surface of the semiconductor layer. Thus, light is emitted from the pn junction. In this way, a microscopic rod-like light-emitting device having great freedom in installing into an apparatus can be manufactured. The term "microscopic rod-like light-emitting device" as used herein refers to a device, for example, with the size of the order of micrometers in which the diameter is 1 μm and the length is 10 μm, or with the size in the order of nanometers in which at least the diameter of the diameter and the length is less than 1 μm. The rod-like light-emitting device mentioned above allows a decrease in the amount of semiconductor used. This makes it possible to reduce the thickness and weight of an apparatus using the light-emitting device. Also because light is emitted from the whole periphery of the semiconductor core covered with the semiconductor layer, the light-emitting device is allowed to have an expanded light emitting region. This makes it possible to implement a backlight, an illuminating device and a display device that have high light emitting efficiencies and low power consumption.

In one embodiment, in the semiconductor layer forming step, the cylindrical semiconductor layer of the second conductivity type to cover the surface of the semiconductor core is formed under a condition where part of the outer peripheral surface of the semiconductor core is covered with a substance which inhibits forming of the semiconductor layer of the second conductivity type. And, in the exposing step, the substance of inhibiting forming of the semiconductor layer of the second conductivity type is removed to expose part of the outer peripheral surface of the semiconductor core.

In one embodiment, the substrate is made of a semiconductor of the first conductivity type. And, after the semiconductor layer forming step and before the separating step, the exposing step removes, by an etching process, the semiconductor layer of the second conductivity type in a region other than a part covering the surface of the semiconductor core, and an upper part of the substrate corresponding to the region, to thereby expose part of the outer peripheral surface of the semiconductor core.

In one embodiment, under a condition where the semiconductor core having the semiconductor layer of the second conductivity type and separated from the substrate in the separating step is aligned at a preset position on an insulating substrate, the exposing step exposes part of the outer peripheral surface of the semiconductor core having the semiconductor layer of the second conductivity type.

In one embodiment, in the exposing step, a substrate-side portion of the outer peripheral surface of the semiconductor core is exposed, and in the semiconductor layer forming step, an end surface of the semiconductor core opposite from the substrate is covered with the semiconductor layer.

In one embodiment, in the separating step, the semiconductor core covered with the semiconductor layer is separated from the substrate using ultrasonic waves.

In one embodiment, in the separating step, the semiconductor core is mechanically separated from the substrate using a cutting tool.

In one embodiment, the semiconductor core and the semiconductor layer are made of semiconductors whose base materials are GaN, and in the exposing step, dry etching is used.

In one embodiment, in the exposing step, the outer peripheral surface of the semiconductor core is exposed so as to be continuous with and flush with an outer peripheral surface of the semiconductor layer.

In one embodiment, in the exposing step, the outer peripheral surface of a region covered with the semiconductor layer of the semiconductor core and the outer peripheral surface of an exposed region of the semiconductor core are continuous with each other.

A method of manufacturing a display device according to a sixteenth aspect of the invention is a manufacturing method for a display device including a rod-like light-emitting device which is manufactured by any one of the above rod-like light-emitting device manufacturing methods, and the method comprises steps of:

producing an insulating substrate formed with an alignment region having as a unit at least two electrodes to which independent voltages are respectively to be applied;

applying a liquid containing the rod-like light-emitting device in nanometer order size or micrometer order size onto the insulating substrate; and applying the independent voltages respectively to the at least two electrodes to align the rod-like light-emitting device at a position defined by the at least two electrodes.

With the above configuration, the insulating substrate where an alignment region having as a unit at least two electrodes to which independent potentials are respectively to be provided is produced, and a liquid containing the rod-like light-emitting devices with the size of the order of nanometers or of the order of micrometers is applied onto the insulating substrate. Thereafter, independent voltages are respectively applied to the at least two electrodes to align the microscopic rod-like light-emitting devices at positions defined by the at least two electrodes. Thus, the above rod-like light-emitting devices can be easily aligned on the predetermined insulating substrate.

In the above method of manufacturing a light-emitting apparatus, using only microscopic rod-like light-emitting devices makes it possible to decrease the amount of semiconductors used, and to manufacture a display device whose thickness and weight can be reduced. In the above rod-like light-emitting device, light is emitted from the whole side surface of the semiconductor core covered with the semiconductor layer, and therefore the light emitting region becomes larger. This makes it possible to implement a display device that has a high light emitting efficiency and achieves low power consumption.

A method of manufacturing a rod-like light-emitting device according to a seventeenth aspect of the invention comprises steps of:

forming on a substrate an insulator having a through-hole;

forming a semiconductor core of a first conductivity type having a rod shape on a surface of the substrate in a position coincident with the through-hole such that the semiconductor core protrudes from the through-hole;

forming a semiconductor core of a first conductivity type having a rod shape on a surface of the substrate in a position coincident with the through-hole such that the semiconductor core protrudes from the through-hole;

forming a semiconductor layer of a second conductivity type to cover the semiconductor core protruding from the through-hole;

etching the insulator such that part of the insulator remains on at least part of an outer peripheral surface not covered with the semiconductor layer of the semiconductor core, said at least part of the outer peripheral surface not covered with the semiconductor layer being a portion near an outer peripheral surface covered with the semiconductor layer of the semiconductor core; and separating from the substrate a rod-like light-emitting device having the semiconductor core, the semiconductor layer, and the part of the insulator remaining on the substrate in the insulator etching step.

Here, the term "first conductivity type" means p-type or n-type. Also, the "second conductivity type" means n-type in cases where the first conductivity type is p-type whereas the second conductivity type means p-type in cases where the first conductivity type is n-type.

According to the above configuration, the insulator having a through-hole is formed on the substrate, and then the semiconductor core of the first conductivity type shaped like a rod is formed to protrude from the through-hole, on the surface of the substrate exposed from the through-hole.

Next, the semiconductor layer of the second conductivity type is formed to cover the semiconductor core protruding from the through-hole, and the insulator is etched so as to cause part of the insulator to remain on at least a portion near the outer peripheral surface covered with the semiconductor layer of the semiconductor core, of the outer peripheral surface not covered with the semiconductor layer of the semiconductor core. Thus, one end portion (opposite from the substrate) of the semiconductor core can be covered with the semiconductor layer of the second conductivity type whereas at least the above portion of the other end portion (substrate side) of the semiconductor core can be covered with part of the insulator.

Next, the rod-like light-emitting device having the semiconductor core, the semiconductor layer, and the part of the insulator remaining on the substrate is separated from the substrate, for example, by vibrating the substrate by means of ultrasonic waves, or by the use of a cutting tool.

In this way, separating the rod-like light-emitting device from the substrate allows great freedom in installing into an apparatus of the rod-like light-emitting device. Therefore, a microscopic rod-like light-emitting device that has great freedom in installing into an apparatus can be manufactured.

The term "microscopic rod-like light-emitting device" as used herein refers to, for example, a device that has such dimensions that the diameter is within the range of from 10 nm to 5 µm, inclusive, and the length is within the range of from 100 nm to 200 µm, inclusive, and preferably a device that has such dimensions that the diameter is within the range of from 100 nm to 2 µm, inclusive, and the length is within the range of from 1 µm to 50 µm, inclusive.

On the surface of the substrate in a position coincident with the through-hole mentioned above, the semiconductor core of the first conductivity type shaped like a rod is formed to protrude from the through-hole. This enables the thickness of the semiconductor core to be uniform.

The substrate is separated from the rod-like light-emitting device and therefore need not be used at the time of light emission of the rod-like light-emitting device. Accordingly, substrate options that are available at the time of light emission of the rod-like light-emitting device are expanded. This can increase the freedom in selecting the form of the apparatus in which the rod-like light-emitting device is to be mounted.

There is a portion of the semiconductor core that is easily broken upon the above-described separation from the substrate at the boundary (undesired position) between a region covered with the semiconductor layer of the second conductivity type and a region not covered with the semiconductor layer of the second conductivity type. This portion is reinforced with the insulator that remains on the semiconductor core. Therefore, the rod-like light-emitting device can be easily split at a desired portion, that is, the root of the semiconductor core. Accordingly, even in cases where a plurality of rod-like light-emitting devices mentioned above are manufactured, the lengths of the plurality of rod-like light-emitting devices can be made uniform.

The substrate that has been used for forming the rod-like light-emitting device can be reused for manufacturing a rod-like light-emitting device after the previous rod-like light-emitting device is separated from the substrate. This can reduce the manufacturing cost.

The above rod-like light-emitting device is microscopic, and therefore the amount of semiconductors used can be decreased. Therefore, it becomes possible to reduce the thickness and weight of an apparatus in which the rod-like light-emitting devices is to be mounted. This allows loads to the environment to be reduced.

In the above-described manufacturing method, of all the outer peripheral surface not covered with the semiconductor layer of the semiconductor core, at least a portion near the outer peripheral surface covered with the semiconductor layer of the semiconductor core can be covered with the insulator. With an electrode on a first conductivity side connected to a portion not covered with the insulator of the semiconductor core, and with an electrode on a second conductivity side connected to the semiconductor layer, a current is caused to flow between the electrodes, so that the rod-like light-emitting device emits light.

The above-described manufacturing method allows one side, i.e., one end portion, of the semiconductor core to be covered with the semiconductor layer of the second conductivity type. This can expand the light emitting region to increase the amount of emitted light and to raise the light emitting efficiency.

With the above-described manufacturing method, of all the outer peripheral surface not covered with the semiconductor layer of the semiconductor core, at least the portion near the outer peripheral surface covered with the semiconductor layer of the one end of the semiconductor core can be covered with the insulator. Therefore, the electrode on the first conductivity side can be prevented from being short-circuited to the electrode on the second conductivity side.

A method of manufacturing a rod-like light-emitting device according to an eighteenth aspect of the invention comprises steps of:

forming on a substrate an underlying layer made of a semiconductor of a first conductivity type;

forming on the underlying layer an insulator having a through-hole;

forming a semiconductor core of the first conductivity type having a rod shape on a surface of the underlying layer in a position coincident with the through-hole such that the semiconductor core protrudes from the through-hole;

forming a semiconductor layer of a second conductivity type to cover the semiconductor core protruding from the through-hole;

etching the insulator and the underlying layer such that part of the insulator remains on at least part of an outer peripheral surface not covered with the semiconductor layer of the semiconductor core, said at least part of the outer peripheral surface not covered with the semiconductor layer being a portion near an outer peripheral surface covered with the semiconductor layer of the semiconductor core, and such that part of the underlying layer adjacent to a substrate-side end surface of the semiconductor core remains; and separating from the substrate a rod-like light-emitting device having the semiconductor core, the semiconductor layer, the part of the insulator remaining on the substrate in the etching step, and the part of the underlying layer remaining on the substrate in the etching step.

Here, the term "first conductivity type" means p-type or n-type. Also, the "second conductivity type" means n-type in cases where the first conductivity type is p-type whereas the second conductivity type means p-type in cases where the first conductivity type is n-type.

According to the above configuration, the underlying layer made of the semiconductor of the first conductivity type is formed on the substrate, and further the insulator having the through-hole is formed on the underlying layer. Then, the semiconductor core of the first conductivity type shaped like a rod is formed to protrude from the through-hole on the surface of the underlying layer exposed from the through-hole.

Next, the semiconductor layer of the second conductivity type is formed to cover the semiconductor core protruding from the through-hole, and the insulator and the underlying layer are etched so that part of the insulator remains and part of the underlying layer adjacent to an end on the substrate side of the semiconductor core remains on at least a portion near the outer peripheral surface covered with the semiconductor layer of the semiconductor core, of the outer peripheral surface not covered with the semiconductor layer of the semiconductor core. Thus, one side (opposite to the substrate side) of the semiconductor core can be covered with the semiconductor layer of the second conductivity type whereas at least the above portion on the other side (substrate side) of the semiconductor core can be covered with part of the insulator. Part of the outer peripheral surface of the underlying layer can be exposed.

Next, the rod-like light-emitting device having the semiconductor core, the semiconductor layer, the part of the insulator remaining on the substrate, and the part of the underlying layer remaining on the substrate is separated from the substrate by vibrating the substrate by means of ultrasonic waves, or by the use of a cutting tool. Thus, the end surface (end surface in contact with the substrate) in the axial direction opposite to the semiconductor core side of the underlying layer can be exposed.

In this way, separating the rod-like light-emitting device from the substrate allows great freedom in installing into an apparatus of the rod-like light-emitting device. Therefore, a microscopic rod-like light-emitting device that has great freedom in installing into an apparatus can be manufactured.

The term "microscopic rod-like light-emitting device" refers to, for example, a device that has such dimensions that the diameter is within the range of from 10 nm to 5 µm, inclusive, and the length is within the range of from 100 nm to 200 µm, inclusive, and preferably a device that has such dimensions that the diameter is within the range of from 100 nm to 2 µm, inclusive, and the length is within the range of from 1 µm to 50 µm, inclusive.

On the surface of the substrate in a position coincident with the through-hole mentioned above, the semiconductor core of the first conductivity type shaped like a rod is formed to protrude from the through-hole. This enables the thickness of the semiconductor core to be uniform.

The substrate is separated from the rod-like light-emitting device and therefore need not be used at the time of light emission of the rod-like light-emitting device. Accordingly, substrate options that are available at the time of light emission of the rod-like light-emitting device are expanded. This can increase the freedom in selecting the form of the apparatus in which the rod-like light-emitting device is to be mounted.

There is a portion of the semiconductor core that is easily broken upon the above-described separation from the substrate at the boundary (undesired position) between a region covered with the semiconductor layer of the second conductivity type and a region not covered with the semiconductor layer of the second conductivity type. This portion is reinforced with the insulator that remains on the semiconductor core. Therefore, the rod-like light-emitting device can be easily split at a desired portion, that is, the root of the semiconductor core. Accordingly, even in cases where a plurality of rod-like light-emitting devices mentioned above are manufactured, the lengths of the plurality of rod-like light-emitting devices can be made uniform.

The substrate that has been used for forming the rod-like light-emitting device can be reused for manufacturing a rod-like light-emitting device after the previous rod-like light-emitting device is separated from the substrate. This can reduce the manufacturing cost.

The above rod-like light-emitting device is microscopic, and therefore the amount of semiconductors used can be decreased. Therefore, it becomes possible to reduce the thickness and weight of an apparatus in which the rod-like light-emitting devices is to be mounted. This allows loads to the environment to be reduced.

With the above-described manufacturing method, the end surface in the axial direction opposite to the semiconductor core side of the underlying layer can be exposed, and the peripheral surface of the underlying layer can be exposed.

With an electrode on the first conductivity side connected to at least one of the end surface and the peripheral surface, and with an electrode on the second conductivity side connected to the semiconductor layer, a current is caused to flow between the electrodes, so that the rod-like light-emitting device emits light.

The above-described manufacturing method allows one side, i.e., one end portion, of the semiconductor core to be covered with the semiconductor layer of the second conductivity type. This can expand the light emitting region to increase the amount of emitted light and to raise the light emitting efficiency.

With the above-described manufacturing method, of all the outer peripheral surface not covered with the semiconductor layer of the semiconductor core, at least the portion near the outer peripheral surface covered with the semiconductor layer of the one end of the semiconductor core can be covered with the insulator. Therefore, the electrode on the first conductivity side can be prevented from being short-circuited to the electrode on the second conductivity side.

In one embodiment, the method further comprises a step of forming a quantum well layer between the semiconductor core and the semiconductor layer.

A rod-like light-emitting device according to a nineteenth aspect of the invention comprises:
a semiconductor core of a first conductivity type having a rod shape;
a semiconductor layer of a second conductivity type covering one of two ends of the semiconductor core; and
an insulator covering at least a portion near an outer peripheral surface covered with the semiconductor layer of the semiconductor core, of an outer peripheral surface not covered with the semiconductor layer of the semiconductor core.

Here, the term "first conductivity type" means p-type or n-type. Also, the "second conductivity type" means n-type in cases where the first conductivity type is p-type whereas the second conductivity type means p-type in cases where the first conductivity type is n-type.

According to the above configuration, the rod-like light-emitting device can be manufactured by a method of manufacturing a rod-like light-emitting device according to the present invention because the rod-like light-emitting device has the semiconductor core of the first conductivity type having the rod shape, the semiconductor layer of the second conductivity type covering one side, namely one end, of the semiconductor core, and the insulator covering the outer peripheral surface not covered with the semiconductor layer of the semiconductor core, at least the portion near the outer peripheral surface covered with the semiconductor layer of the semiconductor core.

With an electrode on the first conductivity side connected to an end portion of the semiconductor core not covered with the insulator, and an electrode on the second conductivity side connected to the semiconductor layer, a current is caused to flow between the electrodes, so that the rod-like light-emitting device emits light. At this point, one side, or end, of the semiconductor core is covered with the semiconductor layer of the second conductivity type, and therefore the light emitting region becomes larger. Accordingly, the amount of emitted light can be increased, and the light emitting efficiency can be raised.

Even in cases where the rod-like light-emitting device is microscopic, at least an axially end surface of the other end of the semiconductor core is exposed. An electrode on the first conductivity side can be easily connected to this end surface.

The device includes an insulator that covers at least the portion near the outer peripheral surface covered with the semiconductor layer of the semiconductor core, of the outer peripheral surface not covered with the semiconductor layer of the semiconductor core. As a result, the electrode on the first conductivity side becomes less likely to be short-circuited to the electrode on the second conductivity side, which facilitates formation of the electrode on the first conductivity side and the electrode on the second conductivity side.

"The rod-like light-emitting device is microscopic" means that the device has such dimensions that, for example, the diameter is within the range of from 10 nm to 5 μm, inclusive, and the length is within the range of from 100 nm to 200 μm, inclusive, and preferably, the device has such dimensions that the diameter is within the range of from 100 nm to 2 μm, inclusive, and the length is within the range of from 1 μm to 50 μm, inclusive.

A rod-like light-emitting device according to a twentieth aspect of the invention comprises:

a semiconductor core of a first conductivity type having a rod shape;

a semiconductor layer of a second conductivity type covering one of two ends of the semiconductor core;

an insulator covering at least a portion near an outer peripheral surface covered with the semiconductor layer of the semiconductor core, of an outer peripheral surface not covered with the semiconductor layer of the semiconductor core; and an underlying layer of the first conductivity type adjoining the other end of the semiconductor core, wherein an end surface of the underlying layer axially opposite from the semiconductor core and a peripheral surface of the underlying layer are exposed.

Here, the term "first conductivity type" means p-type or n-type. Also, the "second conductivity type" means n-type in cases where the first conductivity type is p-type whereas the second conductivity type means p-type in cases where the first conductivity type is n-type.

According to the above configuration, the rod-like light-emitting device can be manufactured by a method of manufacturing a rod-like light-emitting device according to the invention because the rod-like light-emitting device has a semiconductor core of the first conductivity type having a rod shape, a semiconductor layer of the second conductivity type covering one end, or side, of the semiconductor core, an insulator covering at least a portion near the outer peripheral surface covered with the semiconductor layer of the semiconductor core, of all the outer peripheral surface not covered with the semiconductor layer of the semiconductor core, and an underlying layer of the first conductivity type adjoining the other end of the semiconductor core, and an end surface of the underlying layer axially opposite from the semiconductor core and a peripheral surface of the underlying layer are exposed.

For example, with an electrode on the first conductivity side connected to at least one of the end surface axially opposite to the semiconductor core of the underlying layer and the peripheral surface of the underlying layer, and with the electrode on the second conductivity side connected to the semiconductor layer, a current is caused to flow between the electrodes, so that the rod-like light-emitting device emits light. At this point, one side of the semiconductor core is covered with the semiconductor layer of the second conductivity type, and therefore the light emitting region becomes larger. Accordingly, the amount of emitted light can be increased, and the light emitting efficiency can be raised.

Even in cases where the rod-like light-emitting device is microscopic, the end surface in the axial direction opposite to the semiconductor core of the underlying layer is exposed, and the peripheral surface of the underlying layer is exposed. Therefore, an electrode on the first conductivity side can be easily connected to at least one of the end surface in the axial direction and the peripheral surface.

The insulator that covers at least the portion near the outer peripheral surface covered with the semiconductor layer of the semiconductor core, of the outer peripheral surface not covered with the semiconductor layer of the semiconductor core, is included. As a result, the electrode on the first conductivity side becomes less likely to be short-circuited to the electrode on the second conductivity side, which facilitates formation of the electrode on the first conductivity side and the electrode on the second conductivity side.

Here, the "rod-like light-emitting device being microscopic" means that, for example, the rod-like light-emitting device has such dimensions that the diameter is within the range of from 10 nm to 5 μm and the length is within the range of from 100 nm to 200 μm, and more preferably the device have such dimensions that the diameter is within the range of from 100 nm to 2 μm and the length is within the range of from 1 μm to 50 μm.

A backlight according to a twenty-first aspect of the present invention comprises a rod-like light-emitting device according to the nineteenth or twentieth aspect of the invention.

According to the above configuration, due to the inclusion of the above rod-like light-emitting device, a backlight that has a high light emitting efficiency and achieves low power consumption can be implemented.

An illuminating device according to a twenty-second aspect of the present invention comprises a rod-like light-emitting device according to the nineteenth or twentieth aspect of the invention.

According to the above configuration, due to the inclusion of the above rod-like light-emitting device, an illuminating device that has a high light emitting efficiency and achieves low power consumption can be implemented.

A display device according to a twenty-third aspect of the present invention comprises a rod-like light-emitting device according to the nineteenth or twentieth aspect of the invention.

According to the above configuration, due to the inclusion of the above rod-like light-emitting device, a display device that has a high light emitting efficiency and achieves low power consumption can be implemented.

A light-emitting apparatus according to a twenty-fourth aspect of the invention comprises:

a rod-like light-emitting device including a semiconductor core of a first conductivity type having a rod shape, and a semiconductor layer of a second conductivity type formed to cover the semiconductor core, with an outer peripheral surface of part of the semiconductor core being exposed; and a substrate on which the rod-like light-emitting device is mounted such that a longitudinal direction of the rod-like light-emitting device is parallel to a mounting surface of the substrate.

According to the above configuration, the rod-like light-emitting device that includes the semiconductor core of the first conductivity type having the rod shape, and the semiconductor layer of the second conductivity type formed to cover the semiconductor core, and in which the outer peripheral surface of part of the semiconductor core is exposed, is mounted on the substrate such that the longitudinal direction of the rod-like light-emitting device is parallel to the mounting surface of the substrate. In this rod-like light-emitting device, with one electrode connected to the exposed portion of the semiconductor core, and with the other electrode connected to the semiconductor layer, a current is caused to flow between the electrodes, so that electrons and holes recombine in a pn junction between the outer peripheral surface of the semiconductor core and the inner peripheral surface of the semiconductor layer. As a result, light is emitted from the pn junction, that is, the whole periphery of the semiconductor core. Thus, the rod-like light-emitting device has an expanded light emitting region, and therefore has a high light emitting efficiency. With the rod-like light-emitting device mounted on the substrate such that the longitudinal direction of the rod-like light-emitting device is parallel to the mounting surface of the substrate, the outer peripheral surface of the semiconductor layer is in contact with the mounting surface of the substrate. Therefore, heat generated in the rod-like light-emitting device can be dissipated with a good efficiency from the semiconductor layer to the substrate. Accordingly, it is possible to implement a light-emitting apparatus in which the light emitting efficiency is high and the heat dissipation is good. In the above light-emitting apparatus, the rod-like light-emitting device is arranged to lie on its side on the substrate. This allows the whole thickness of the rod-like light-emitting device including the substrate to be decreased. In the above light-emitting apparatus, using the microscopic rod-like light-emitting device, for example, with the size of the order of micrometers in which the diameter is 1 µm and the length is 10 µm, or with the size in the order of nanometers in which at least the diameter of the diameter and the length is less than 1 µm enables the amount of semiconductors used to be decreased. Using this light-emitting apparatus makes it possible to implement a backlight, an illuminating device, a display device and the like whose thicknesses and weights can be reduced.

In one embodiment, an outer peripheral surface of one of two ends of the semiconductor core is exposed.

In one embodiment, an end surface of the other end of the semiconductor core is covered with the semiconductor layer.

In one embodiment, an outer peripheral surface of an exposed region of the semiconductor core is coincident or substantially coincident with an extension of an outermost peripheral surface of a region of the semiconductor core where the semiconductor core is covered with the semiconductor layer.

In one embodiment, an outer peripheral surface of a region covered with the semiconductor layer of the semiconductor core is continuous with an outer peripheral surface of an exposed region of the semiconductor core.

In one embodiment, the rod-like light-emitting device has a quantum well layer formed between the semiconductor core and the semiconductor layer.

In one embodiment, the rod-like light-emitting device has a transparent electrode covering the semiconductor layer.

In one embodiment, the rod-like light-emitting device has a metal layer on a substrate-side portion of the transparent electrode.

In one embodiment, the rod-like light-emitting device has an exposed portion in which an outer peripheral surface of one of two ends is exposed, and electrodes are formed, with a predetermined spacing therebetween, on the substrate. The exposed portion at the one end of the rod-like light-emitting device is connected to one of the electrodes on the substrate, and the semiconductor layer at the other end of the rod-like light-emitting device is connected to another one of the electrodes on the substrate, and a metal portion is formed between the electrodes and below the rod-like light-emitting device on the substrate.

A backlight according to a twenty-fifth aspect of the invention comprises a light-emitting apparatus according to the twenty-fourth aspect of the invention.

According to the above configuration, use of the light-emitting apparatus makes it possible to implement a backlight with a high light emitting efficiency, low power consumption, and a good heat dissipation. Use of the microscopic rod-like light-emitting devices for the light-emitting apparatus enables the amount of semiconductors used to be decreased to achieve reduction of the thickness and weight of the apparatus.

An illuminating device according to a twenty-sixth aspect of the invention comprises the light-emitting apparatus according to the twenty-fourth aspect of the invention.

According to the above configuration, use of the light-emitting apparatus makes it possible to implement an illuminating device with a high light emitting efficiency, low power consumption, and a good heat dissipation. Use of the microscopic rod-like light-emitting devices for the light-emitting apparatus enables the amount of semiconductors used to be decreased to achieve reduction of the thickness and weight of the apparatus.

A display device according to a twenty-seventh aspect of the invention comprises the light-emitting apparatus according to the twenty-fourth aspect of the invention.

According to the above configuration, use of the light-emitting apparatus makes it possible to implement a display device with a high light emitting efficiency, low power consumption, and a good heat dissipation. Use of the microscopic rod-like light-emitting devices for the light-emitting apparatus enables the amount of semiconductors used to be decreased to achieve reduction of the thickness and weight of the apparatus.

BRIEF DESCRIPTION OF DRAWINGS

The present invention will become more fully understood from the detailed description given hereinbelow and the accompanying drawings which are given by way of illustration only, and thus are not intended to limit the present invention, and wherein:

FIG. 76 shows a process step following that of FIG. 75, showing the method of manufacturing rod-like light-emitting device;

FIG. 77 shows a process step following that of FIG. 76, showing the method of manufacturing rod-like light-emitting device;

FIG. 78 shows a process step following that of FIG. 77, showing the method of manufacturing rod-like light-emitting device;

FIG. 79 shows a process step following that of FIG. 78, showing the method of manufacturing rod-like light-emitting device;

FIG. 80 shows a process step following that of FIG. 79, showing the method of manufacturing rod-like light-emitting device;

FIG. 81 shows a process step following that of FIG. 80, showing the method of manufacturing rod-like light-emitting device;

FIG. 82 shows a process step following that of FIG. 81, showing the method of manufacturing rod-like light-emitting device;

FIG. 83 shows a process step following that of FIG. 82, showing the method of manufacturing rod-like light-emitting device;

FIG. 84 shows a process step following that of FIG. 83, showing the method of manufacturing rod-like light-emitting device;

FIG. 85 shows a process step following that of FIG. 84, showing the method of manufacturing rod-like light-emitting device;

FIG. 86 shows a process step following that of FIG. 85, showing the method of manufacturing rod-like light-emitting device;

FIG. 87A is a plan view showing a process step of a method of manufacturing a display device using the rod-like light-emitting device shown in FIG. 86;

Figure 87A:
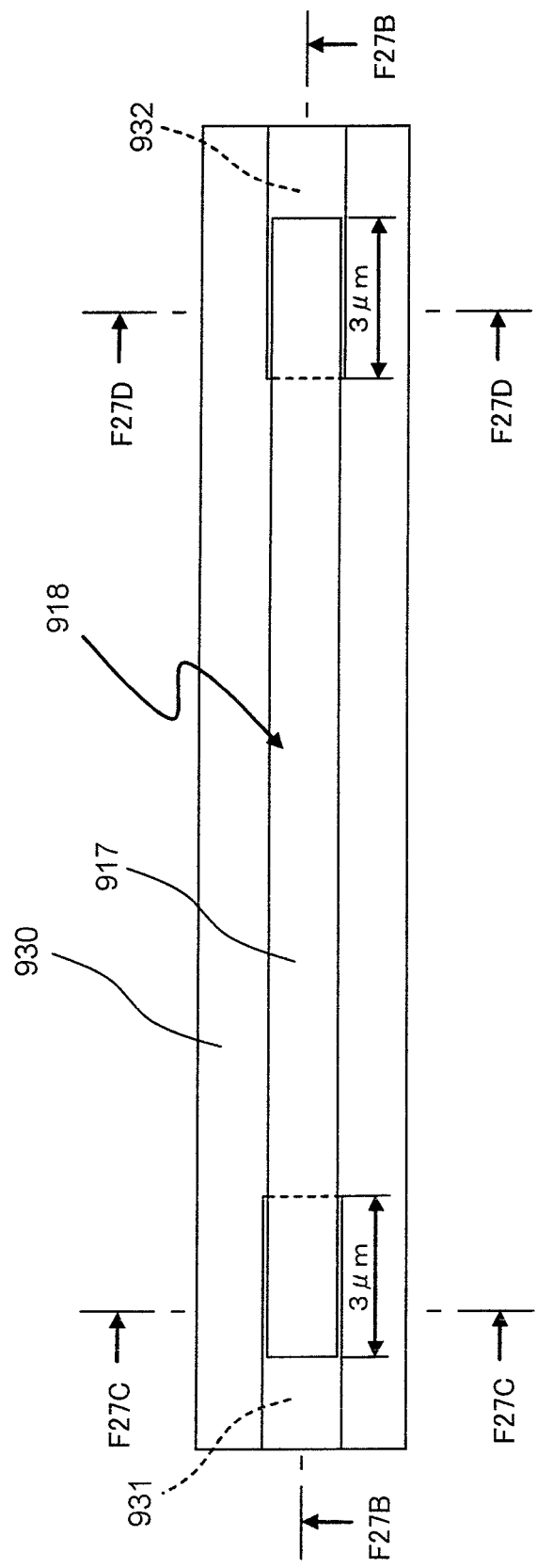
Figure 87C:
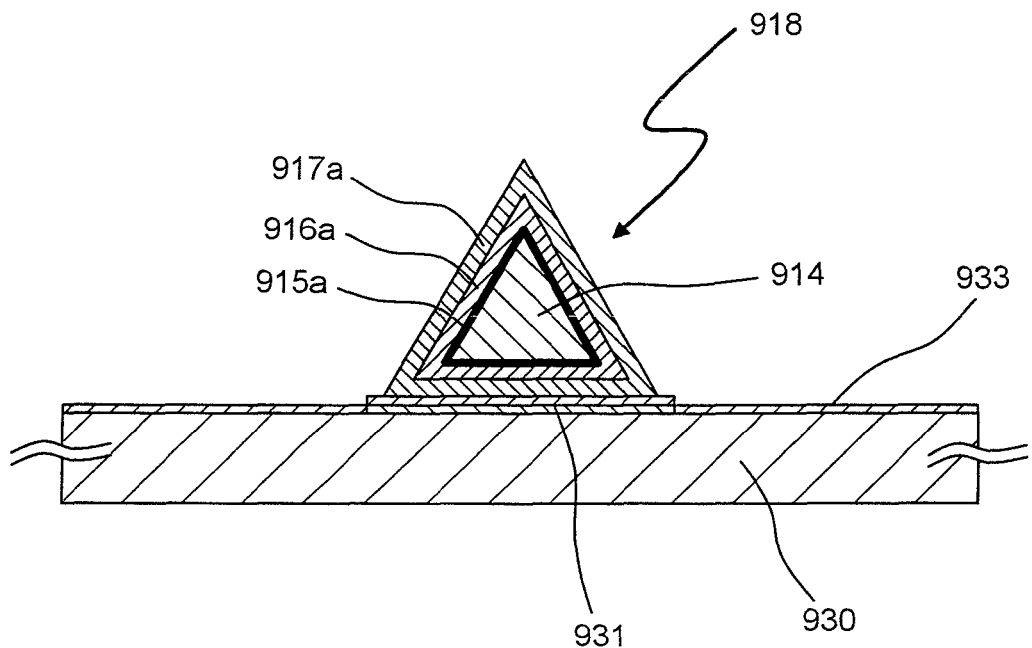
Figure 87D:
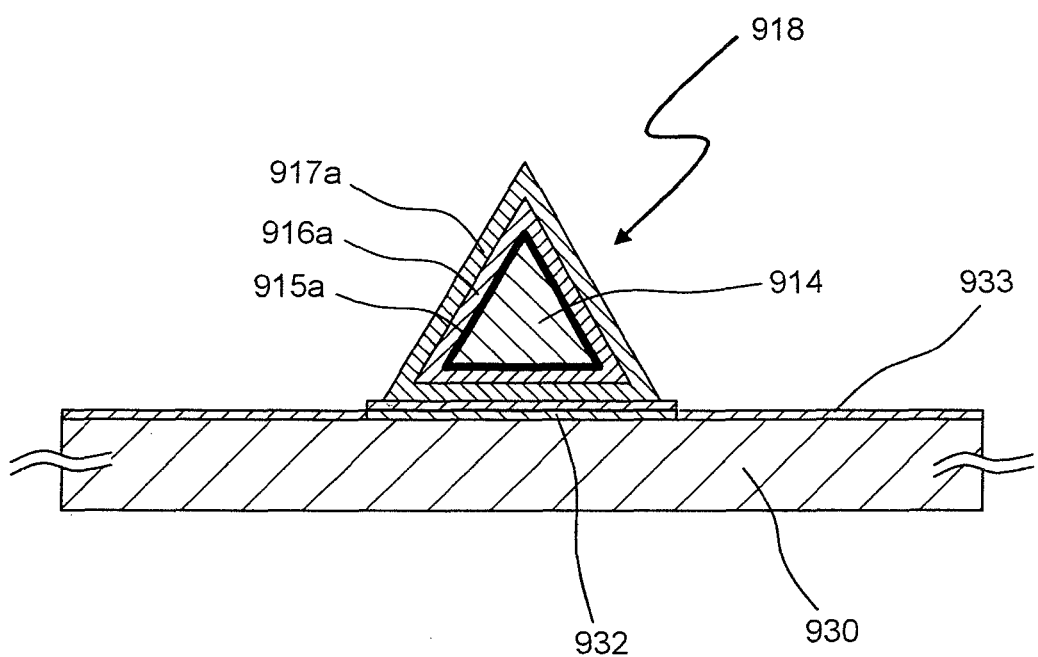
Figure 88B:
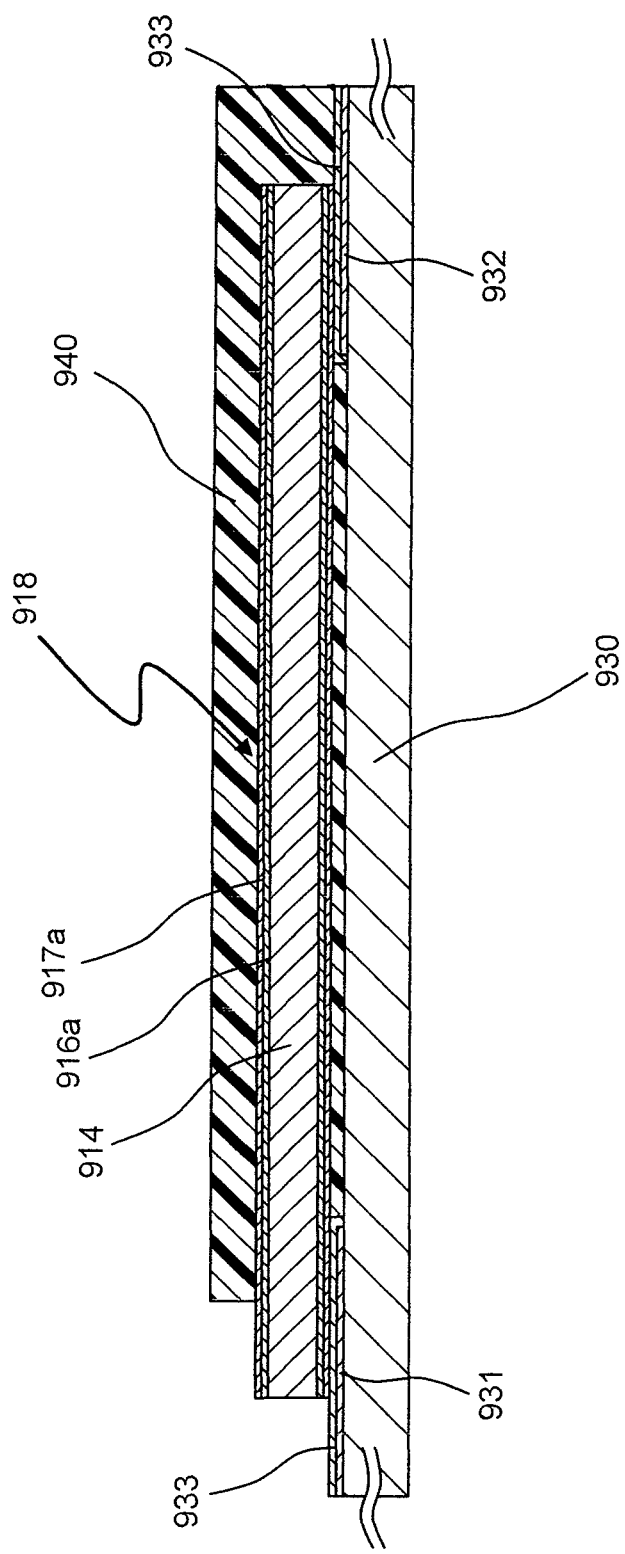
Figure 88C:
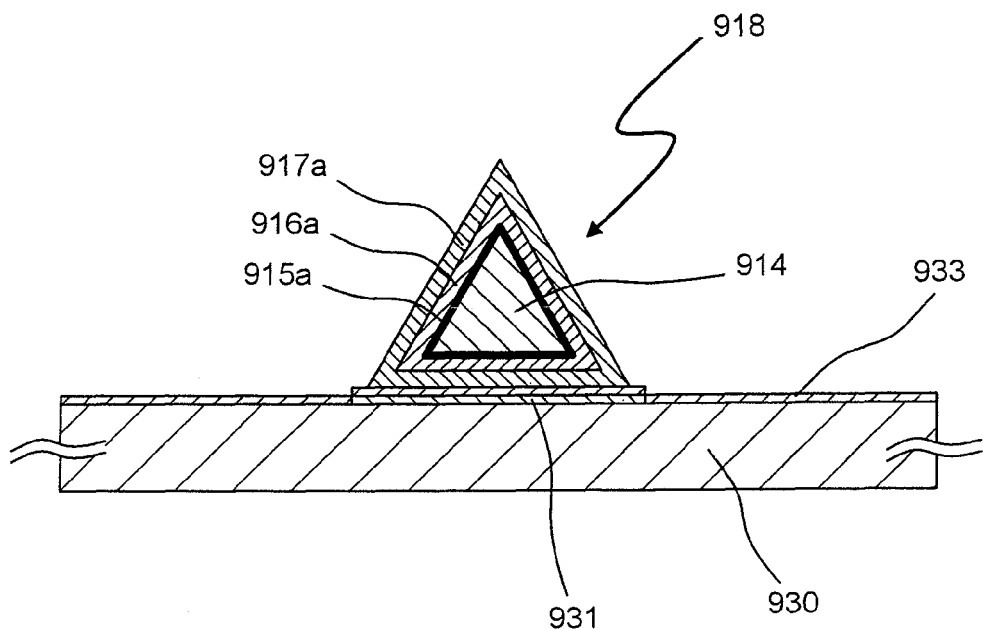
Figure 88D:
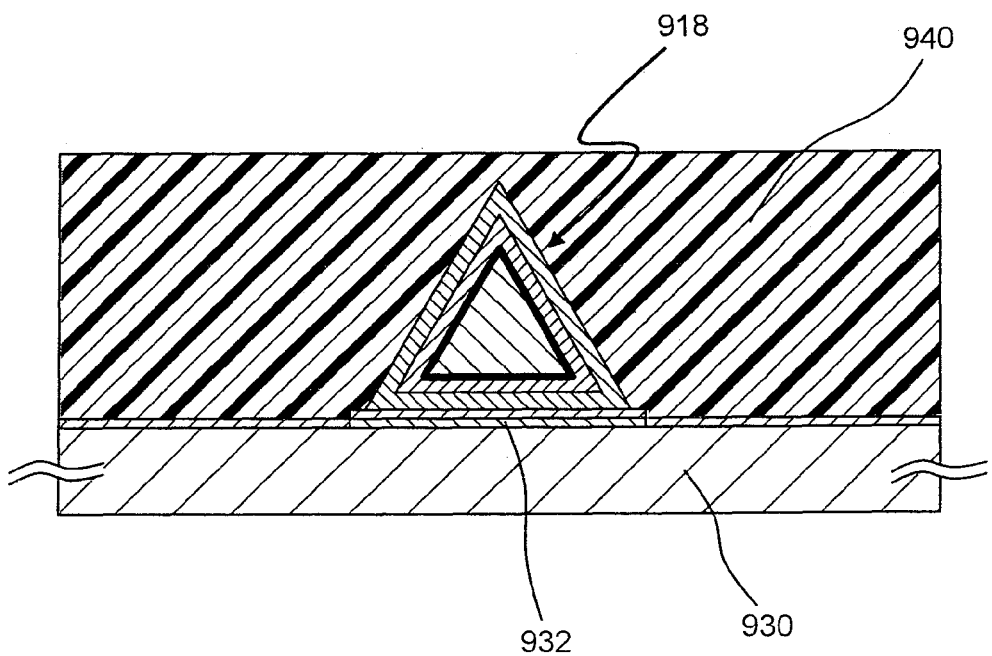
Figure 89B:
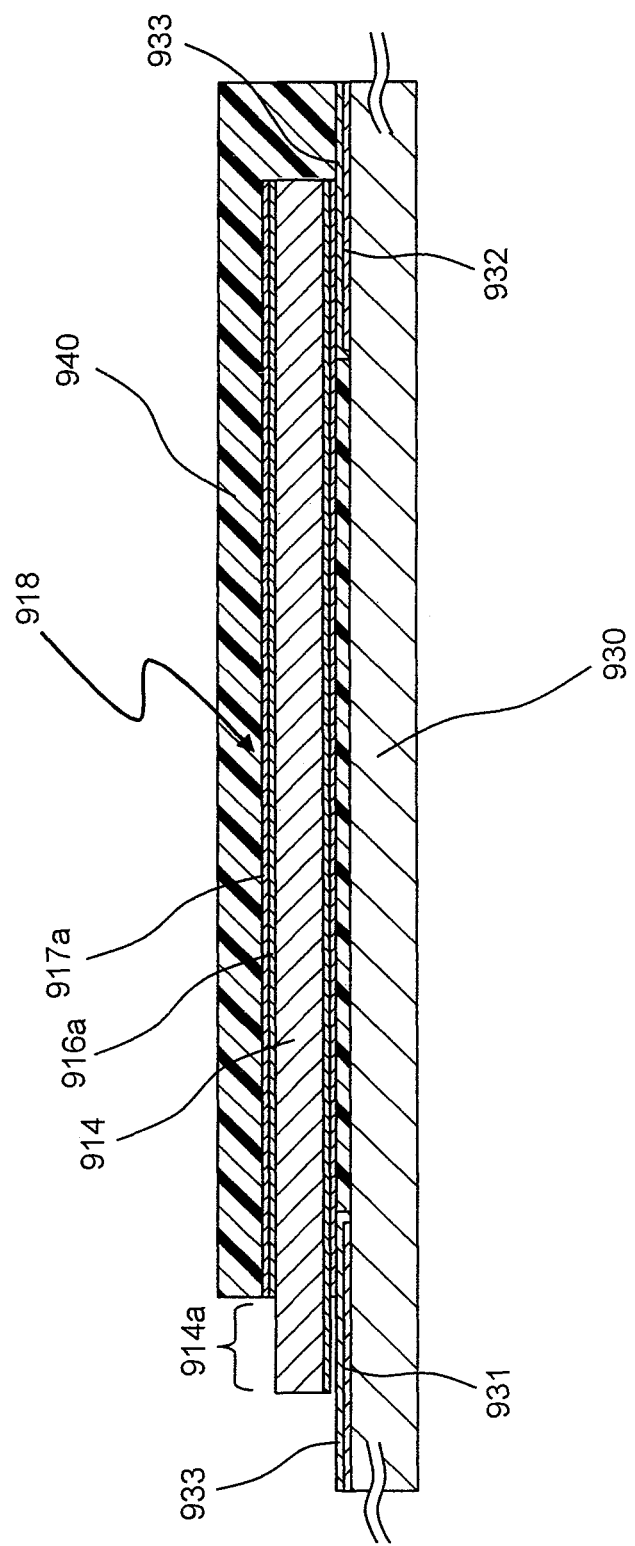
Figure 89C:
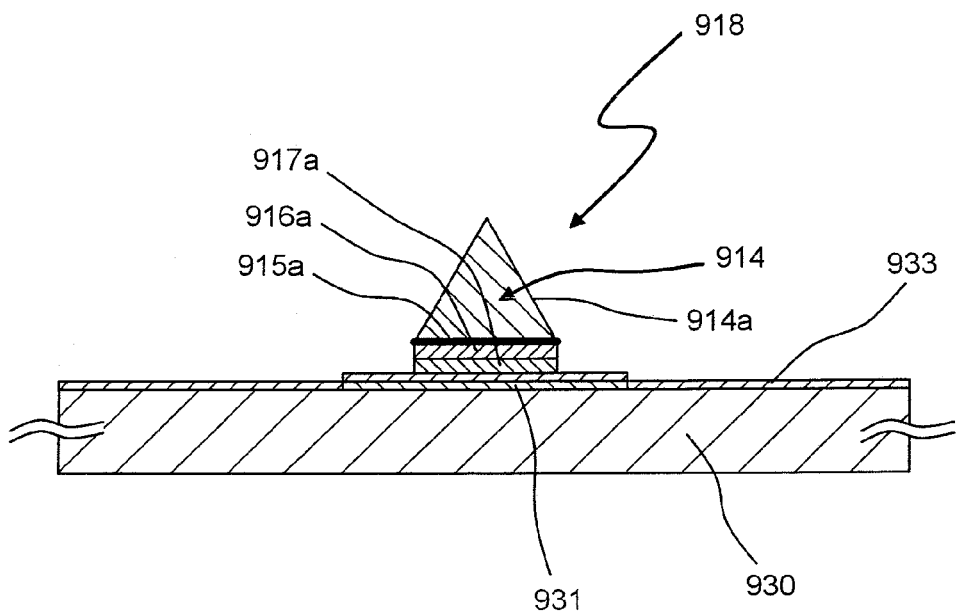
Figure 89D:
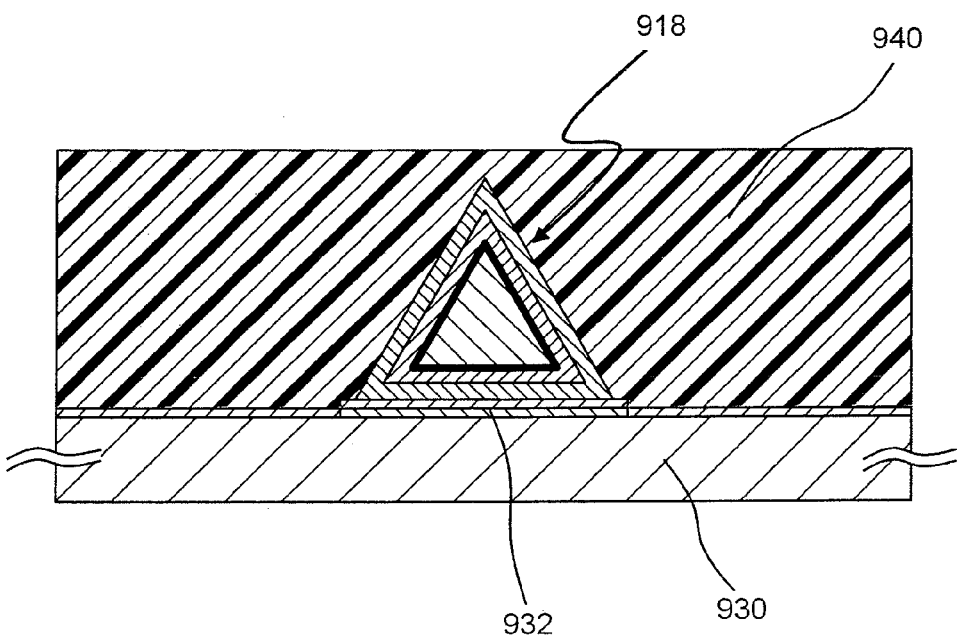
Figure 90A:
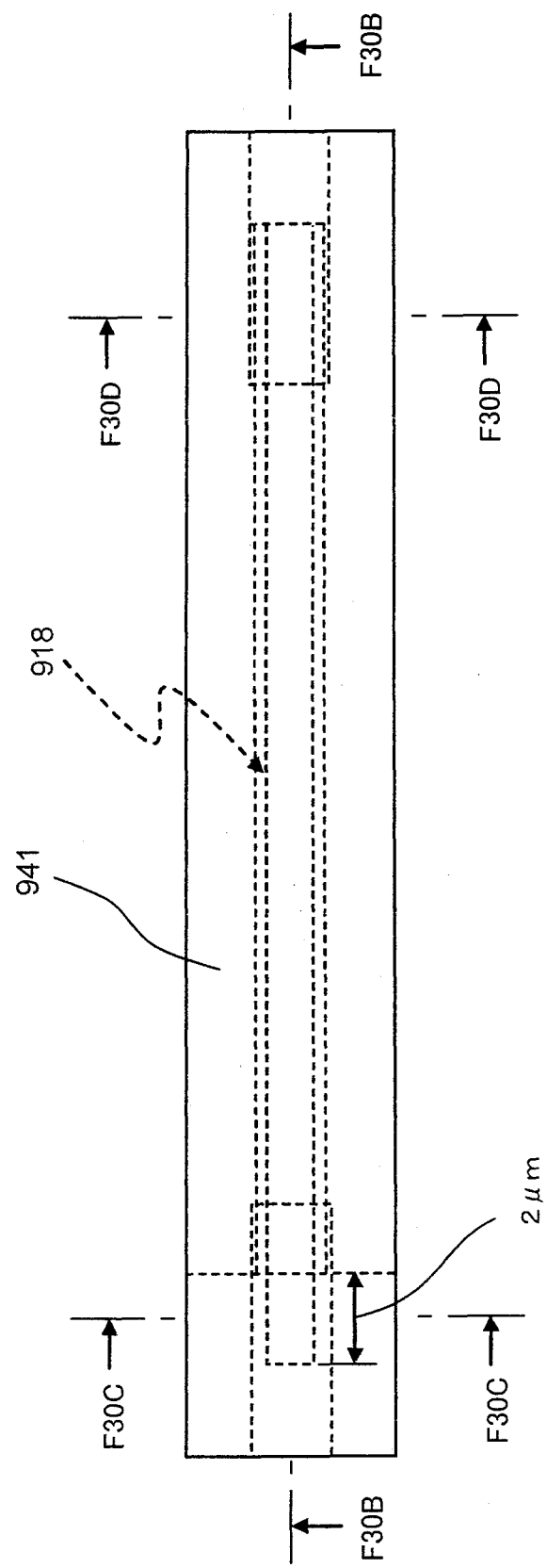
Figure 90B:
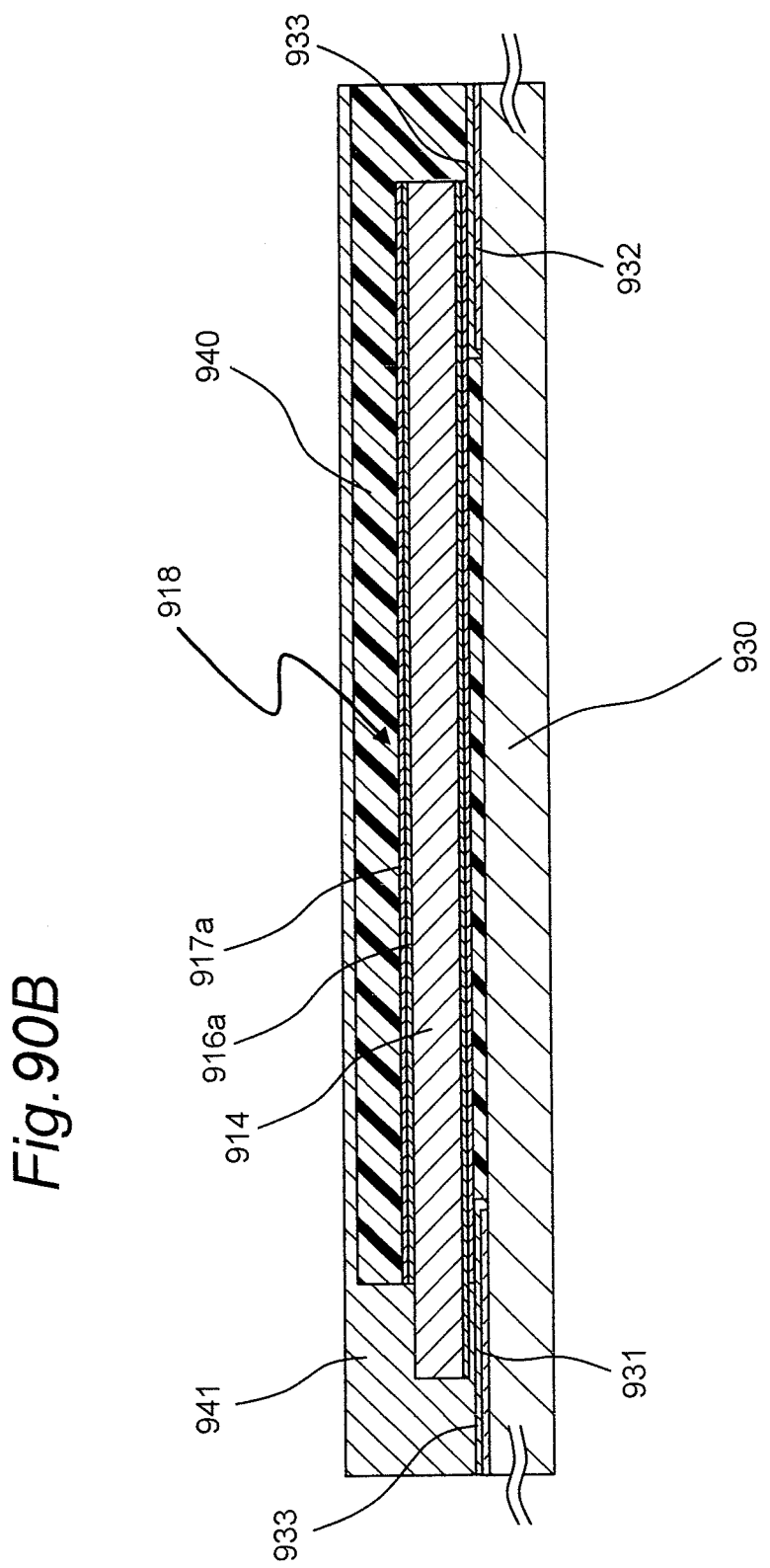
Figure 90C:
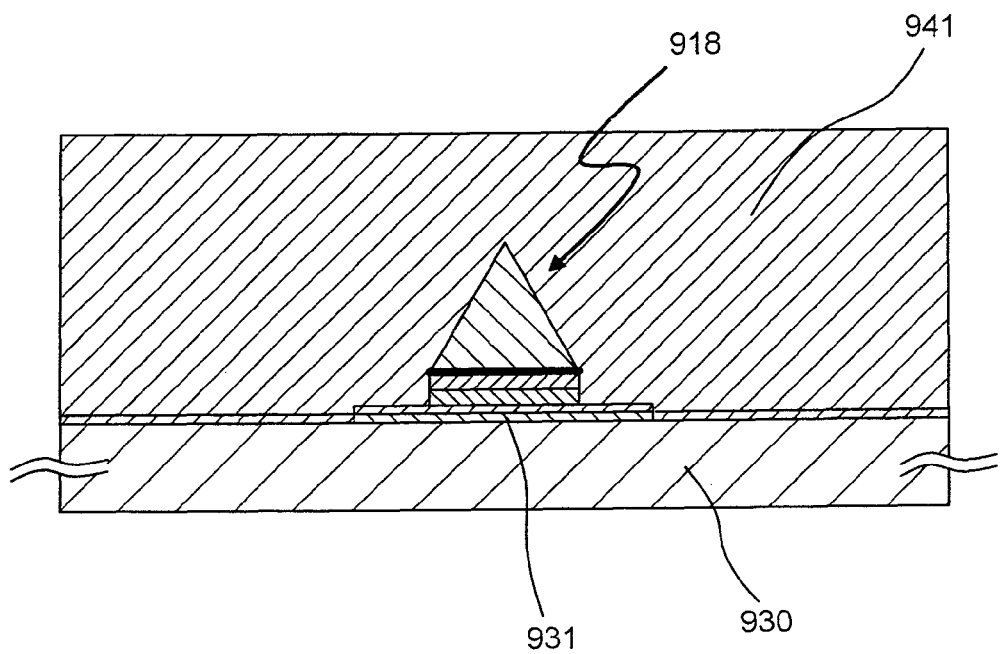
Figure 90D:
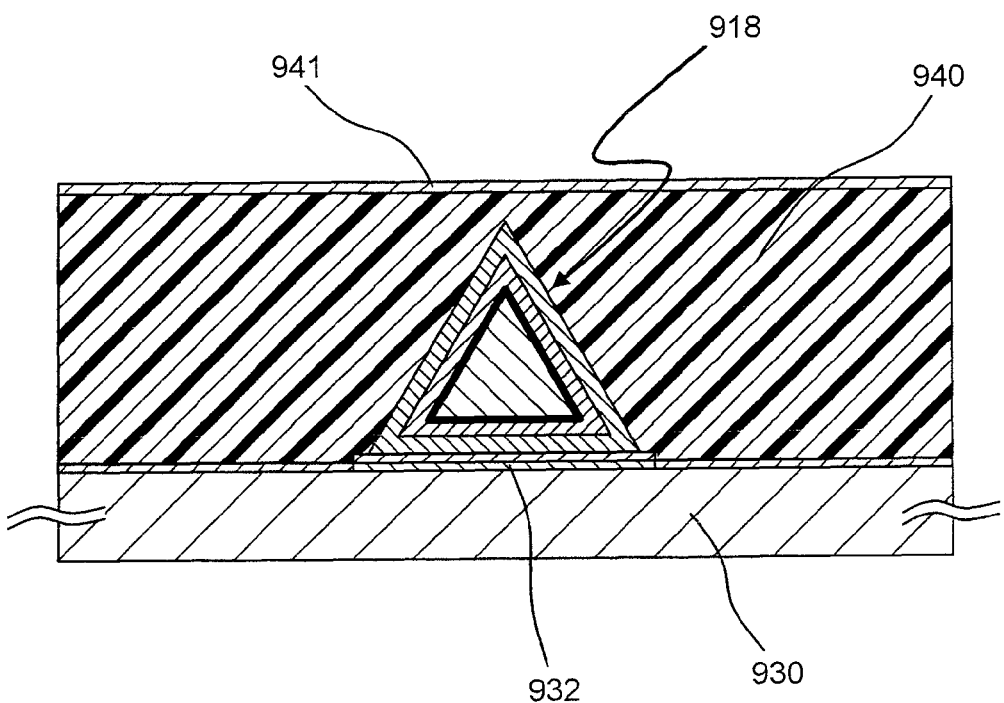
Figure 91C:
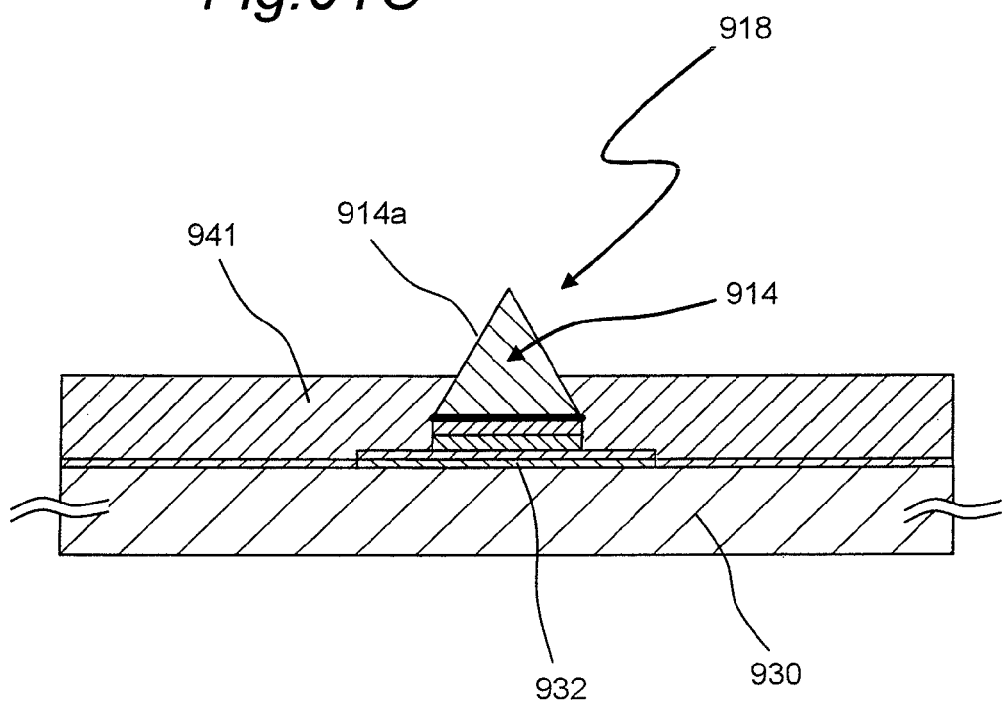
Figure 91D:
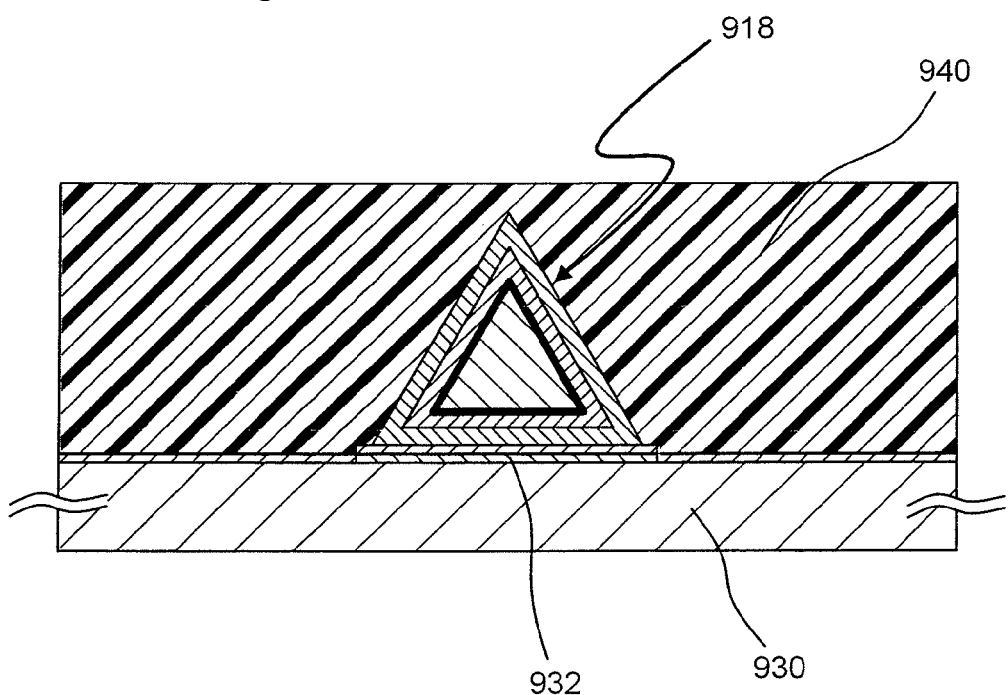
Figure 92A:
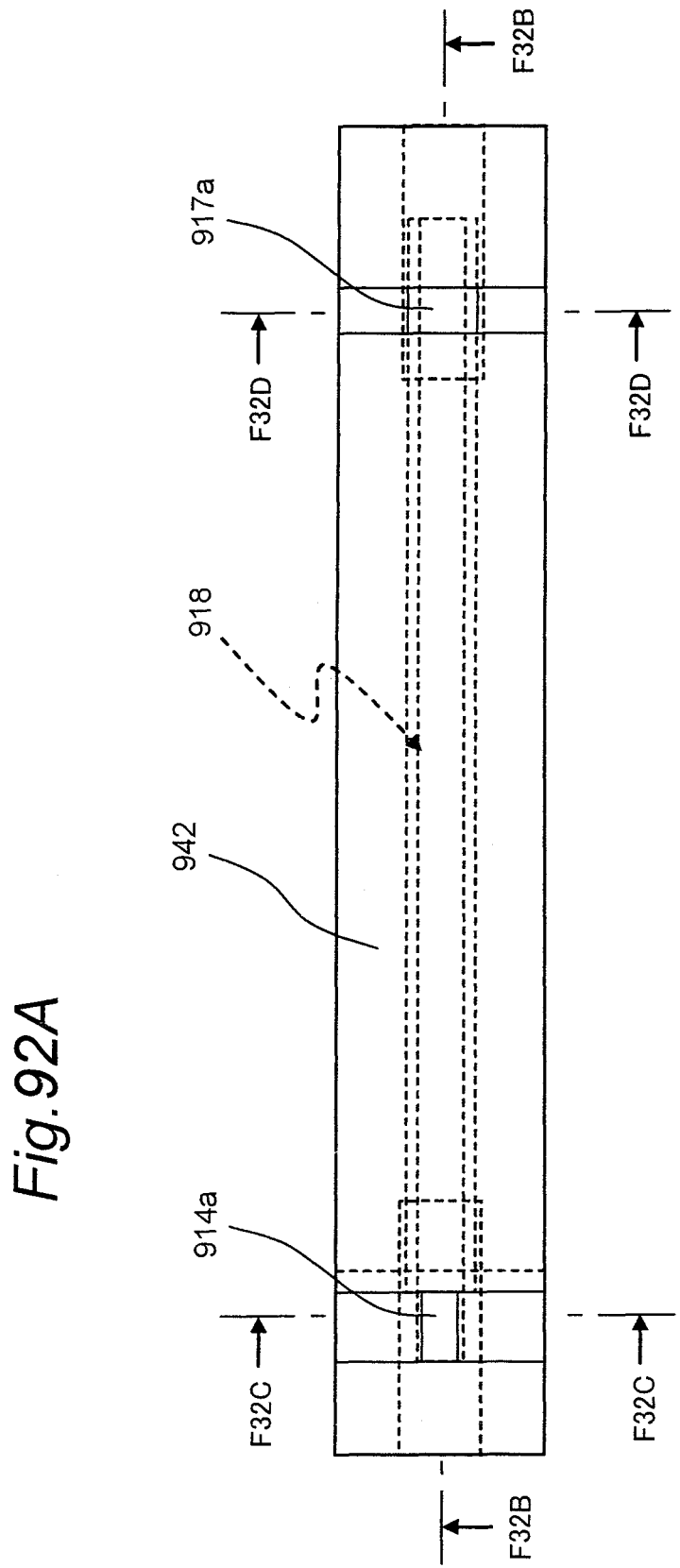
Figure 92C:
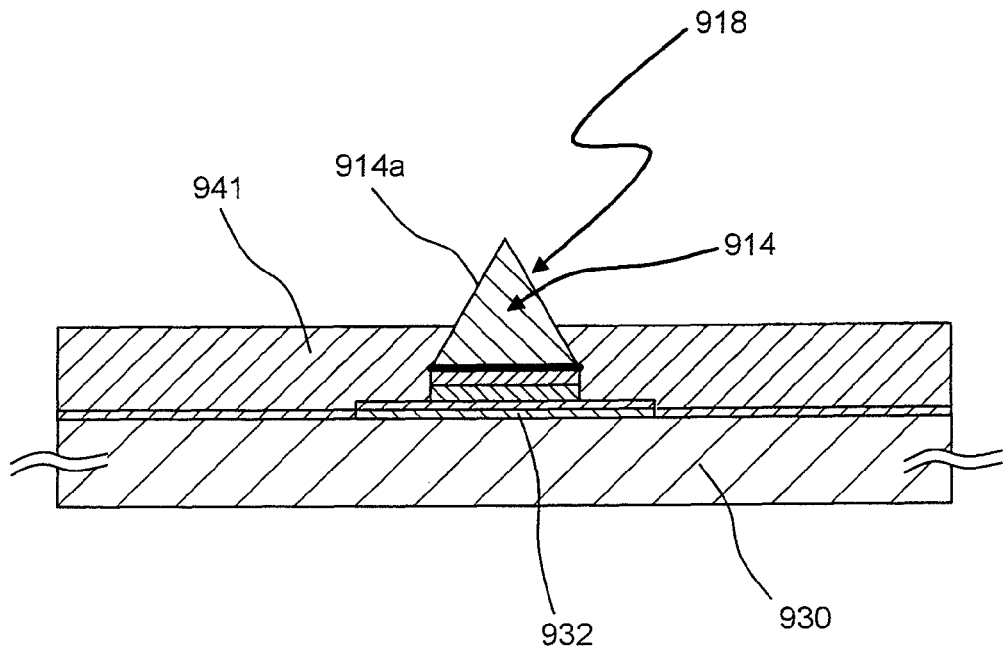
Figure 92D:
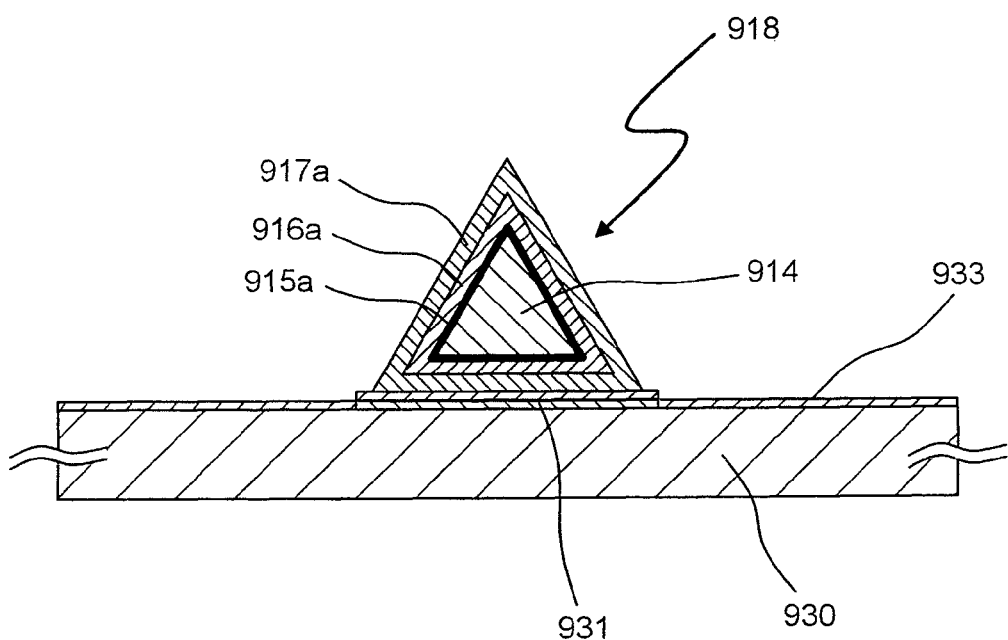
Figure 93A:
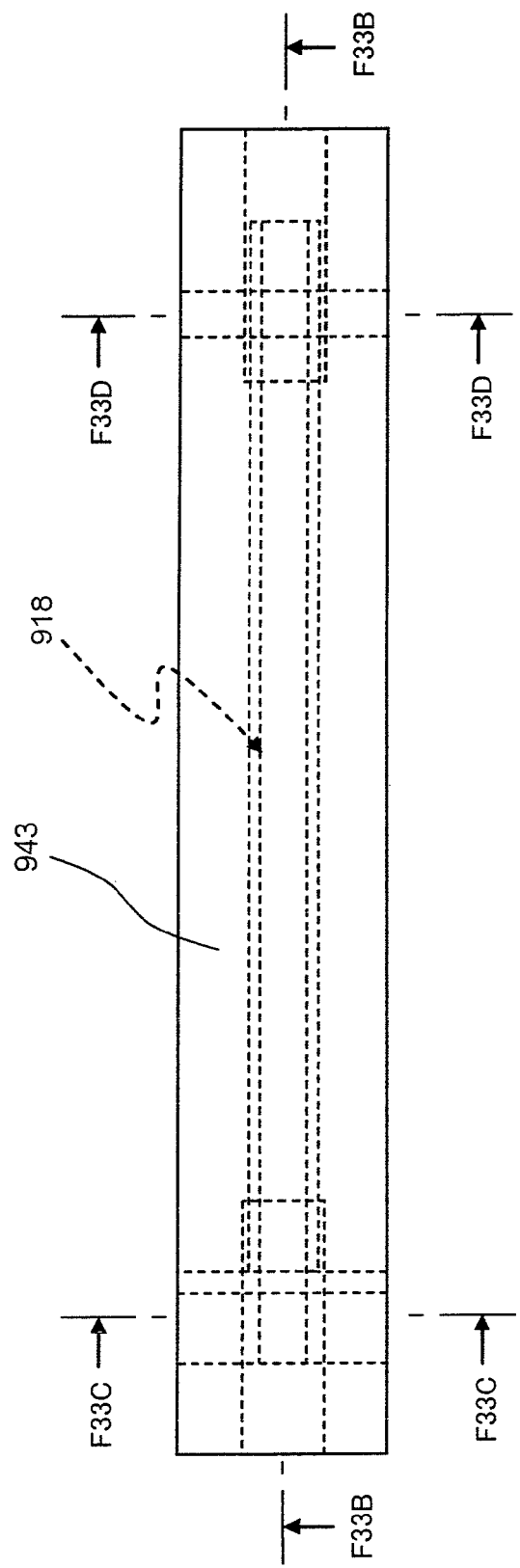
Figure 93B:
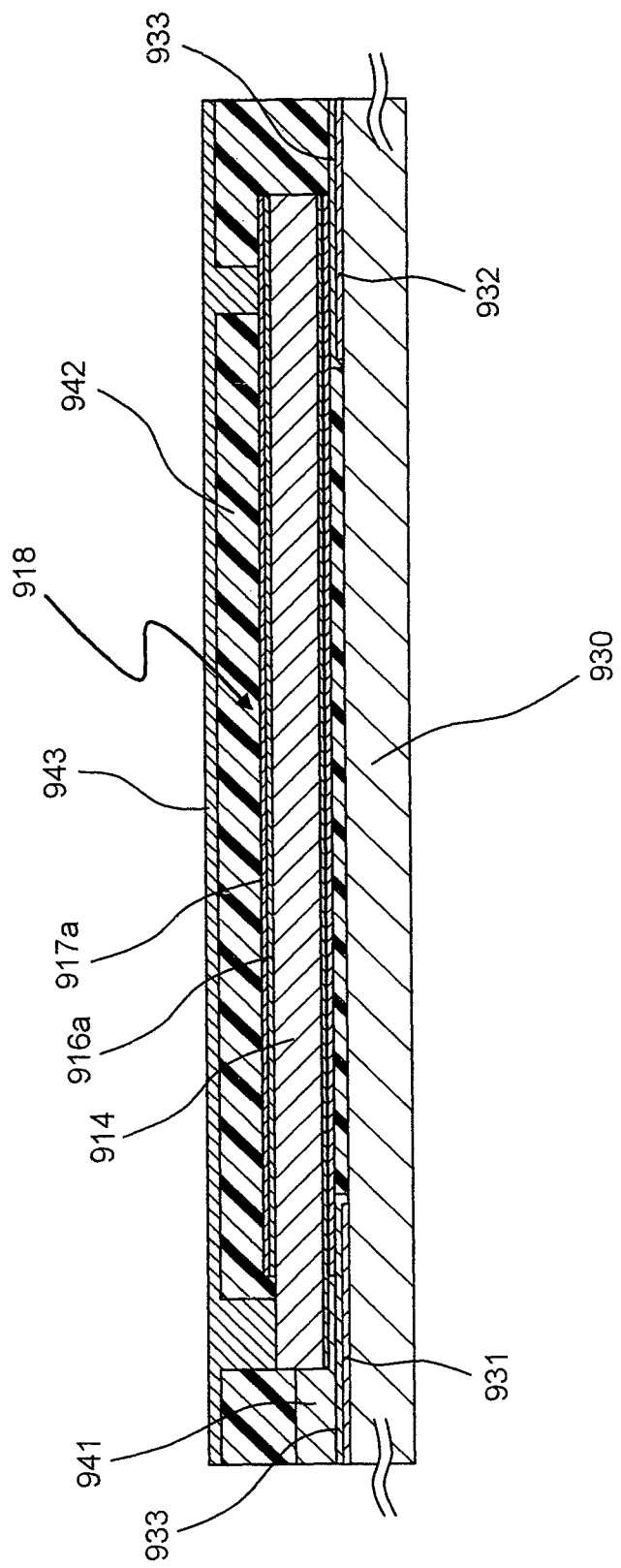
Figure 93C:
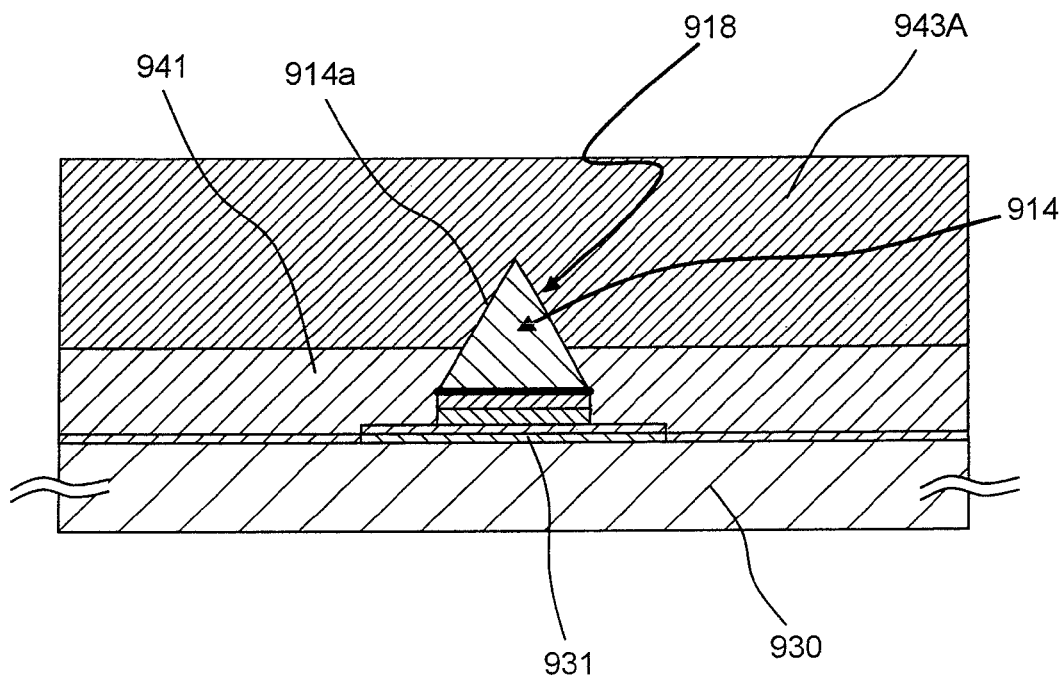
Figure 93D:
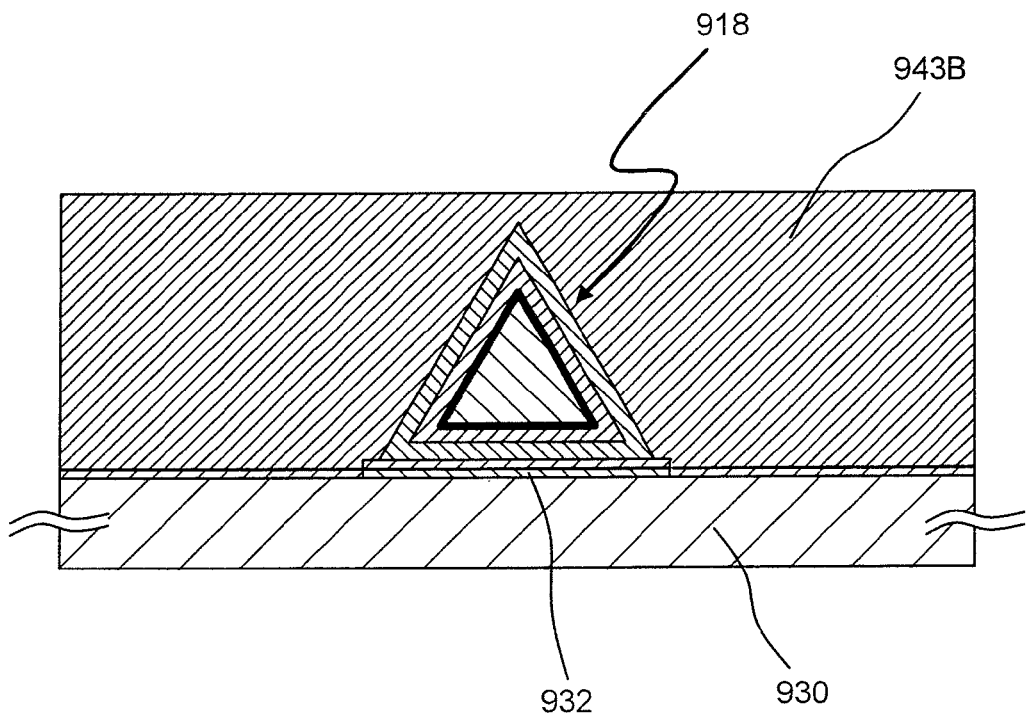
Figure 94B:
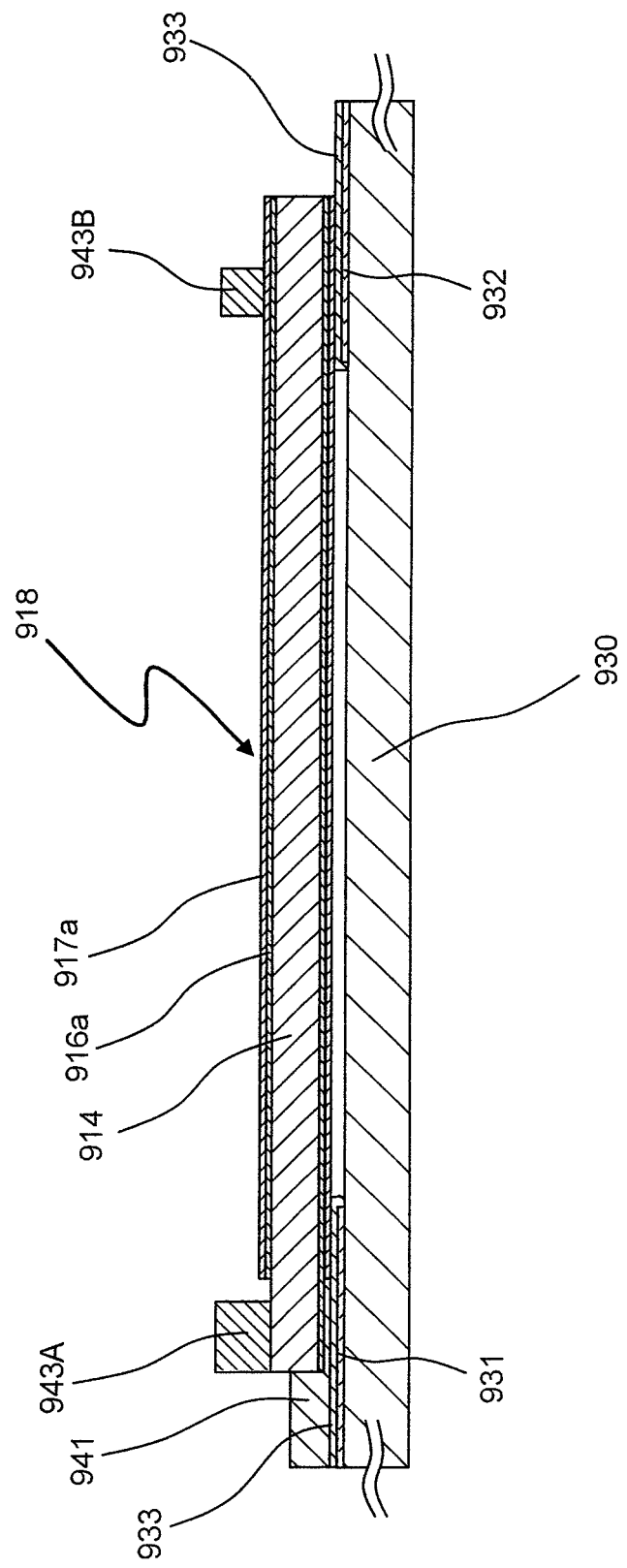
Figure 94C:
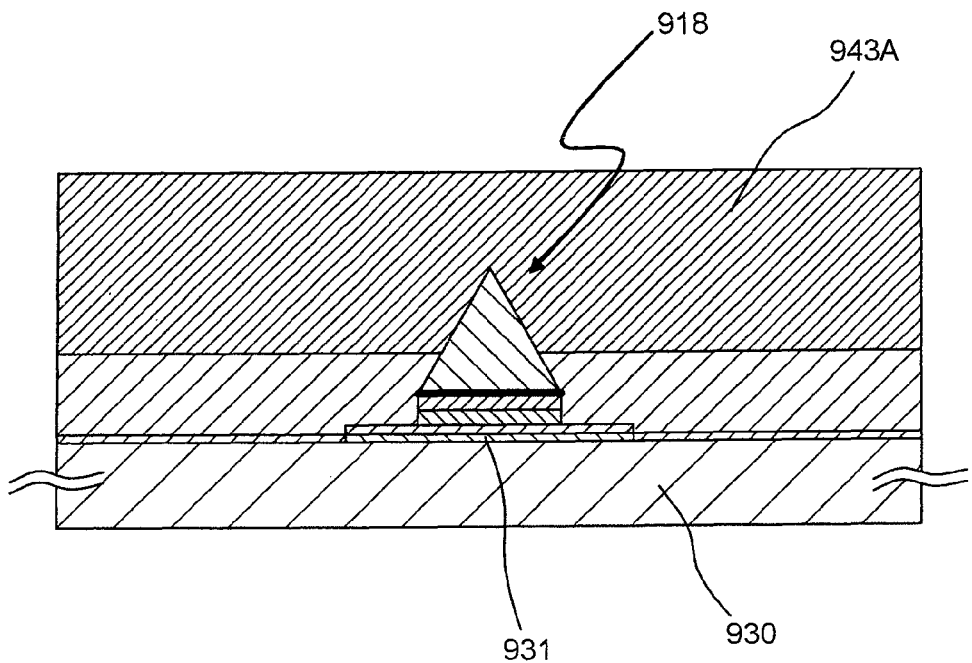
Figure 94D:
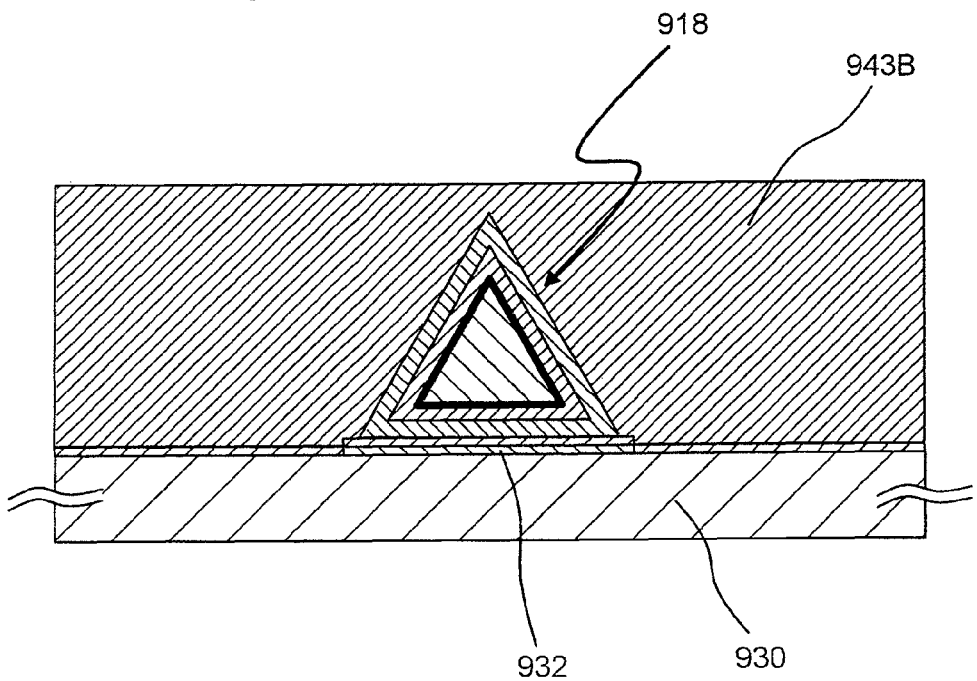
Figure 95:
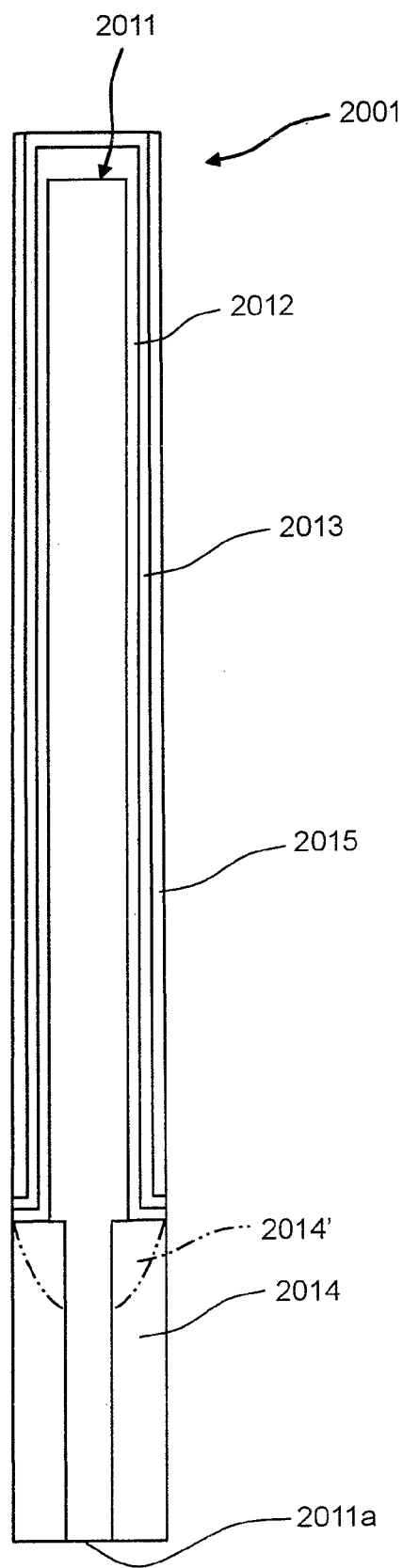
Figure 96A:
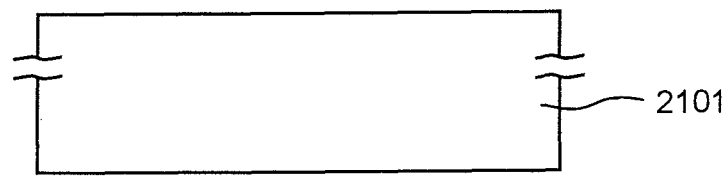
Figure 96B:
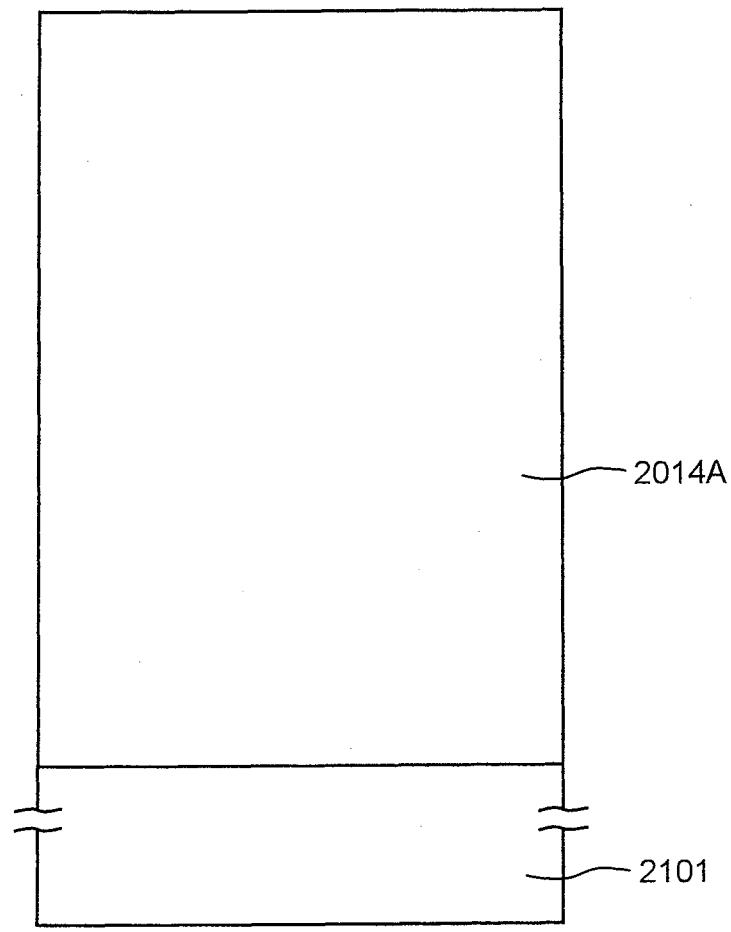
Figure 96C:
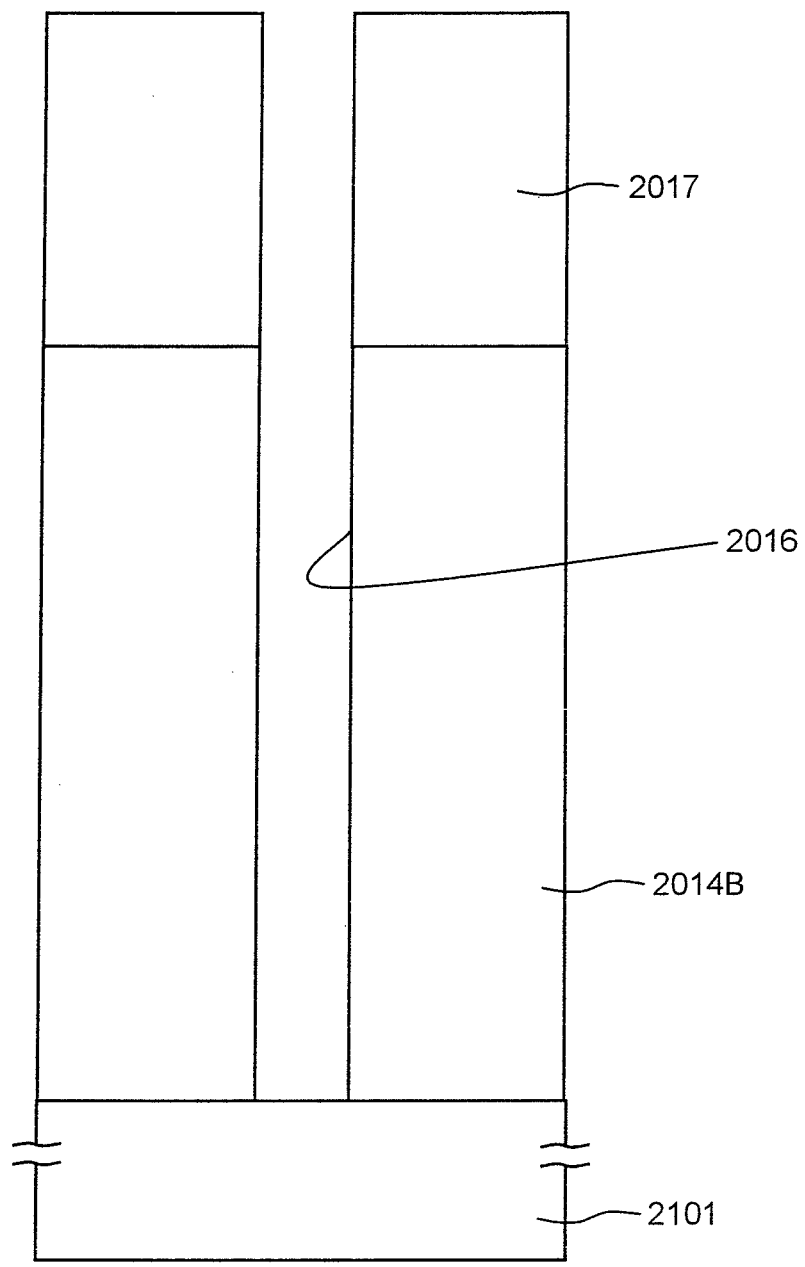
Figure 96D:
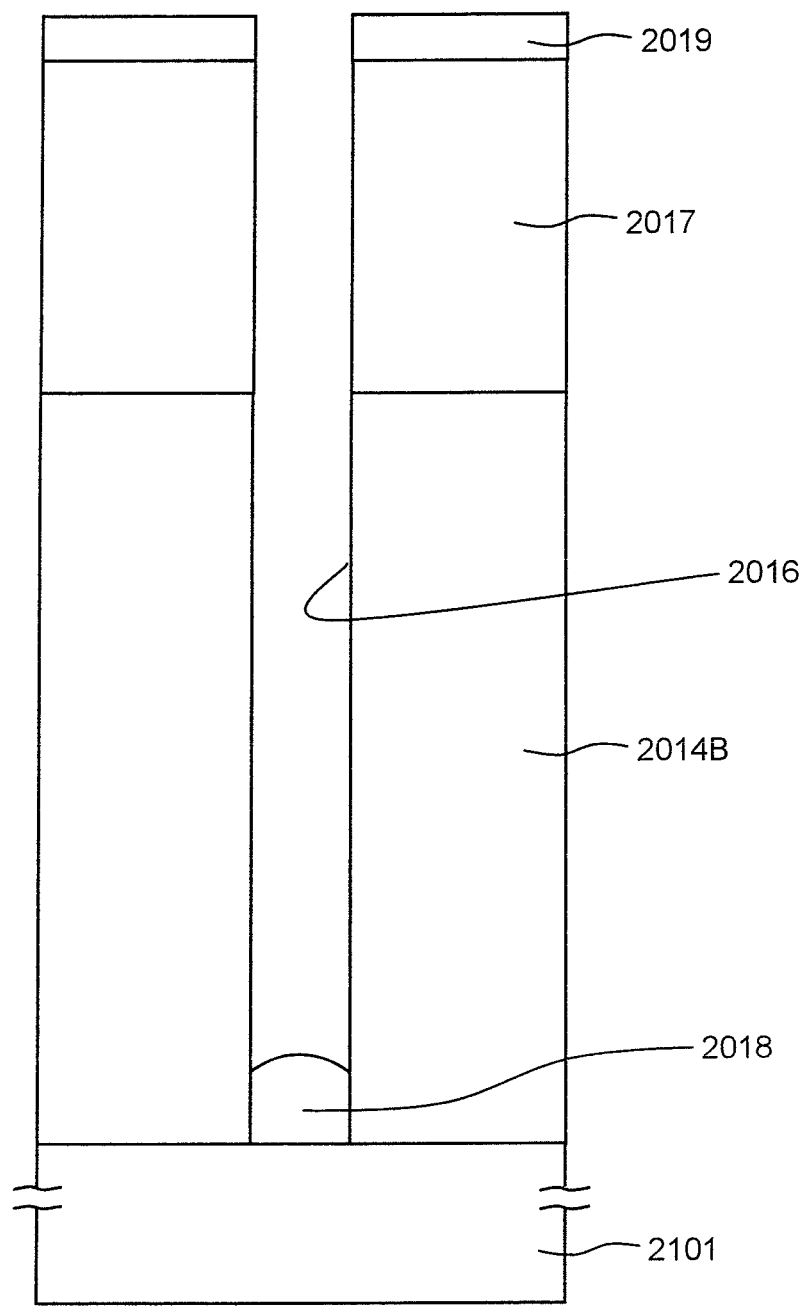
Figure 96E:
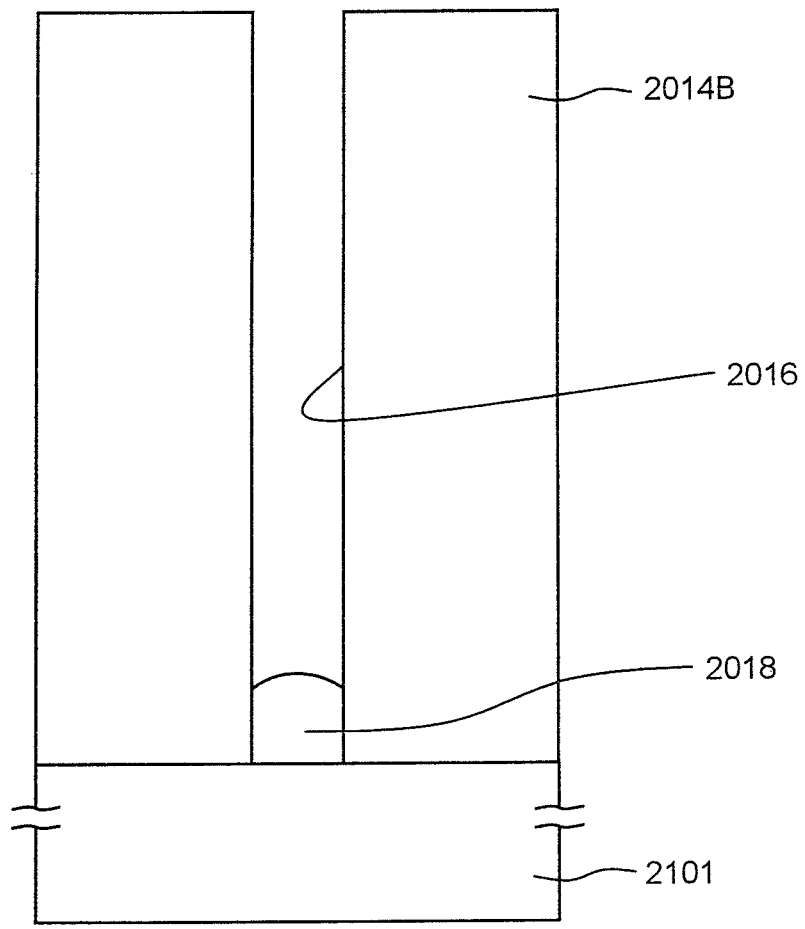
Figure 96F:
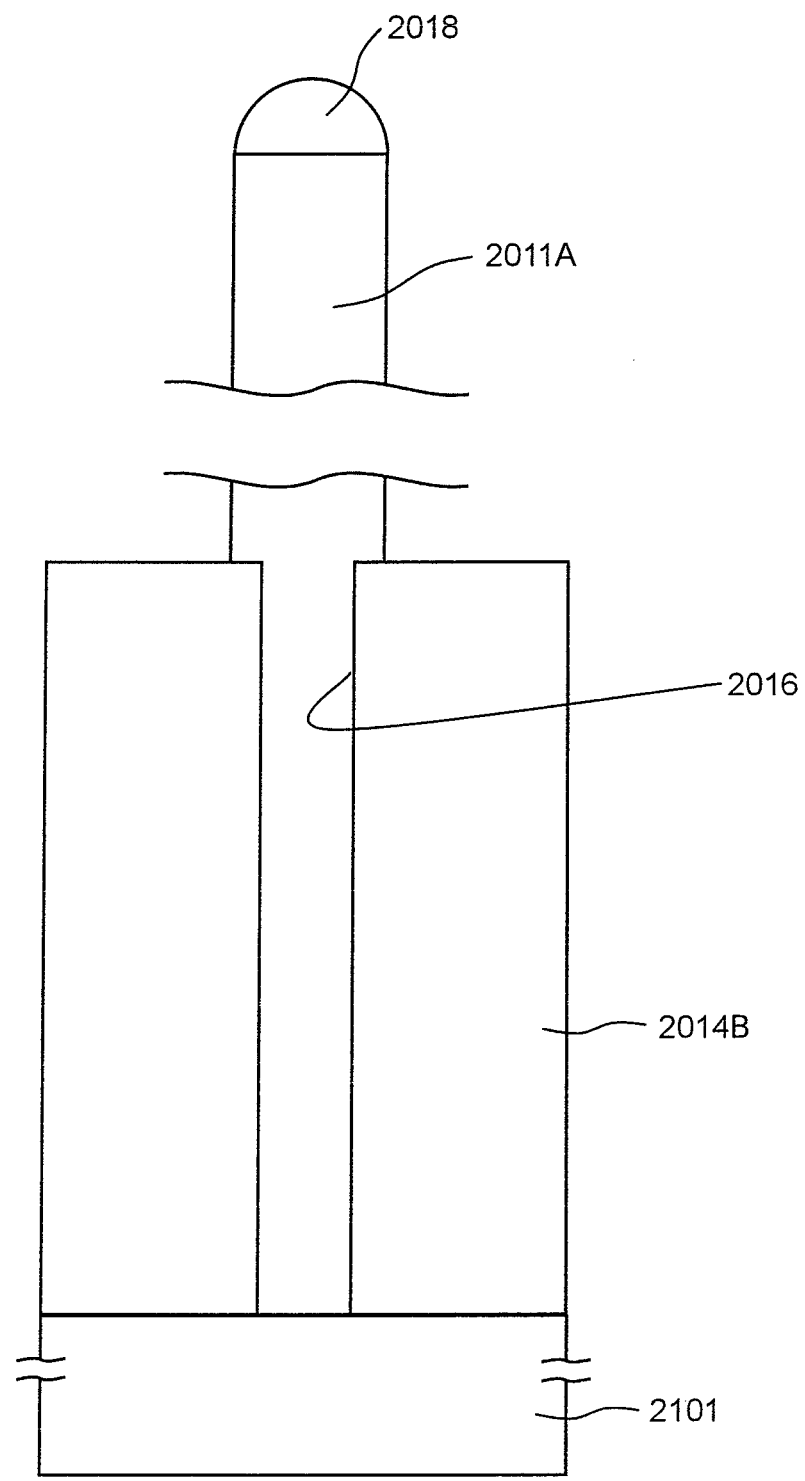
Figure 96G:
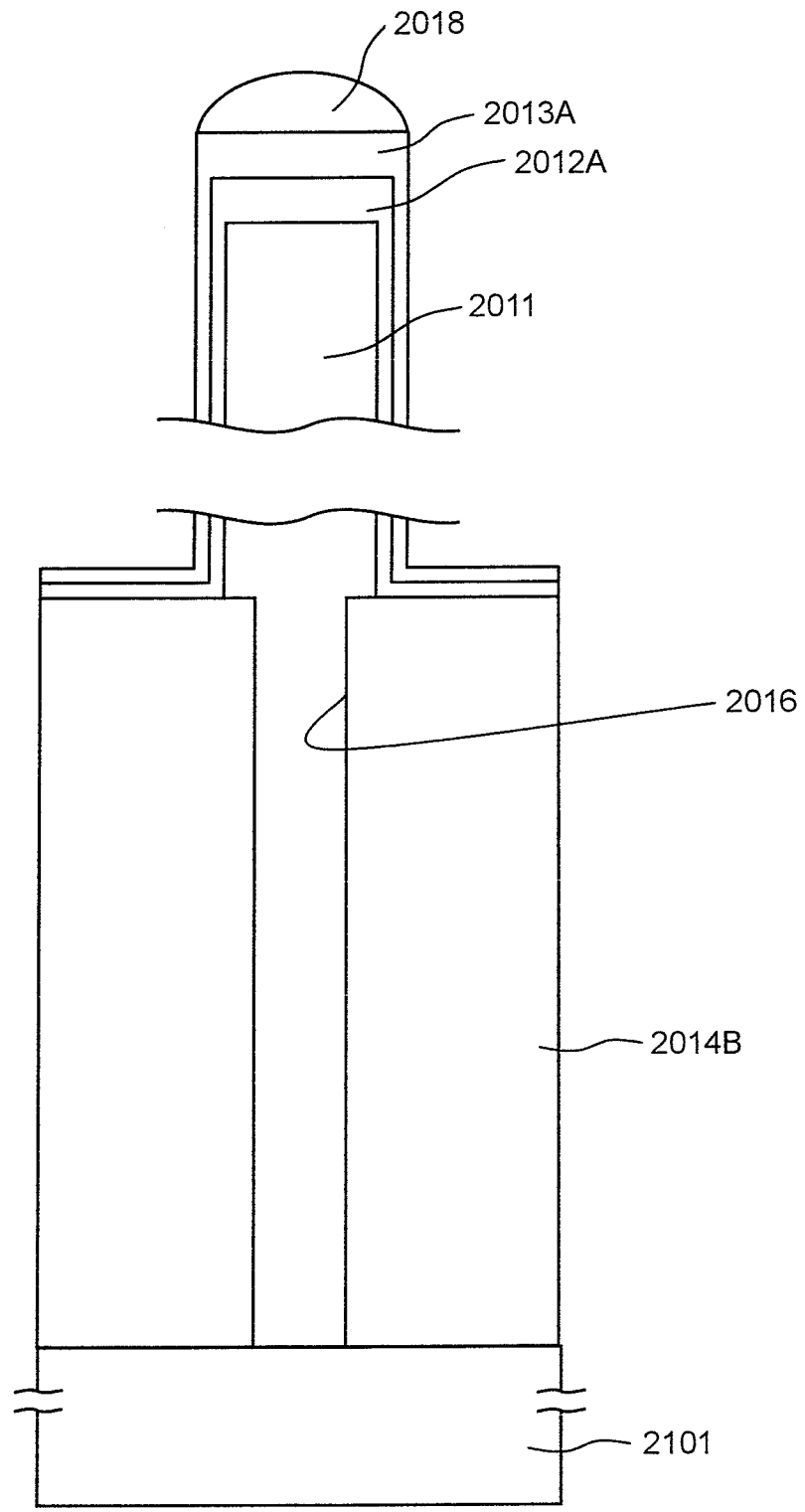
Figure 96H:
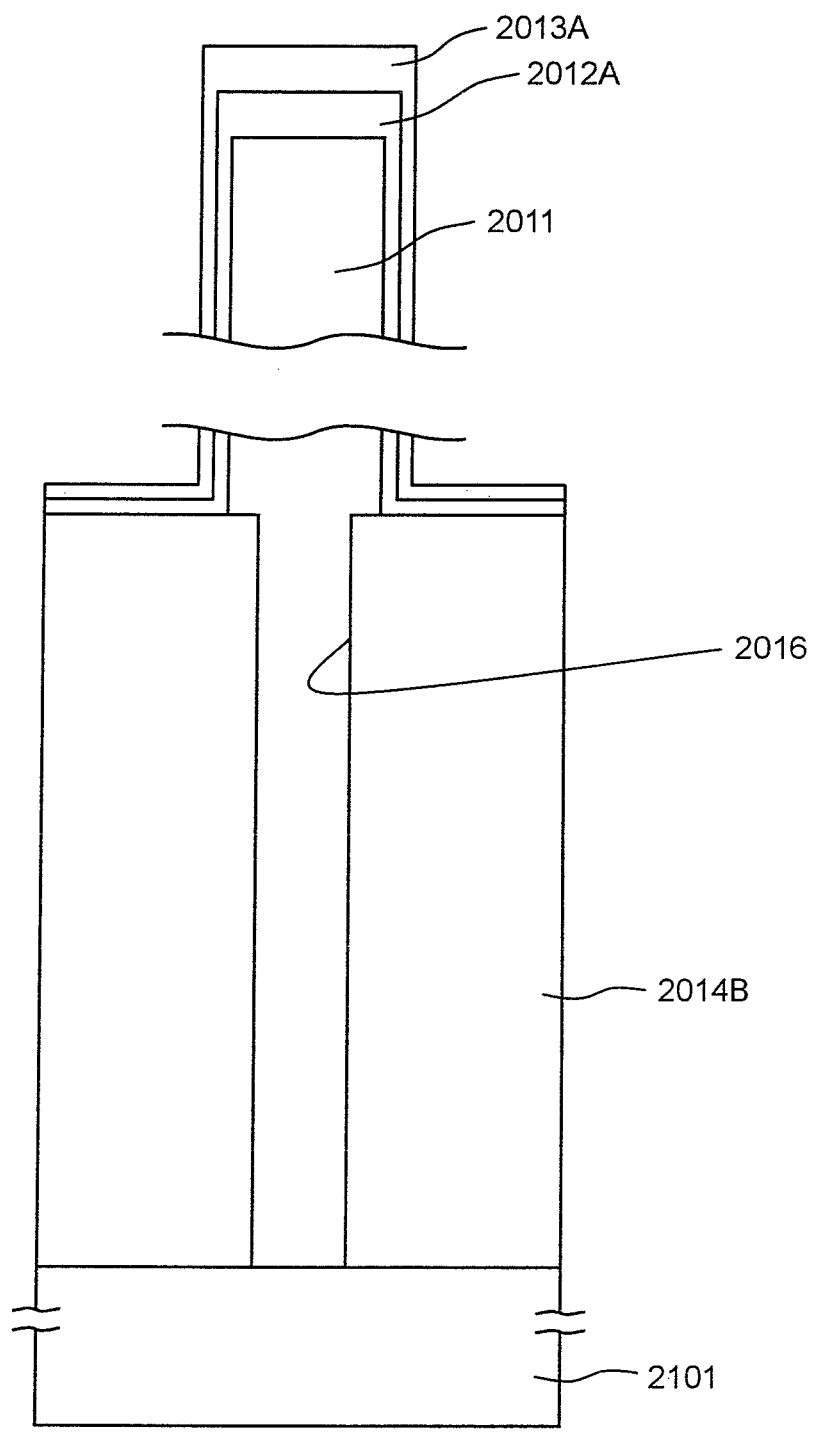
Figure 96I:
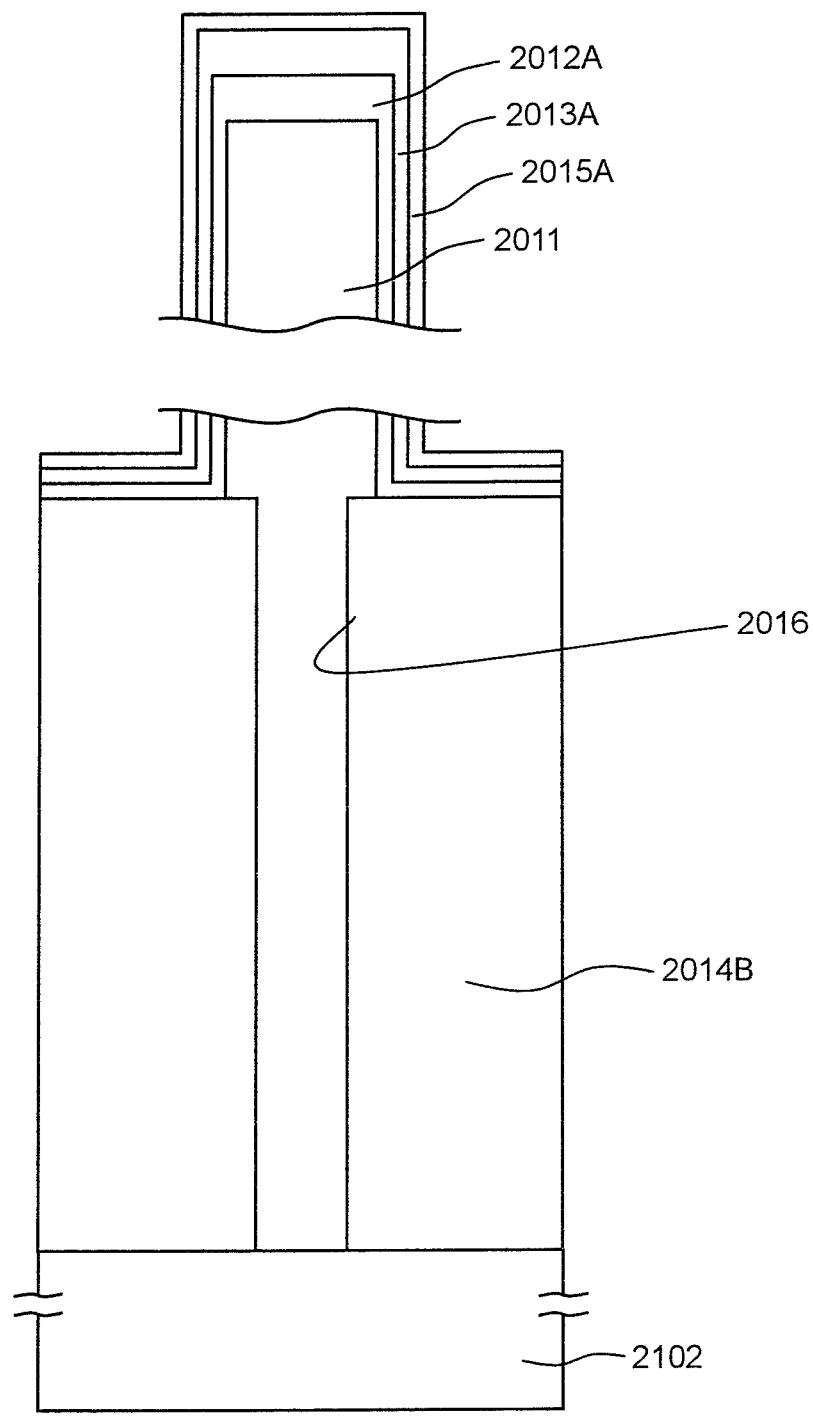
Figure 96J:
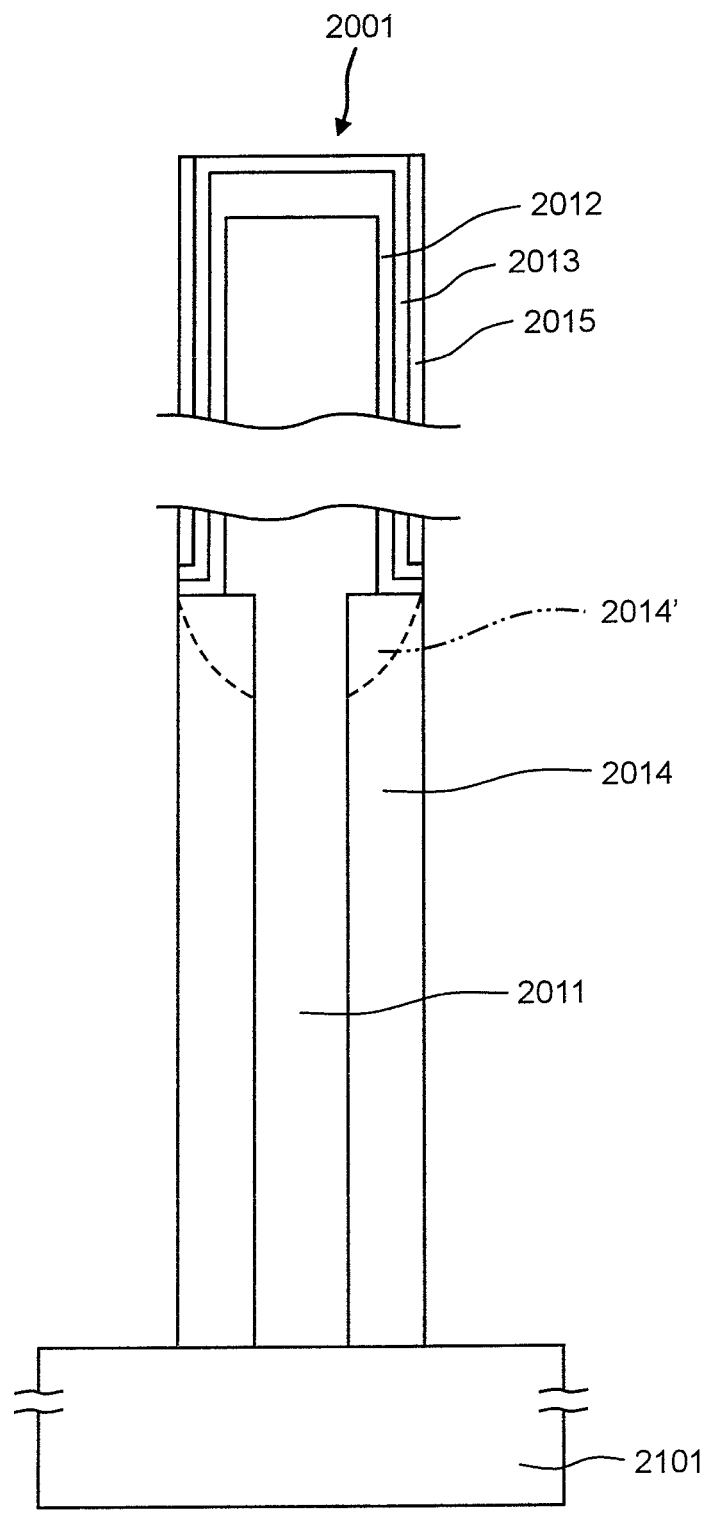
Figure 96K:
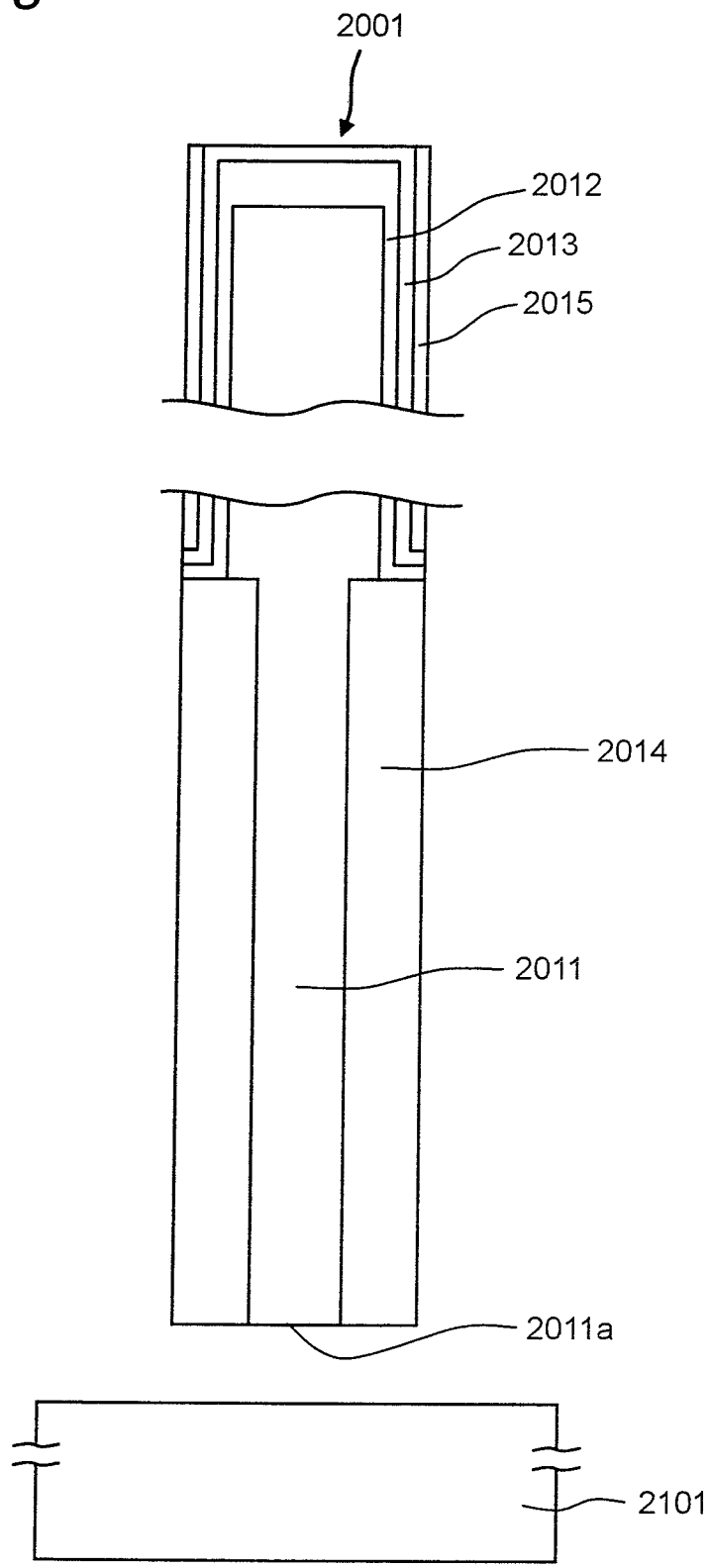
Figure 97:
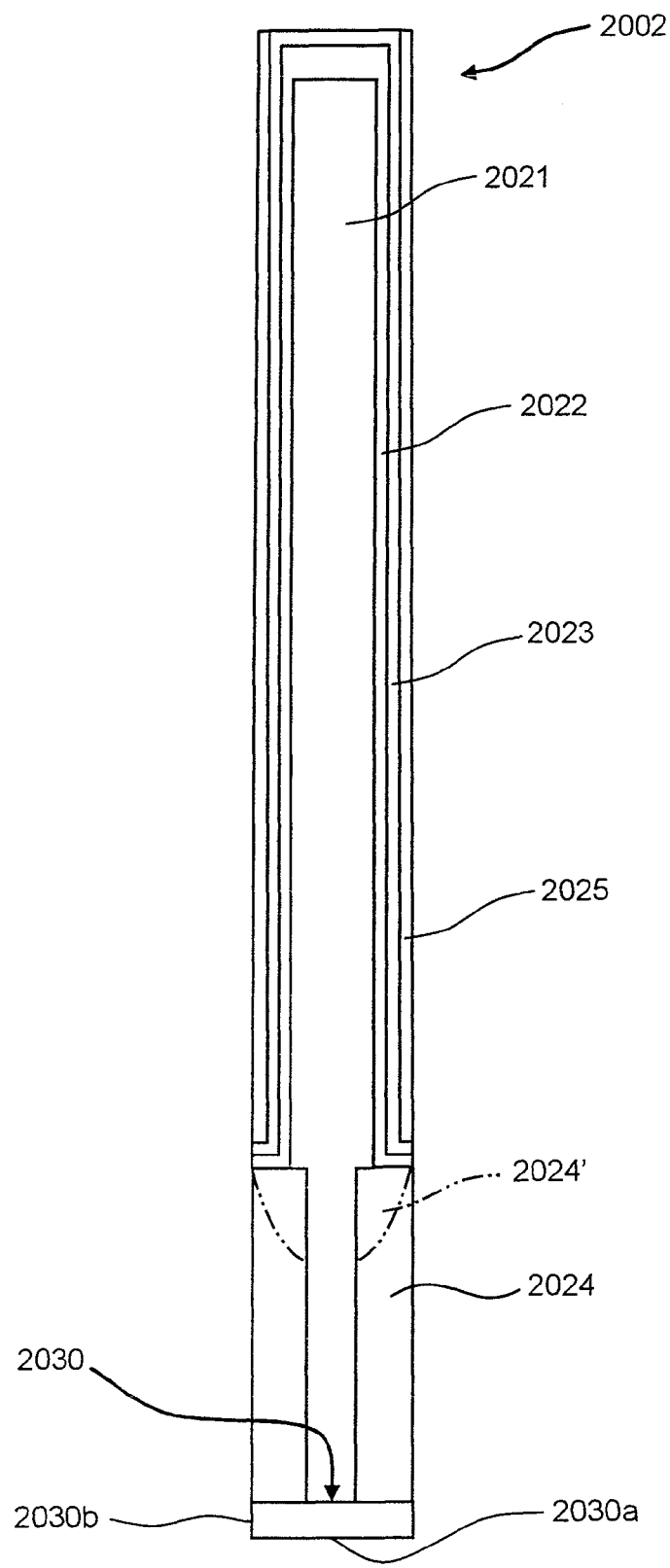
Figure 98A:
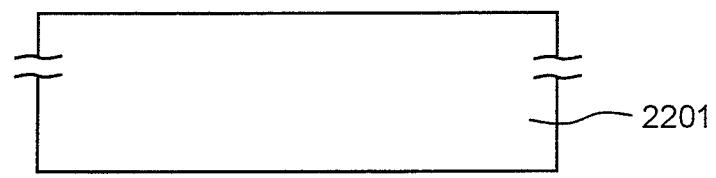
Figure 98B:
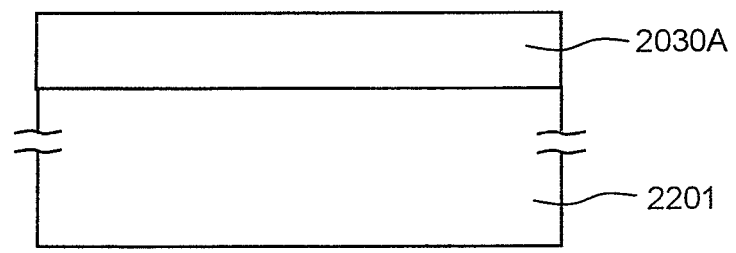
Figure 98C:
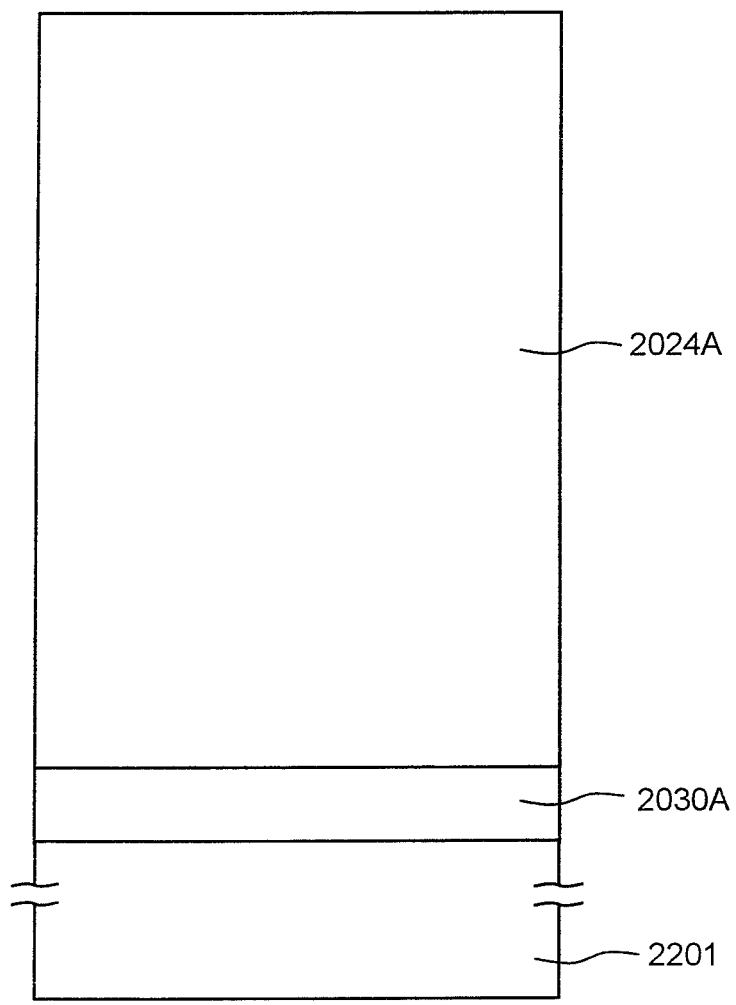
Figure 98D:
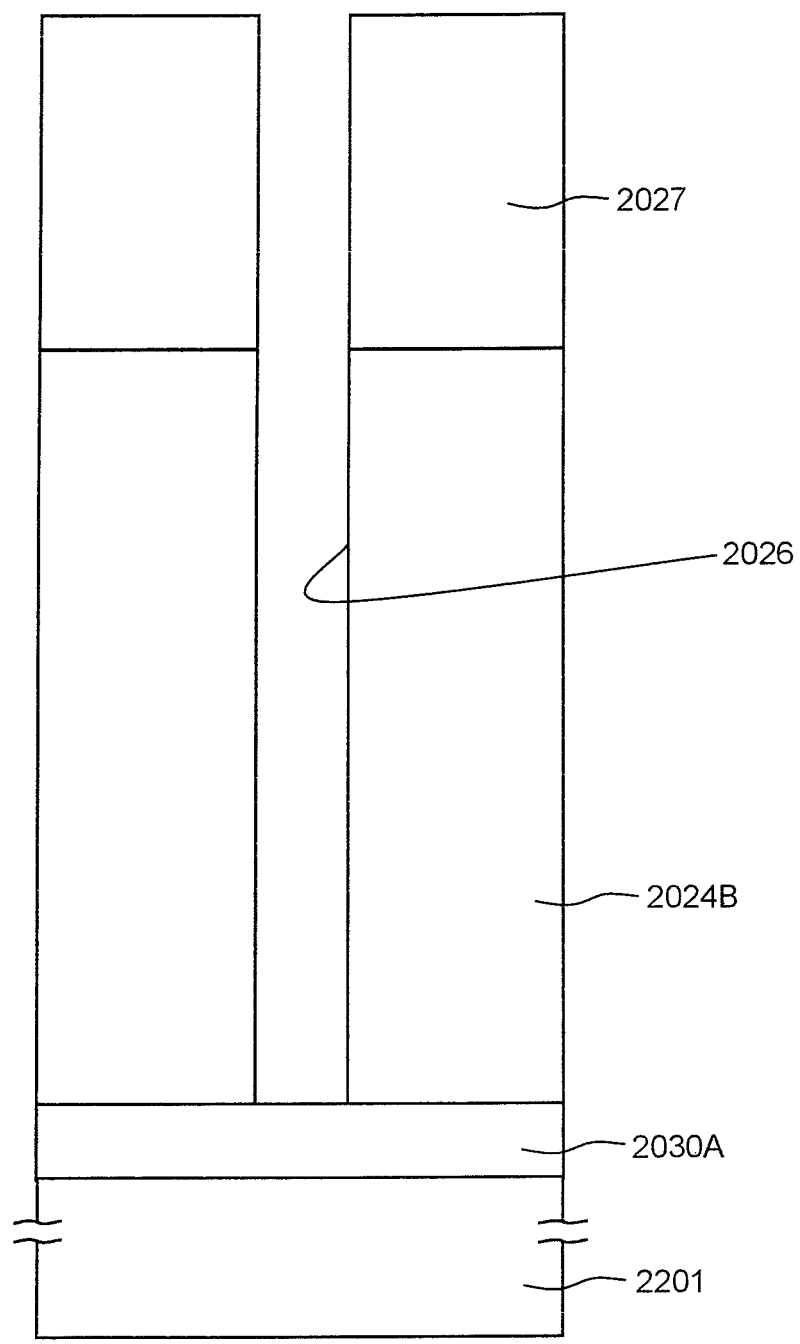
Figure 98E:
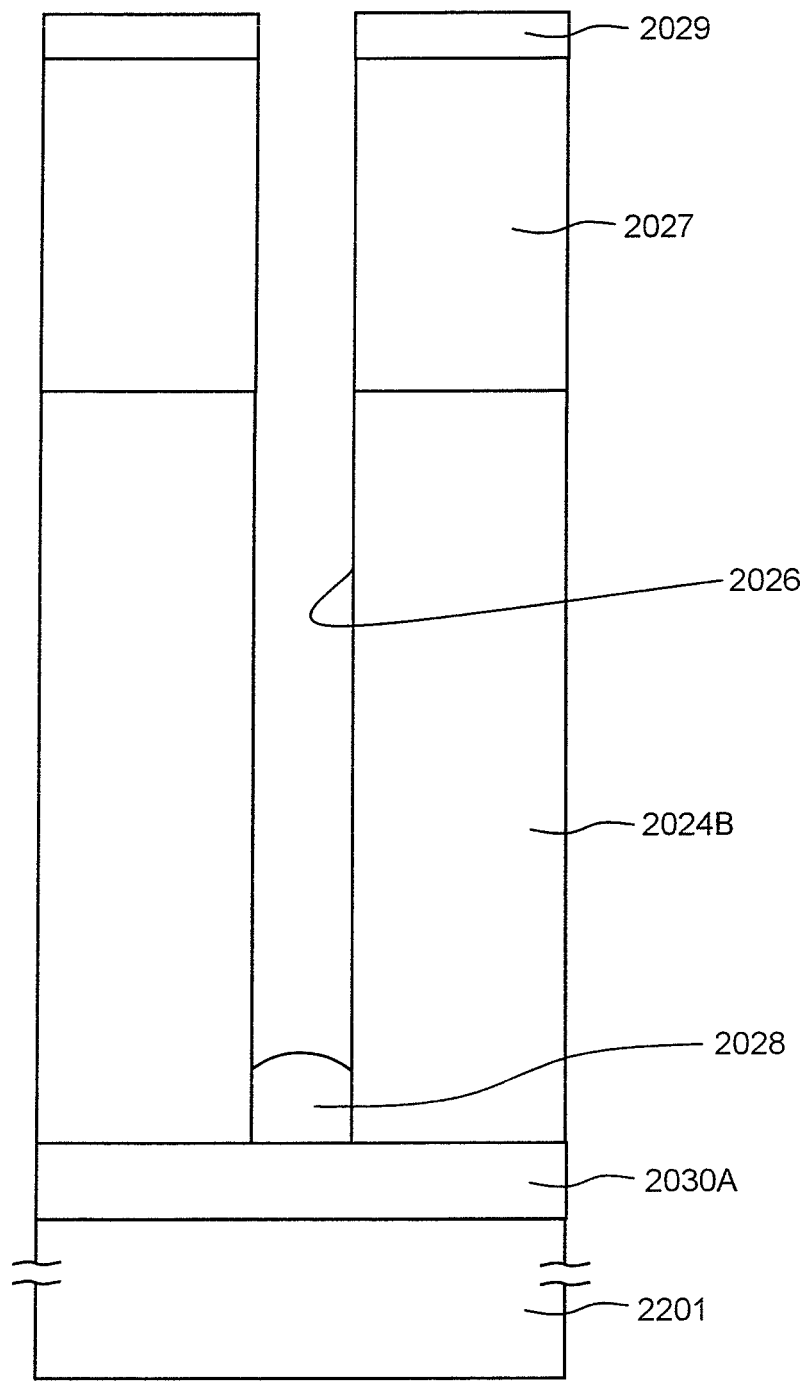
Figure 98F:
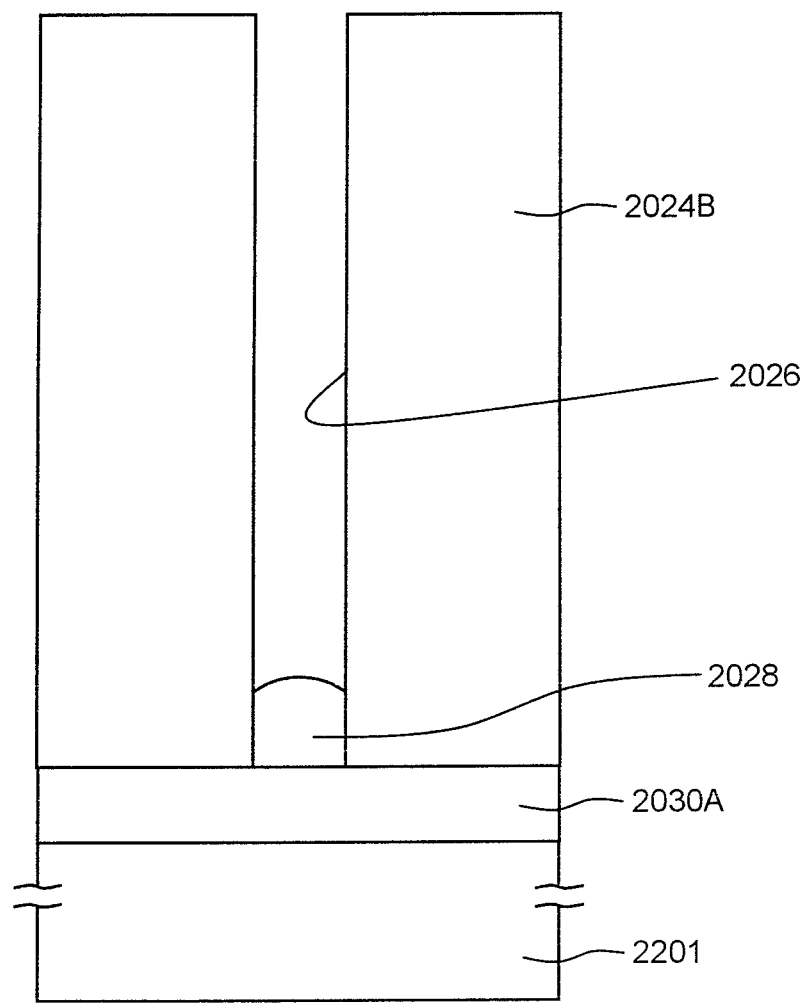
Figure 98G:
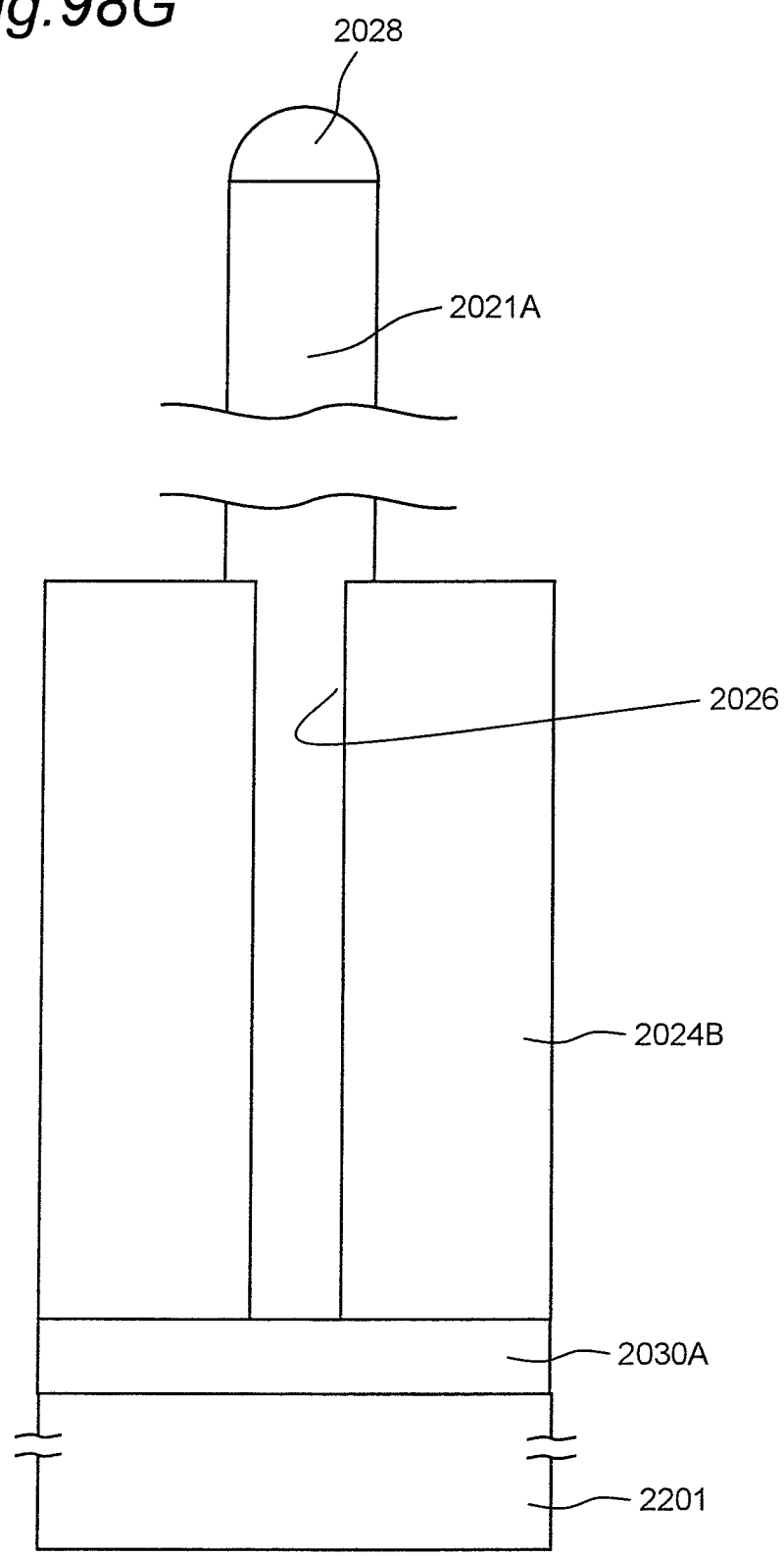
Figure 98H:
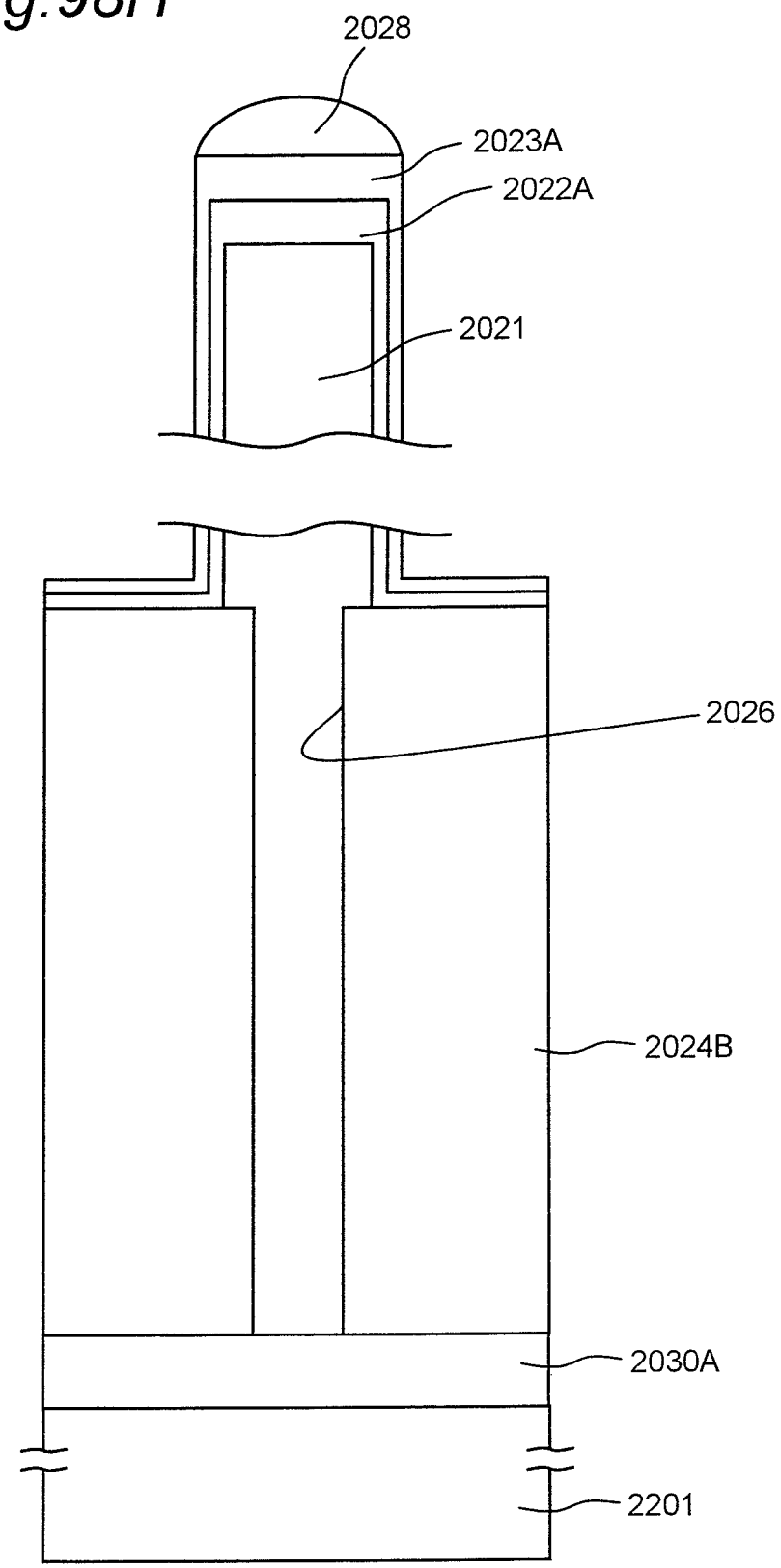
Figure 98I:
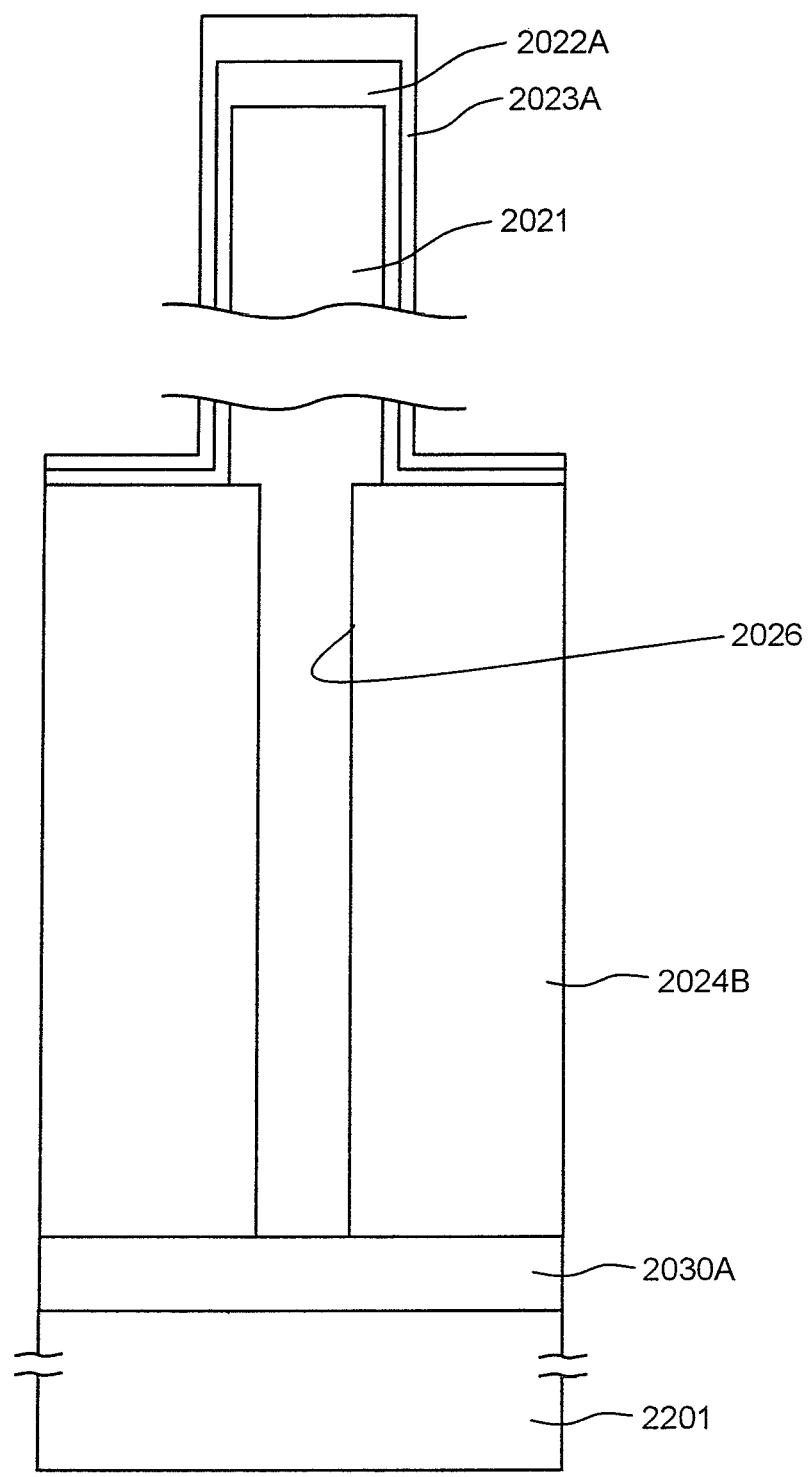
Figure 98J:
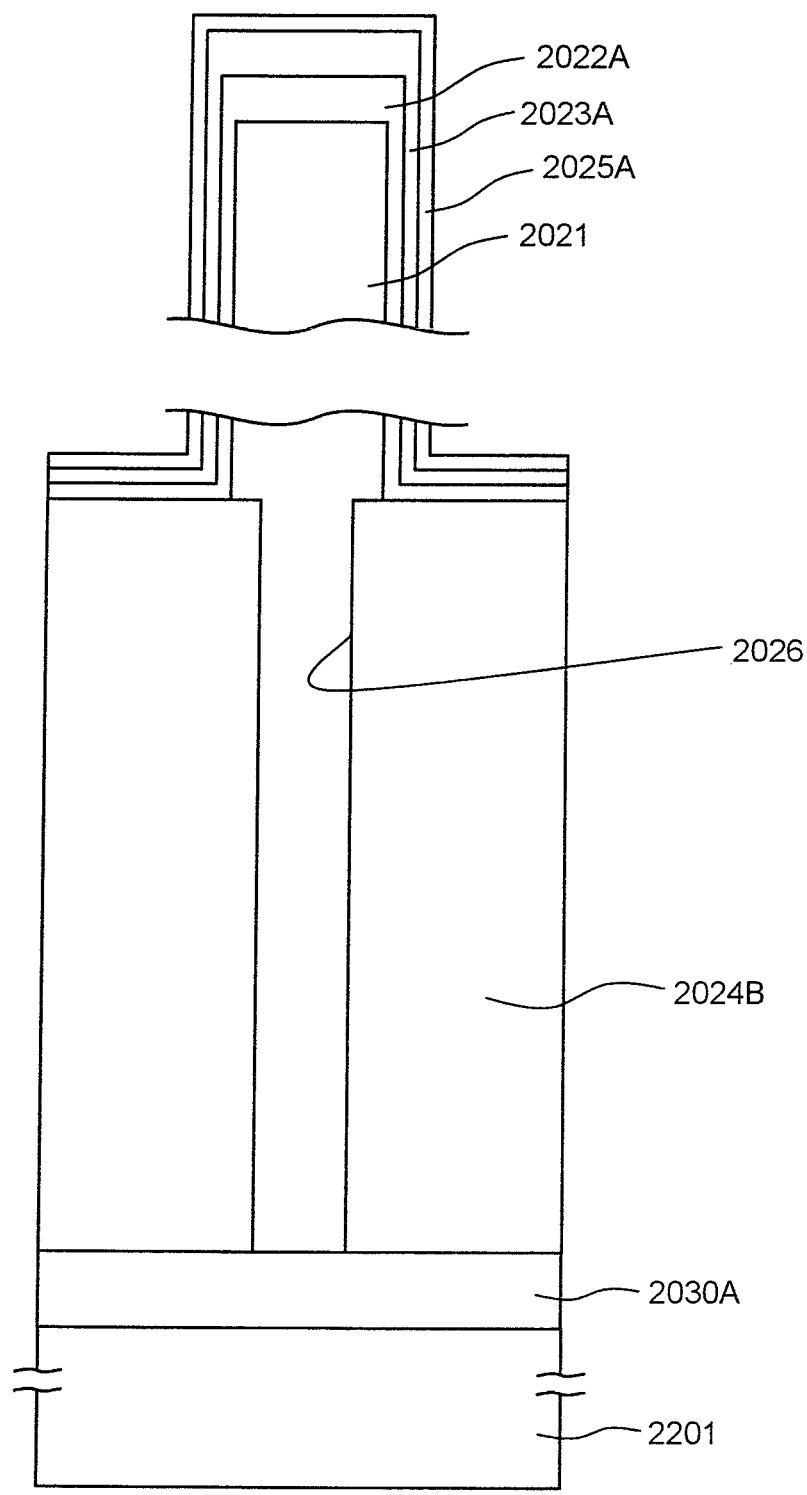
Figure 98K:
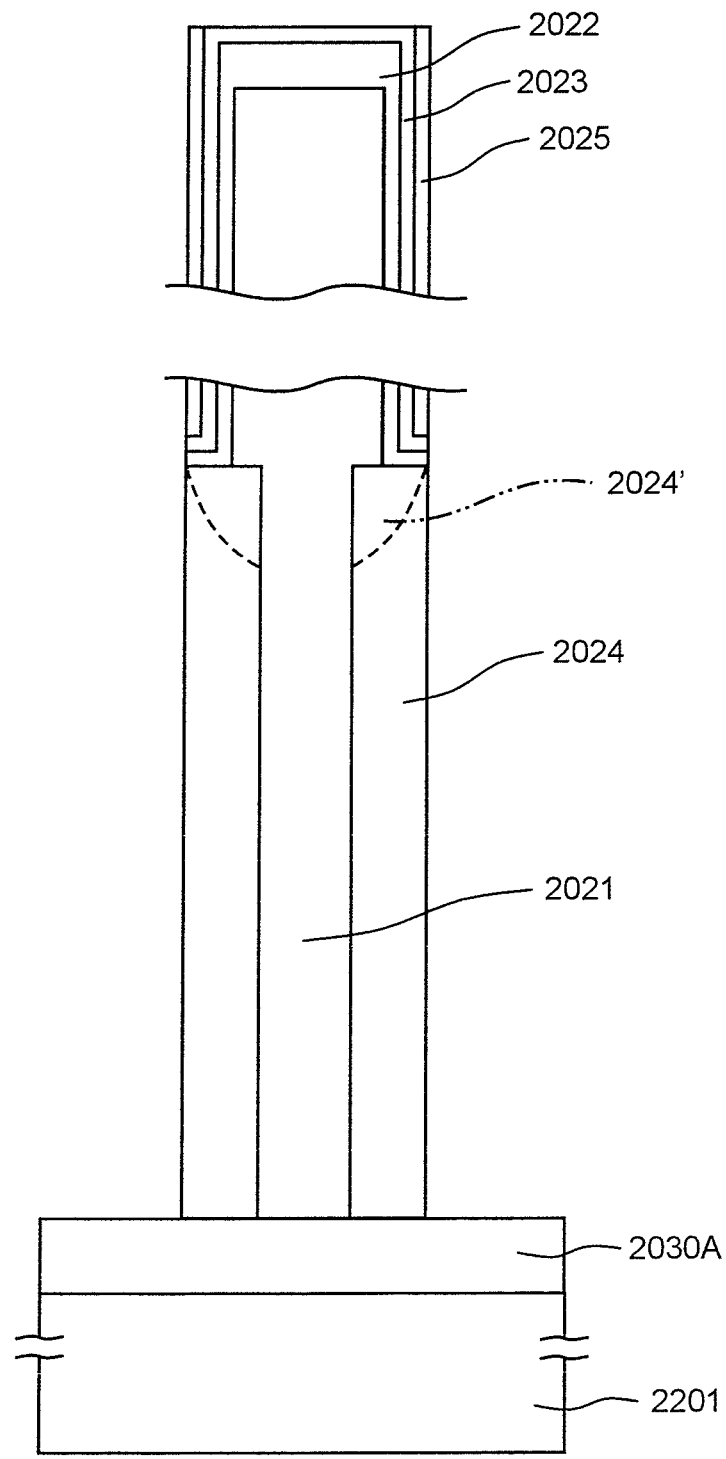
Figure 98L:
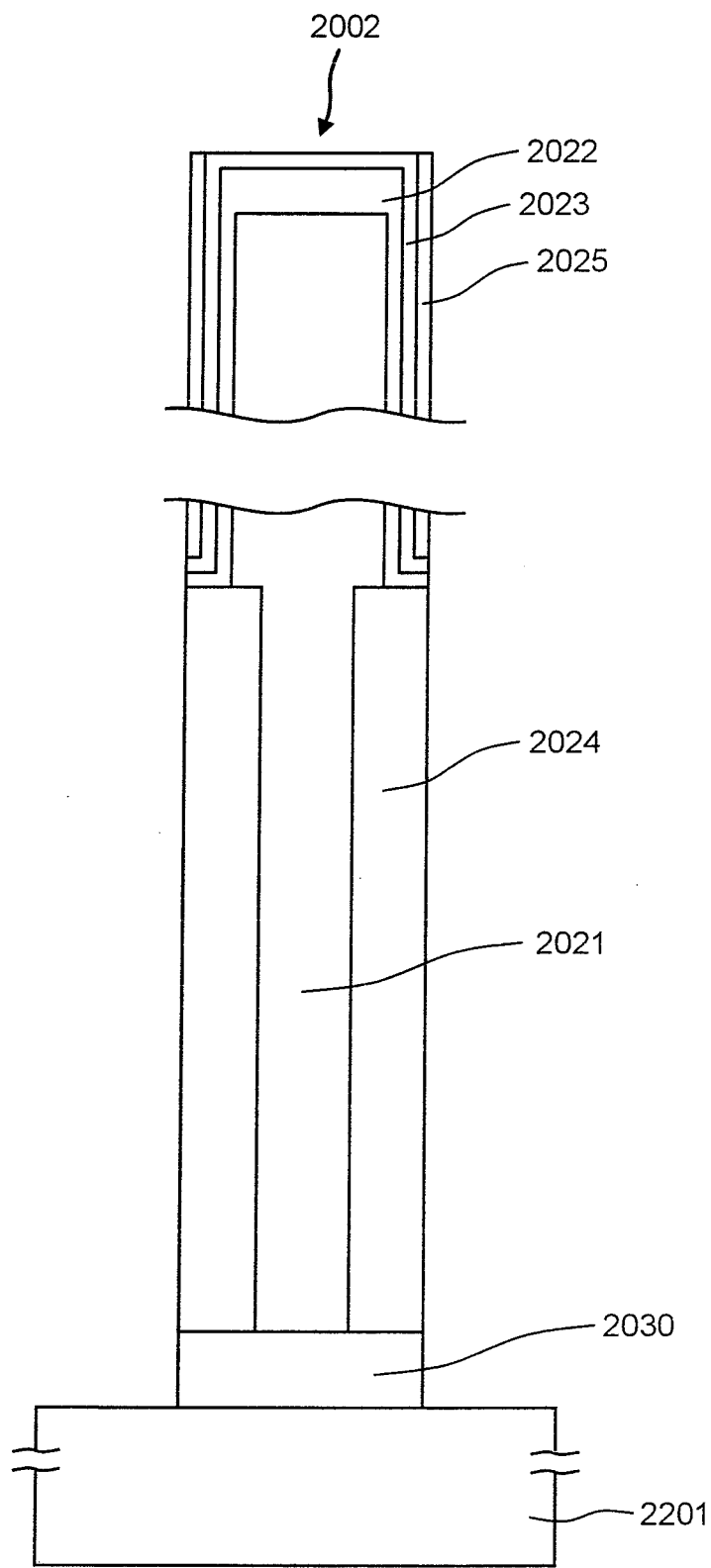
Figure 98M:
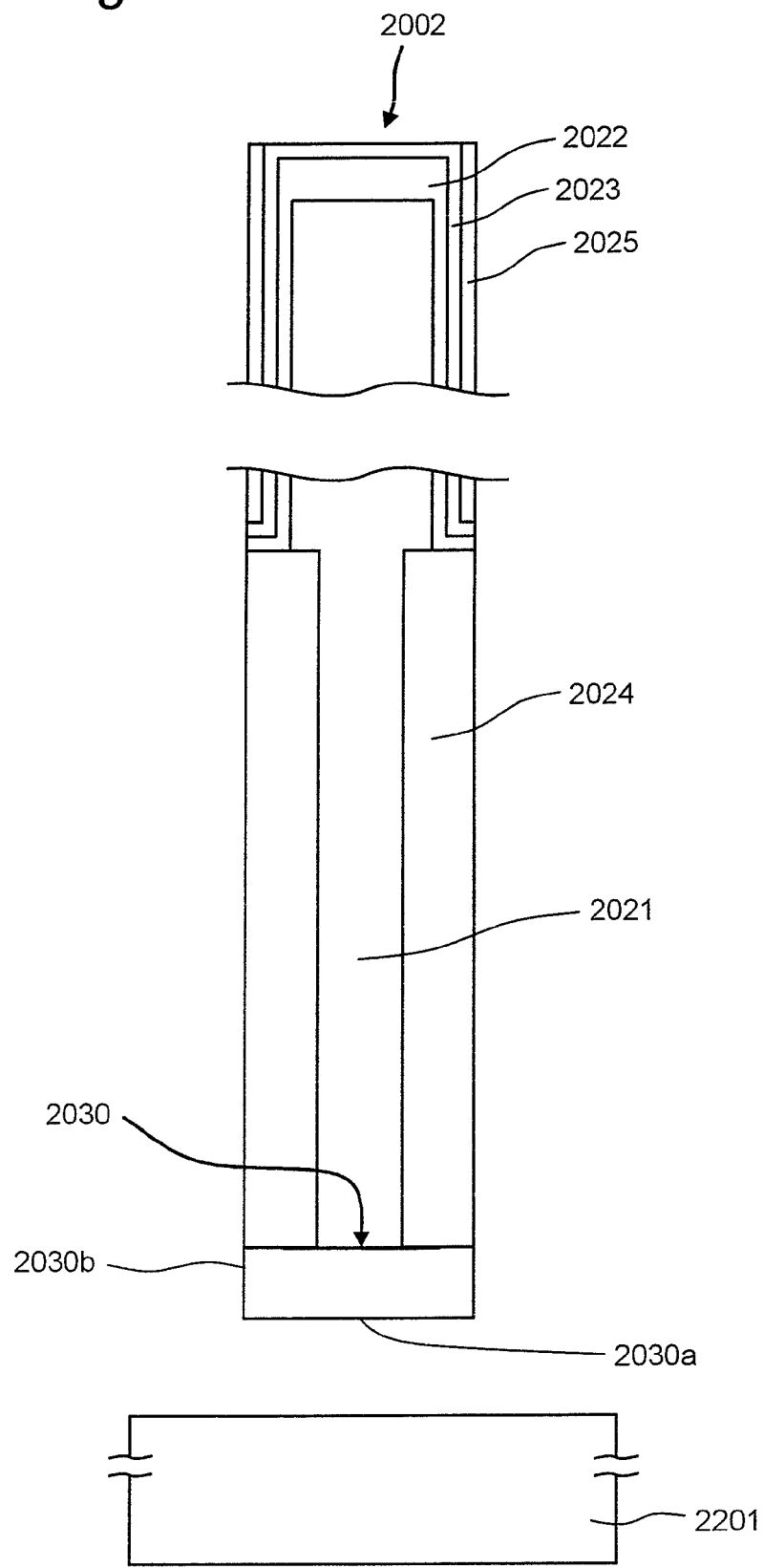
Figure 99:
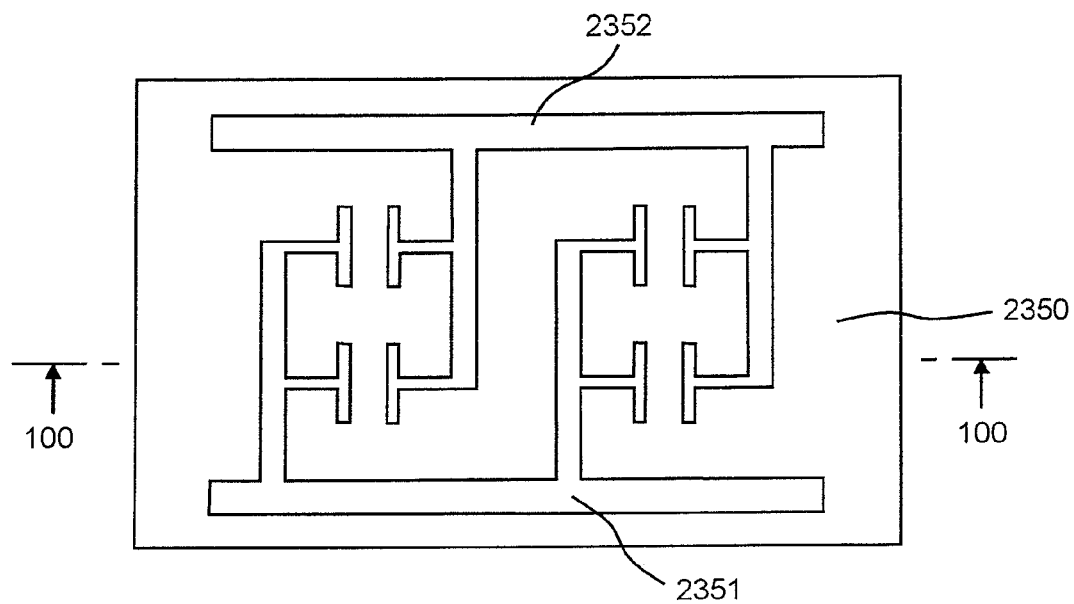
Figure 100:
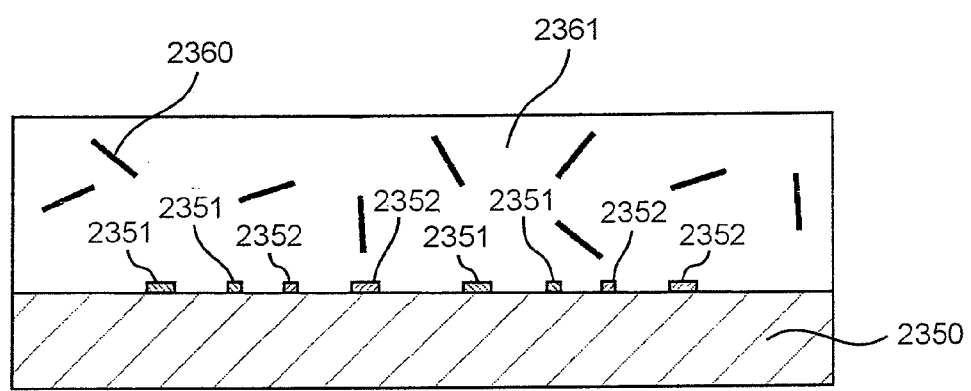
Figure 101:
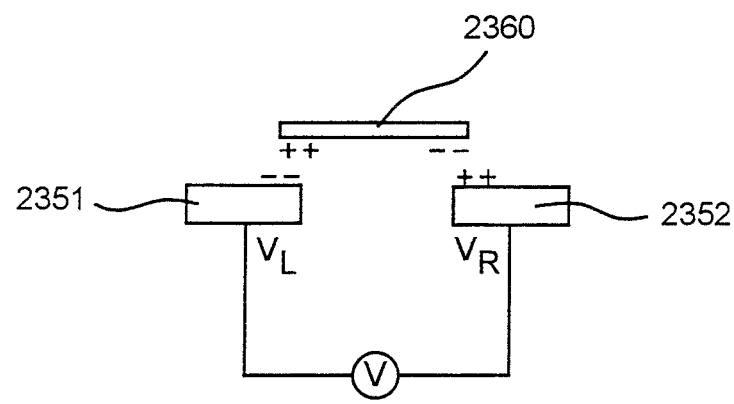
Figure 102:
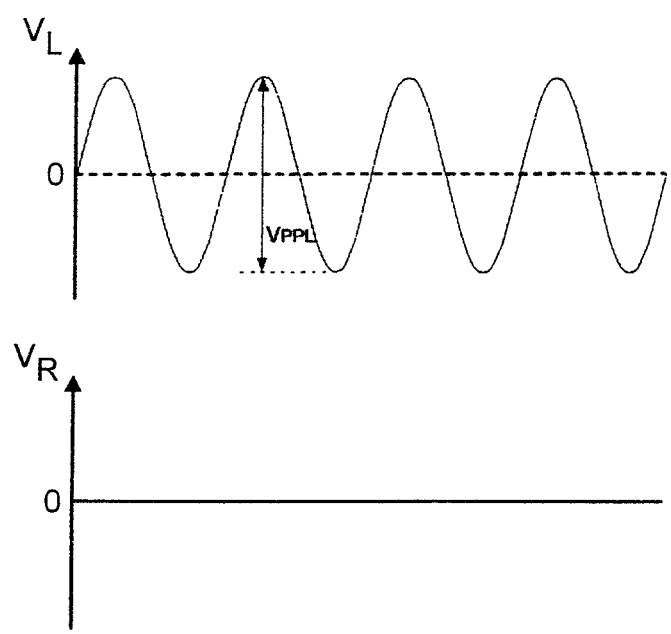
Figure 103:
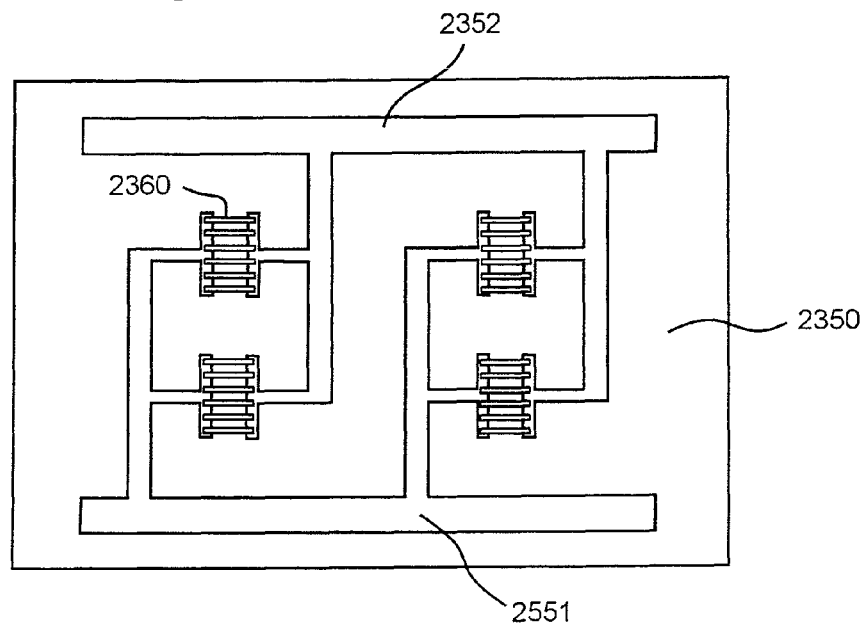
Figure 104:
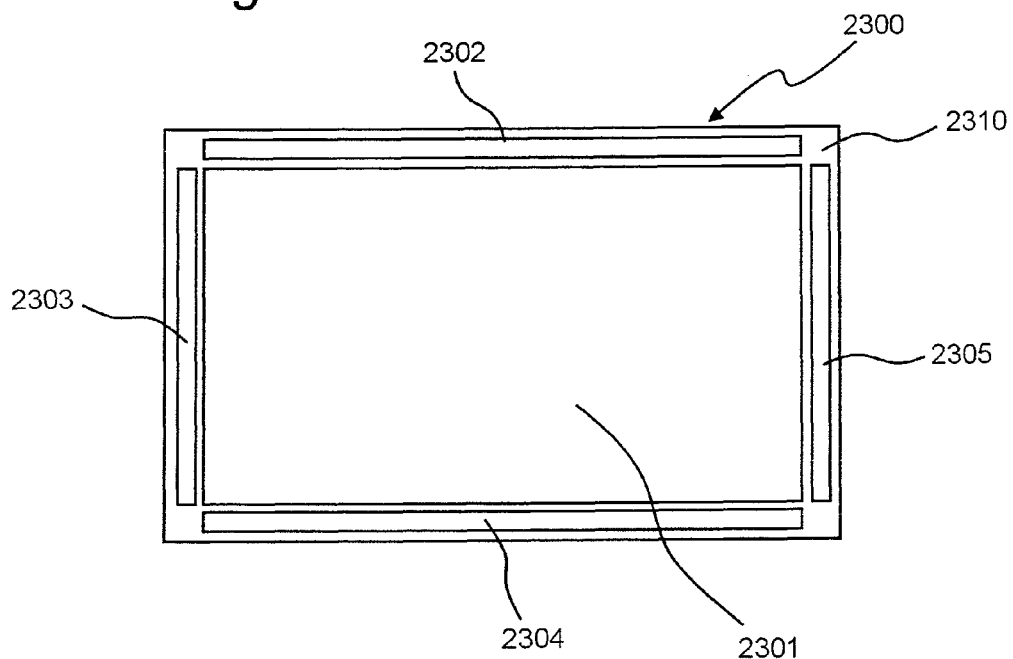
Figure 105:
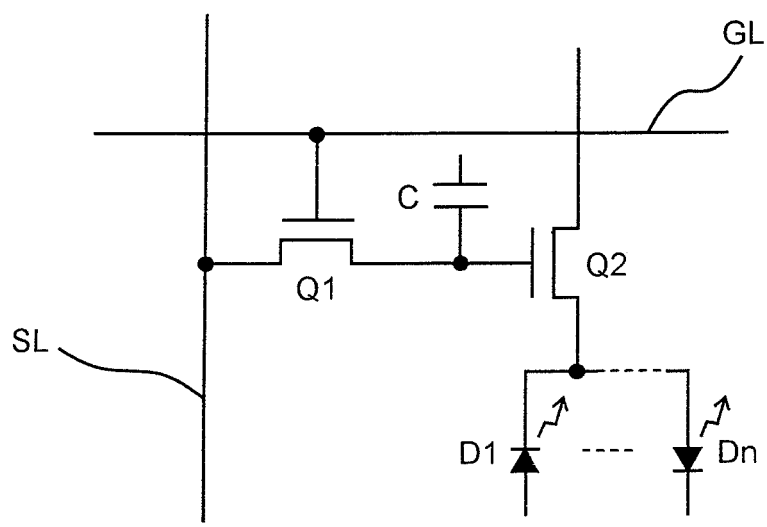
Figure 106:
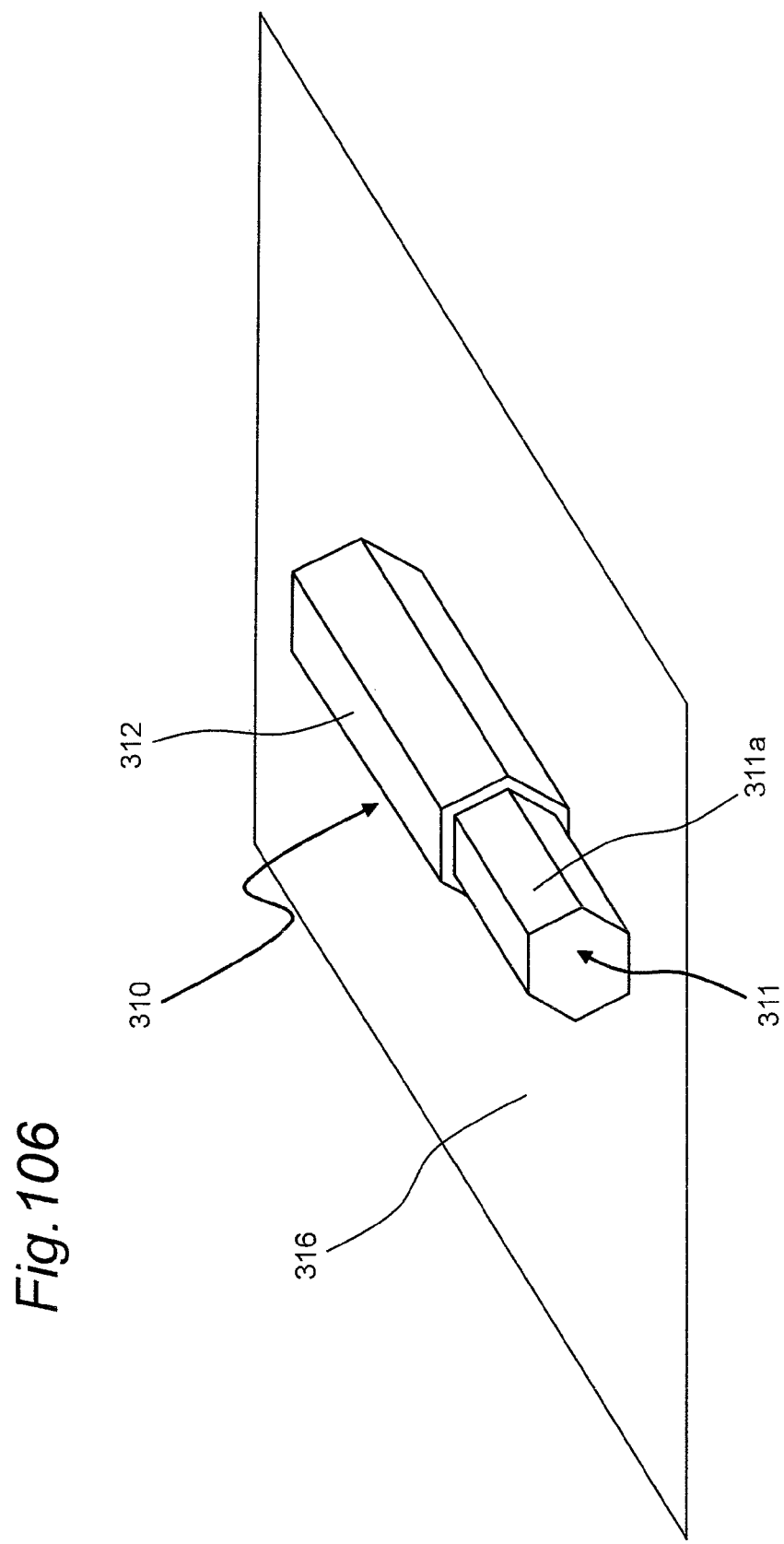
Figure 107:
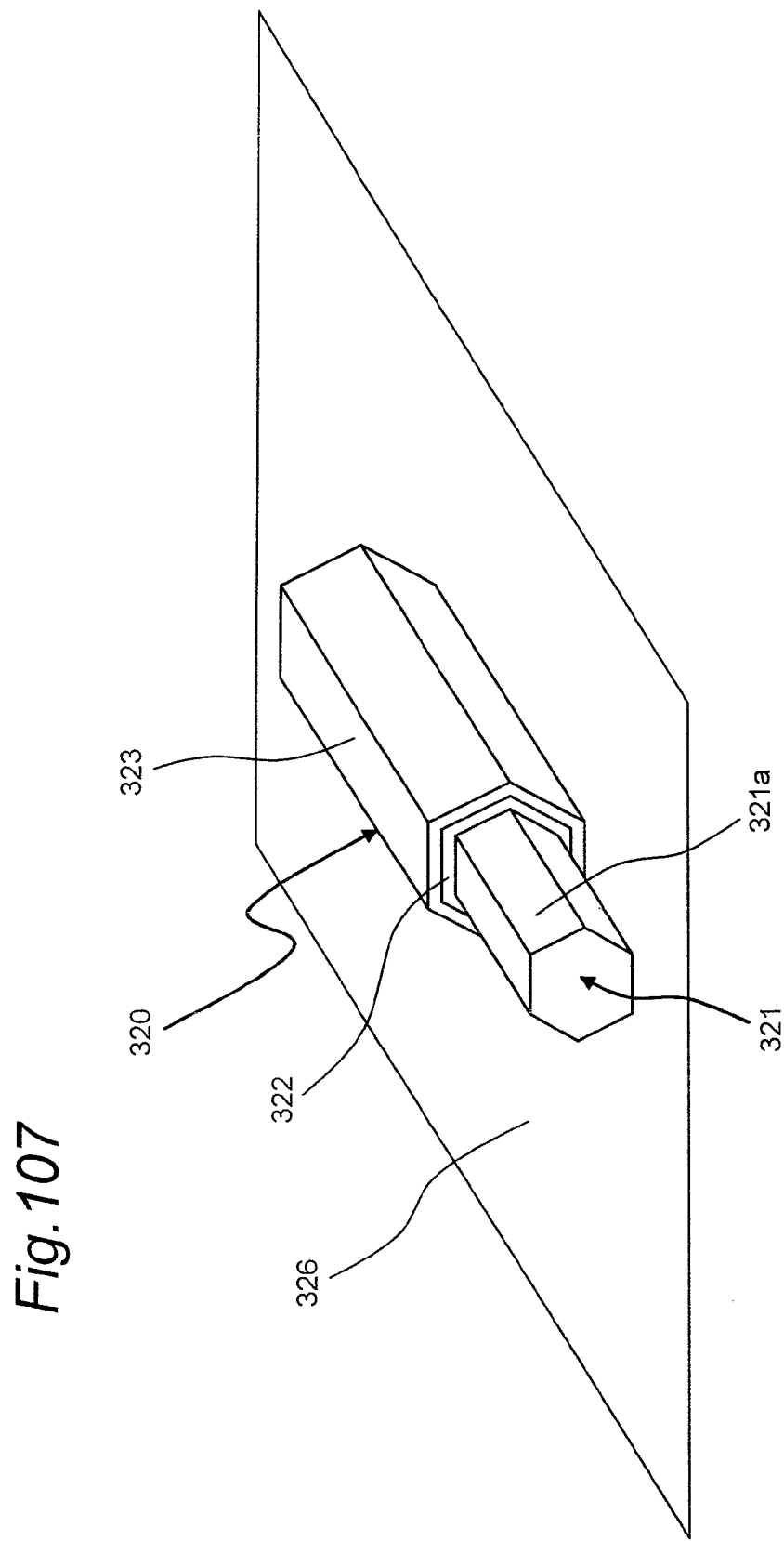
Figure 108:
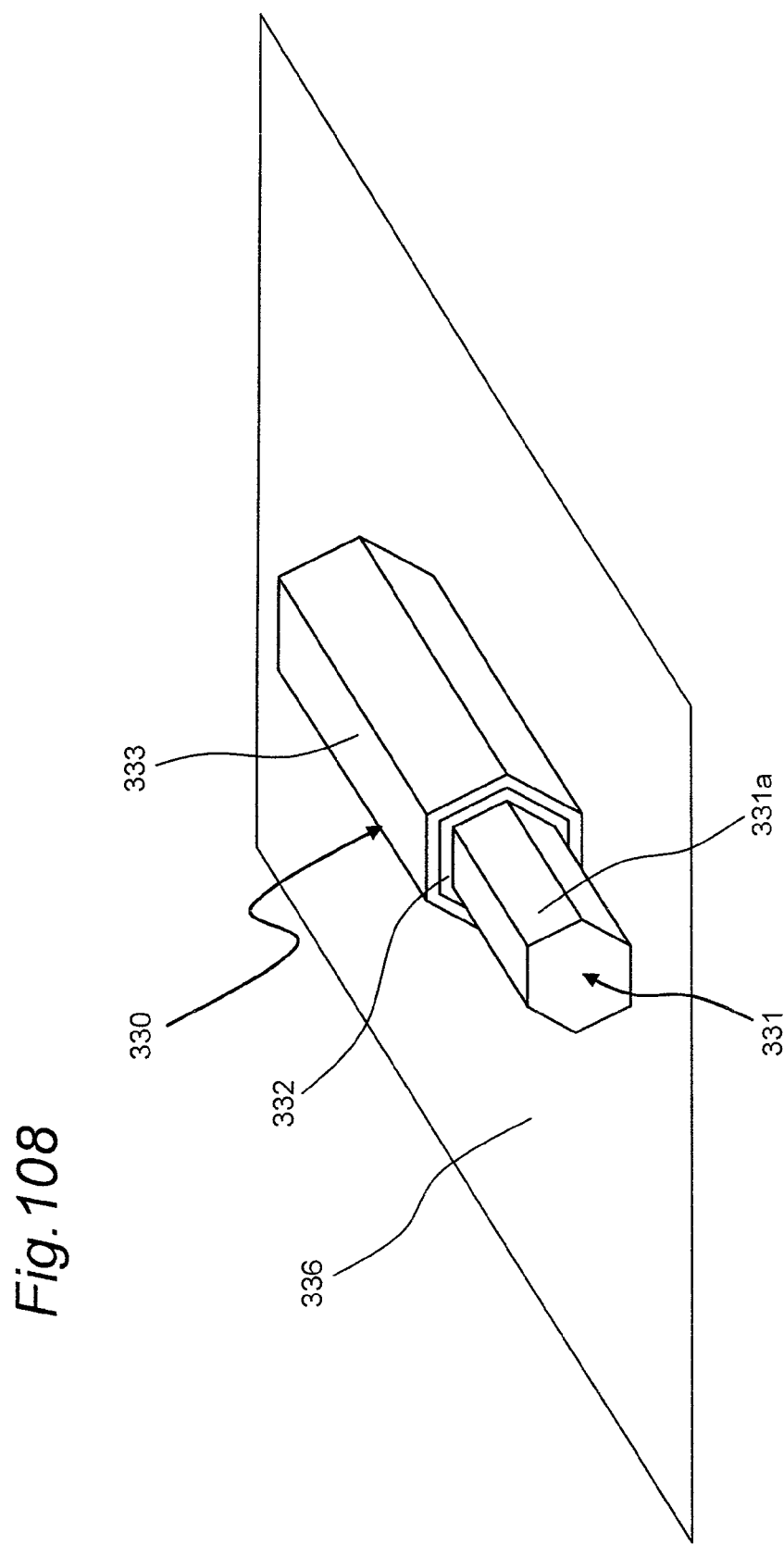
Figure 109:
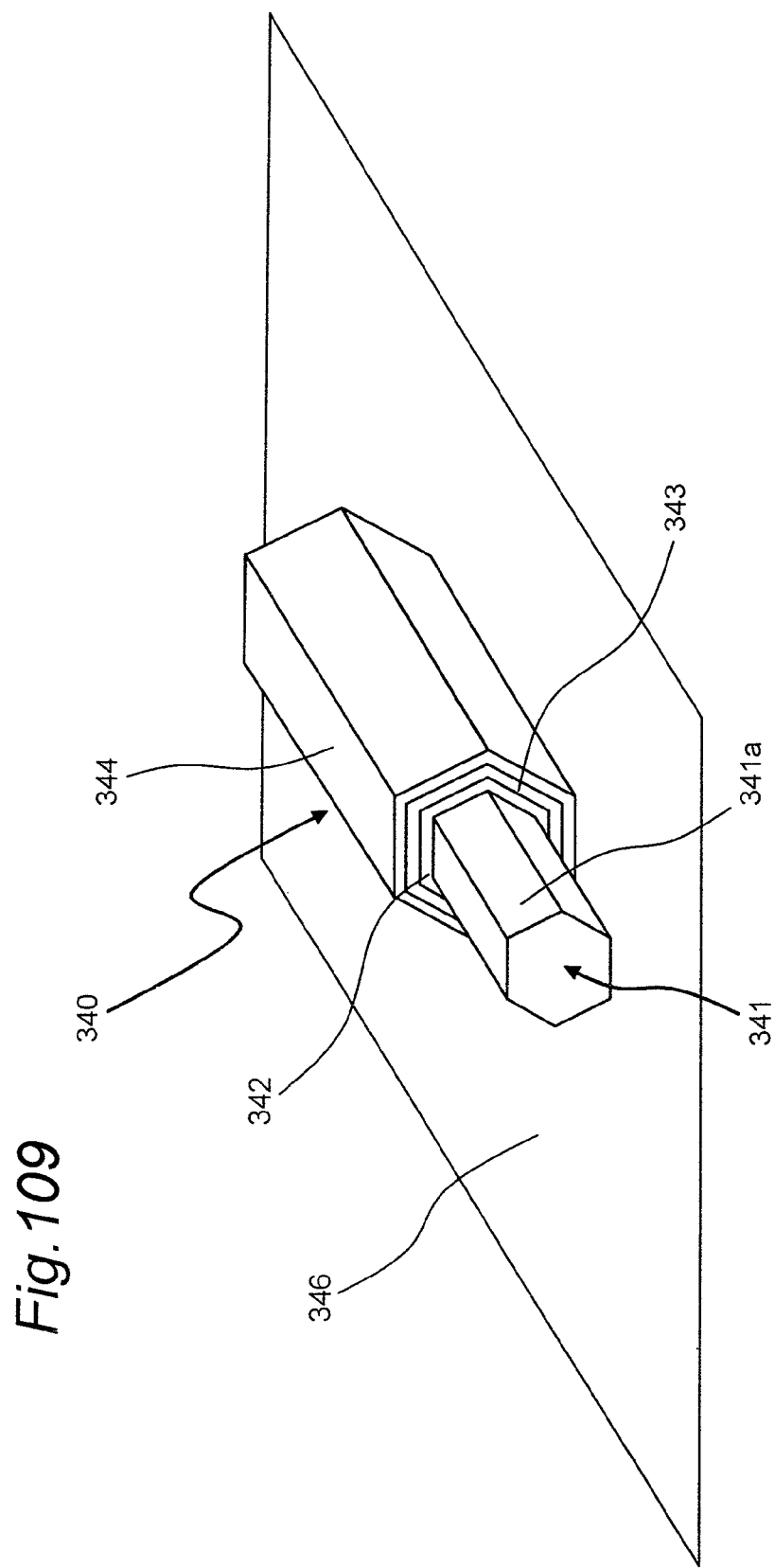
Figure 110:
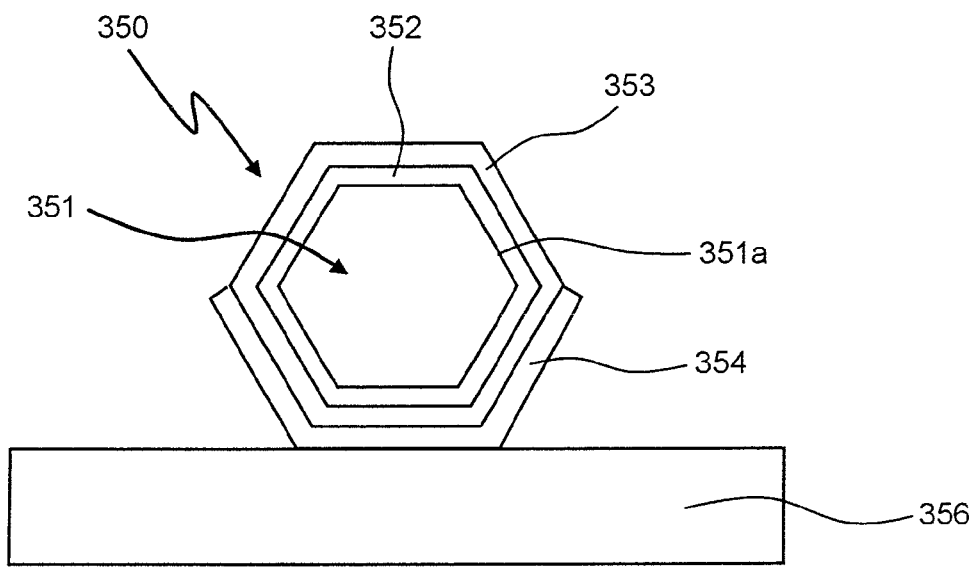
Figure 111:
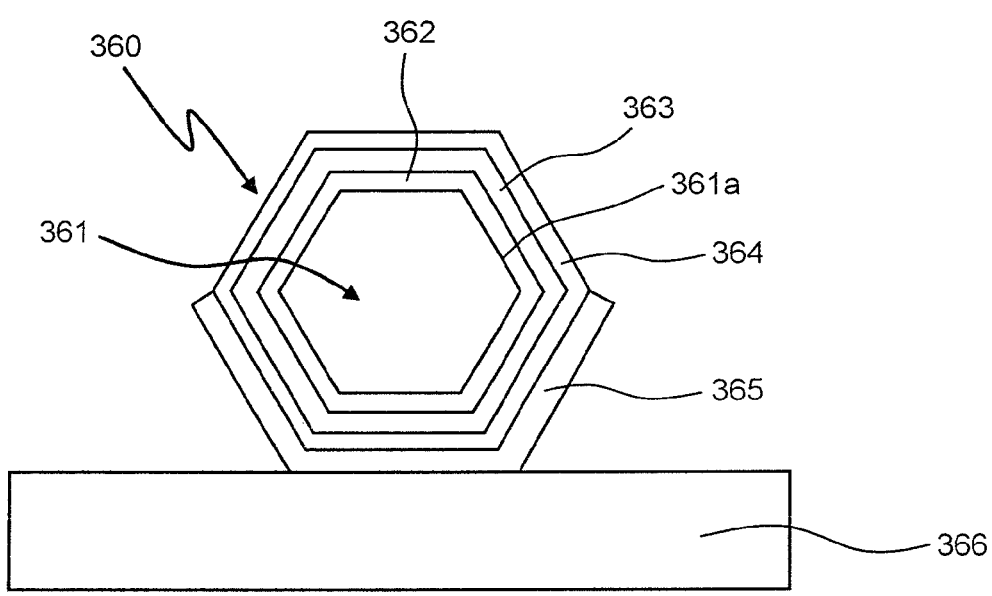
Figure 112:
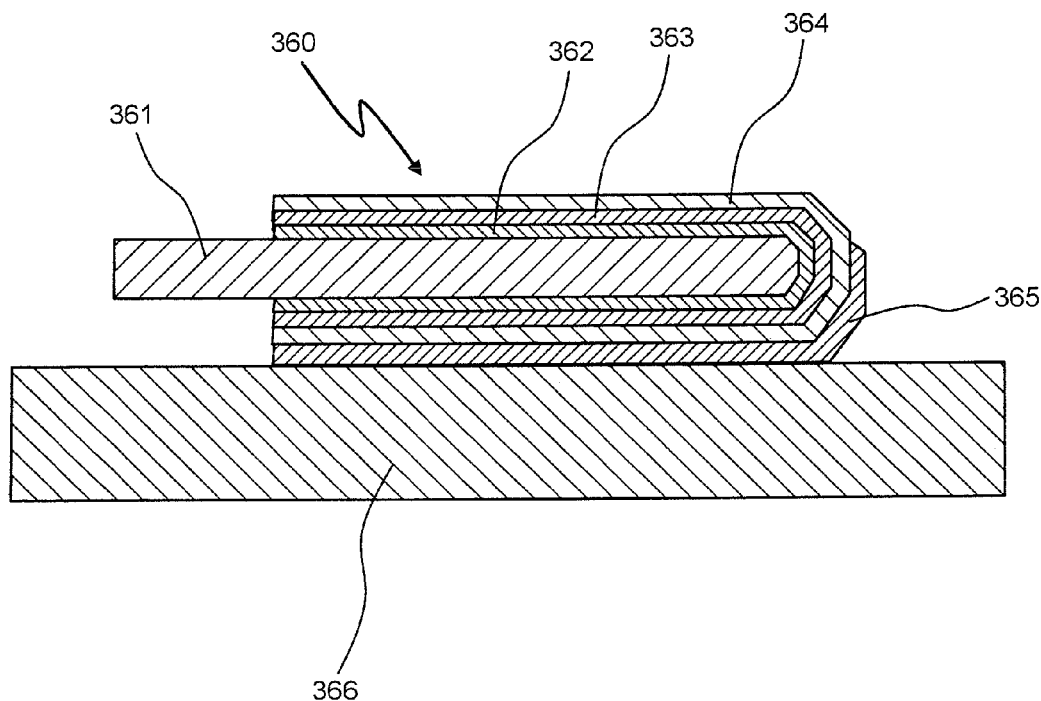
Figure 113:
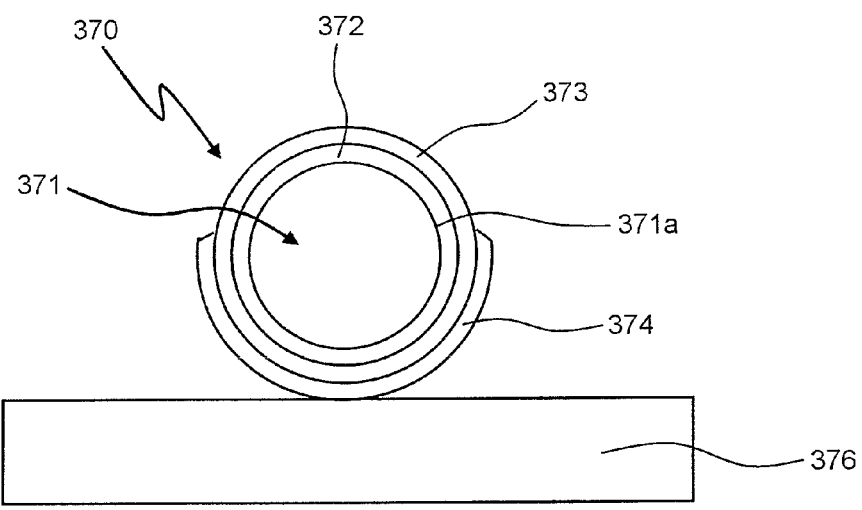
Figure 114:
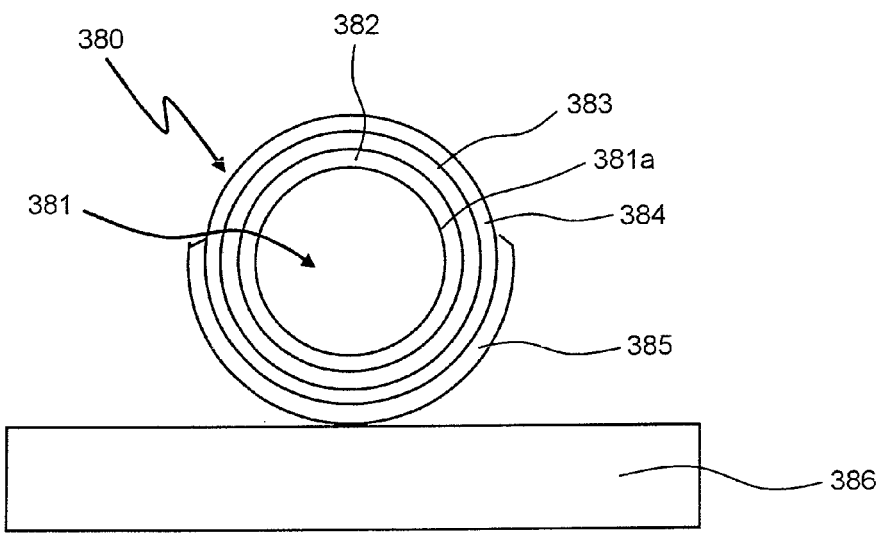
Figure 115:
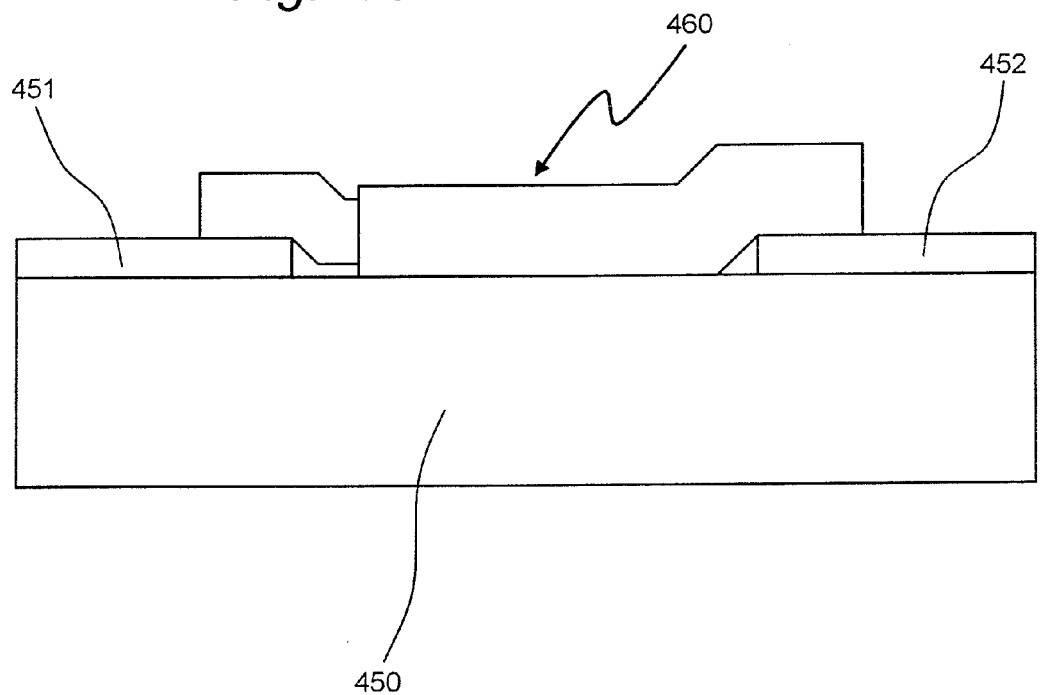
Figure 116:
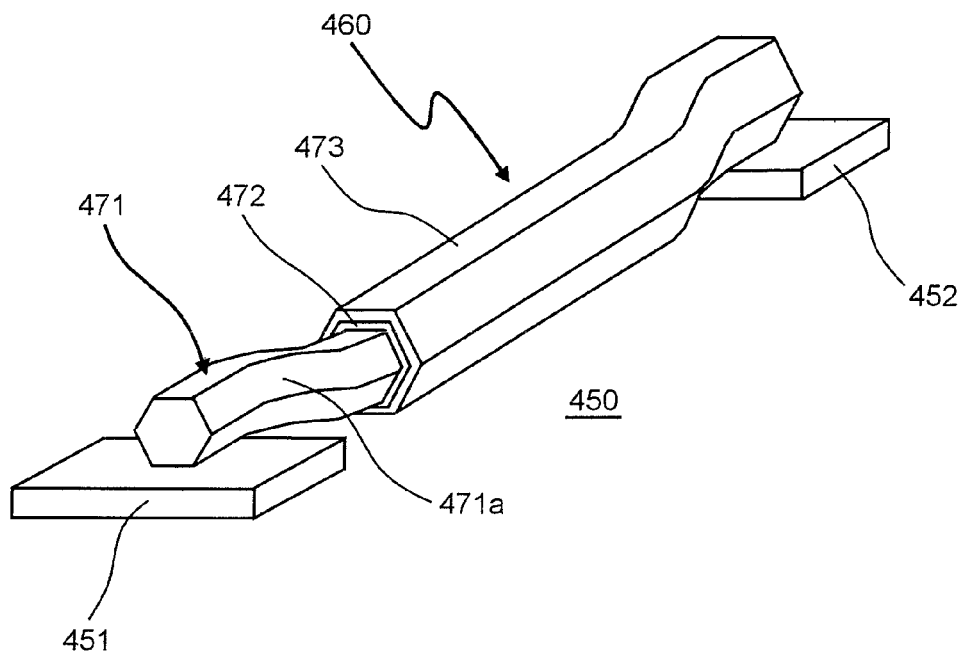
Figure 117:
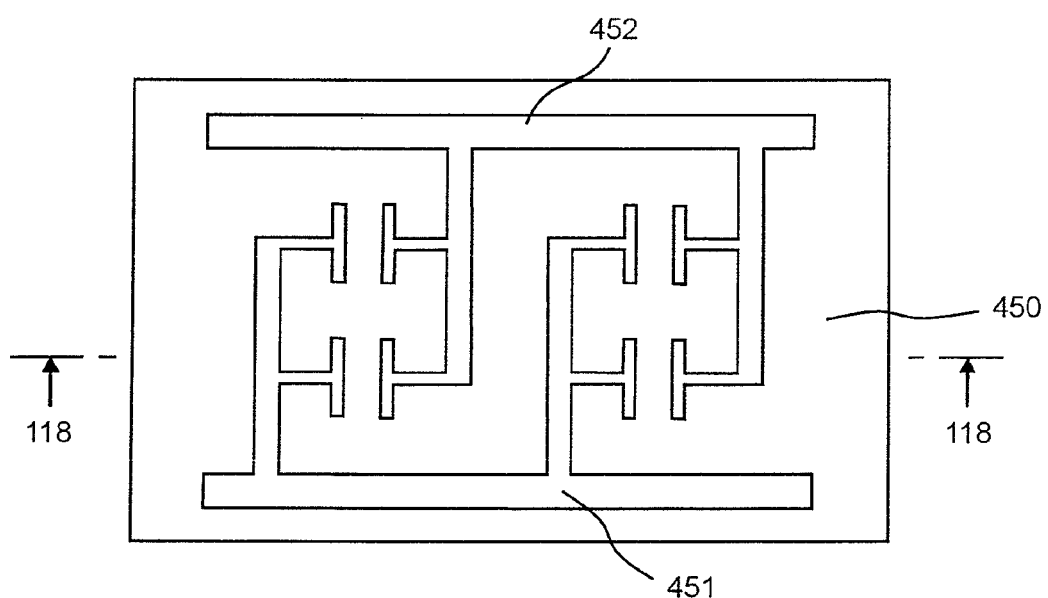
Figure 118:
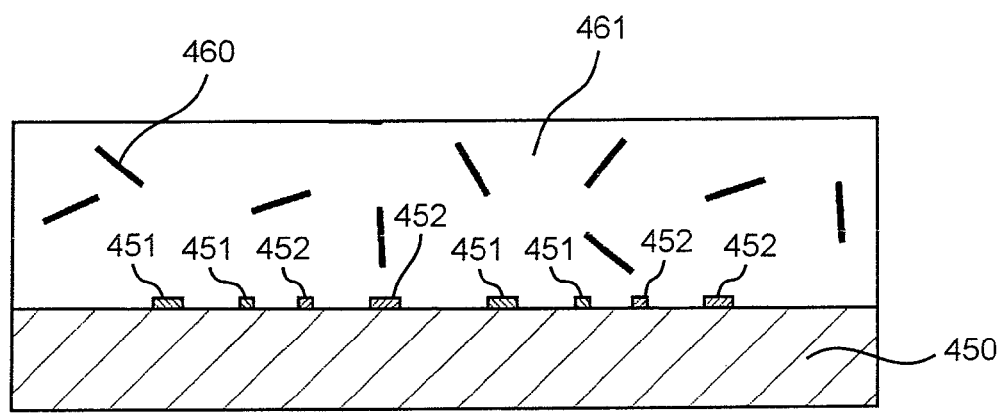
Figure 119:
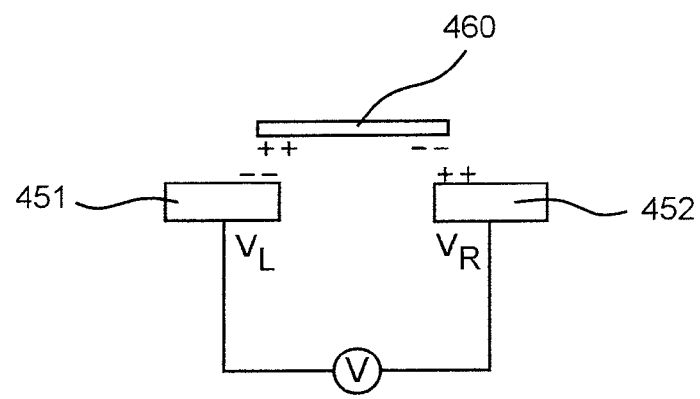
Figure 120:
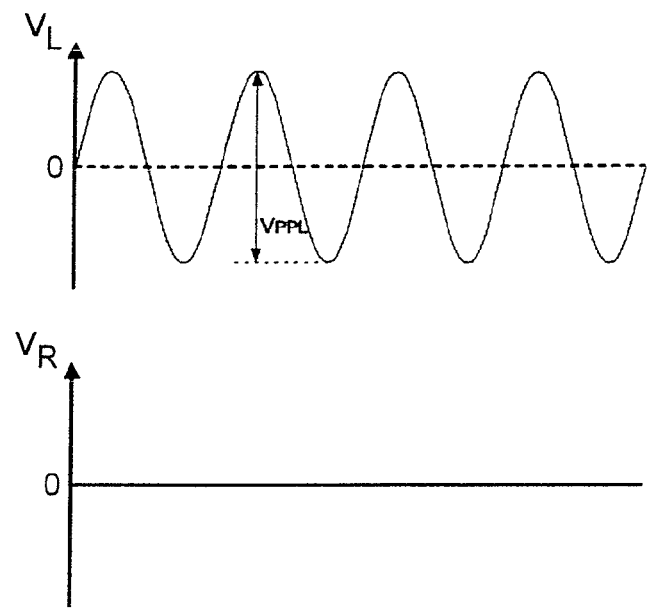
Figure 121:
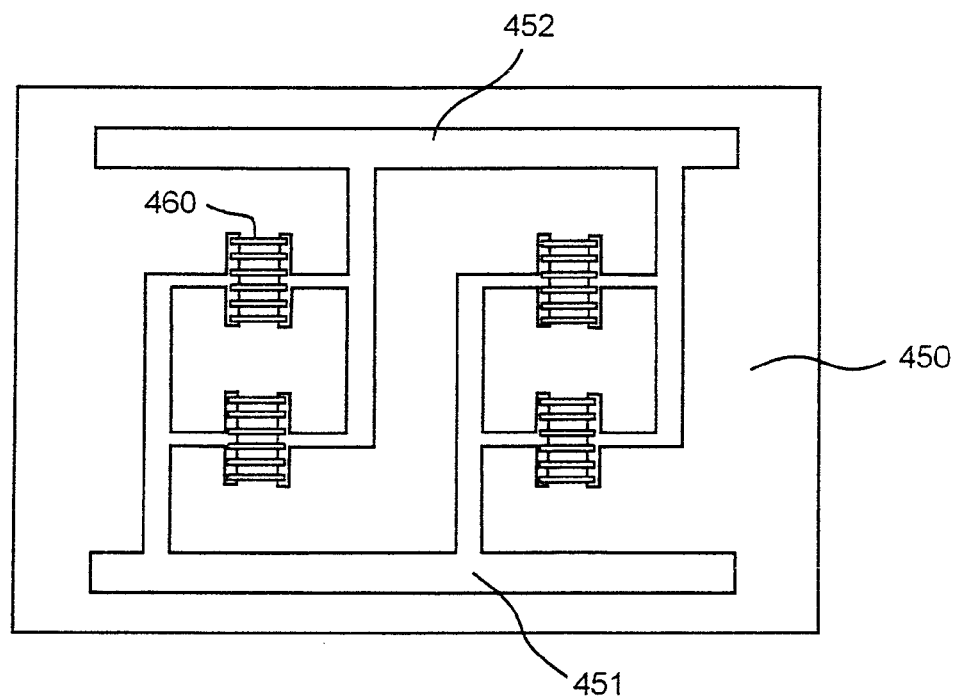
Figure 122:
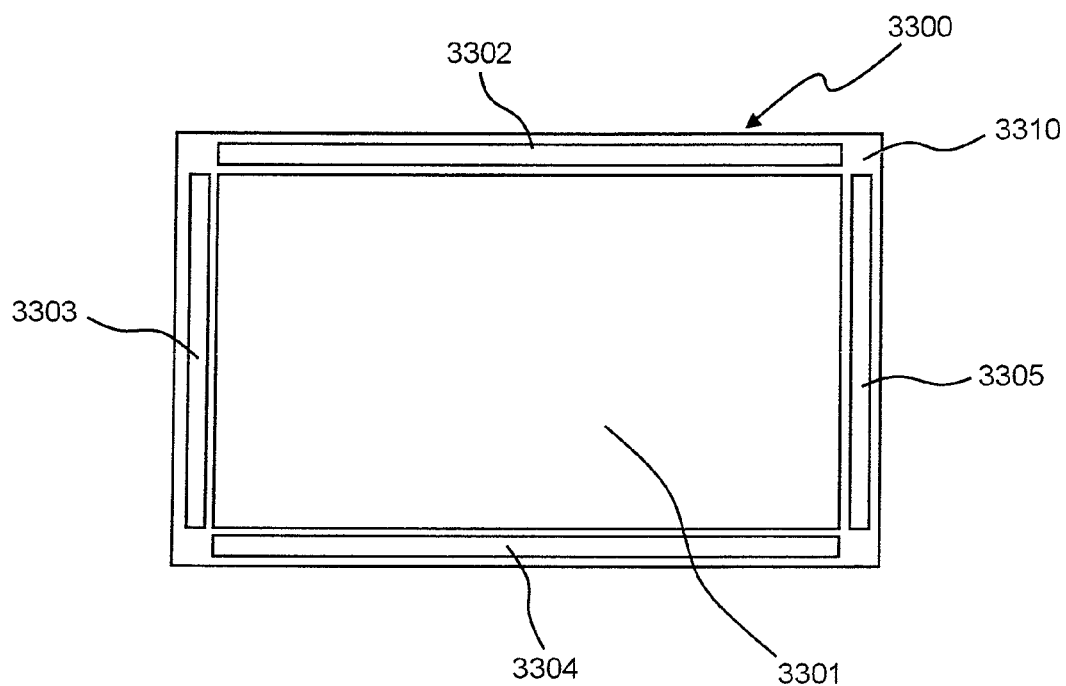
Figure 123:
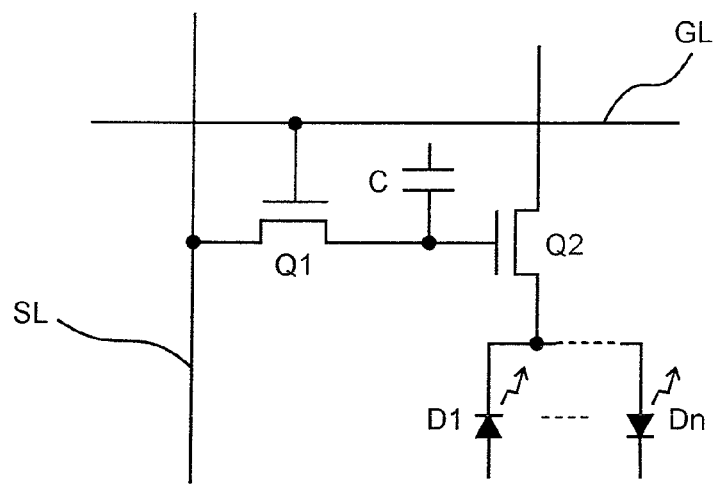
Figure 124:
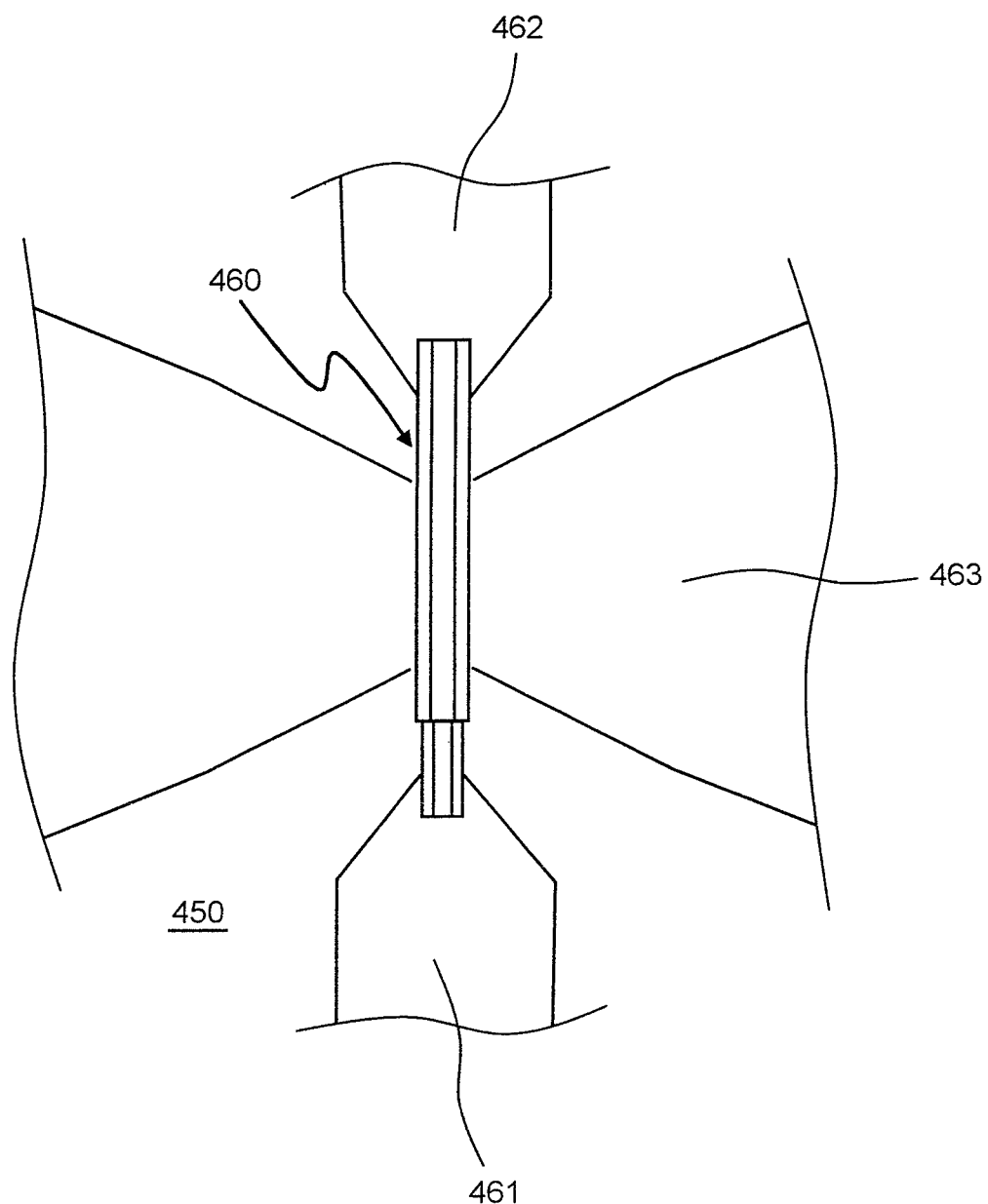
Figure 125:
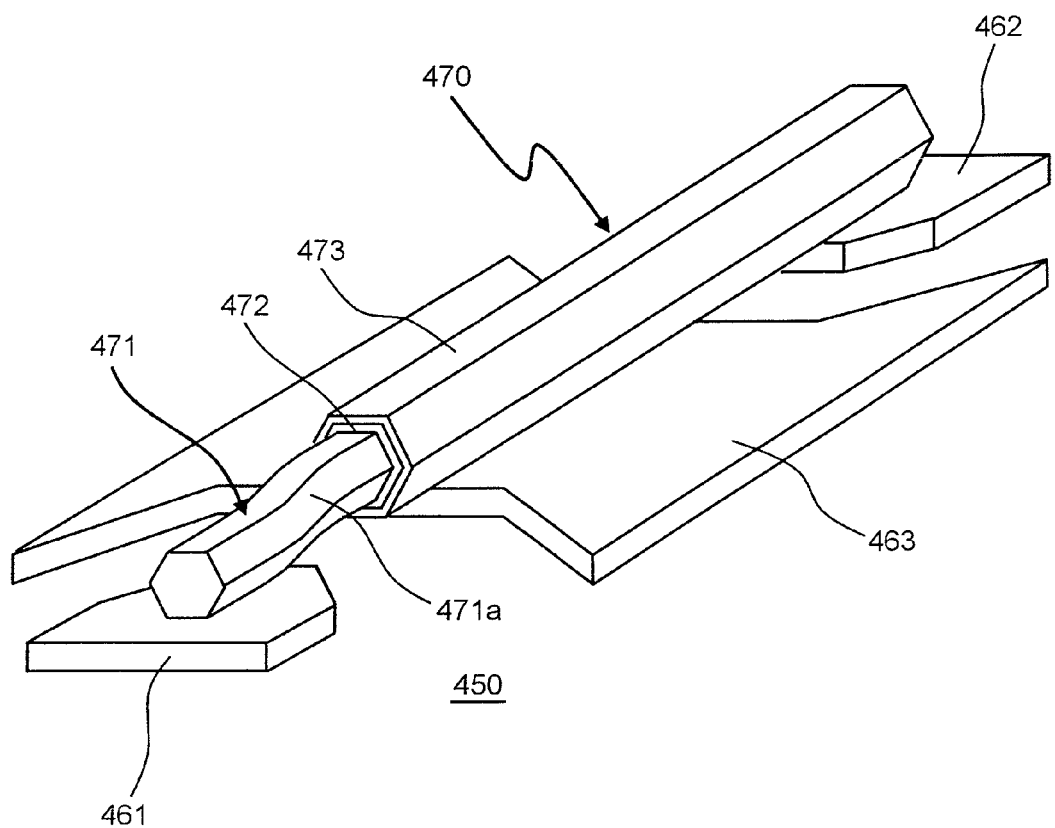

FIG. 87B is a cross-sectional view of the display device taken along the line F27B-F27B of FIG. 87A;

FIG. 87C is a cross-sectional view of the display device taken along the line F27C-F27C of FIG. 87A;

FIG. 87D is a cross-sectional view of the display device taken along the line F27D-F27D of FIG. 87A;

FIG. 88A is a plan view showing a step subsequent to the steps shown in FIGS. 87A to 87D of the method of manufacturing a display device;

FIG. 88B is a cross-sectional view of the display device taken along the line F28B-F28B of FIG. 88A;

FIG. 88C is a cross-sectional view of the display device taken along the line F28C-F28C of FIG. 88A;

FIG. 88D is a cross-sectional view of the display device taken along the line F28D-F28D of FIG. 88A;

FIG. 89A is a plan view showing a step subsequent to the steps shown in FIGS. 88A to 88D of the method of manufacturing a display device;

FIG. 89B is a cross-sectional view of the display device taken along the line F29B-F29B of FIG. 89A;

FIG. 89C is a cross-sectional view of the display device taken along the line F29C-F29C of FIG. 89A;

FIG. 89D is a cross-sectional view of the display device taken along the line F29D-F29D of FIG. 89A;

FIG. 90A is a plan view showing a step subsequent to the steps shown in FIGS. 89A to 89D of the method of manufacturing a display device;

FIG. 90B is a cross-sectional view of the display device taken along the line F30B-F30B of FIG. 90A;

FIG. 90C is a cross-sectional view of the display device taken along the line F30C-F30C of FIG. 90A;

FIG. 90D is a cross-sectional view of the display device taken along the line F30D-F30D of FIG. 90A;

FIG. 91A is a plan view showing a step subsequent to the steps shown in FIGS. 90A to 90D of the method of manufacturing a display device;

FIG. 91B is a cross-sectional view of the display device taken along the line F31B-F31B of FIG. 91A;

FIG. 91C is a cross-sectional view of the display device taken along the line F31C-F31C of FIG. 91A;

FIG. 91D is a cross-sectional view of the display device taken along the line F31D-F31D of FIG. 91A;

FIG. 92A is a plan view showing a step subsequent to the steps shown in FIGS. 91A to 91D of the method of manufacturing a display device;

FIG. 92B is a cross-sectional view of the display device taken along the line F32B-F32B of FIG. 92A;

FIG. 92C is a cross-sectional view of the display device taken along the line F32C-F32C of FIG. 92A;

FIG. 92D is a cross-sectional view of the display device taken along the line F32D-F32D of FIG. 92A;

FIG. 93A is a plan view showing a step subsequent to the steps shown in FIGS. 92A to 92D of the method of manufacturing a display device;

FIG. 93B is a cross-sectional view of the display device taken along the line F33B-F33B of FIG. 93A;

FIG. 93C is a cross-sectional view of the display device taken along the line F33C-F33C of FIG. 93A;

FIG. 93D is a cross-sectional view of the display device taken along the line F33D-F33D of FIG. 93A;

FIG. 94A is a plan view showing a step subsequent to the steps shown in FIGS. 93A to 93D of the method of manufacturing a display device;

FIG. 94B is a cross-sectional view of the display device taken along the line F34B-F34B of FIG. 94A;

FIG. 94C is a cross-sectional view of the display device taken along the line F34C-F34C of FIG. 94A;

FIG. 94D is a cross-sectional view of the display device taken along the line F34D-F34D of FIG. 94A;

FIG. 95 is a schematic cross-sectional view of a rod-like light-emitting device of Embodiment 36 of this invention;

FIG. 96A shows a process step of a method of manufacturing the rod-like light-emitting device of Embodiment 36;

FIG. 96B shows a process step of the method of manufacturing the rod-like light-emitting device of Embodiment 36;

FIG. 96C shows a process step of the method of manufacturing the rod-like light-emitting device of Embodiment 36;

FIG. 96D shows a process step of the method of manufacturing the rod-like light-emitting device of Embodiment 36;

FIG. 96E shows a process step of the method of manufacturing the rod-like light-emitting device of Embodiment 36;

FIG. 96F shows a process step of the method of manufacturing the rod-like light-emitting device of Embodiment 36;

FIG. 96G shows a process step of the method of manufacturing the rod-like light-emitting device of Embodiment 36;

FIG. 96H shows a process step of the method of manufacturing the rod-like light-emitting device of Embodiment 36;

FIG. 96I shows a process step of the method of manufacturing the rod-like light-emitting device of Embodiment 36;

FIG. 96J shows a process step of the method of manufacturing the rod-like light-emitting device of Embodiment 36;

FIG. 96K shows a process step of the method of manufacturing the rod-like light-emitting device of Embodiment 36;

FIG. 97 is a schematic cross-sectional view of a rod-like light-emitting device of Embodiment 37 of this invention;

FIG. 98A shows a process step of a method of manufacturing the rod-like light-emitting device of Embodiment 37;

FIG. 98B shows a process step of the method of manufacturing the rod-like light-emitting device of Embodiment 37;

FIG. 98C shows a process step of the method of manufacturing the rod-like light-emitting device of Embodiment 37;

FIG. 98D shows a process step of the method of manufacturing the rod-like light-emitting device of Embodiment 37;

FIG. 98E shows a process step of the method of manufacturing the rod-like light-emitting device of Embodiment 37;

FIG. 98F shows a process step of the method of manufacturing the rod-like light-emitting device of Embodiment 37;

FIG. 98G shows a process step of the method of manufacturing the rod-like light-emitting device of Embodiment 37;

FIG. 98H shows a process step of the method of manufacturing the rod-like light-emitting device of Embodiment 37;

FIG. 98I shows a process step of the method of manufacturing the rod-like light-emitting device of Embodiment 37;

FIG. 98J shows a process step of the method of manufacturing the rod-like light-emitting device of Embodiment 37;

FIG. 98K shows a process step of the method of manufacturing the rod-like light-emitting device of Embodiment 37;

FIG. 98L shows a process step of the method of manufacturing the rod-like light-emitting device of Embodiment 37;

FIG. 98M shows a process step of the method of manufacturing the rod-like light-emitting device of Embodiment 37;

FIG. 99 is a plan view of an insulating substrate used for a backlight, an illuminating device and/or a display device each including the rod-like light-emitting devices of Embodiment 38 of the invention;

FIG. 100 is a schematic cross-sectional view taken along the line 100-100 of FIG. 99;

FIG. 101 illustrates the principle of aligning the rod-like light-emitting devices of the above embodiment;

FIG. 102 is a diagram for illustration of potentials applied to electrodes when the rod-like light-emitting devices of the above embodiment are aligned;

FIG. 103 is a plan view of an insulating substrate on which the rod-like light-emitting devices of the above embodiment are aligned;

FIG. 104 is a plan view of the display device;

FIG. 105 is a circuit diagram of a main part of a display unit of the display device;

FIG. 106 is a perspective view of a light-emitting apparatus of Embodiment 39 of this invention;

FIG. 107 is a perspective view of a light-emitting apparatus of Embodiment 40 of this invention;

FIG. 108 is a perspective view of a light-emitting apparatus of Embodiment 41 of this invention;

FIG. 109 is a perspective view of a light-emitting apparatus of Embodiment 42 of this invention;

FIG. 110 is a perspective view of a light-emitting apparatus of Embodiment 43 of this invention;

FIG. 111 is a side view of a light-emitting apparatus of Embodiment 44 of this invention;

FIG. 112 is a cross-sectional view of the light-emitting apparatus;

FIG. 113 is a cross-sectional view of a variation of the light-emitting apparatus;

FIG. 114 is a cross-sectional view of another variation of the light-emitting apparatus;

FIG. 115 is a side view of a light-emitting apparatus of Embodiment 45 of this invention;

FIG. 116 is a perspective view of the light-emitting apparatus;

FIG. 117 is a plan view of an insulating substrate of a light-emitting apparatus used for a backlight, an illuminating device and/or a display device;

FIG. 118 is a schematic cross-sectional view taken along the line 118-118 of FIG. 117;

FIG. 119 illustrates the principle of aligning the rod-like light-emitting devices of the above embodiment;

FIG. 120 is a diagram for illustration of potentials applied to electrodes when the rod-like light-emitting devices of the above embodiment are aligned;

FIG. 121 is a plan view of an insulating substrate on which the rod-like light-emitting devices are aligned;

FIG. 122 is a plan view of the display device;

FIG. 123 is a circuit diagram of a main part of a display unit of the display device;

FIG. 124 is a plan view of a light-emitting apparatus of Embodiment 46 of this invention;

FIG. 125 is a perspective view of the light-emitting apparatus; and

Figure 126:
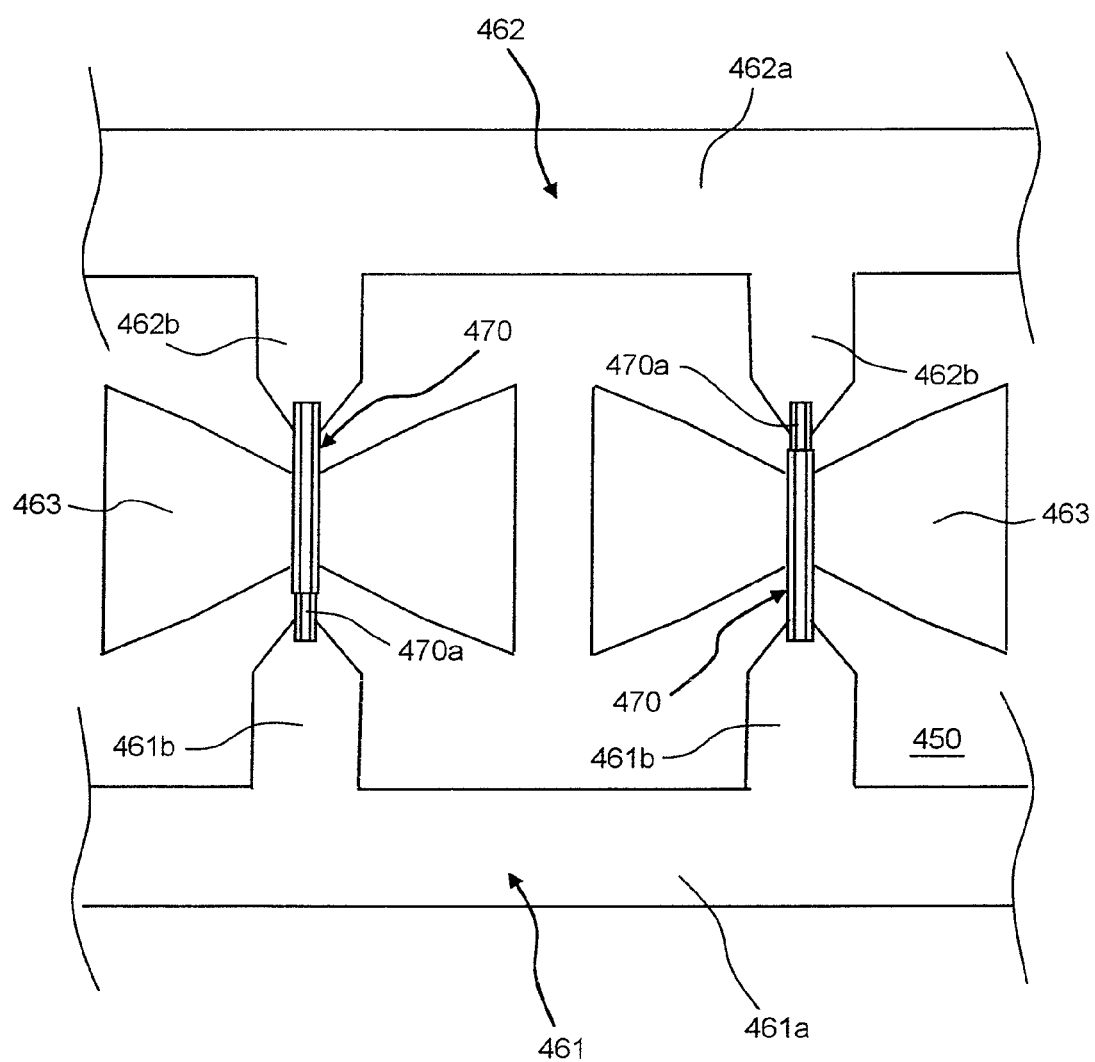

FIG. 126 is a plan view of a main part of the light-emitting apparatus in which rod-like light-emitting devices adjacent to each other are opposite in orientation.

DESCRIPTION OF EMBODIMENTS

A rod-like light-emitting device, a method of manufacturing a rod-like light-emitting device, a backlight, an illuminating device and a display device according to this invention, in embodiments shown in figures, are described in detail below. Note that a first conductivity type is an n type, and a second conductivity type is a p type in the embodiments; however, the first conductivity type may be the p type, and the second conductivity type may be an n type.

(Embodiment 1)

Figure 1:
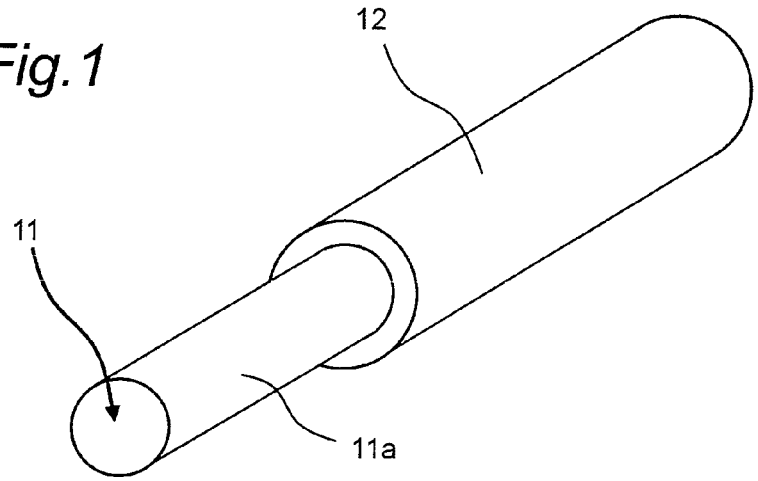
FIG. 1 is a perspective view of a rod-like light-emitting device of Embodiment 1 of this invention.

FIG. 1 is a perspective view of a rod-like light-emitting device of Embodiment 1 of this invention. The rod-like light-emitting device of Embodiment 1, as shown in FIG. 1, includes a semiconductor core 11 made of n-type GaN in a rod shape whose cross section is nearly circular, and a semiconductor layer 12 made of p-type GaN and formed to cover part of the semiconductor core 11. The semiconductor core 11 has, at one end thereof, an exposed portion 11a in which an outer peripheral surface of the semiconductor core 11 is exposed. An end surface of the other end of the semiconductor core 11 is covered with the semiconductor layer 12.

The rod-like light-emitting device is manufactured in the following way.

First, a mask having a growth hole is formed on a substrate made of n-type GaN. Silicon oxide ($SiO_2$), silicon nitride ($Si_3N_4$) or another material that is selectively etchable with respect to the semiconductor core 11 and the semiconductor layer 12 is used as the material for the mask. To form a growth hole, a lithography method and a dry etching method, which are known and used for usual semiconductor processes, can be used.

Next, the semiconductor core 11 shaped like a rod is formed by crystal growth of n-type GaN on the substrate exposed through a growth hole of the mask using a metal organic chemical vapor deposition (MOCVD) device. The temperature of the MOCVD device is set to about 950° C., trimethylgalium (TMG) and ammonia ($NH_3$) are used as growth gases, and silane ($SiH_3$) for n-type impurity supply and further hydrogen ($H_3$) as a carrier gas are supplied, so that a semiconductor core of n-type GaN with Si used as the impurity can be grown. At this point, the diameter of the semiconductor core 11 to be grown can be determined depending on the diameter of the growth hole of the mask.

Next, a semiconductor layer made of p-type GaN is formed over the whole substrate so that the rod-like semiconductor core 11 is covered with the semiconductor layer. The temperature of the MOCVD device is set to about 960° C., TMG and $NH_3$ are used as growth gases, and bis(cyclopentadienyl) magnesium ($Cp_2Mg$) is used for p-type impurity supply, so that p-type GaN with magnesium (Mg) used as the impurity can be grown.

Next, all of the region except for a portion covering the semiconductor core of the semiconductor layer, and the mask are removed by lift-off to expose the outer peripheral surface on the substrate side of the rod-like semiconductor core 11, so that the exposed portion 11a is formed. In this state, the end surface of the semiconductor core 11 opposite to the substrate is covered with the semiconductor layer 12. In the case where a mask is made of silicon oxide ($SiO_2$) or silicon nitride ($Si_3N_4$), use of a solution containing hydrofluoric acid (HF) enables the mask to be easily etched without affecting the semiconductor core and the semiconductor layer portion covering the semiconductor core, and enables the mask together with the semiconductor layer on the mask (all of the region of the semiconductor layer except for a portion thereof covering the semiconductor core) to be removed by lift-off. In this embodiment, the length of the exposed portion 11a of the semiconductor core 11 is determined depending on the thickness of the removed mask. The lift-off is used in the exposing step of this embodiment; however, part of the semiconductor core may be exposed by etching.

Next, the substrate is immersed in an isopropyl alcohol (IPA) aqueous solution, and is vibrated along the plane of the substrate using ultrasonic waves (e.g., several tens of kilohertz). This causes stress to act on the semiconductor core 11 covered with the semiconductor layer 12 so as to bend the root close to the substrate of the semiconductor core 11 that erects on the substrate. As a result, the semiconductor core 11 covered with the semiconductor layer 12 is separated from the substrate.

In this way, the microscopic rod-like light-emitting device that is separated from the substrate made of n-type GaN can be manufactured.

Moreover, in the rod-like light-emitting device described above, crystal growth of the semiconductor layer occurs radially outward from the outer peripheral surface of the semiconductor core 11. The growth distance in the radial direction is short and the defect deviates outward, and therefore the semiconductor core 11 can be covered with the semiconductor layer 12 having less crystal defects. Accordingly, a rod-like light-emitting device having good characteristics can be implemented.

According to a rod-like light-emitting device having the above configuration, the semiconductor layer 12 made of p-type GaN is formed to cover the semiconductor core 11 shaped like a rod and made of n-type GaN, and to expose the outer peripheral surface of part of the semiconductor core 11. This makes it possible to connect the exposed portion 11a of the semiconductor core 11 to an n-side electrode and to connect a p-side electrode to a portion of the semiconductor layer 12 with which the semiconductor core 11 is covered, even when the rod-like light-emitting device is microscopic and has a size of the order of micrometers or of the order of nanometers. In the rod-like light-emitting device, with the n-side electrode connected to the exposed portion 11a of the semiconductor core 11 and with the p-side electrode connected to the semiconductor layer 12, a current is caused to flow from the p-side electrode to the n-side electrode to result in recombination of electrons and holes in a pn junction between the outer peripheral surface of the semiconductor core 11 and the inner peripheral surface of the semiconductor layer 12. Thus, light is emitted from the pn junction. In this rod-like light-emitting device, light is emitted from the whole periphery of the semiconductor core covered with the semiconductor layer 12. The light emitting region therefore becomes larger, which results in a high light emitting efficiency. Accordingly, it is possible to implement a microscopic rod-like light-emitting device that allows electrode connections to be easily made with a simple configuration and has a high light emitting efficiency. The above rod-like light-emitting device is not integral with the substrate, which allows great freedom in installing into an apparatus.

The microscopic rod-like light-emitting device as used herein is a device, for example, in micrometer order size with a diameter of 1 μm and a length in the range of from 10 μm to 30 μm, or in nanometer order size in which at least the diameter of the diameter and the length of 1 μm or less. The rod-like light-emitting device mentioned above allows a decrease in the amount of semiconductors used. This makes it possible to reduce the thickness and weight of an apparatus using the light-emitting device, and to implement a backlight, an illuminating device and a display device that have high light emitting efficiencies and achieve low power consumption.

The outer peripheral surface of one side of the above semiconductor core 11 is exposed, for example, in the axial direction by about 1 μm to 5 μm. This makes it possible to connect one electrode to the exposed portion 11a of the outer peripheral surface of the semiconductor core 11 and to connect an electrode to the semiconductor layer 12 on the other side of the semiconductor core 11. Therefore, connections can be made with the electrodes separate from each other in both ends. Thus, the electrode connected to the semiconductor layer 12 and the exposed portion of the semiconductor core 11 can easily be prevented from becoming short-circuited to each other.

The end surface of the other end of the above semiconductor core 11 is covered with the semiconductor layer 12. This makes it possible to easily connect the p-side electrode to a portion of the semiconductor layer 12 that covers the end surface of the semiconductor core 11 opposite to the exposed portion 11a, without short-circuiting the p-side electrode to the semiconductor core 11. In this way, electrodes can easily be connected to both ends of the microscopic rod-like light-emitting device.

The outer peripheral surface of the region covered with the semiconductor layer 12 of the semiconductor core 11 and the outer peripheral surface of the exposed region of the semiconductor core 11 are continuous with each other such that the exposed region of the semiconductor core 11 is thinner than the outer diameter of the semiconductor layer 12, and therefore, in the manufacturing step, the side of the substrate of the exposed region of the semiconductor core 11 becomes more likely to be broken on the substrate side in the exposed region of the semiconductor core 11, which facilitates manufacturing.

(Embodiment 2)

Figure 2:
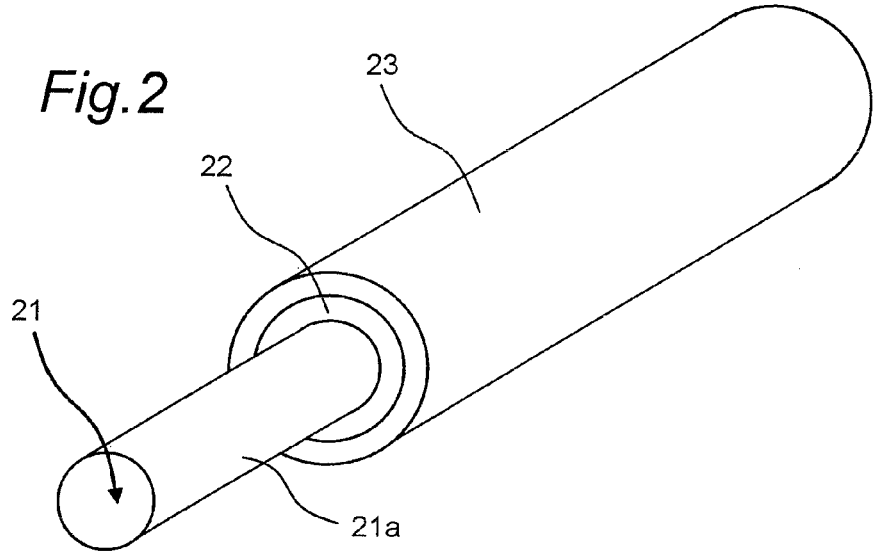
FIG. 2 is a perspective view of a rod-like light-emitting device of Embodiment 2 of this invention.

FIG. 2 is a perspective view of a rod-like light-emitting device of Embodiment 2 of this invention. The rod-like light-emitting device of Embodiment 2, as shown in FIG. 2, includes a semiconductor core 21 made of n-type GaN in a rod shape whose cross section is nearly circular, a quantum well layer 22 made of p-type InGaN and formed to cover part of the semiconductor core 21, and a semiconductor layer 23 made of p-type GaN and formed to cover the quantum well layer 22. The semiconductor core 21 has, at one end thereof, an exposed portion 21a in which the outer peripheral surface of the semiconductor core 21 is exposed. The end surface of the other end of the semiconductor core 21 is covered with the quantum well layer 22 and the semiconductor layer 23.

In the above rod-like light-emitting device of Embodiment 2, like the rod-like light-emitting device of Embodiment 1, the semiconductor core 21 shaped like a rod is formed by crystal growth of n-type GaN on the substrate made of n-type GaN using the MOCVD device.

The above rod-like light-emitting device of Embodiment 2 has effects similar to those of the rod-like light-emitting device of Embodiment 1.

The quantum well layer 22 is formed between the semiconductor core 21 and the semiconductor layer 23. As a result, due to quantum confinement effects of the quantum well layer 22, the light emitting efficiency can further be improved. After the semiconductor core of n-type GaN has been grown in the MOCVD device as described above, the set temperature is changed from 600° C. to 800° C. in accordance with the wavelength of emitted light, and nitrogen ($N_2$) is supplied to the carrier gas and TMG, $NH_3$ and trimethylindium (TMI) are supplied to the growth gas. In this way, the InGaN quantum well layer 22 can be formed on the semiconductor core 21 of n-type GaN. Thereafter, further, the set temperature is changed to 960° C., and TMG and $NH_3$ are used as the growth gases as mentioned above, and $Cp_2Mg$ is used for p-type impurity supply. In this way, the semiconductor layer 23 made of p-type GaN can be formed. Note that the quantum well layer may have a p-type AlGaN layer as an electron block layer inserted between the InGaN layer and the p-type GaN layer, and may have a multiple quantum well structure in which barrier layers of GaN and quantum well layers of InGaN are alternately laminated.

(Embodiment 3)

Figure 3:
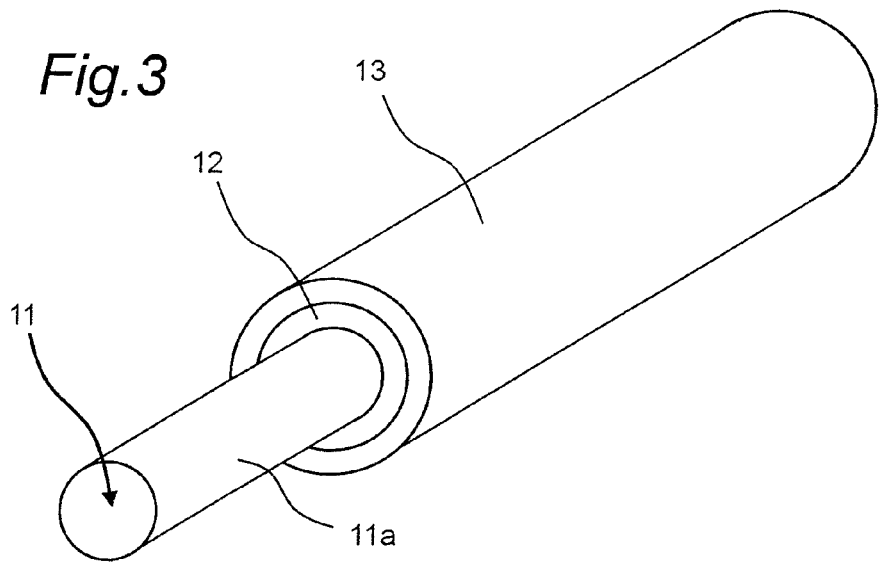
FIG. 3 is a perspective view of a rod-like light-emitting device of Embodiment 3 of this invention.

FIG. 3 is a perspective view of a rod-like light-emitting device of Embodiment 3 of this invention. The rod-like light-emitting device of Embodiment 3, as shown in FIG. 3, includes the semiconductor core 11 made of n-type GaN in a rod shape whose cross section is nearly circular, the semiconductor layer 12 made of p-type GaN and formed to cover part of the semiconductor core 11, and a transparent electrode 13 formed to cover the semiconductor layer 12. The semiconductor core 11 has, at one end thereof, an exposed portion 11a in which the outer peripheral surface of the semiconductor core 11 is exposed. The end surface of the other end of the semiconductor core is covered with the semiconductor layer 12 and the transparent electrode 13. The transparent electrode 13 is formed of tin-doped indium oxide (ITO) having a thickness of 200 nm. For deposition of ITO, a vapor-deposition method or a sputtering method can be used. After the deposition of the ITO film, heat treatment is performed at a temperature of 500° C. to 600° C., which makes it possible to reduce the contact resistance between the semiconductor layer 12 made of p-type GaN and the transparent electrode 13 made of ITO. Note that the transparent electrode is not limited to this, and a laminated metal film of, for example, Ag/Ni having a thickness of 5 nm. For the deposition, a vapor-deposition method or a sputtering method can be used. To further decrease the resistance of the electrode layer, a laminated metal film of Ag/Ni may be deposited on the ITO film.

In the above rod-like light-emitting device of Embodiment 3, like the rod-like light-emitting device of Embodiment 1, the semiconductor core 11 shaped like a rod is formed by crystal growth of n-type GaN on the substrate made of n-type GaN using the MOCVD device.

The above rod-like light-emitting device of Embodiment 3 has effects similar to those of the rod-like light-emitting device of Embodiment 1.

Forming the transparent electrode 13 so as to cover approximately the whole of the semiconductor layer 12 causes the semiconductor layer 12 to be connected through the transparent electrode 13 to an electrode, which allows a wide current path to be formed without a current being concentrated to an electrode connection portion and being unbalanced, so that the whole device can emit light. Thus, the light emitting efficiency is further improved. In particular, with a configuration of a semiconductor core made of an n-type semiconductor and a semiconductor layer made of a p-type semiconductor, the semiconductor layer made of the p-type semiconductor is less likely to increase the impurity concentration, and the resistance is high. However, the transparent electrode allows a wider current path to be formed, so that the whole device can emit light. Thus, the light emitting efficiency is further improved.

(Embodiment 4)

Figure 4:
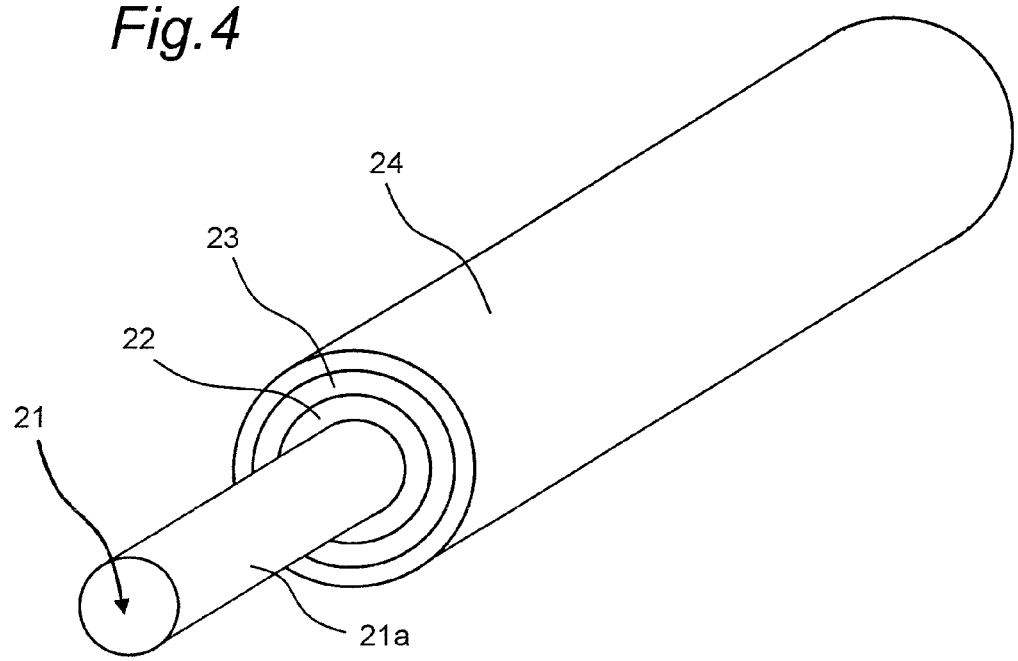
FIG. 4 is a perspective view of a rod-like light-emitting device of Embodiment 4 of this invention.

FIG. 4 is a perspective view of a rod-like light-emitting device of Embodiment 4 of this invention. The rod-like light-emitting device of Embodiment 4, as shown in FIG. 4, includes the semiconductor core 21 made of n-type GaN in a rod shape whose cross section is nearly circular, the quantum well layer 22 made of p-type InGaN and formed to cover part of the semiconductor core 21, the semiconductor layer 23 made of p-type GaN and formed to cover the quantum well layer 22, and a transparent electrode 24 formed to cover the semiconductor layer 23. The semiconductor core 21 has, at one end thereof, an exposed portion 21a in which the outer peripheral surface of the semiconductor core 21 is exposed. As shown in the cross-sectional view of FIG. 5, the end surface of the other end of the semiconductor core 21 is covered with the quantum well layer 22, the semiconductor layer 23, and the transparent electrode 24. As such, connecting an electrode (or interconnection) to an end of the transparent electrode far from the exposed portion 21a of the semiconductor core 21 can easily prevent short-circuiting between the electrode and the semiconductor core 21, and the electrode (or interconnection) connected to the transparent electrode can be thick or have a large cross-sectional area to enable heat to be dissipated with a good efficiency through the electrode (or interconnection).

Figure 6:
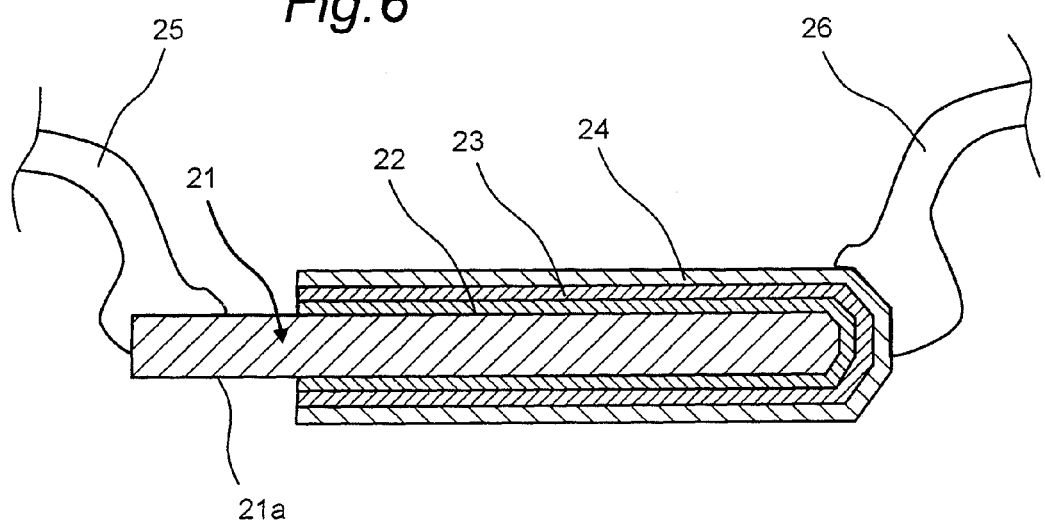
FIG. 6 is a cross-sectional view for illustration of electrode connections of the rod-like light-emitting device.

In the rod-like light-emitting device, as shown in FIG. 6, an n-side electrode 25 is connected to the exposed portion 21a of the semiconductor core 21, and a p-side electrode 26 is connected to the transparent electrode 24 on the other side. The p-side electrode 26 is connected to an end of the transparent electrode 24, and therefore the area obtained by shielding the light emitting region by the electrodes can be minimized to increase the light-extraction efficiency.

In the above rod-like light-emitting device of Embodiment 4, like the rod-like light-emitting device of Embodiment 1, the semiconductor core 21 shaped like a rod is formed by crystal growth of n-type GaN on the substrate made of n-type GaN using the MOCVD device.

The above rod-like light-emitting device of Embodiment 4 has effects similar to those of the rod-like light-emitting device of Embodiment 2.

Forming the transparent electrode 24 so as to cover nearly the whole of the semiconductor layer 23 causes the semiconductor layer 23 to be connected through the transparent electrode 24 to the p-side electrode 26, which allows a wide current path to be formed without a current being concentrated to an electrode connection portion and being unbalanced, so that the whole device can emit light. Thus, the light emitting efficiency is further improved. In particular, with a configuration of a semiconductor core made of an n-type semiconductor and a semiconductor layer made of a p-type semiconductor, the semiconductor layer made of the p-type semiconductor is less likely to increase the impurity concentration, and the resistance is high. However, the transparent electrode allows a wider current path to be formed, so that the whole device can emit light. Thus, the light emitting efficiency is further improved.

While n-type GaN doped with Si and p-type GaN doped with Mg are used in Embodiments 1 to 4 described above, impurities for doping GaN are not limited to this case. For the n type, Ge and the like can be used, and for the p type, Zn and the like can be used.

Note that while, in the above Embodiments 1 to 4, descriptions have been given of the rod-like light-emitting devices in which the semiconductor cores 11 and 21 having rod shapes whose cross-sections are nearly circular are covered with a semiconductor layer and a quantum well layer, this invention may be applied to a rod-like light-emitting device in which, for example, a semiconductor core having a rod shape whose cross-section has the shape of another polygon, such as approximately a hexagon, is covered with a semiconductor layer, a quantum well layer and the like. N-type GaN results in hexagonal crystal growth, and a semiconductor core in the shape of approximately a hexagonal prism is obtained by growing the crystals under the condition where a direction perpendicular to the surface of the substrate is the c-axis direction. Depending on growth conditions such as a growth direction and a growth temperature, the shape of the cross section tends to be nearly circular in cases where the semiconductor core to be grown has a small diameter in the range of from several tens of nanometers to several hundreds of nanometers. In cases where the diameter is large in the range of from about 0.5 μm to several micrometers, it becomes easier to grow the semiconductor core whose cross section is nearly hexagonal.

Figure 7:
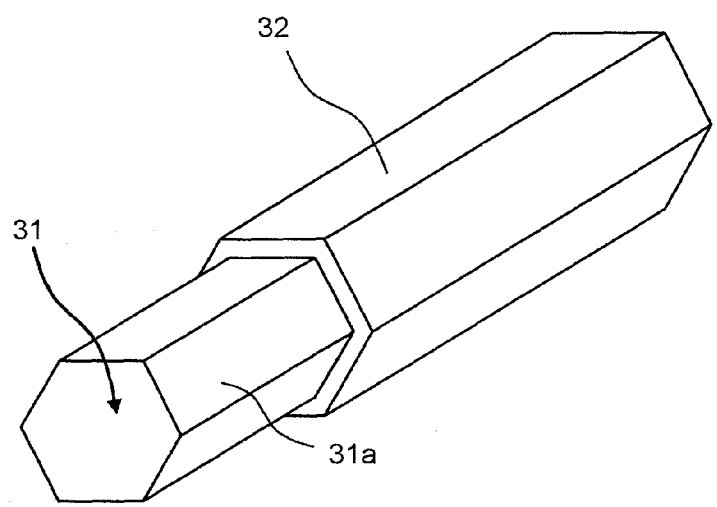
FIG. 7 is a perspective view of another rod-like light-emitting device having a rod shape whose cross section is hexagonal.

For example, as shown in FIG. 7, there are included a semiconductor core 31 made of n-type GaN and having a rod shape whose cross section is nearly hexagonal, and a semiconductor layer 32 made of p-type GaN and formed to cover part of the semiconductor core 31. The semiconductor core 31 has, at one end thereof, an exposed portion 31a in which the outer peripheral surface of the semiconductor core 31 is exposed. The end surface of the other end of the semiconductor core 31 is covered with the semiconductor layer 32.

Figure 8:
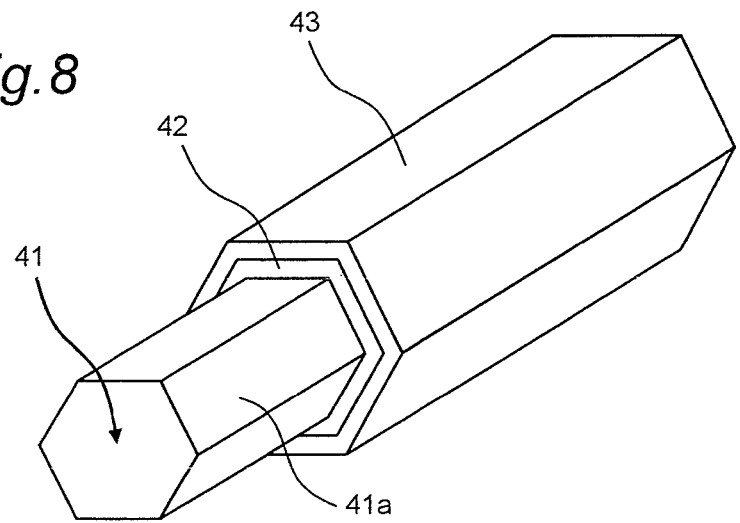
FIG. 8 is a perspective view of another rod-like light-emitting device having a rod shape whose cross section is hexagonal.

As shown in FIG. 8, there are included a semiconductor core 41 made of n-type GaN and having a rod shape whose cross section is nearly hexagonal, a quantum well layer 42 formed to cover part of the semiconductor core 41, and a semiconductor layer 43 made of p-type GaN and formed to cover the quantum well layer 42. The semiconductor core 41 has, at one end thereof, an exposed portion 41a in which the outer peripheral surface of the semiconductor core 41 is exposed. The end surface of the other end of the semiconductor core 41 is covered with the quantum well layer 42 and the semiconductor layer 43.

Figure 9:
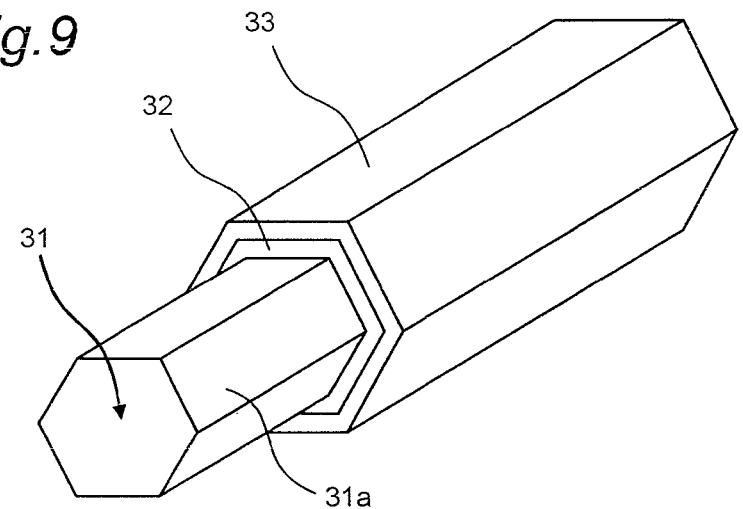
FIG. 9 is a perspective view of another rod-like light-emitting device having a rod shape whose cross section is hexagonal.

As shown in FIG. 9, there are included the semiconductor core 31 made of n-type GaN and having a rod shape whose cross section is nearly circular, the semiconductor layer 32 formed to cover part of the semiconductor core 31, and a transparent electrode 33 made of ITO and formed to cover the semiconductor layer 32. The semiconductor core 31 has, at one end thereof, an exposed portion 31a in which the outer peripheral surface of the semiconductor core 31 is exposed. The end surface of the other end of the semiconductor core 31 is covered with the semiconductor layer 32 and the transparent electrode 33.

Figure 5:
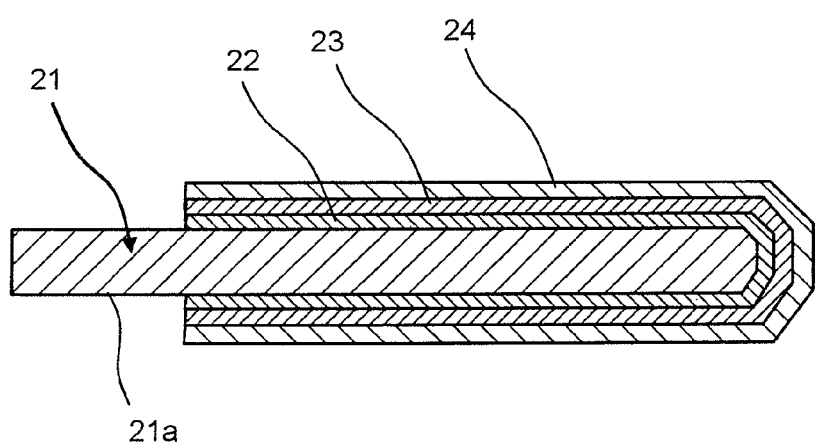
FIG. 5 is a cross-sectional view of the rod-like light-emitting device.
Figure 10:
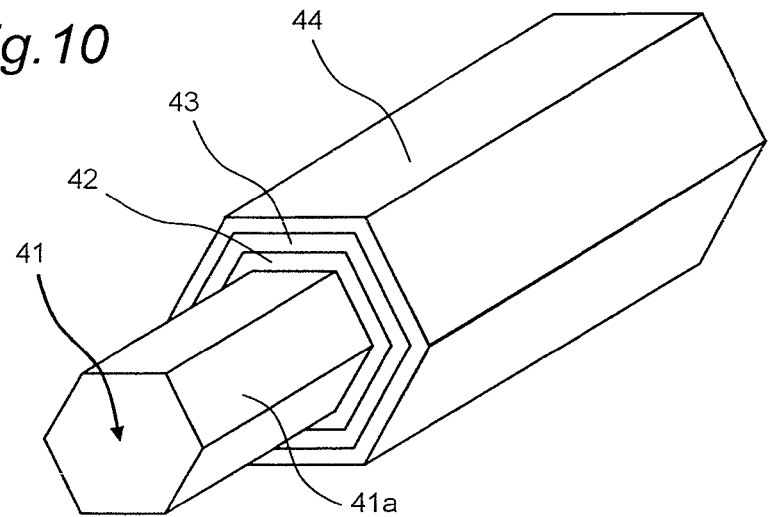
FIG. 10 is a perspective view of another rod-like light-emitting device having a rod shape whose cross section is hexagonal.

As shown in FIG. 10, there are included the semiconductor core 41 made of n-type GaN and having a rod shape whose cross section is nearly circular, the quantum well layer 42 made of p-type InGaN and formed to cover part of the semiconductor core 41, the semiconductor layer 43 made of p-type GaN and formed to cover the quantum well layer 42, and a transparent electrode 44 made of ITO and formed to cover the semiconductor layer 43. The semiconductor core 41 has, at one end thereof, an exposed portion 41a in which the outer peripheral surface of the semiconductor core 41 is exposed. As shown in FIG. 5, the end surface of the other end of the semiconductor core 41 is covered with the quantum well layer 42, the semiconductor layer 43 and the transparent electrode 44.

(Embodiment 5)

Figure 11:
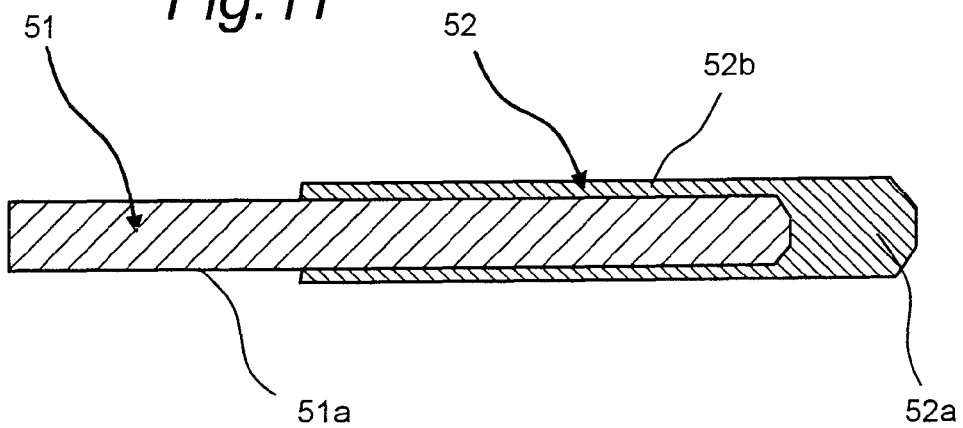
FIG. 11 is a cross-sectional view of a rod-like light-emitting device of Embodiment 5 of this invention.

FIG. 11 is a sectional view of a rod-like light-emitting device of Embodiment 5 of this invention. The rod-like light-emitting device of Embodiment 5, as shown in FIG. 11, includes a semiconductor core 51 made of n-type GaN in a rod shape whose cross section is nearly circular, and a semiconductor layer 52 made of p-type GaN and formed to cover part of the semiconductor core 51. The semiconductor core 51 has, at one end thereof, an exposed portion 51a in which an outer peripheral surface of the semiconductor core 51 is exposed. An end surface of the other end of the semiconductor core 51 is covered with the semiconductor layer 52.

The semiconductor layer 52 is formed such that the thickness in the axial direction of a portion 52a that covers the end surface of the other end of the semiconductor core 51 is larger than the thickness in the radial direction of a portion 52b that covers the outer peripheral surface of the semiconductor core 51.

Figure 12:
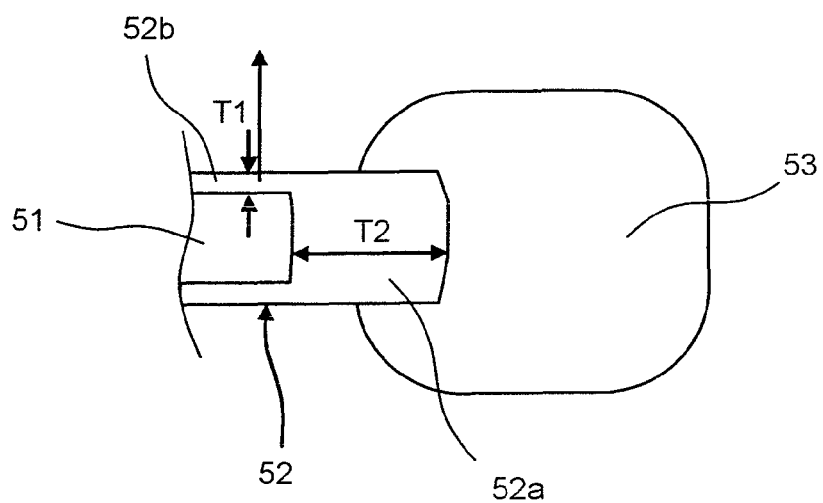
FIG. 12 is a schematic cross-sectional view of a main part of the rod-like light-emitting device.

FIG. 12 is a schematic cross-sectional view of the main part of the above rod-like light-emitting device. In the semiconductor layer 52, a thickness T2 in the axial direction of the portion 52a for covering the end surface of the other end of the semiconductor core 51 is larger than a thickness T1 in the radial direction of the portion 52b for covering the outer peripheral surface of the semiconductor core 51.

Thus, an electrode 53 can be connected to the semiconductor layer 52, which covers the end surface of the other end of the semiconductor core 51, without overlapping the semiconductor core 51. The light-extraction efficiency of the side surface of the semiconductor core 51 can therefore be improved. Also, even in cases where the electrode 53 connected to the semiconductor layer 52 that covers the end surface of the other end of the semiconductor core 51 overlaps the semiconductor core 51, the amount of overlapping can be reduced, and therefore the light-extraction efficiency can be improved. In the semiconductor layer 52, the thickness T2 in the axial direction of the portion 52a covering the end surface of the other end of the semiconductor core 51 is larger than the thickness T1 in the radial direction of the portion 52b covering the outer peripheral surface of the semiconductor core 51, and therefore the portion 52a of the semiconductor layer 52 covering the end surface of the other side of the semiconductor core 51 has a high resistance. As a result, light emitting does not concentrate to the other side of the semiconductor core 51. This can enhance light emitting in a side surface region of the semiconductor core 51, and can reduce or eliminate the leakage current in the portion 52a of the semiconductor layer 52 that covers the end surface of the other end of the semiconductor core 51.

Figure 13:
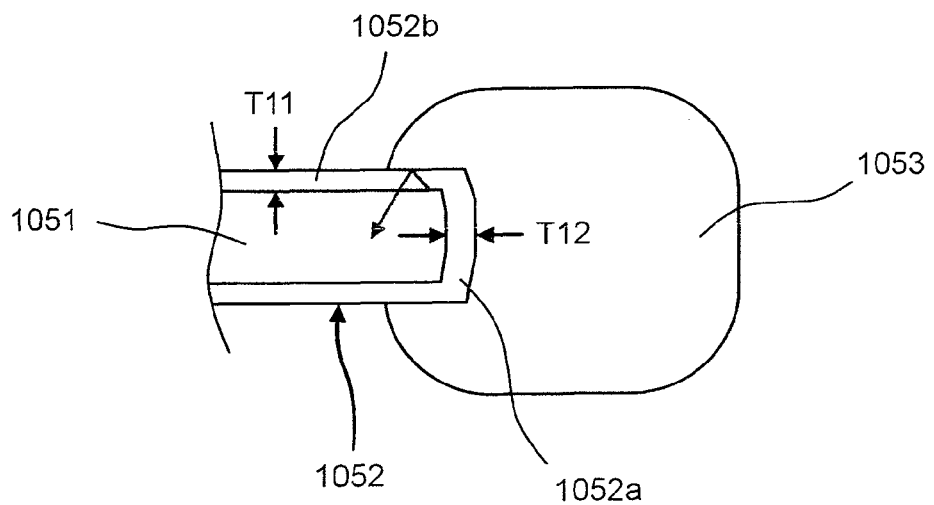
FIG. 13 is a schematic cross-sectional view of a rod-like light-emitting device of a comparative example.

In contrast, for example, as shown in a schematic cross-sectional view of the main part of a rod-like light-emitting device in a comparative example of FIG. 13, when, in a semiconductor layer 1052, a thickness T11 in the radial direction of a portion 1052b covering the outer peripheral surface of a semiconductor core 1051 is approximately the same as a thickness T12 in the axial direction of a portion 1052a covering the end surface of the other end of the semiconductor core 1051, light emission concentrates to the other side of the semiconductor core 1051. Therefore, light emission can be reduced in a side surface region of the semiconductor core 1051, and a leakage current can occur in the portion 1052a of the semiconductor layer 1052 covering the end surface of the other end of the semiconductor core 1051. An electrode 1053 greatly overlaps the semiconductor core 1051, and therefore the light-extraction efficiency decreases.

The above rod-like light-emitting device of Embodiment 5 has effects similar to those of the rod-like light-emitting device of Embodiment 1.

(Embodiment 6)

Figure 14:
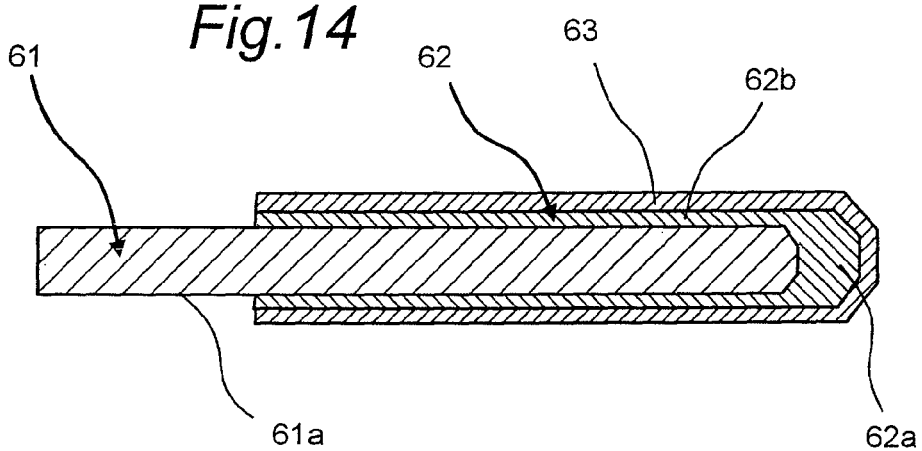
FIG. 14 is a cross-sectional view of a rod-like light-emitting device of Embodiment 6 of this invention.

FIG. 14 is a sectional view of a rod-like light-emitting device of Embodiment 6 of this invention. The rod-like light-emitting device of Embodiment 6, as shown in FIG. 14, includes a semiconductor core 61 made of n-type GaN in a rod shape whose cross section is nearly circular, a quantum well layer 62 made of p-type InGaN and formed to cover part of the semiconductor core 61, and a semiconductor layer 63 made of p-type GaN and formed to cover the quantum well layer 62. The semiconductor core 61 has, at one end thereof, an exposed portion 61a in which the outer peripheral surface of the semiconductor core 61 is exposed. The end surface of the other end of the semiconductor core 61 is covered with the quantum well layer 62 and the semiconductor layer 63.

The quantum well layer 62 is formed such that the thickness in the axial direction of a portion 62a that covers the end surface of the other end of the semiconductor core 61 is larger than the thickness in the radial direction of a portion 62b that covers the outer peripheral surface of the semiconductor core 61.

Figure 15:
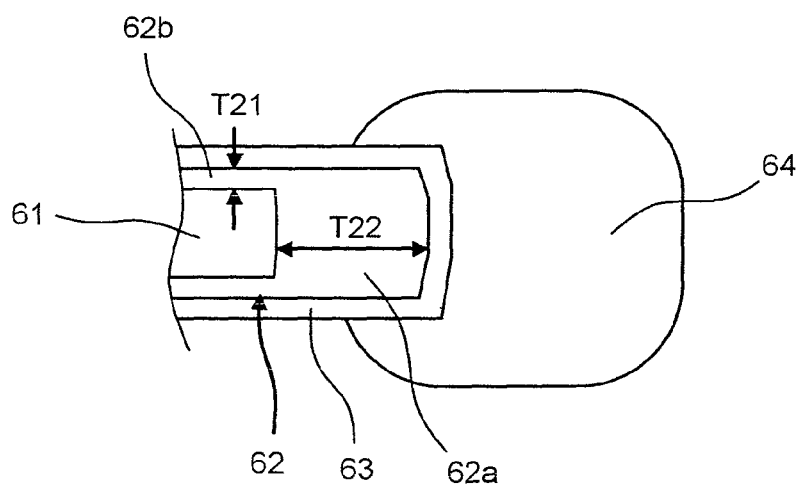
FIG. 15 is a schematic cross-sectional view of a main part of the rod-like light-emitting device.

FIG. 15 is a schematic cross-sectional view of the main part of the above rod-like light-emitting device. In the quantum well layer 62, a thickness T22 in the axial direction of the portion 62a for covering the end surface of the other end of the semiconductor core 61 is larger than a thickness T21 in the radial direction of the portion 62b for covering the outer peripheral surface of the semiconductor core 61.

Thus, an electrode 64 can be connected to the semiconductor layer 63, which covers the end surface of the other end of the semiconductor core 61, without overlapping the semiconductor core 61. The light-extraction efficiency of the side surface of the semiconductor core 61 can therefore be improved. Also, even in cases where the electrode 64 connected to the semiconductor layer 63 that covers the end surface of the other end of the semiconductor core 61 overlaps the semiconductor core 61, the amount of overlapping can be reduced, and therefore the light-extraction efficiency can be improved. In the quantum well layer 62, the thickness T22 in the axial direction of the portion 62a covering the end surface of the other end of the semiconductor core 61 is larger than the thickness T21 in the radial direction of the portion 62b covering the outer peripheral surface of the semiconductor core 61. This can relax electric field concentration that occurs at a corner on the other side of the semiconductor core 61 to improve the breakdown voltage and increase the lifetime of the light-emitting device and can reduce or eliminate the leakage current in the portion 62a of the quantum well layer 62 that covers the end surface of the other end of the semiconductor core 61.

Figure 16:
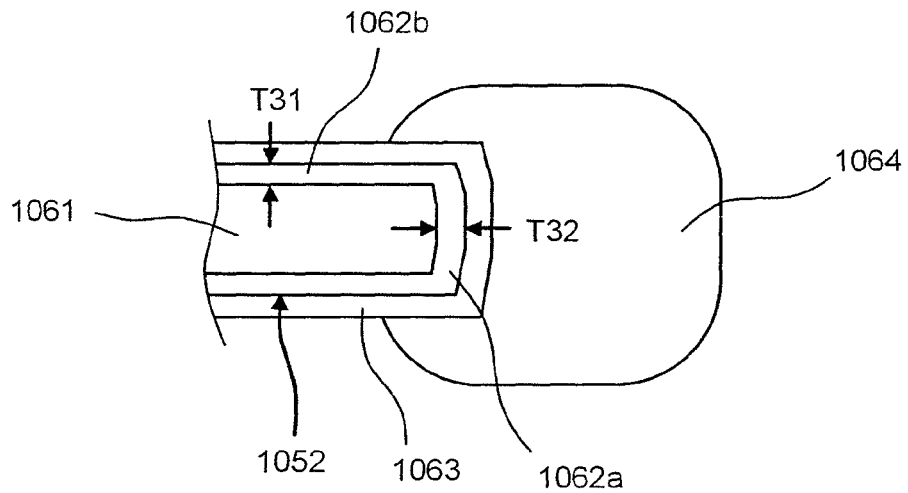
FIG. 16 is a schematic cross-sectional view of a main part of a rod-like light-emitting device of a comparative example.

In contrast, for example, as shown in a schematic cross-sectional view of the main part of a rod-like light-emitting device in a comparative example of FIG. 16, when, in a quantum well layer 1062, a thickness T31 in the radial direction of a portion 1062b covering the outer peripheral surface of a semiconductor core 1061 is approximately the same as a thickness T32 in the axial direction of a portion 1062a covering the end surface of the other end of the semiconductor core 1061, electric field concentration would occur at a corner of the other end of the semiconductor core 1061 so that the breakdown voltage would be lowered. Therefore, light emission can be reduced in a side surface region of the semiconductor core 1061, and a leakage current would occur in the portion 1062a of the quantum well layer 1062 covering the end surface of the other end of the semiconductor core 1061. An electrode 1064 greatly overlaps the semiconductor core 1061, and therefore the light-extraction efficiency decreases.

The above rod-like light-emitting device of Embodiment 6 has effects and advantages similar to those of the rod-like light-emitting device of Embodiment 1.

(Embodiment 7)

FIGS. 17A to 17E are process drawings of a method of manufacturing a rod-like light-emitting device of Embodiment 7 of this invention. In this embodiment, n-type GaN doped with Si and p-type GaN doped with Mg are used. However, the impurity with which GaN is doped is not limited to this.

Figure 17A:
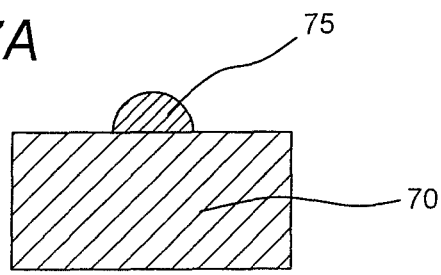
FIG. 17A shows a process step of a method of manufacturing a rod-like light-emitting device of Embodiment 7 of this invention.

First, as shown in FIG. 17A, a catalyst metal island layer 75 is formed on a substrate 70 made of n-type GaN (catalyst metal layer forming step). Materials such as Ni, Fe and Au that dissolve and take in compound semiconductor materials such as Ga, N, In and Al and impurity materials such as Si and Mg, and that are less likely to form compounds with themselves can be used for the catalyst metal layer. To form an island pattern, a catalyst metal layer having a thickness of from about 100 nm to 300 nm is formed on the substrate 70, and then is patterned in the shape of islands of about 1 μm in diameter, in which semiconductor cores are to be grown, at appropriate intervals by way of a lithography method and dry etching.

Figure 17B:
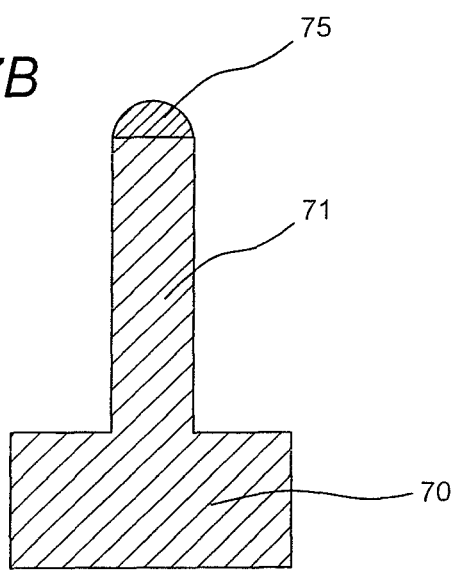
FIG. 17B shows a process step following that of FIG. 17A, showing the method of manufacturing rod-like light-emitting device.

Next, as shown in FIG. 17B, on the substrate 70 on which the catalyst metal island layer 75 is formed, a rod-like semiconductor core 71 made of n-type GaN is formed by crystal growth of n-type GaN from an interface between the catalyst metal island layer 75 and the substrate 70 using a metal organic chemical vapor deposition (MOCVD) device (semiconductor core forming step). The growth temperature is set to about 800° C., trimethylgalium (TMG) and ammonia ($NH_3$) are used as growth gases, and silane ($SiH_4$) for n-type impurity supply and further hydrogen ($H_2$) as a carrier gas are supplied, so that the semiconductor core 71 of n-type GaN with Si used as the impurity can be grown. Here, n-type GaN results in hexagonal crystal growth, and a semiconductor core in the shape of a hexagonal prism is obtained by growing the crystals under the condition where a direction perpendicular to the surface of the substrate 70 is the c-axis direction.

Figure 17C:
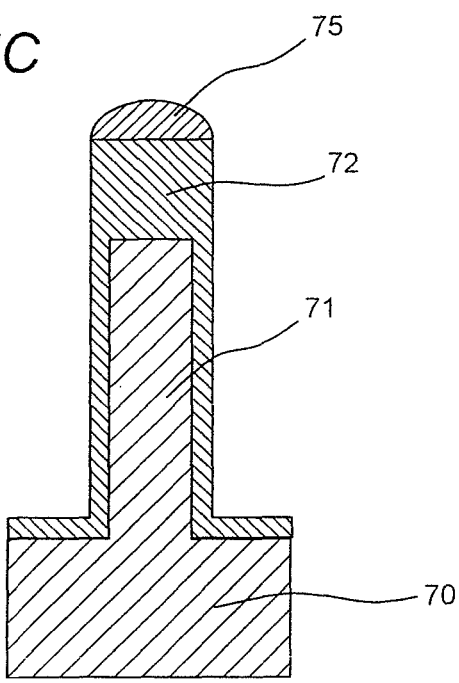
FIG. 17C shows a process step following that of FIG. 17B, showing the method of manufacturing rod-like light-emitting device.

Next, as shown in FIG. 17C, with the catalyst metal island layer 75 maintained at the tip of the semiconductor core 71, a semiconductor layer 72 made of p-type GaN is formed through crystal growth from the outer peripheral surface of the semiconductor core 71 and from an interface between the semiconductor core 71 and the catalyst metal island layer 75 such that semiconductor layer 72 covers the semiconductor core 71 ("semiconductor layer forming step"). In the semiconductor layer forming step, the growth temperature is set to about 900° C., trimethylgalium (TMG) and ammonia ($NH_3$) are used as growth gases, and bis(cyclopentadienyl)magnesium ($Cp_2Mg$) is used for p-type impurity supply, so that p-type GaN with magnesium (Mg) used as the impurity can be grown.

Figure 17D:
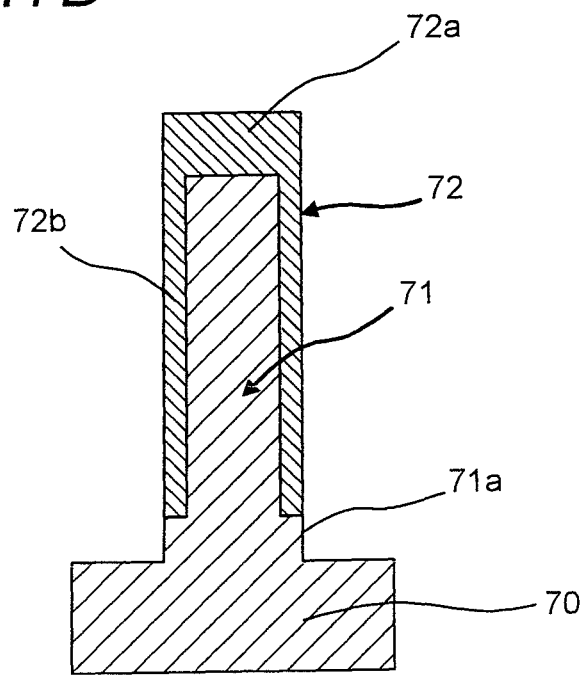
FIG. 17D shows a process step following that of FIG. 17C, showing the method of manufacturing rod-like light-emitting device.

Next, as shown in FIG. 17D, the outer peripheral surface on the side of the substrate 70 of the semiconductor core 71 is exposed by dry etching (exposing step). At this point, the catalyst metal island layer 75 is removed, and part of the upper end of the semiconductor core 71 is removed. In connection with the semiconductor layer 72, the thickness in the axial direction of a portion 72a thereof covering the end surface of an end of the semiconductor core 71 is larger than the thickness in the radial direction of a portion 72b thereof covering the outer peripheral surface of the end of the semiconductor core 71. In the exposing step, the use of $SiCl_4$ for reactive ion etching (RIE), which is dry etching, allows GaN to be anisotropically etched with ease.

Figure 17E:
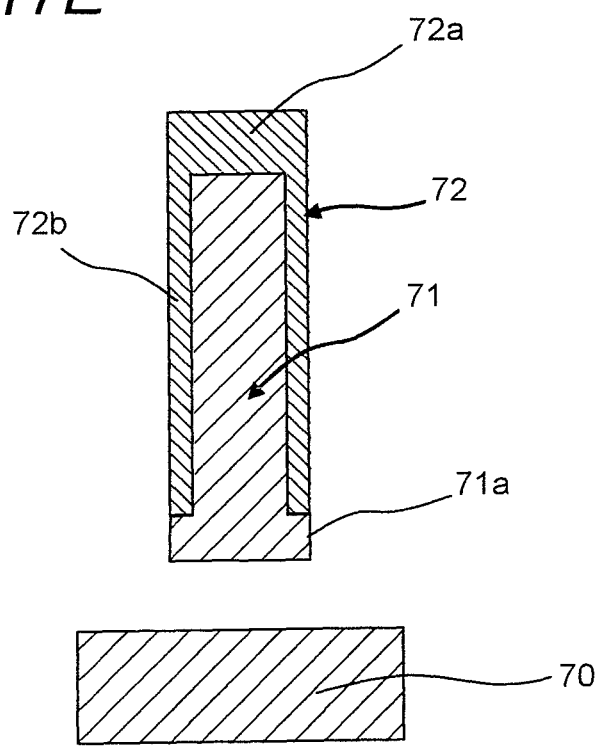
FIG. 17E shows a process step following that of FIG. 17D, showing the method of manufacturing rod-like light-emitting device.

Next, in a separating step, the substrate is immersed in an isopropyl alcohol (IPA) aqueous solution, and is vibrated along the plane of the substrate 70 using ultrasonic waves (e.g., several tens of kilo-hertz). This causes stress to act on the semiconductor core 71 covered with the semiconductor layer 72 so as to bend the root close to the substrate 70 of the semiconductor core 71 that erects on the substrate 70. As a result, as shown in FIG. 17E, the semiconductor core 71 covered with the semiconductor layer 72 is separated from the substrate 70.

In this way, the microscopic rod-like light-emitting device that is separated from the substrate 70 can be manufactured. In Embodiment 7, the rod-like light-emitting device has a diameter of 1 μm and a length of 10 μm (in FIGS. 17A to 17E, the length of the rod-like light-emitting device is drawn shorter for the sake of clarity).

Moreover, in the rod-like light-emitting device described above, crystal growth of the semiconductor layer occurs radially outward from the outer peripheral surface of the semiconductor core 71. The growth distance in the radial direction is short and the defect deviates outward, and therefore the semiconductor core 71 can be covered with the semiconductor layer 72 having less crystal defects. Accordingly, a rod-like light-emitting device having good characteristics can be implemented.

In the rod-like light-emitting device separated from the substrate 70 in this way, with one electrode connected to an exposed portion 71a of the semiconductor core 71 and with the other electrode connected to the semiconductor layer 72, a current is caused to flow between the electrodes to result in recombination of electrons and holes in a pn junction between the outer peripheral surface of the semiconductor core 71 and the inner peripheral surface of the semiconductor layer 72. Thus, light is emitted from the pn junction.

In the above semiconductor layer forming step, under the condition where the catalyst metal island layer 75 is held at a tip of the semiconductor core 71 without removal of the catalyst metal island layer 75, the p-type semiconductor layer 72 covering the surface of the semiconductor core 71 is formed. This facilitates crystal growth from an interface between the catalyst metal layer 75 and the semiconductor core 71 rather than that from the outer peripheral surface of the semiconductor core 71. Therefore, the semiconductor layer 72 in which the thickness in the axial direction of the portion 72a covering the end surface of the other end of the semiconductor core 71 is larger than the thickness in the radial direction of the portion 72b covering the outer peripheral surface of the semiconductor core 71 can be easily formed.

With the fabricating method, a microscopic rod-like light-emitting device having great freedom in installing in an apparatus can be manufactured. The term "microscopic rod-like light-emitting device" as used herein refers to a device, for example, with the size of the order of micrometers in which the diameter is 1 μm and the length is 10 μm, or with the size in the order of nanometers in which at least the diameter of the diameter and the length is less than 1 μm. The rod-like light-emitting device mentioned above allows a decrease in the amount of semiconductor used. This makes it possible to reduce the thickness and weight of an apparatus using the light-emitting device. Also because light is emitted from the whole periphery of the semiconductor core covered with the semiconductor layer, the light-emitting device is allowed to have an expanded light emitting region. This makes it possible to implement a backlight, an illuminating device and a display device that have high light emitting efficiencies and low power consumption.

Note that, before the semiconductor layer forming step to form the semiconductor layer 72, a quantum well layer may be formed to cover the surface of the semiconductor core 71, under the condition where the catalyst metal island layer 75 is held at the tip of the semiconductor core 71 without removal of the catalyst metal island layer 75. Thus, a quantum well layer in which the thickness in the axial direction of a portion covering the end surface of the other end of a semiconductor core is larger than the thickness in the radial direction of a portion covering the outer peripheral surface of the semiconductor core can be easily formed.

The above rod-like light-emitting device of Embodiment 7 has effects similar to those of the rod-like light-emitting device of Embodiment 5.

In the semiconductor layer 72, the thickness in the axial direction of the portion 72a covering the end surface of the other end of the semiconductor core 71 is larger than the thickness in the radial direction of the portion 72b covering the outer peripheral surface of the semiconductor core 71. As a result, an electrode to be connected to the side of the semiconductor layer 72 covering the end surface of the other end of the semiconductor core 71 can be connected just to the portion 72a of the semiconductor layer 72 without overlapping up to the position of the end surface of the other end of the semiconductor core 71. Therefore, the light-extraction efficiency of the whole side surface of the semiconductor core 71 can be improved. In the semiconductor layer 72, the thickness in the axial direction of the portion 72a covering the end surface of the other end of the semiconductor core 71 is larger than the thickness in the radial direction of the portion 72b covering the outer peripheral surface of the semiconductor core 71. Therefore, the portion 72a of the semiconductor layer 72 covering the end surface of the other end of the semiconductor core 71 has a high resistance. As a result, light emitting does not concentrate to the other side of the semiconductor core 71. This can enhance light emitting in a side surface region of the semiconductor core 71, and can reduce or eliminate the leakage current in the portion 72a of the semiconductor layer 72 that covers the end surface of the other end of the semiconductor core 71.

(Embodiment 8)

FIGS. 18A to 18D are process drawings of a method of manufacturing a rod-like light-emitting device of Embodiment 8 of this invention. In this embodiment, n-type GaN doped with Si and p-type GaN doped with Mg are used. However, the impurity with which GaN is doped is not limited to this.

Figure 18A:
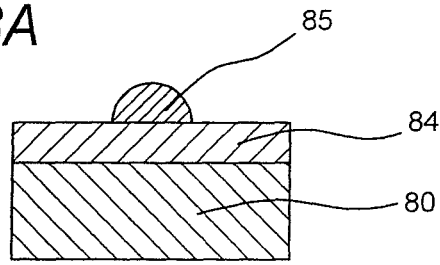
FIG. 18A shows a process step of a method of manufacturing rod-like light-emitting device of Embodiment 8 of this invention.

First, as shown in FIG. 18A, a semiconductor film 84 made of n-type GaN is formed on an underlying substrate 80, and an catalyst metal island layer 85 is formed on the semiconductor film 84 (catalyst metal layer forming step). Materials such as Ni, Fe and Au that dissolve and take in compound semiconductor materials such as Ga, N, In and Al and impurity materials such as Si and Mg, and that are less likely to form compounds with themselves can be used for the catalyst metal layer. To form an island pattern, a catalyst metal layer having a thickness of from about 100 nm to 300 nm is formed on the semiconductor film 84, and then is patterned in the shape of islands of about 1 μm in diameter, in which semiconductor cores are to be grown, at appropriate intervals by way of a lithography method and dry etching.

Figure 18B:
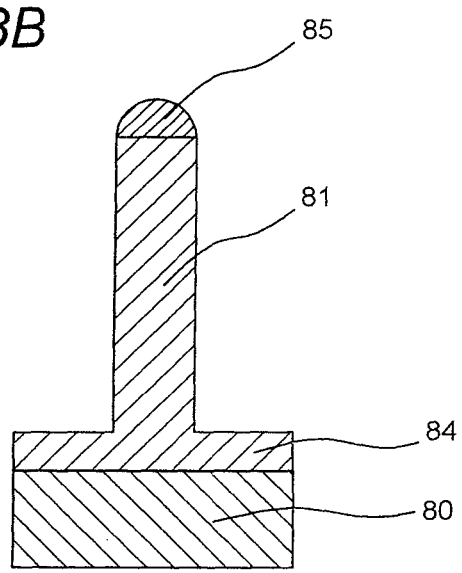
FIG. 18B shows a process step following that of FIG. 18A, showing the method of manufacturing rod-like light-emitting device.

Next, as shown in FIG. 18B, on the semiconductor film 84 on which the catalyst metal island layer 85 is formed, a rod-like semiconductor core 81 made of n-type GaN is formed by crystal growth of n-type GaN from an interface between the catalyst metal island layer and the semiconductor film 84 using an MOCVD device ("semiconductor core forming step"). The growth temperature is set to about 800° C., trimethylgalium (TMG) and ammonia ($NH_3$) are used as growth gases, and silane ($SiH_4$) for n-type impurity supply and further hydrogen ($H_2$) as a carrier gas are supplied, so that the semiconductor core 81 of n-type GaN with Si used as the impurity can be grown. Here, n-type GaN results in hexagonal crystal growth, and a semiconductor core in the shape of a hexagonal prism is obtained by growing the crystals under the condition where a direction perpendicular to the surface of the semiconductor film 84 is the c-axis direction.

Figure 18C:
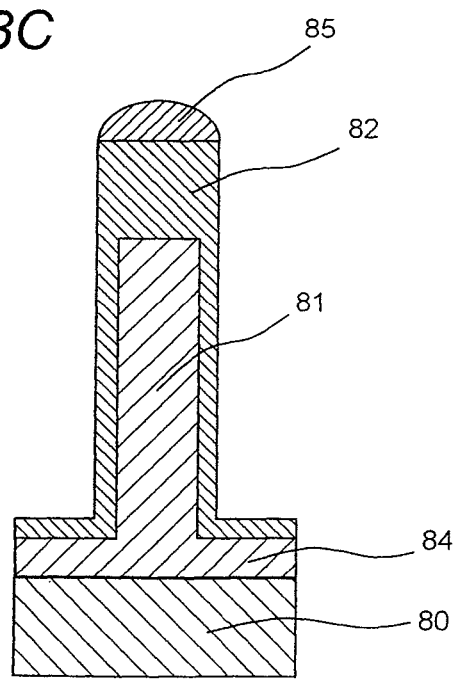
FIG. 18C shows a process step following that of FIG. 18B, showing the method of manufacturing rod-like light-emitting device.

Next, as shown in FIG. 18C, with the catalyst metal island layer 85 maintained at the tip of the semiconductor core 81, a semiconductor layer 82 made of p-type GaN is formed through crystal growth from the outer peripheral surface of the semiconductor core 81 and from an interface between the semiconductor core 81 and the catalyst metal island layer 85 such that semiconductor layer 82 covers the semiconductor core 81 ("semiconductor layer forming step"). In the semiconductor layer forming step, the growth temperature is set to about 900° C., trimethylgalium (TMG) and ammonia ($NH_3$) are used as growth gases, and bis(cyclopentadienyl)magnesium ($Cp_2Mg$) is used for p-type impurity supply, so that p-type GaN with magnesium (Mg) used as the impurity can be grown.

Figure 18D:
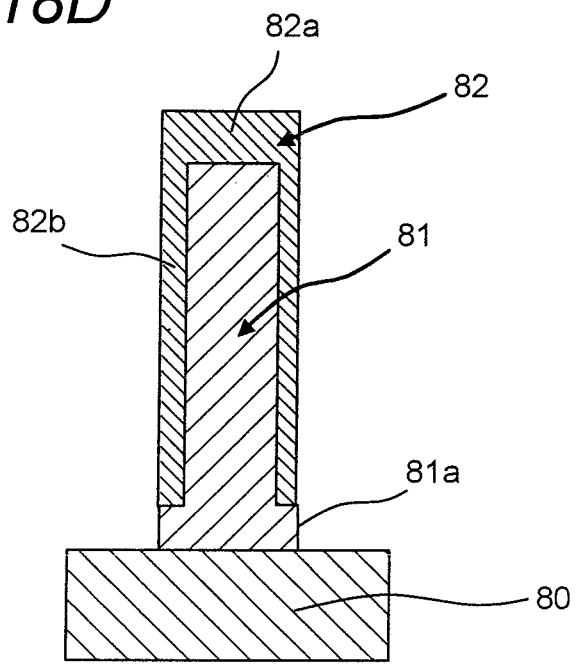
FIG. 18D shows a process step following that of FIG. 18C, showing the method of manufacturing rod-like light-emitting device.

Next, as shown in FIG. 18D, the surface of the underlying substrate 80 and the outer peripheral surface on the side of the underlying substrate 80 of the semiconductor core 81 are exposed by dry etching ("exposing step"). At this point, the catalyst metal island layer 75 is removed, and part of the upper end of the semiconductor core 71 is removed. In connection with the semiconductor layer 72, the thickness in the axial direction of a portion 72a thereof covering the end surface of the other end of the semiconductor core 71 is larger than the thickness in the radial direction of a portion 72b covering the outer peripheral surface of the semiconductor core 71. In the exposing step, the use of $SiCl_4$ for RIE, which is dry etching, allows GaN to be anisotropically etched with ease.

Figure 18E:
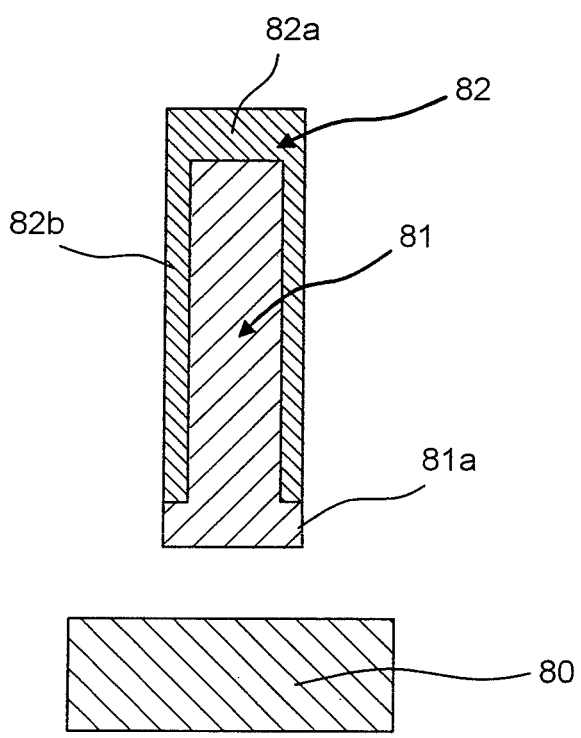
FIG. 18E shows a process step following that of FIG. 18D, showing the method of manufacturing rod-like light-emitting device.

Next, in a separating step, the substrate is immersed in an isopropyl alcohol (IPA) aqueous solution, and is vibrated along the plane of the substrate 70 using ultrasonic waves (e.g., several tens of kilo-hertz). This causes stress to act on the semiconductor core 81 covered with the semiconductor layer 82 so as to bend the root close to the underlying substrate 80 of the semiconductor core 81 that erects on the underlying substrate 80. As a result, as shown in FIG. 18E, the semiconductor core 81 covered with the semiconductor layer 82 is separated from the underlying substrate 80.

In this way, the microscopic rod-like light-emitting device that is separated from the underlying substrate 80 can be manufactured. In Embodiment 8, the rod-like light-emitting device has a diameter of 1 μm and a length of 10 μm (in FIGS. 18A to 18E, the length of the rod-like light-emitting device is drawn shorter for the sake of clarity).

Moreover, in the rod-like light-emitting device described above, crystal growth of the semiconductor layer occurs radially outward from the outer peripheral surface of the semiconductor core 81. The growth distance in the radial direction is short and the defect deviates outward, and therefore the semiconductor core 81 can be covered with the semiconductor layer 82 having less crystal defects. Accordingly, a rod-like light-emitting device having good characteristics can be implemented.

In the rod-like light-emitting device separated from the underlying substrate 80 in this way, with one electrode connected to an exposed portion 81a of the semiconductor core 81 and with the other electrode connected to the semiconductor layer 82, a current is caused to flow between the electrodes to result in recombination of electrons and holes in a pn junction between the outer peripheral surface of the semiconductor core 81 and the inner peripheral surface of the semiconductor layer 82. Thus, light is emitted from the pn junction.

In the above semiconductor layer forming step, under the condition where the catalyst metal island layer 85 is held at a tip of the semiconductor core 81 without removal of the catalyst metal island layer 85, the p-type semiconductor layer 82 covering the surface of the semiconductor core 81 is formed. This facilitates crystal growth from an interface between the catalyst metal layer 85 and the semiconductor core 81 rather than that from the outer peripheral surface of the semiconductor core 81. Therefore, the semiconductor layer 82 in which the thickness in the axial direction of the portion 82a covering the end surface of the other end of the semiconductor core 81 is larger than the thickness in the radial direction of the portion 82b covering the outer peripheral surface of the semiconductor core 81 can be easily formed.

With the fabricating method, a microscopic rod-like light-emitting device having great freedom in installing in an apparatus can be manufactured. The term "microscopic rod-like light-emitting device" as used herein refers to a device, for example, with the size of the order of micrometers in which the diameter is 1 μm and the length is 10 μm, or with the size in the order of nanometers in which at least the diameter of the diameter and the length is less than 1 μm. The rod-like light-emitting device mentioned above allows a decrease in the amount of semiconductor used. This makes it possible to reduce the thickness and weight of an apparatus using the light-emitting device. Also because light is emitted from the whole periphery of the semiconductor core covered with the semiconductor layer, the light-emitting device is allowed to have an expanded light emitting region. This makes it possible to implement a backlight, an illuminating device and a display device that have high light emitting efficiencies and low power consumption.

The outer peripheral surface of the semiconductor layer 82 and the outer peripheral surface of the exposed portion 81*a* of the semiconductor core 81 are continuous with each other without a step. Therefore, when the microscopic rod-like light-emitting device that has been separated is mounted on an insulating substrate having an electrode formed thereon such that the axial direction of the device is parallel to the plane of the substrate, the exposed portion 81*a* of the semiconductor core 81 can be reliably and easily connected with the electrode because no step exists between the outer peripheral surface of the semiconductor layer 82 and the outer peripheral surface of the exposed portion 81*a* of the semiconductor core 81.

Note that, before the semiconductor layer forming step to form the semiconductor layer 82, a quantum well layer may be formed to cover the surface of the semiconductor core 81, under the condition where the catalyst metal island layer 85 is held at the tip of the semiconductor core 81 without removal of the catalyst metal island layer 85. Thus, a quantum well layer in which the thickness in the axial direction of a portion covering the end surface of the other end of a semiconductor core is larger than the thickness in the radial direction of a portion covering the outer peripheral surface of the semiconductor core can be easily formed.

The above rod-like light-emitting device of Embodiment 8 has effects similar to those of the rod-like light-emitting device of Embodiment 5.

In the semiconductor layer 82, the thickness in the axial direction of the portion 82*a* covering the end surface of the other end of the semiconductor core 81 is larger than the thickness in the radial direction of the portion 82*b* covering the outer peripheral surface of the semiconductor core 81. As a result, an electrode to be connected to the side of the semiconductor layer 82 covering the end surface of the other end of the semiconductor core 81 can be connected just to the portion 82*a* of the semiconductor layer 82 without overlapping up to the position of the end surface of the other end of the semiconductor core 81. Therefore, the light-extraction efficiency of the whole side surface of the semiconductor core 81 can be improved. In the semiconductor layer 82, the thickness in the axial direction of the portion 82*a* covering the end surface of the other end of the semiconductor core 81 is larger than the thickness in the radial direction of the portion 82*b* covering the outer peripheral surface of the semiconductor core 81. Therefore, the portion 82*a* of the semiconductor layer 82 covering the end surface of the other end of the semiconductor core 81 has a high resistance. As a result, light emitting does not concentrate to the other side of the semiconductor core 81. This can enhance light emitting in a side surface region of the semiconductor core 81, and can reduce or eliminate the leakage current in the portion 82*a* of the semiconductor layer 82 that covers the end surface of the other end of the semiconductor core 81.

(Embodiment 9)

FIGS. 19A to 19E are process drawings of a method of manufacturing a rod-like light-emitting device of Embodiment 9 of this invention. In this embodiment, n-type GaN doped with Si and p-type GaN doped with Mg are used. However, the impurity with which GaN is doped is not limited to this.

Figure 19A:
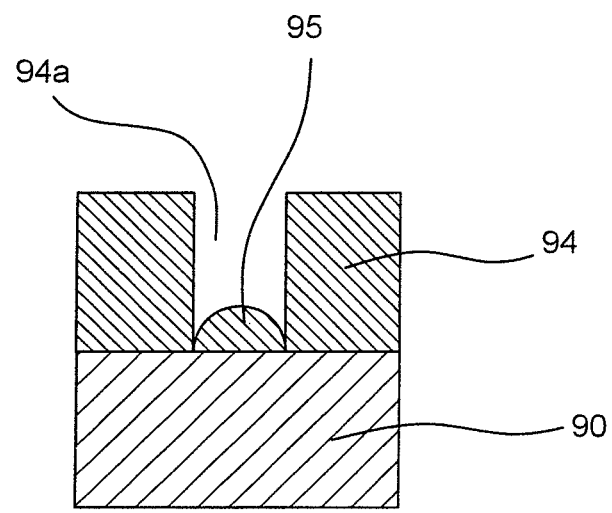
FIG. 19A shows a process step of a method of manufacturing rod-like light-emitting device of Embodiment 9 of this invention.

First, as shown in FIG. 19A, a mask 94 having a growth hole 94*a* is formed on a substrate 90 made of n-type GaN. For the mask 94, a material capable of selectively etching the semiconductor core and the semiconductor layer, such as silicon oxide ($SiO_2$) or silicon nitride ($Si_3N_4$), can be used. To form the growth hole 94*a*, known lithography and dry etching methods that are used for usual semiconductor processes can be used. At this point, the diameter of the semiconductor core to be grown depends on the size of the growth hole 94*a* of the mask 94.

Next, an catalyst metal island layer 95 is formed on the substrate 90 exposed through the growth hole 94*a* of the mask 94 (catalyst metal layer forming step). Materials such as Ni, Fe and Au that dissolve and take in compound semiconductor materials such as Ga, N, In and Al and impurity materials such as Si and Mg, and that are less likely to form compounds with themselves can be used for the catalyst metal layer. The catalyst metal island layer 95 on the substrate 90 exposed in the growth hole 94*a* is obtained in such a way that, with a resist (not shown) that has been used for the formation of the growth hole 94*a* by the lithography and dry etching methods remaining on the mask 94, a catalyst metal layer having a thickness of from about 100 nm to 300 nm is formed on the resist and the substrate 90, and the catalyst metal layer on the resist as well as the resist are removed by a lift-off method.

Figure 19B:
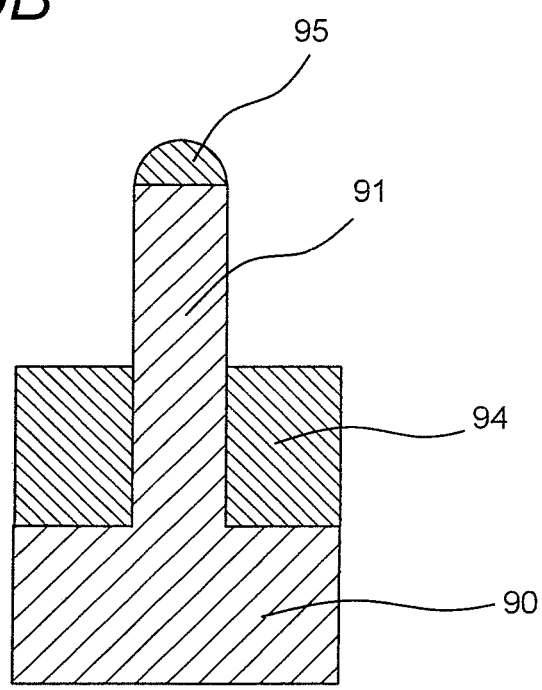
FIG. 19B shows a process step following that of FIG. 19A, showing the method of manufacturing rod-like light-emitting device.

Next, as shown in FIG. 19B, on the substrate 90 on which the catalyst metal island layer 95 is formed, a rod-like semiconductor core 91 made of n-type GaN is formed by crystal growth of n-type GaN from an interface between the catalyst metal island layer 95 and the substrate 90 using a MOCVD device ("semiconductor core forming step"). The growth temperature is set to about 800° C., trimethylgalium (TMG) and ammonia ($NH_3$) are used as growth gases, and silane ($SiH_4$) for n-type impurity supply and further hydrogen ($H_2$) as a carrier gas are supplied, so that the semiconductor core 91 of n-type GaN with Si used as the impurity can be grown. Here, n-type GaN results in hexagonal crystal growth, and a semiconductor core in the shape of a hexagonal prism is obtained by growing the crystals under the condition where a direction perpendicular to the surface of the substrate 90 is the c-axis direction.

Figure 19C:
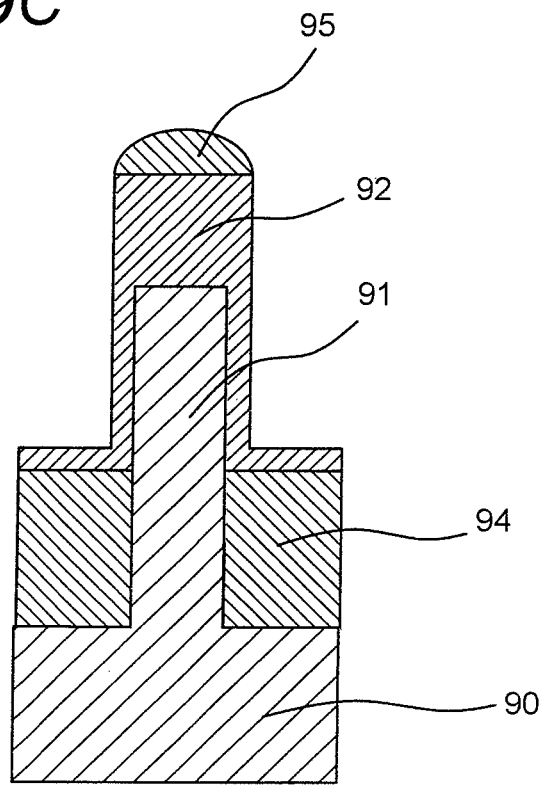
FIG. 19C shows a process step following that of FIG. 19B, showing the method of manufacturing rod-like light-emitting device.

Next, as shown in FIG. 19C, with the catalyst metal island layer 95 maintained at the tip of the semiconductor core 91, a semiconductor layer 92 made of p-type GaN is formed through crystal growth from the outer peripheral surface of the semiconductor core 91 and from an interface between the semiconductor core 91 and the catalyst metal island layer 95 such that semiconductor layer 92 covers the semiconductor core 91 ("semiconductor layer forming step"). In the semiconductor layer forming step, the growth temperature is set to about 900° C., trimethylgalium (TMG) and ammonia ($NH_3$) are used as growth gases, and bis(cyclopentadienyl)magnesium ($Cp_2Mg$) is used for p-type impurity supply, so that p-type GaN with magnesium (Mg) used as the impurity can be grown.

Figure 19D:
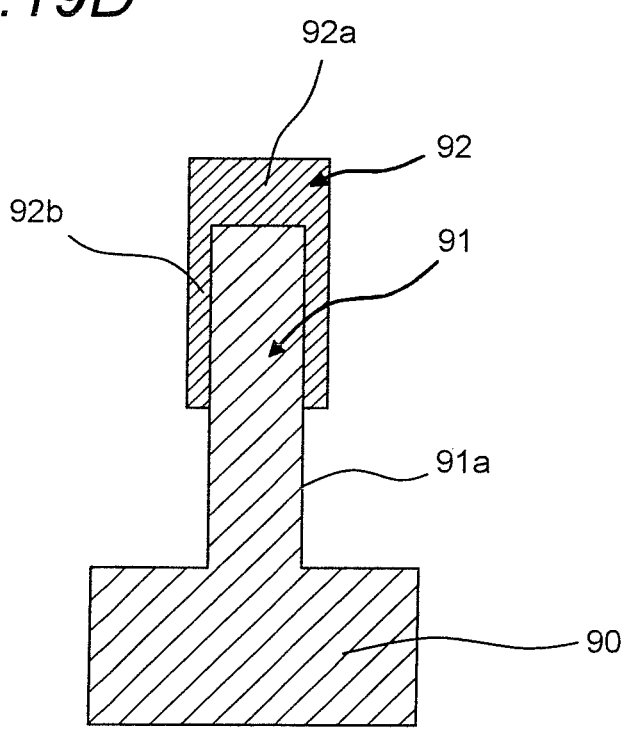
FIG. 19D shows a process step following that of FIG. 19C, showing the method of manufacturing rod-like light-emitting device.

Next, as shown in FIG. 19D, in an exposing step, all of the region of the semiconductor layer 92, except for a portion thereof covering the semiconductor core 91, and the mask 94 (shown in FIG. 19C) are removed by etching to expose the outer peripheral surface on the side of the substrate 90 of the rod-like semiconductor core 91, which results in formation of an exposed portion 91*a*. Under this condition, the catalyst metal island layer 95 is removed, and part of the upper end of the semiconductor core 91 is removed. In the semiconductor layer 92, the thickness in the axial direction of a portion 92*a* covering the end surface of the other end of the semiconductor core 91 is larger than the thickness in the radial direction of a portion 92*b* covering the outer peripheral surface of the semiconductor core 91.

In the case where a mask is made of silicon oxide (SiO$_2$) or silicon nitride (Si$_3$N$_4$), use of a solution containing hydrofluoric acid (HF) enables the mask to be easily etched without affecting the semiconductor core and the semiconductor layer portion covering the semiconductor core, and enables the mask together with the semiconductor layer on the mask (all of the region of the semiconductor layer except for a portion thereof covering the semiconductor core) to be removed by lift-off. In the exposing step of this embodiment, dry etching using CF$_4$ and XeF$_2$ enables the mask to be easily etched without affecting the semiconductor core and the semiconductor layer portion covering the semiconductor core, so that the semiconductor layer (all of the region of the semiconductor layer except for the portion thereof covering the semiconductor core) on the mask as well as the mask can be removed.

Figure 19E:
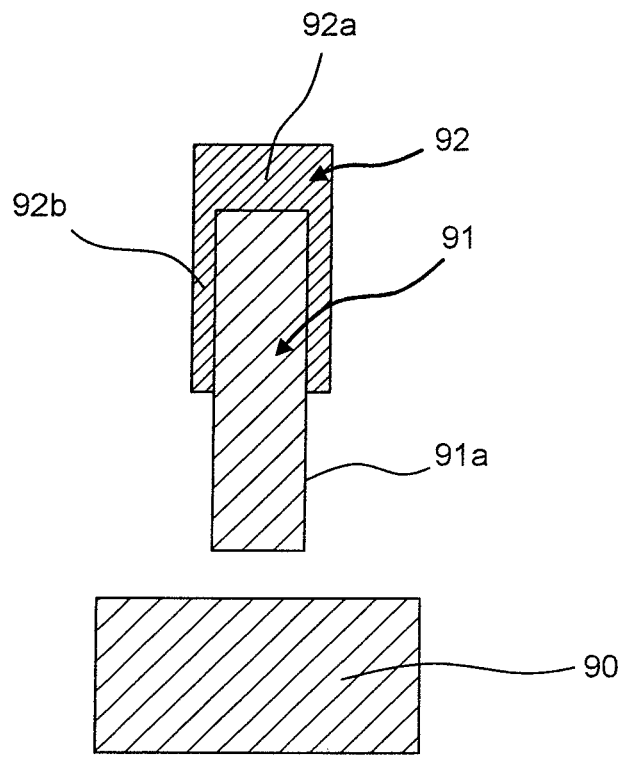
FIG. 19E shows a process step following that of FIG. 19D, showing the method of manufacturing rod-like light-emitting device.

Next, in a separating step, the substrate is immersed in an isopropyl alcohol (IPA) aqueous solution, and is vibrated along the plane of the substrate 90 using ultrasonic waves (e.g., several tens of kilo-hertz). This causes stress to act on the semiconductor core 91 covered with the semiconductor layer 92 so as to bend the root close to the substrate 90 of the semiconductor core 91 that erects on the substrate 90. As a result, as shown in FIG. 19E, the semiconductor core 91 covered with the semiconductor layer 92 is separated from the substrate 90.

In this way, the microscopic rod-like light-emitting device that is separated from the substrate 90 can be manufactured. In Embodiment 9, the rod-like light-emitting device has a diameter of 1 μm and a length of 10 μm (in FIGS. 19A to 19E, the length of the rod-like light-emitting device is drawn shorter for the sake of clarity).

Moreover, in the rod-like light-emitting device described above, crystal growth of the semiconductor layer 92 occurs radially outward from the outer peripheral surface of the semiconductor core 91. The growth distance in the radial direction is short and the defect deviates outward, and therefore the semiconductor core 91 can be covered with the semiconductor layer 92 having less crystal defects. Accordingly, a rod-like light-emitting device having good characteristics can be implemented.

In the rod-like light-emitting device separated from the substrate 90 in this way, with one electrode connected to an exposed portion 91a of the semiconductor core 91 and with the other electrode connected to the semiconductor layer 92, a current is caused to flow between the electrodes to result in recombination of electrons and holes in a pn junction between the outer peripheral surface of the semiconductor core 91 and the inner peripheral surface of the semiconductor layer 92. Thus, light is emitted from the pn junction.

In the above semiconductor layer forming step, under the condition where the catalyst metal island layer 95 is held at a tip of the semiconductor core 91 without removal of the catalyst metal island layer 95, the p-type semiconductor layer 92 covering the surface of the semiconductor core 91 is formed. This facilitates crystal growth from an interface between the catalyst metal layer 95 and the semiconductor core 91 rather than that from the outer peripheral surface of the semiconductor core 91. Therefore, the semiconductor layer 92 in which the thickness in the axial direction of the portion 92a covering the end surface of the other end of the semiconductor core 91 is larger than the thickness in the radial direction of the portion 92b covering the outer peripheral surface of the semiconductor core 91 can be easily formed.

With this fabricating method, a microscopic rod-like light-emitting device having great freedom in installing in an apparatus can be manufactured. The term "microscopic rod-like light-emitting device" as used herein refers to a device, for example, with the size of the order of micrometers in which the diameter is 1 μm and the length is 10 μm, or with the size in the order of nanometers in which at least the diameter of the diameter and the length is less than 1 μm. The rod-like light-emitting device mentioned above allows a decrease in the amount of semiconductor used. This makes it possible to reduce the thickness and weight of an apparatus using the light-emitting device. Also because light is emitted from the whole periphery of the semiconductor core covered with the semiconductor layer, the light-emitting device is allowed to have an expanded light emitting region. This makes it possible to implement a backlight, an illuminating device and a display device that have high light emitting efficiencies and low power consumption.

Note that, before the semiconductor layer forming step to form the semiconductor layer 92, a quantum well layer may be formed to cover the surface of the semiconductor core 91, under the condition where the catalyst metal island layer 95 is held at the tip of the semiconductor core 91 without removal of the catalyst metal island layer 95. Thus, a quantum well layer in which the thickness in the axial direction of a portion covering the end surface of the other end of a semiconductor core is larger than the thickness in the radial direction of a portion covering the outer peripheral surface of the semiconductor core can be easily formed.

The above rod-like light-emitting device of Embodiment 9 has effects similar to those of the rod-like light-emitting device of Embodiment 5.

In the semiconductor layer 92, the thickness in the axial direction of the portion 92a covering the end surface of the other end of the semiconductor core 91 is larger than the thickness in the radial direction of the portion 92b covering the outer peripheral surface of the semiconductor core 91. As a result, an electrode to be connected to the side of the semiconductor layer 92 covering the end surface of the other end of the semiconductor core 91 can be connected just to the semiconductor layer 92 without overlapping up to the position of the end surface of the other end of the semiconductor core 91. Therefore, the light-extraction efficiency of the whole side surface of the semiconductor core 91 can be improved. In the semiconductor layer 92, the thickness in the axial direction of the portion 92a covering the end surface of the other end of the semiconductor core 91 is larger than the thickness in the radial direction of the portion 92b covering the outer peripheral surface of the semiconductor core 91. Therefore, the portion 92a of the semiconductor layer 92 covering the end surface of the other end of the semiconductor core 91 has a high resistance. As a result, light emitting does not concentrate to the other side of the semiconductor core 91. This can enhance light emitting in a side surface region of the semiconductor core 91, and can reduce or eliminate the leakage current in the portion 92a of the semiconductor layer 92 that covers the end surface of the other end of the semiconductor core 91.

Note that, in Embodiments 1 to 4 described above, descriptions have been given of the rod-like light-emitting devices having the exposed portions 11, 21, 31 and in which the outer peripheral surfaces of one end portion of the semiconductor cores 11, 21, 31 and 41 are exposed. However, the rod-like light-emitting device is not limited to these cases, and may be that which has, at both ends thereof, exposed portions in which the outer peripheral surface of the semiconductor core are exposed and that which has, at a central portion thereof, an exposed portion in which the outer peripheral surface of the semiconductor core is exposed.

In Embodiments 1 to 9 described above, semiconductors whose base materials are GaN are used for the semiconductor core and the semiconductor layer. However, this invention may be applied to light-emitting devices using semiconductors whose base materials are GaAs, AlGaAs, GaAsP, InGaN, AlGaN, GaP, ZnSe, AlGaInP and the like. While the semiconductor core is of n type and the semiconductor layer is of p type, this invention may be applied to a rod-like light-emitting device in which the conductivity types are reversed. The rod-like light-emitting devices having the semiconductor cores with hexagonal prism shapes have been described. However, the rod-like light-emitting device is not limited to this, and may have a rod shape whose cross section has a circle shape or an ellipse shape. This invention may be applied to a rod-like light-emitting device having a semiconductor core in a rod shape whose cross section has the shape of another polygon such as a triangle.

In Embodiments 1 to 9 described above, the rod-like light-emitting device has a size of the order of micrometers with a diameter of 1 µm and a length of from 10 µm to 30 µm. However, there may be used a device with the size in the order of nanometers in which at least the diameter of the diameter and the length is less than 1 µm. The diameter of the semiconductor core of the above rod-like light-emitting device is preferably 500 nm or more and 50 µm or less, which enables variations in diameter of the semiconductor core to be reduced compared to a rod-like light-emitting device having a semiconductor core whose diameter ranges from several tens of nanometers to several hundreds of nanometers. Therefore, variations in the light emitting region, that is, variations in light emission characteristics can be decreased. This can lead to improvement in yields.

In Embodiments 1 to 4 and 7 to 9 described above, crystal growth of a semiconductor core is made using the MOCVD device. However, the semiconductor core may be formed using another crystal growth device such as a molecular-beam epitaxy (MBE) device. The crystal growth of the semiconductor core is made on a substrate using a mask having a growth hole. However, metal species are placed on a substrate, and crystal growth of a semiconductor core may result from the metal species.

In Embodiments 1 to 4 and 7 to 9 described above, the semiconductor core covered with the semiconductor layer is separated from the substrate using ultrasonic waves. However, the way of separation is not limited to this, and the semiconductor core may be separated from the substrate by mechanically bending the semiconductor core with a cutting tool. In this case, a plurality of microscopic rod-like light-emitting devices provided on the substrate can be separated by a simple way for a short time.

(Embodiment 10)

Figure 20:
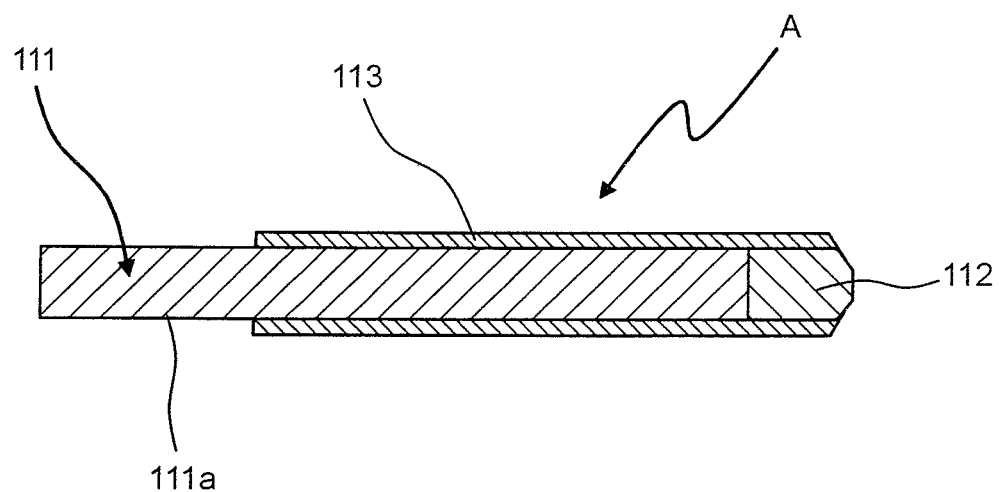
FIG. 20 is a cross-sectional view of a rod-like light-emitting device of Embodiment 10 of this invention.

FIG. 20 is a cross-sectional view of a rod-like light-emitting device of Embodiment 10 of this invention.

A rod-like light-emitting device A of Embodiment 10, as shown in FIG. 20, includes a semiconductor core 111 made of n-type GaN and having a rod shape whose cross section is nearly hexagonal, a cap layer 112 covering one end surface of the semiconductor core 111, and a semiconductor layer 113 made of p-type GaN and that covers the outer peripheral surface of a portion other than an exposed portion 111a of the semiconductor core 111 such that a portion opposite to a portion covered with the cap layer 112 of the semiconductor core 111 is not covered, so that the exposed portion 111a is provided. The outer peripheral surface of the semiconductor core 111 and the outer peripheral surface of the cap layer 112 are covered with the continuous semiconductor layer 113.

The cap layer 112 mentioned above uses, as a material having a higher electric resistance than the semiconductor layer 113, for example, an insulating material, intrinsic GaN, n-type GaN of the same conductivity type as that of the semiconductor layer 113 and with a low impurity concentration, or p-type GaN of a conductivity type different from that of the semiconductor layer 113 and with a low impurity concentration.

According to the rod-like light-emitting device A having the above configuration, one end surface of the semiconductor core 111 made of n-type GaN and shaped like a rod is covered with the cap layer 112, and the outer peripheral surface of the portion other than the exposed portion 111a of the semiconductor core 111 is covered with the semiconductor layer 113 made of p-type GaN such that the portion opposite to the portion covered with the cap layer 112 of the semiconductor core 111 is not covered, so that the exposed portion 111a is provided. As a result, even in cases where the rod-like light-emitting device is microscopic and has a size of the order of micrometers or of the order of nanometers, it becomes possible to connect the exposed portion 111a of the semiconductor core 111 to an n-side electrode and to connect a p-side electrode to a portion the semiconductor layer 113 that covers the semiconductor core 111. In the rod-like light-emitting device A, with the n-side electrode connected to the exposed portion 111a of the semiconductor core 111 and with the p-side electrode connected to the semiconductor layer 113, a current is caused to flow from the p-side electrode to the n-side electrode to result in recombination of electrons and holes in an interface (pn junction) between the outer peripheral surface of the semiconductor core 111 and the inner peripheral surface of the semiconductor layer 113. Thus, light is emitted. In the rod-like light-emitting device A, light is emitted from the whole side surface of the semiconductor core 111 covered with the semiconductor layer 113. The light emitting region therefore becomes larger, which results in a high light emitting efficiency.

Accordingly, it is possible to implement the microscopic rod-like light-emitting device A that allows electrode connections to be easily made with a simple configuration and has a high light emitting efficiency. The above rod-like light-emitting device A is not integral with the substrate, which allows great freedom in installing into an apparatus.

The microscopic rod-like light-emitting device as used herein is a device, for example, in micrometer order size with a diameter of 1 µm and a length in the range of from 10 µm to 30 µm, or in nanometer order size in which at least the diameter of the diameter and the length of 1 µm or less. The rod-like light-emitting device mentioned above allows a decrease in the amount of semiconductors used. This makes it possible to reduce the thickness and weight of an apparatus using the light-emitting device, and to implement a backlight, an illuminating device and a display device that have high light emitting efficiencies and achieve low power consumption.

The outer peripheral surface of one side of the above semiconductor core 111 is exposed, for example, in the axial direction by about 1 µm to 5 µm. This makes it possible to connect an n-side electrode to the exposed portion 111a of the outer peripheral surface of the semiconductor core 111 and to connect a p-side electrode to the semiconductor layer 113 on the other side of the semiconductor core 111. Therefore, connections can be made with the electrodes separate from each other in both ends. Thus, the p-side electrode connected to the semiconductor layer 113 and the exposed portion 111a of the semiconductor core 111 can easily be prevented from becoming short-circuited to each other.

One end surface of the semiconductor core 111 is covered with the cap layer 112. This makes it possible to easily connect the p-side electrode to the portion of the semiconductor layer 113 covering the outer peripheral surface of the semiconductor core 111 opposite to the exposed portion 111a, without short-circuiting the p-side electrode with the semiconductor core 111. In this way, electrodes can easily be connected to both ends of the microscopic rod-like light-emitting device A.

Figure 21:
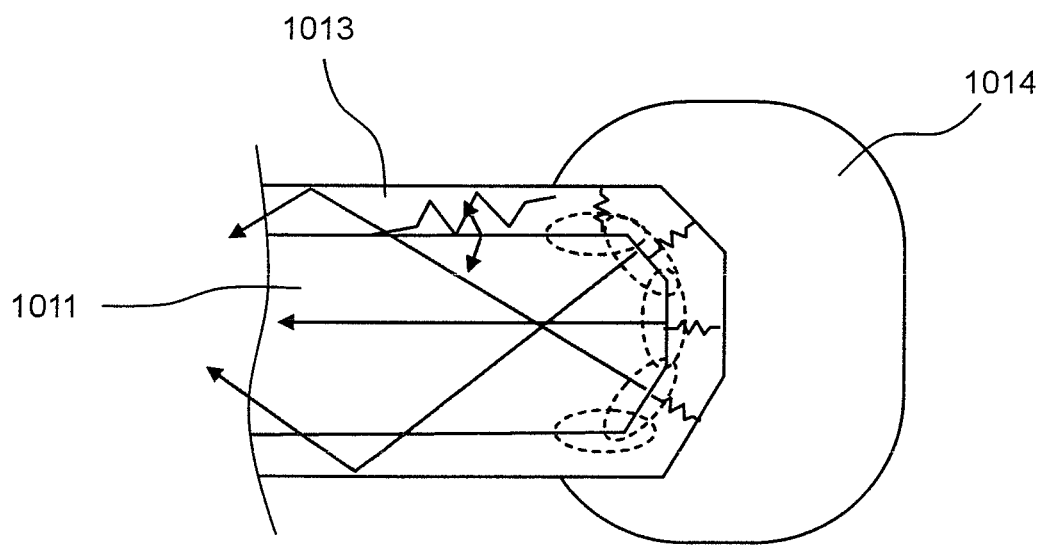
FIG. 21 is a schematic cross-sectional view of a main part of a rod-like light-emitting device of a comparative example.

FIG. 21 is a schematic cross-sectional view of the main part of a rod-like light-emitting device of a comparative example, but not a rod-like light-emitting device of this invention. The rod-like light-emitting device of FIG. 21 differs from the above rod-like light-emitting device A shown in FIG. 20 of Embodiment 10 in that the rod-like light-emitting device has no cap layer that covers one end surface of a semiconductor core 1011, and a semiconductor layer 1013 covers the outer peripheral surface and the end surface of the semiconductor core 1011.

As shown in FIG. 21, when a p-side electrode 1014 is connected to the semiconductor layer 1013 on the end surface side of the semiconductor core 1011, the resistance decreases in the film thickness direction (the resistance as seen from the side of the p-side electrode 1014), in which the cross-sectional area of the semiconductor layer 1013 covering the end surface side of the semiconductor core 1011 is large, whereas the resistance increases in the longitudinal direction (the resistance as seen from the side of the p-side electrode 1014), in which the cross-sectional area of the semiconductor layer 1013 covering the outer peripheral surface of the semiconductor core 1011 is small. For this reason, a current concentrates to the end surface of the semiconductor core 1011, and light emission concentrates to the end surface of the semiconductor core 1011. As a result, light is not efficiently emitted from the whole side surface of the semiconductor core 1011.

Figure 22:
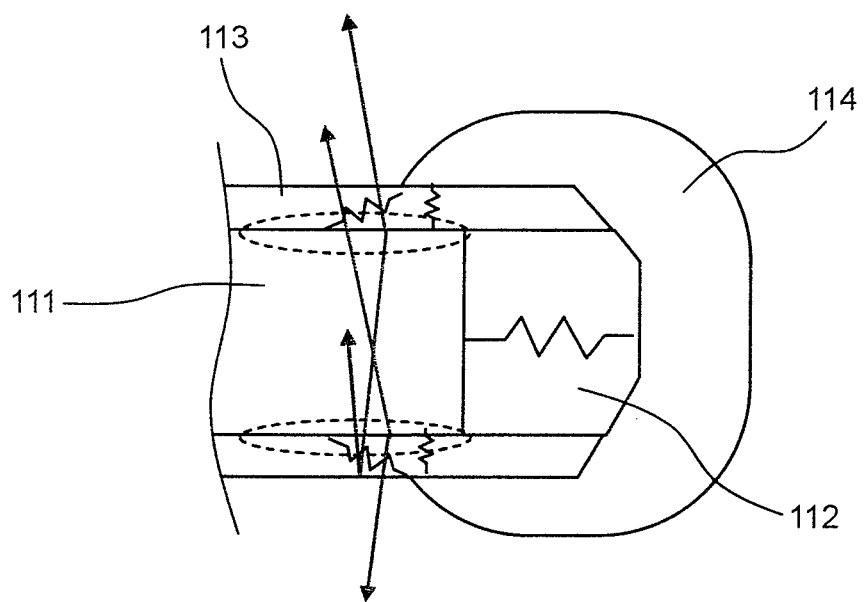
FIG. 22 is a cross-sectional view of a main part of the rod-like light-emitting device of Embodiment 10.

In contrast, as shown in a schematic cross-sectional view of FIG. 22, in the rod-like light-emitting device shown in FIG. 20 of Embodiment 10 mentioned above, one end surface of the semiconductor core 111 is covered with the cap layer 112 made of a material having a higher electric resistance than the semiconductor layer 113. This, on the one hand, prevents a current from flowing between a p-side electrode 114 connected to the side of the cap layer 112 of the semiconductor core 111 and the semiconductor core 111 through the cap layer 112, and on the other hand, allows a current to flow between the p-side electrode 114 and the outer peripheral surface side of the semiconductor core 111 through the semiconductor layer 113 having a lower resistance than the cap layer 112. This reduces current concentration to the end surface on the side having the cap layer 112 thereon of the semiconductor core 111 is provided. As a result, without concentration of light emission to the end surface of the semiconductor core 111, the efficiency of extracting light from the side surface of the semiconductor core 111 is improved.

Figure 23A:
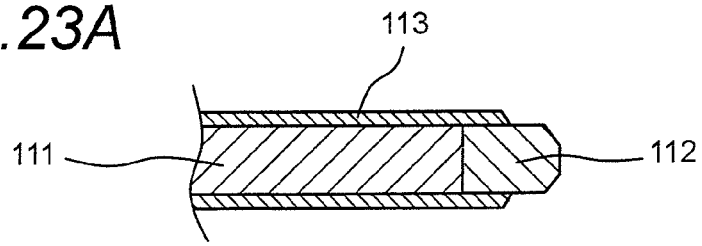
FIG. 23A is a cross-sectional view of a main part of a first modification of the rod-like light-emitting device of Embodiment 10.
Figure 23B:
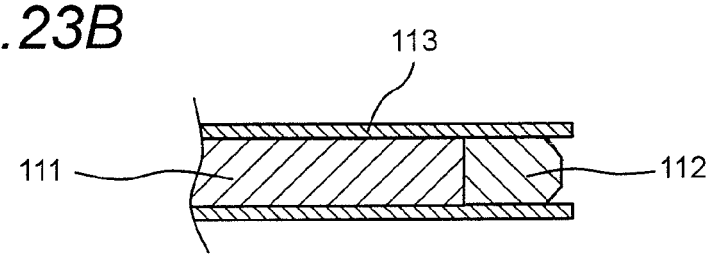
FIG. 23B is a cross-sectional view of a main part of a second modification of the rod-like light-emitting device of Embodiment 10.
Figure 23C:
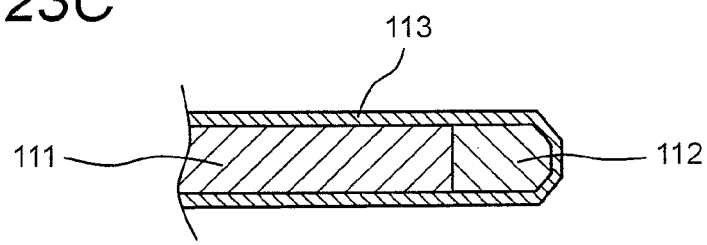
FIG. 23C is a cross-sectional view of a main part of a third modification of the rod-like light-emitting device of Embodiment 10.

FIGS. 23A to 23C are cross-sectional views of the main parts of first to third modifications of the above rod-like light-emitting device of Embodiment 10. In FIGS. 23A to 23C, although forms of the semiconductor layer 113 differ from that of FIG. 20, the same elements as those of FIG. 20 are denoted by the same reference characters.

In the rod-like light-emitting device of this invention, as shown in the first modification of FIG. 23A, the semiconductor layer 113 may be formed to cover part on the side of the semiconductor core 111 of the outer peripheral surface of the cap layer 112. As shown in the second modification of FIG. 23B, the semiconductor layer 113 may also be formed to cover all the outer peripheral surface of the cap layer 112 and to protrude farther than the end surface of the cap layer 112, and, as a result, the end surface of the cap layer 112 is exposed. Further, in the rod-like light-emitting device of this invention, as shown in the third modification of FIG. 23C, the semiconductor layer 113 may be formed to cover all the outer peripheral surface of the cap layer 112 and to cover the end surface of the cap layer 112.

Figure 24:
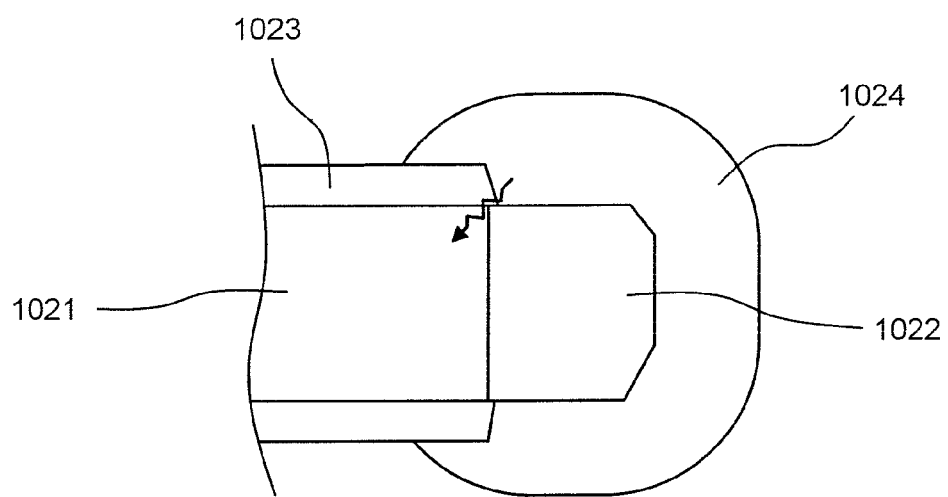
FIG. 24 is a schematic cross-sectional view of a main part of a rod-like light-emitting device of a modification in which the outer peripheral surface of a cap layer is not covered with a semiconductor layer.
Figure 25:
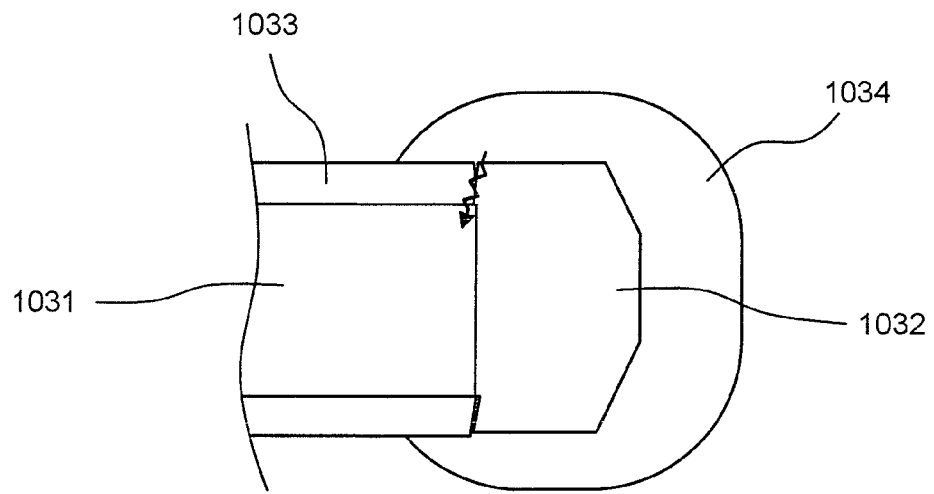
FIG. 25 is a schematic cross-sectional view of a main part of a rod-like light-emitting device of another modification in which the outer peripheral surface of a cap layer is not covered with a semiconductor layer.

FIG. 24 and FIG. 25 are schematic cross-sectional views of the main parts of the rod-like light-emitting devices of modifications in which the outer peripheral surface of a cap layer is not covered with a semiconductor layer. In FIG. 24 and FIG. 25, reference characters 1021 and 1031 denote semiconductor cores, 1022 and 1032 denote cap layers, 1023 and 1033 denote semiconductor layers, and 1024 and 1034 denote p-side electrodes; materials used for elements are the same as those used for elements of the above rod-like light-emitting device of Embodiment 10.

In the rod-like light-emitting device of the modification shown in FIG. 24, just a little region near the semiconductor core 1021 of the outer peripheral surface of the cap layer 1022 is covered with the semiconductor layer 1023, and therefore a current path might be formed in this portion to allow a leakage current to flow between the p-side electrode 1024 and the semiconductor core 1021 through the current path.

Also, in the rod-like light-emitting device of the modification shown in FIG. 25, the outer peripheral surface of the cap layer 1032 is not covered with the semiconductor layer 1033, and therefore a current path might be formed in a portion where the end surface of the semiconductor layer 1033 comes in contact with the end surface of the cap layer 1032 to allow a leakage current to flow between the p-side electrode 1034 and the semiconductor core 1031 through this current path.

In contrast, according to the above rod-like light-emitting device A shown in FIG. 20 of Embodiment 10, the outer peripheral surface of the semiconductor core 111 excepting the exposed portion 111a and the outer peripheral surface of the cap layer 112 are covered with the continuous semiconductor layer 113, which makes it possible to eliminate or reduce occurrence of a leakage current between the p-side electrode 14 connected to the side of the cap layer 112 of the semiconductor core 111 and the semiconductor core 111.

In the above rod-like light-emitting device A, the use of an insulating material for the cap layer 112 causes the semiconductor core 111 to be completely insulated from the electrode with the cap layer 112, and therefore light emission from the end surface on the side on which the cap layer 112 of the semiconductor core 111 is provided can be reduced, and the occurrence of a leakage current between the semiconductor core 111 and the electrode can be eliminated or reduced in the vicinity of the end surface of the semiconductor core 111.

In the above rod-like light-emitting device A, in cases where an intrinsic semiconductor is used for the cap layer 112, the semiconductor core 111 is completely insulated from the electrode with the cap layer 112, and therefore light emission from the end surface on the side having the cap layer 112 thereon of the semiconductor core 111 can be reduced, and the occurrence of a leakage current between the semiconductor core 111 and the electrode can be eliminated or reduced in the vicinity of the end surface of the semiconductor core 111. For example, in the case of using GaN as the intrinsic semiconductor, an n-type semiconductor containing an impurity is actually obtained. However, the impurity concentration is low, and the resistance is high. Therefore, little current flows on the side of the cap layer 112, which enables a sufficient voltage to be applied between the semiconductor core 111 and the semiconductor layer 113 that covers the outer peripheral surface of the semiconductor core 111.

In the above rod-like light-emitting device A, in cases where the same n-type semiconductor as that used for the semiconductor core 111 is used for the cap layer 112, the cap layer 112 has a higher resistance than the semiconductor layer 113, and therefore light emission from the end surface on the side having the cap layer 112 thereon of the semiconductor core 111 can be reduced, and the occurrence of a leakage current between the semiconductor core 111 and the electrode can be eliminated or reduced in the vicinity of the end surface of the semiconductor core 111.

In the above rod-like light-emitting device A, in cases where the same p-type semiconductor as that used for the semiconductor layer 113 is used for the cap layer 112, a light-emitting surface is formed in the end surface having the cap layer 112 thereon of the semiconductor core 111, and therefore the light emitting region can be increased. The cap layer 112 has a higher resistance than the semiconductor layer, and therefore a little current flows on the side of the cap layer 112, which enables a sufficient voltage to be applied between the semiconductor core 111 and the semiconductor layer 113 that covers the outer peripheral surface of the semiconductor core 111.

Note that, in Embodiment 10 described above, a description has been given of the rod-like light-emitting device in which the semiconductor core 111 having a rod shape whose cross section is nearly hexagonal is covered with the semiconductor layer. However, this invention may be applied to a rod-like light-emitting device in which, for example, a semiconductor core shaped like a rod having the shape of a circle or another polygon is covered with a semiconductor layer, a quantum well layer and the like. N-type GaN results in hexagonal crystal growth, and a semiconductor core in the shape of approximately a hexagonal prism is obtained by growing the crystals under the condition where a direction perpendicular to the surface of the substrate is the c-axis direction. Depending on growth conditions such as a growth direction and a growth temperature, the shape of the cross section tends to be nearly circular in cases where the semiconductor core to be grown has a small diameter in the range of from several tens of nanometers to several hundreds of nanometers. In cases where the diameter is large in the range of from about 0.5 µm to several micrometers, it becomes easier to grow the semiconductor core whose cross section is nearly hexagonal.

(Embodiment 11)

Figure 26:
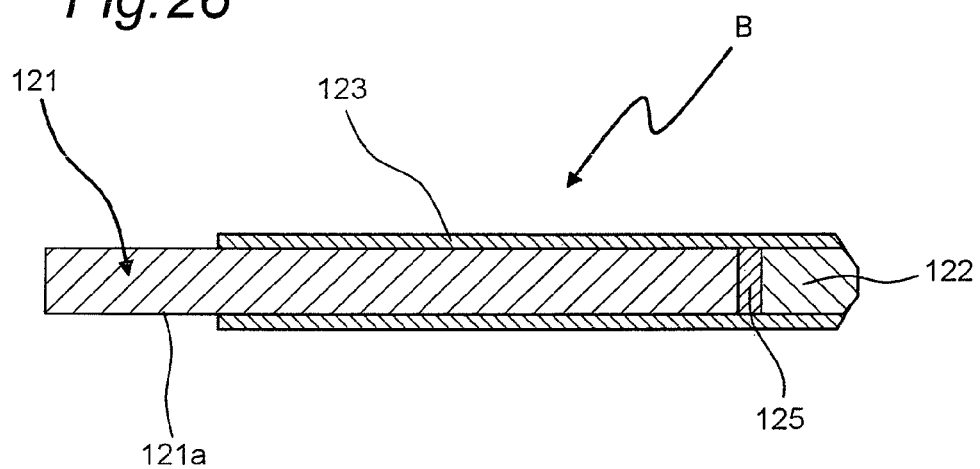
FIG. 26 is a cross-sectional view of a rod-like light-emitting device of Embodiment 11 of this invention.

FIG. 26 is a cross-sectional view of a rod-like light-emitting device of Embodiment 11 of this invention. A rod-like light-emitting device of this Embodiment 11 has the same configuration as the rod-like light-emitting device of Embodiment 10, except for the quantum well layer.

A rod-like light-emitting device B of Embodiment 11, as shown in FIG. 26, includes a semiconductor core 121 made of n-type GaN and having a rod shape whose cross section is nearly hexagonal, a quantum well layer 125 that is made of p-type InGaN and that covers one end surface of the semiconductor core 121, a cap layer 122 that covers the outer peripheral surface of the quantum well layer 125, and a semiconductor layer 123 that is made of p-type GaN and that covers the outer peripheral surface of a portion other than an exposed portion 121a of the semiconductor core 121 such that a portion opposite to the portion covered with the cap layer 122 of the semiconductor core 121 is not covered, so that the exposed portion 121a is provided. The outer peripheral surface of the semiconductor core 121 and the outer peripheral surface of the cap layer 122 are covered with the continuous semiconductor layer 123.

The above rod-like light-emitting device of Embodiment 11 has effects similar to those of the rod-like light-emitting device of Embodiment 10.

In the above rod-like light-emitting device of Embodiment 11, the quantum well layer 125 made of p-type InGaN is formed between the end surface of the semiconductor core 121 and the cap layer 122. As a result, due to quantum confinement effects of the quantum well layer 125, the light emitting efficiency at an interface between the end surface of the semiconductor core 121 and the cap layer 122 can be improved.

Note that the quantum well layer may have a multiple quantum well structure in which barrier layers of GaN and quantum well layers of InGaN are alternately laminated.

(Embodiment 12)

Figure 27:
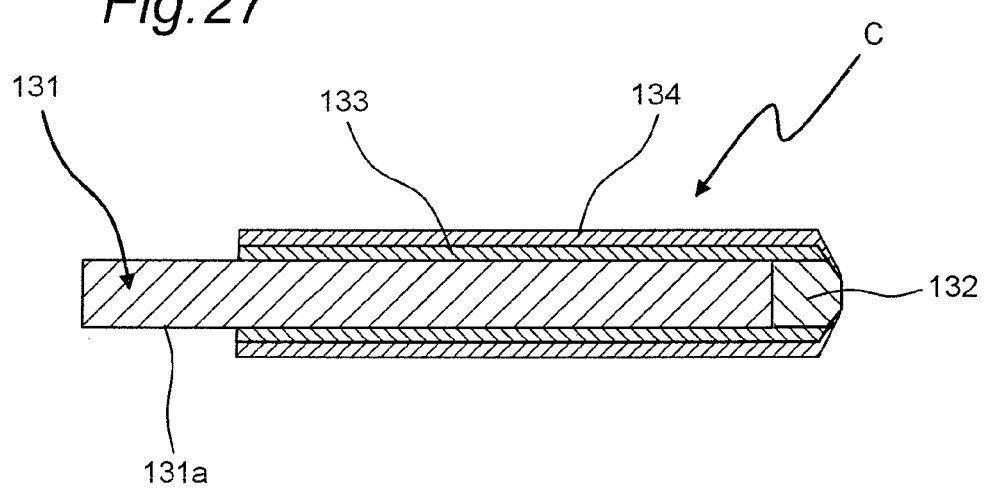
FIG. 27 is a cross-sectional view of a rod-like light-emitting device of Embodiment 12 of this invention.

FIG. 27 is a cross-sectional view of a rod-like light-emitting device of Embodiment 12 of this invention.

A rod-like light-emitting device C of Embodiment 12, as shown in FIG. 27, includes a semiconductor core 131 made of n-type GaN and having a rod shape whose cross section is nearly hexagonal, a cap layer 132 that covers one end surface of the semiconductor core 131, a quantum well layer 133 that is made of p-type InGaN and that covers the outer peripheral surface of a portion other than an exposed portion 131a of the semiconductor core 131 such that a portion opposite to the portion covered with the cap layer 132 of the semiconductor core 131 is not covered, so that the exposed portion 131a is provided, and a semiconductor layer 134 that is made of p-type GaN and that covers the outer peripheral surface of the quantum well layer 133. The outer peripheral surface of the above semiconductor core 131 and the outer peripheral surface of the cap layer 132 are covered with the quantum well layer 133 and the semiconductor layer 134 that are continuous with each other.

The cap layer 132 mentioned above uses, as a material having a higher electric resistance than the semiconductor layer 134, for example, an insulating material, intrinsic GaN, n-type GaN of the same conductivity type as that of the semiconductor layer 134 and with a low impurity concentration, or p-type GaN of a conductivity type different from that of the semiconductor layer 134 and with a low impurity concentration.

Figure 28:
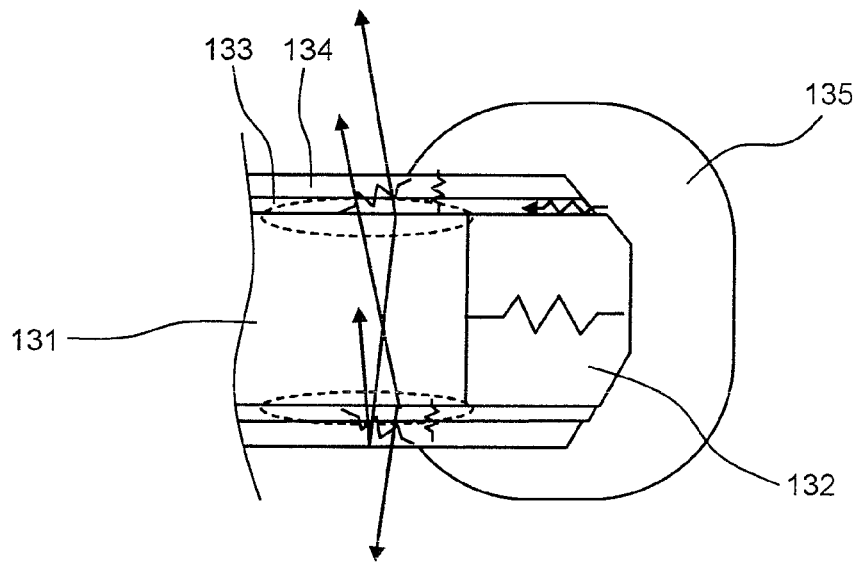
FIG. 28 is a schematic cross-sectional view of a main part of the rod-like light-emitting device.

FIG. 28 is a cross-sectional view of the main part of the above rod-like light-emitting device C. As shown in FIG. 28, in the above rod-like light-emitting device C of Embodiment 12, one end surface of the semiconductor core 131 is covered with the cap layer 132 made of a material having a higher electric resistance than the semiconductor layer 134. This prevents a current from flowing between a p-side electrode 135 connected to the side of the cap layer 132 of the semiconductor core 131 and the semiconductor core 131 through the cap layer 132 and, on the other hand, allows a current to flow between the p-side electrode 135 and the outer peripheral surface side of the semiconductor core 131 through the semiconductor layer 134 having a lower resistance than the cap layer 132. This reduces current concentration to the end surface on the side having the cap layer 132 thereon of the semiconductor core 131 is provided. As a result, without concentration of light emission to the end surface of the semiconductor core 131, the efficiency of extracting light from the side surface of the semiconductor core 131 is improved.

Note that, as shown in FIG. 28, in the configuration case in which the semiconductor layer 134 covering the cap layer 132 does not reach the end surface of the cap layer 132, occurrence of a leakage current from the p-side electrode 135 to the semiconductor core 131 in the plane direction of the quantum well layer 133 is predicted. However, the resistance of the quantum well layer 133 is sufficiently large (the film thickness being small, and the distance from the p-side electrode 135 to the semiconductor core 131 being sufficiently long), and therefore the occurrence of a leakage current is extremely rare. This allows a sufficient voltage to be applied between the semiconductor core 131 and the semiconductor layer 134.

Here, the distance from the p-side electrode 135 to the semiconductor core 131 in the quantum well layer 133 approximately corresponds to, for example, the length of from 1 μm to 5 μm of the cap layer 132.

The above rod-like light-emitting device of Embodiment 12 has effects similar to those of the rod-like light-emitting device of Embodiment 10.

Figure 29A:
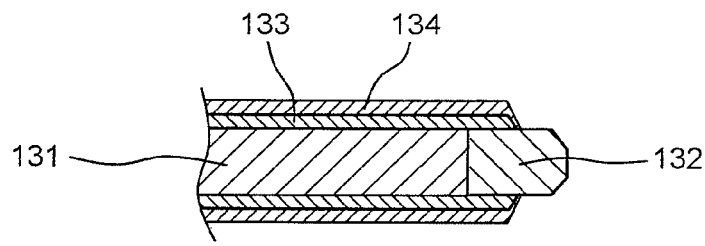
FIG. 29A is a cross-sectional view of a main part of a first modification of the rod-like light-emitting device of Embodiment 12.
Figure 29B:
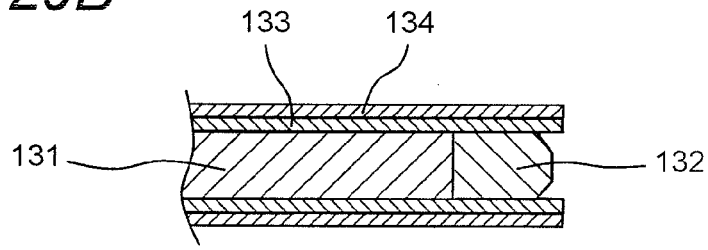
FIG. 29B is a cross-sectional view of a main part of a second modification of the rod-like light-emitting device of Embodiment 12.
Figure 29C:
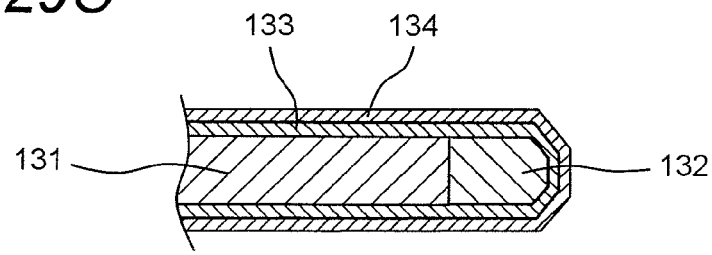
FIG. 29C is a cross-sectional view of a main part of a third modification of the rod-like light-emitting device of Embodiment 12.

FIGS. 29A to 29C are cross-sectional views of the main parts of the first to third modifications of the above rod-like light-emitting device of Embodiment 12. In FIGS. 29A to 29C, although forms of the quantum well layer 133 and the semiconductor layer 134 differ from those of FIG. 27, the same elements as those of FIG. 27 are denoted by the same reference characters.

In the rod-like light-emitting device of this invention, as shown in the first modification of FIG. 29A, the quantum well layer 133 and the semiconductor layer 134 may be formed to cover part on the side of the semiconductor core 131 of the outer peripheral surface of the cap layer 132. As shown in the second modification of FIG. 29B, the quantum well layer 133 and the semiconductor layer 134 may also be formed to cover all the outer peripheral surface of the cap layer 132 and to protrude farther than the end surface of the cap layer 132, so that the end surface of the cap layer 132 is exposed. Further, in the rod-like light-emitting device of this invention, as shown in the third modification of FIG. 29C, the quantum well layer 133 and the semiconductor layer 134 may be formed to cover all the outer peripheral surface of the cap layer 132 and to cover the end surface of the cap layer 132.

Figure 30:
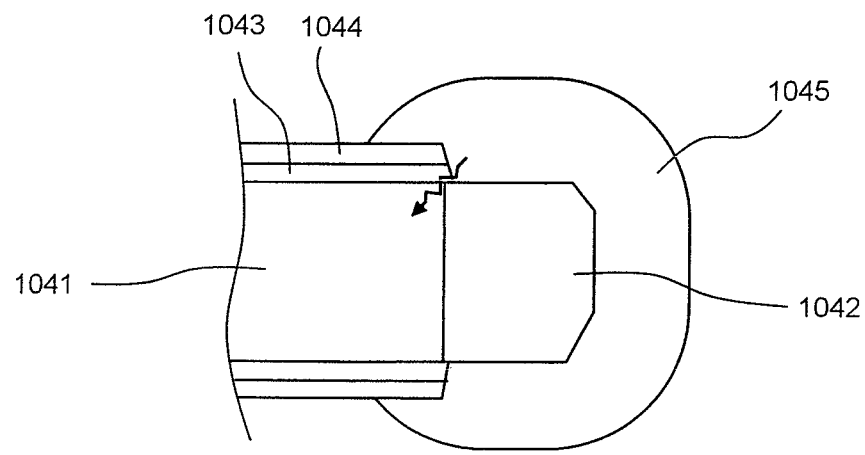
FIG. 30 is a schematic cross-sectional view of a main part of a rod-like light-emitting device of a modification in which the outer peripheral surface of a cap layer is not covered with a quantum well layer or a semiconductor layer.
Figure 31:
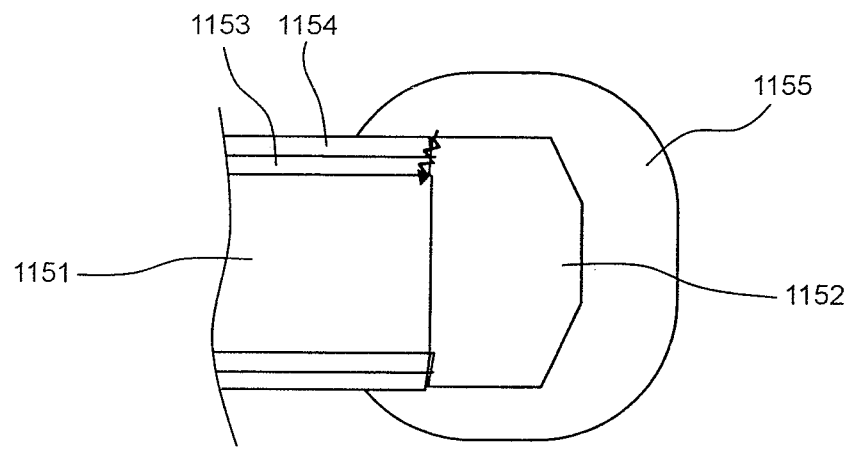
FIG. 31 is a schematic cross-sectional view of a main part of a rod-like light-emitting device of another modification in which the outer peripheral surface of a cap layer is not covered with a quantum well layer or a semiconductor layer.

FIG. 30 and FIG. 31 are schematic cross-sectional views of the main parts of rod-like light-emitting devices of modifications in which the outer peripheral surface of a cap layer is not covered with a quantum well layer and a semiconductor layer.

In FIG. 30 and FIG. 31, reference characters 1041 and 1151 denote semiconductor cores, 1042 and 1152 denote cap layers, 1043 and 1153 denote quantum well layers, 1044 and 1154 denote semiconductor layers, and 1045 and 1155 denote p-side electrodes; materials used for elements are the same as those used for elements of the above rod-like light-emitting device of Embodiment 12.

In the rod-like light-emitting device of the modification shown in FIG. 30, just a little region near the semiconductor core 1041 of the outer peripheral surface of the cap layer 1042 is covered with the quantum well layer 1043 and the semiconductor layer 1044, and therefore a current path might be formed in this portion to allow a leakage current to flow between the p-side electrode 1045 and the semiconductor core 1041 through this current path.

Also, in the rod-like light-emitting device of the modification shown in FIG. 31, the outer peripheral surface of the cap layer 1152 is not covered with the semiconductor layer 1154, and therefore a current path might be formed in a portion where the end surface of the semiconductor layer 1154 comes in contact with the end surface of the cap layer 1152 to allow a leakage current to flow between the p-side electrode 1155 and the semiconductor core 1151 through this current path.

In contrast, according to the above rod-like light-emitting device shown in FIG. 27 of Embodiment 12, the outer peripheral surface of the semiconductor core 131 excepting the exposed portion 131a and the outer peripheral surface of the cap layer 132 are covered with the continuous semiconductor layer 134, which makes it possible to eliminate or reduce occurrence of a leakage current to the semiconductor core 131 from the p-side electrode 135 connected to the side of the cap layer 132 of the semiconductor core 131.

In the above rod-like light-emitting device of Embodiment 12, the quantum well layer 133 is formed between the outer peripheral surface of the semiconductor core 131 and the semiconductor layer 134. As a result, due to quantum confinement effects of the quantum well layer 133, the light emitting efficiency at an interface between the outer peripheral surface of the semiconductor core 131 and the semiconductor layer 134 can be improved.

Note that the quantum well layer may have a multiple quantum well structure in which barrier layers of GaN and quantum well layers of InGaN are alternately laminated.

According to the above rod-like light-emitting device, the outer peripheral surface of the semiconductor core 131 excepting the exposed portion 131a and the outer peripheral surface of the cap layer 132 are covered with the continuous quantum well layer 133, which makes it possible to eliminate or reduce occurrence of a leakage current between an electrode connected to the side of the cap layer 132 of the semiconductor core 131 and the semiconductor core 131.

(Embodiment 13)

Figure 32:
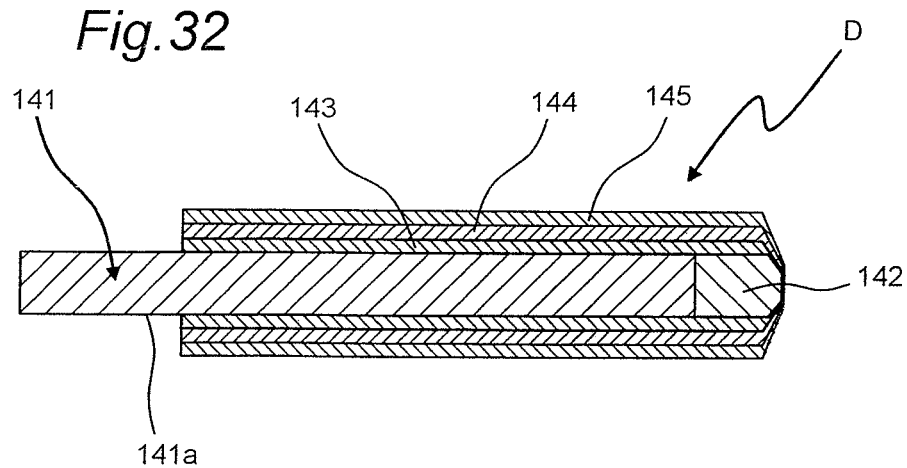
FIG. 32 is a cross-sectional view of a rod-like light-emitting device of Embodiment 13 of this invention.

FIG. 32 is a cross-sectional view of a rod-like light-emitting device of Embodiment 13 of this invention. The rod-like light-emitting device of this Embodiment 13 has the same configuration as the rod-like light-emitting device of Embodiment 12, except for a conductive layer.

A rod-like light-emitting device D of Embodiment 13, as shown in FIG. 32, includes a semiconductor core 141 made of n-type GaN and having a rod shape whose cross section is nearly hexagonal; a cap layer 142 that covers one end surface of the semiconductor core 141; a quantum well layer 143 that is made of p-type InGaN and that covers the outer peripheral surface of a portion other than an exposed portion 141a of the semiconductor core 141 so as not to cover a portion opposite to the portion on the side of the semiconductor core 141 covered with the cap layer 142, so that the exposed portion 141a is provided; a semiconductor layer 144 that is made of p-type GaN and that covers the outer peripheral surface of the quantum well layer 143; and a conductive layer 145 that covers the outer peripheral surface of the semiconductor layer 144. The outer peripheral surface of the above semiconductor core 141 and the outer peripheral surface of the cap layer 142 are covered with the quantum well layer 143 and the semiconductor layer 144 that are continuous with each other.

The conductive layer 145 is formed of ITO having a film thickness of 200 nm. For the deposition of ITO, a vapor-deposition method or a sputtering method can be used. After the ITO film is deposited, heat treatment is performed at a temperature of from 500° C. to 600° C., which makes it possible to decrease the contact resistance between the semiconductor layer 144 made of p-type GaN and the conductive layer 145 made of ITO. Note that the conductive layer 145 is not limited to this, and, for example, a translucent laminated metal film of Ag/Ni or Au/Ni having a thickness of 5 nm may be used for the conductive layer 145. For the deposition of the laminated metal film, a vapor-deposition method or a sputtering method can be used. Moreover, to further decrease the resistance of the conductive layer, a laminated metal film of Ag/Ni or Au/Ni may be deposited on the ITO film mentioned above.

Figure 33:
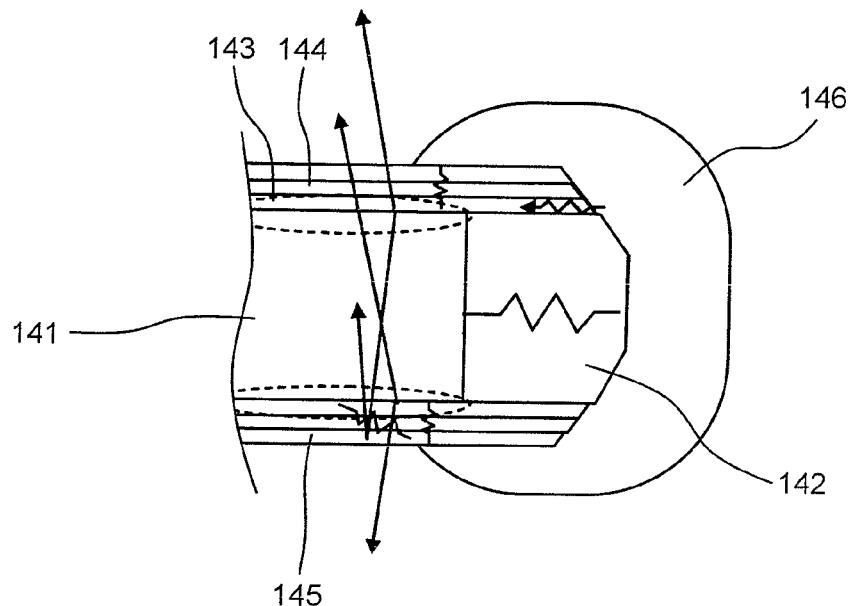
FIG. 33 is a schematic cross-sectional view of a main part of the rod-like light-emitting device.

FIG. 33 is a schematic cross-sectional view of the main part of the rod-like light-emitting device D. As shown in FIG. 33, in the rod-like light-emitting device D of this Embodiment 13, one end surface of the semiconductor core 141 is covered with the cap layer 142 made of a material having a higher electric resistance than the semiconductor layer 144. This prevents a current from flowing between a p-side electrode 146 connected to the side of the cap layer 142 of the semiconductor core 141 and the semiconductor core 141 through the cap layer 142 and, on the other hand, allows a current to flow between the p-side electrode 146 and the outer peripheral surface side of the semiconductor core 141 through the semiconductor layer 144 having a lower electric resistance than the cap layer 142. This reduces current concentration to the end surface on the side having the cap layer 142 thereon of the semiconductor core 141 is provided. As a result, without concentration of light emission to the end surface of the semiconductor core 141, the efficiency of extracting light from the side surface of the semiconductor core 141 is improved.

The above rod-like light-emitting device of Embodiment 13 has effects similar to those of the rod-like light-emitting device of Embodiment 10.

According to the above rod-like light-emitting device, the semiconductor layer 144 is connected through the conductive layer 145, which has a lower resistance than the semiconductor layer 144, to the electrode. This allows a wide current path to be formed without a current being concentrated to an electrode connection portion and being unbalanced, so that light can be efficiently emitted from the whole side surface of the semiconductor core 141. Thus, the light emitting efficiency is further improved.

Figure 34:
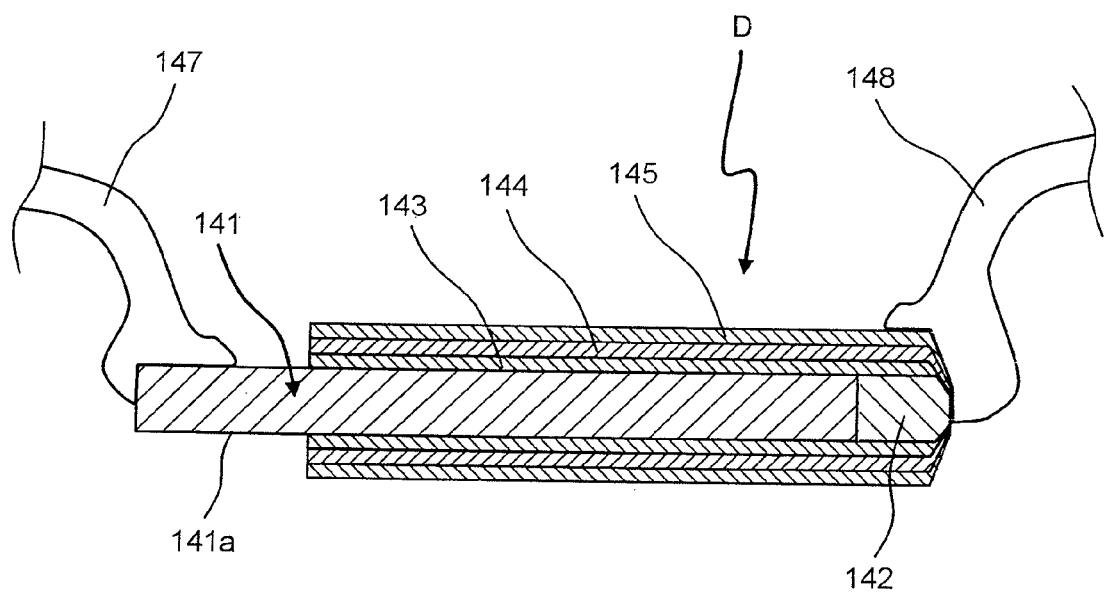
FIG. 34 is a cross-sectional view for illustration of electrode connections of the rod-like light-emitting device.

In the above rod-like light-emitting device, as shown in FIG. 34, an n-side electrode 147 as one example of the first electrode is connected to the exposed portion 141a of the semiconductor core 141, and a p-side electrode 148 as one example of the second electrode is connected to the side on which the cap layer 142 of the semiconductor core 141 is provided.

In FIG. 34, one end surface of the semiconductor core 141 is not exposed owing to the cap layer 142, and, through the semiconductor layer 144 and the conductive layer 145, an electric connection between the semiconductor core 141 and the p-side electrode 148 can be easily made. This makes it possible to minimize the area of the side surface shielded with the p-side electrode 148 of the whole side surface of the semiconductor core 141 covered with the semiconductor layer 144 and the conductive layer 145, which enables the light-extraction efficiency to be improved. This also eliminates or reduces current concentration to the end surface on the side having the cap layer 142 thereon of the semiconductor core 141. As a result, without concentration of light emission to the end surface of the semiconductor core 141, the efficiency of extracting light from the side surface of the semiconductor core 141 is improved.

Note that the semiconductor core 141 and the p-side electrode 148 may be electrically connected only through the conductive layer 145 in an end on the side of the cap layer 142 of the semiconductor core 141.

(Embodiment 14)

Figure 35:
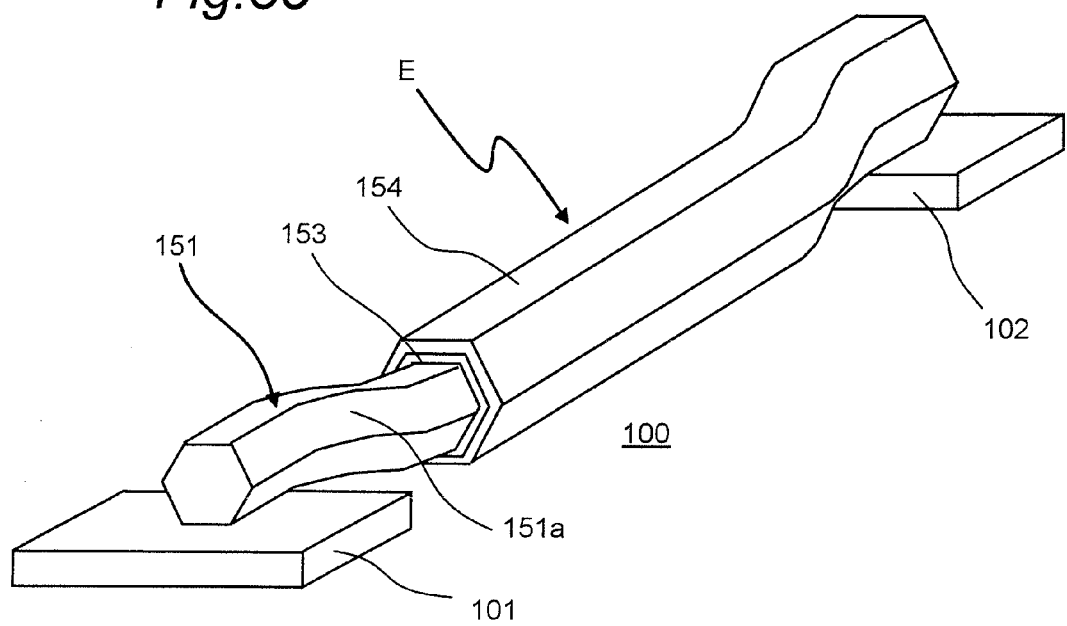
FIG. 35 is a perspective view of a light-emitting apparatus including a rod-like light-emitting device of Embodiment 14 of this invention.

FIG. 35 is a perspective view of a light-emitting apparatus including a rod-like light-emitting device of Embodiment 14 of this invention. In this Embodiment 14, a rod-like light-emitting device having the same configuration as the rod-like light-emitting device C of Embodiment 12 is used. Note that, as the rod-like light-emitting device, any one of the above rod-like light-emitting devices of Embodiments 1, 11 and 13 may be used.

The light-emitting apparatus of this Embodiment 14, as shown in FIG. 35, includes an insulating substrate 100 having metal electrodes 101 and 102 formed on a mounting surface thereof, and a rod-like light-emitting device E mounted on the insulating substrate 100 such that the longitudinal direction of the rod-like light-emitting device E is parallel to the mounting surface of the insulating substrate 100.

The rod-like light-emitting device E includes a semiconductor core 151 made of n-type GaN and having a rod shape whose cross section is nearly hexagonal; a cap layer (not shown) that covers one end surface of the semiconductor core 151; a quantum well layer 153 that is made of p-type InGaN and that covers the outer peripheral surface of a portion other than an exposed portion 151a of the semiconductor core 151 so as not to cover a portion opposite to the side of a portion of the semiconductor core 151 covered with the cap layer 152, so that the exposed portion 151a is provided; and a semiconductor layer 154 that is made of p-type GaN and that covers the outer peripheral surface of the quantum well layer 153. The semiconductor core 151 has, at one end thereof, an exposed portion 151a in which the outer peripheral surface of the semiconductor core 151 is exposed. The end surface of the cap layer on the other side of the semiconductor core 151 is exposed without being covered with the quantum well layer 153 and the semiconductor layer 154.

As shown in FIG. 35, the exposed portion 151a at one end of the rod-like light-emitting device E is connected to the metal electrode 101, and the semiconductor layer 154 at the other end of the rod-like light-emitting device E is connected to the metal electrode 102.

Here, in the rod-like light-emitting device E, its central portion is deformed to come in contact with the insulating substrate 100. This deformation is caused by stiction that occurs when a droplet contracts in a clearance between the substrate surface and the rod-like light-emitting device because of vaporization during drying of an IPA aqueous solution in a method of aligning the rod-like light-emitting devices of Embodiment 38 to be described later.

According to the above light-emitting apparatus of the Embodiment 14, in the rod-like light-emitting device E mounted on the insulating substrate 100 such that the longitudinal direction of the rod-like light-emitting device E is parallel to the mounting surface of the insulating substrate 100, the outer peripheral surface of the semiconductor layer 154 comes in contact with the mounting surface of the insulating substrate 100, and therefore heat generated in the rod-like light-emitting device E can be dissipated with a good efficiency from the semiconductor layer 154 to the insulating substrate 100. Accordingly, it is possible to implement the light-emitting apparatus in which the light emitting efficiency is high and the heat dissipation is good. Note that, in a rod-like light-emitting device in which a conductive layer is formed to cover a semiconductor layer, the outer peripheral surface of the conductive layer comes in contact with a mounting surface of an insulating substrate, and thus the effects can be obtained similarly.

In the above light-emitting apparatus, the rod-like light-emitting device E is arranged to lie on its side on the insulating substrate 100. This allows the whole thickness of the rod-like light-emitting device E including the insulating substrate 100 to be decreased. In the above light-emitting apparatus, the microscopic rod-like light-emitting device E, for example, with the size of the order of micrometers in which the diameter is 1 µm and the length is 10 µm, or with the size in the order of nanometers in which at least the diameter of the diameter and the length is less than 1 µm is used. The use of the microscopic rod-like light-emitting device E enables the amount of semiconductors used to be decreased. Using this light-emitting apparatus makes it possible to implement a backlight, an illuminating device, a display device and the like whose thicknesses and weights can be reduced.

(Embodiment 15)

Figure 36:
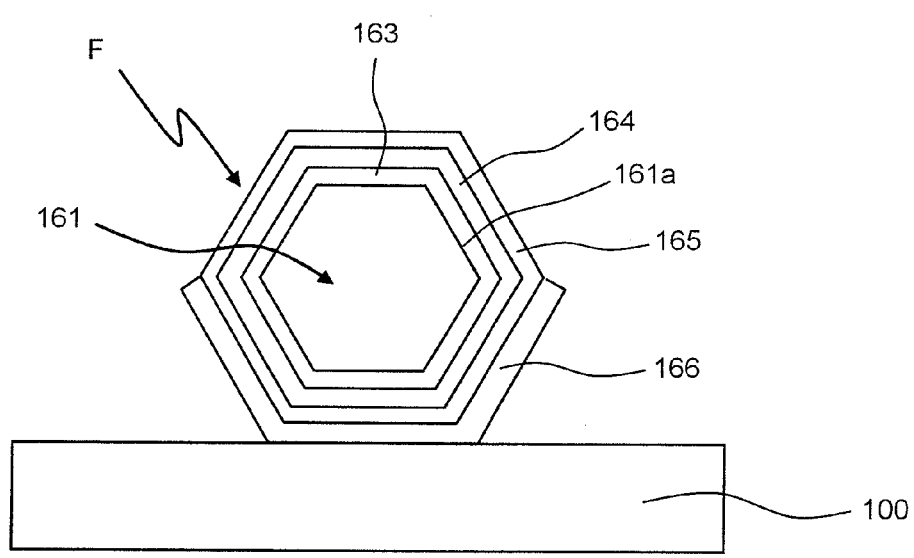
FIG. 36 is a side view of a light-emitting apparatus including a rod-like light-emitting device of Embodiment 15 of this invention.

FIG. 36 is a side view of a light-emitting apparatus including a rod-like light-emitting device of Embodiment 15 of this invention.

The light-emitting apparatus of this Embodiment 15, as shown in FIG. 36, includes the insulating substrate 100, a rod-like light-emitting device F mounted on the insulating substrate 100 such that the longitudinal direction of the rod-like light-emitting device F is parallel to the mounting surface of the insulating substrate 100.

The rod-like light-emitting device F includes a semiconductor core 161 made of n-type GaN and having a rod shape whose cross section is nearly hexagonal; a cap layer 162 (shown in FIG. 37) that covers one end surface of the semiconductor core 161; a quantum well layer 163 that is made of p-type InGaN and that covers the outer peripheral surface of a portion other than an exposed portion 161a of the semiconductor core 161 so as not to cover a portion opposite to the portion covered with the cap layer 162 of the semiconductor core 161, so that the exposed portion 161a is provided; a semiconductor layer 164 that is made of p-type GaN and that covers the outer peripheral surface of the quantum well layer 163; and a conductive layer 165 that covers the outer peripheral surface of the semiconductor layer 164. The semiconductor core 161 has, at one end thereof, an exposed portion 161a in which the outer peripheral surface of the semiconductor core 161 is exposed. A metal layer 166 as one example of the second conductive layer is formed on an insulating substrate 100 side portion of the conductive layer 165. About the lower half of the outer peripheral surface of the conductive layer 165 is covered with the metal layer 166. The conductive layer 165 is formed of ITO. Note that the conductive layer is not limited to this, and, for example, a translucent laminated metal film of Ag/Ni or Au/Ni having a thickness of 5 nm may be used. For the deposition of the laminated metal film, a vapor-deposition method or a sputtering method can be used. Moreover, to further decrease the resistance of the conductive layer, a laminated metal film of Ag/Ni or Au/Ni may be deposited on the ITO film mentioned above. The material used for the metal layer 166 is not limited to Al, and Cu, W, Ag, Au and the like may be used.

Figure 37:
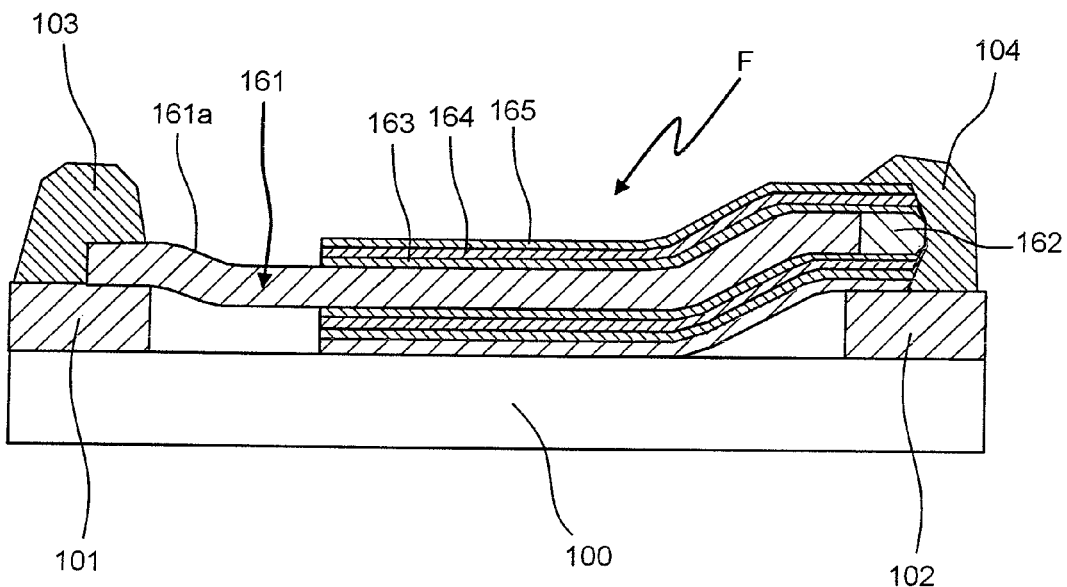
FIG. 37 is a cross-sectional view of the light-emitting apparatus.

The light-emitting apparatus of this Embodiment 15, as shown in FIG. 37, includes the insulating substrate 100 having the metal electrodes 101 and 102 formed on the mounting surface thereof, and the rod-like light-emitting device F mounted on the insulating substrate 100 such that the longitudinal direction of the rod-like light-emitting device F is parallel to the mounting surface of the insulating substrate 100.

The exposed portion 161a at one end of the rod-like light-emitting device F is connected to the metal electrode 101 by means of an adhesive joint 103 of a conductive adhesive or the like, and the metal layer 166 on the other end of the rod-like light-emitting device F is connected to the metal electrode 102 by means of an adhesive joint 104 of a conductive adhesive or the like.

Here, in the rod-like light-emitting device F, its central portion is deformed to come in contact with the insulating substrate 100. This deformation is caused by stiction that occurs when a droplet contracts in a clearance between the substrate surface and the rod-like light-emitting device because of vaporization during drying of an IPA aqueous solution in a method of aligning the rod-like light-emitting devices of Embodiment 38 to be described later.

According to the above light-emitting apparatus of Embodiment 15, the metal layer 166, as one example of the second conductive layer, having a lower resistance than the semiconductor layer 164 is formed on the conductive layer 165 of the rod-like light-emitting device F and on the side of the insulating substrate 100. On a side without the metal layer 166, which is opposite to the side of the insulating substrate 100 of the rod-like light-emitting device F, the conductive layer 165 exists with which the outer peripheral surface of the semiconductor core 161 is covered. Therefore, a lower resistance can be achieved by the metal layer 166 without sacrificing the ease of flow of a current to the whole semiconductor layer 164 having a high resistance. For the conductive layer 165 covering the outer peripheral surface of the semiconductor core 161, a material having a low transmittance cannot be used in consideration of the light emitting efficiency, and therefore a material having a low resistance cannot be used. However, for the metal layer 166, a conductive material for which a low resistance has precedence over the transmittance can be used. Moreover, in the rod-like light-emitting device F mounted on the insulating substrate 100 such that the longitudinal direction of the rod-like light-emitting device F is parallel to the mounting surface of the insulating substrate 100, the metal layer 166 comes in contact with the mounting surface of the insulating substrate 100. Therefore, heat generated in the rod-like light-emitting device F can be dissipated with a good efficiency through the metal layer 166 to the insulating substrate 100.

(Embodiment 16)

Figure 38:
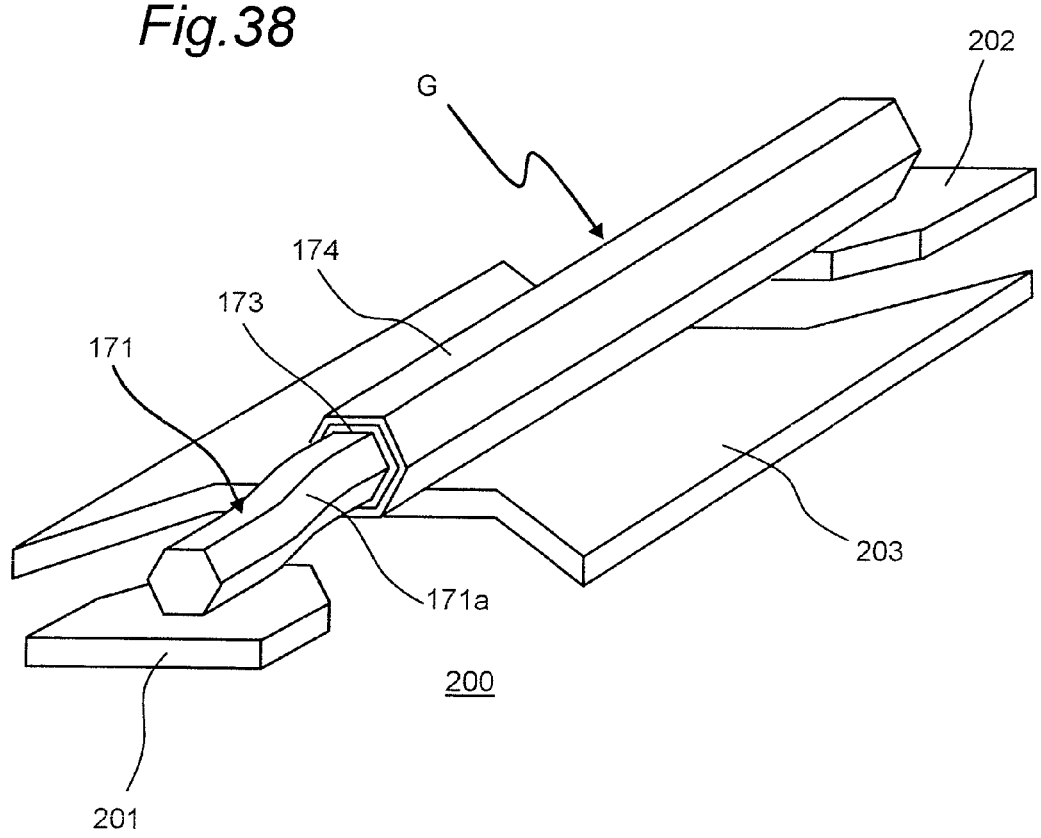
FIG. 38 is a perspective view of a light-emitting apparatus of Embodiment 16 of this invention.

FIG. 38 is a perspective view of a light-emitting apparatus including a rod-like light-emitting device of Embodiment 16 of this invention. In this Embodiment 16, a rod-like light-emitting device having the same configuration as the rod-like light-emitting device C of Embodiment 12 is used. Note that, as the rod-like light-emitting device, any one of the above rod-like light-emitting devices of Embodiments 10, 11 and 13 may be used.

The light-emitting apparatus of this Embodiment 16, as shown in FIG. 38, includes an insulating substrate 200 having metal electrodes 201 and 202 formed on a mounting surface thereof, and a rod-like light-emitting device G mounted on the insulating substrate 200 such that the longitudinal direction of the rod-like light-emitting device G is parallel to the mounting surface of the insulating substrate 200. On the insulating substrate 200, a third metal electrode 203, as one example of the metal portion, is formed between the metal electrodes 201 and 202 on the insulating substrate 200 and below the rod-like light-emitting device G. In FIG. 38, only parts of the metal electrodes 201, 202 and 203 are shown.

The rod-like light-emitting device G includes a semiconductor core 171 made of n-type GaN and having a rod shape whose cross section is nearly hexagonal; a cap layer (not shown) that covers one end surface of the semiconductor core 171; a quantum well layer 173 that is made of p-type InGaN and that covers the outer peripheral surface of a portion other than an exposed portion 171a of the semiconductor core 171 so as not to cover a portion opposite to the portion covered with the cap layer of the semiconductor core 171, so that the exposed portion 171a is provided; and a semiconductor layer 174 that is made of p-type GaN and that covers the outer peripheral surface of the quantum well layer 173. The semiconductor core 171 has, at one end thereof, an exposed portion 171a in which the outer peripheral surface of the semiconductor core 171 is exposed. The end surface of the cap layer on the other side of the semiconductor core 171 is exposed without being covered with the quantum well layer 173 and the semiconductor layer 174.

According to the above light-emitting apparatus of Embodiment 16, the metal electrode 203 is formed between the electrodes 201 and 202 on the insulating substrate 200 and below the rod-like light-emitting device G, so that the central side of the rod-like light-emitting device G whose both ends are connected to the metal electrodes 201 and 202 is supported by bringing the central side into contact with the surface of the metal electrode 203. As a result, the rod-like light-emitting device G, which is connected at both ends, is supported by the metal electrode 203, without being deformed, and heat generated in the rod-like light-emitting device G can be dissipated with a good efficiency from the semiconductor layer 174 through the metal electrode 203 to the insulating substrate 200.

Figure 39:
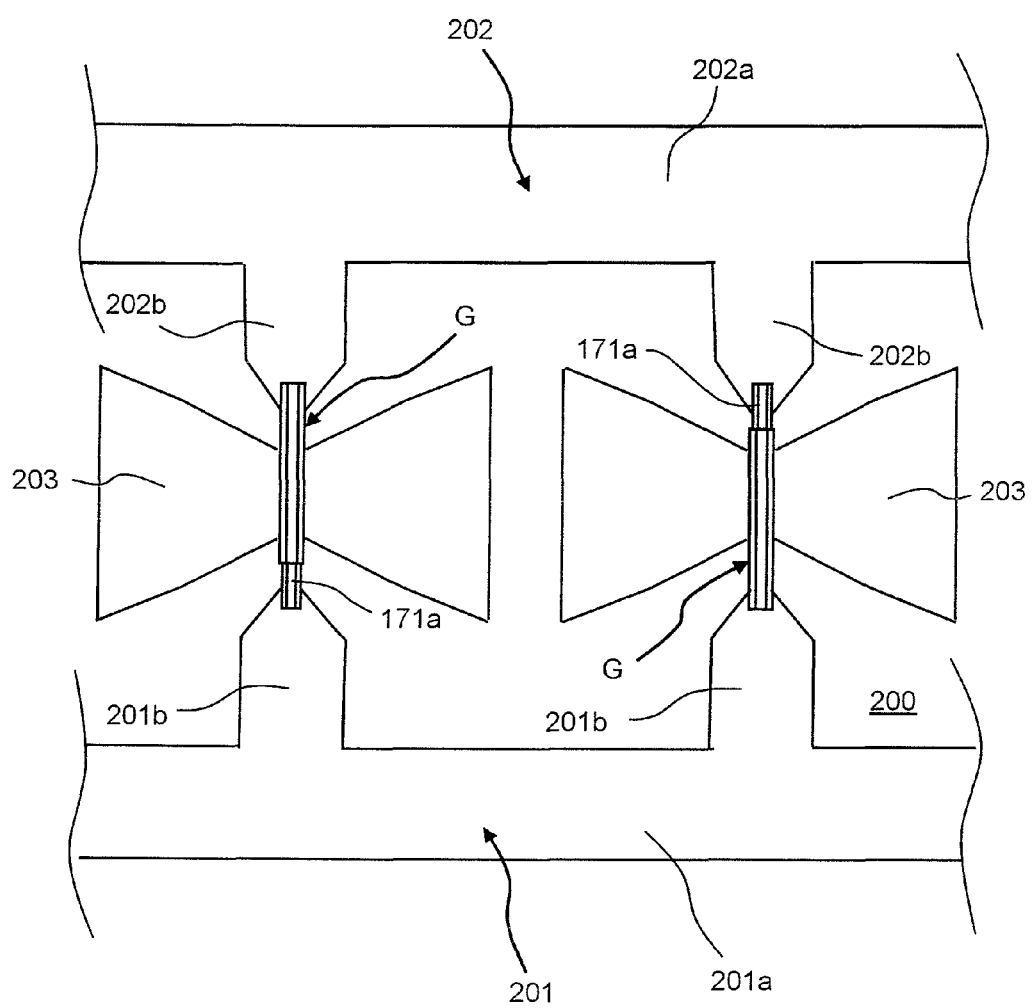
FIG. 39 is a plan view of a main part of the light-emitting apparatus in which rod-like light-emitting devices adjacent to each other are opposite in orientation.

Note that, as shown in FIG. 39, the metal electrodes 201 and 202 include base portions 201a and 202a that are nearly parallel to each other with a predetermined spacing therebetween, and pluralities of electrode portions 201b and 202b extending between the base portions 201a and 202a from positions facing each other in the base portions 201a and 202a, respectively. One rod-like light-emitting device G is aligned at the electrode portion 201b of the metal electrode 201 and the electrode portion 202b of the metal electrode 202 opposite thereto. Between the electrode portion 201b of the metal electrode 201 and the electrode portion 202b of the metal electrode 202 opposite thereto, the third metal electrode 203 in the shape of a butterfly whose central portion is narrow is formed on the insulating substrate 200.

The third metal electrodes 203 adjacent to each other are electrically separated. As shown in FIG. 39, even in cases where the orientations of the rod-like light-emitting devices G adjacent to each other are reversed, the metal electrode 201 and the metal electrode 202 can be prevented from becoming short-circuited to each other through the metal electrode 203.

(Embodiment 17)

FIGS. 40A to 40D are process drawings of a method of manufacturing a rod-like light-emitting device of Embodiment 17 of this invention. In this embodiment, n-type GaN doped with Si and p-type GaN doped with Mg are used. However, the impurity with which GaN is doped is not limited to this.

Figure 40A:
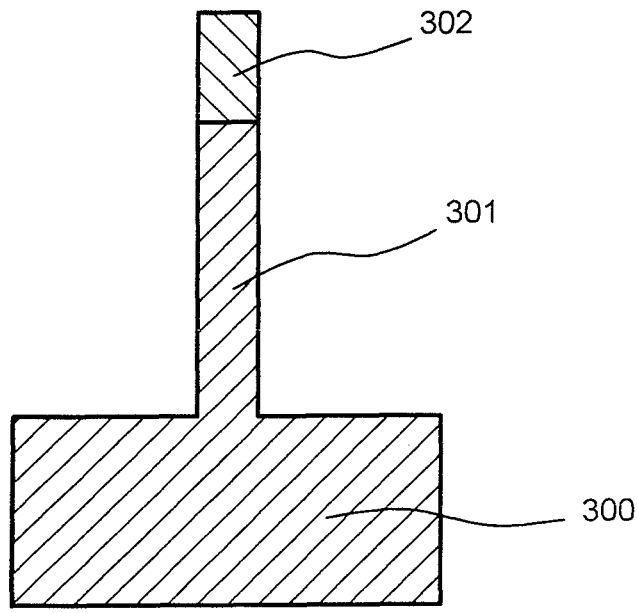
FIG. 40A shows a process step of a method of manufacturing rod-like light-emitting device of Embodiment 17 of this invention.

First, as shown in FIG. 40A, a mask (not shown) having a growth hole is formed on a substrate 300 made of n-type GaN. A material capable of selectively etching a semiconductor core and a semiconductor layer, such as silicon oxide ($SiO_2$) or silicon nitride ($Si_3N_4$), can be used for the mask. To form a growth hole, a lithography method and a dry etching method, which are known and used for usual semiconductor processes, can be used. At this point, the diameter of the semiconductor core to be grown depends on the size of the above growth hole of the mask.

Next, in a semiconductor core forming step, a rod-like semiconductor core 301 is formed on the substrate 300 exposed through the growth hole of the mask by crystal growth of n-type GaN using a metal organic chemical vapor deposition (MOCVD) device. The growth temperature is set to about 950° C., trimethylgalium (TMG) and ammonia ($NH_3$) are used as growth gases, and silane ($SiH_4$) for n-type impurity supply and further hydrogen ($H_2$) as a carrier gas are supplied, so that the semiconductor core 301 of n-type GaN with Si used as the impurity can be grown. Here, n-type GaN results in hexagonal crystal growth, and a semiconductor core in the shape of a hexagonal prism is obtained by growing the crystals under the condition where a direction perpendicular to the surface of the substrate 300 is the c-axis direction.

Then, after the semiconductor core forming step, TMG and $NH_3$ are used as growth gases, and $Cp_2Mg$ is used for p-type impurity supply. Thus, a cap layer 302 made of p-type GaN is formed on the semiconductor core 301. The cap layer 302 is adjusted so as to have a low impurity concentration by controlling the ratio of gases supplied, so that the cap layer 302 has a higher electric resistance than a semiconductor layer to be formed next.

Figure 40B:
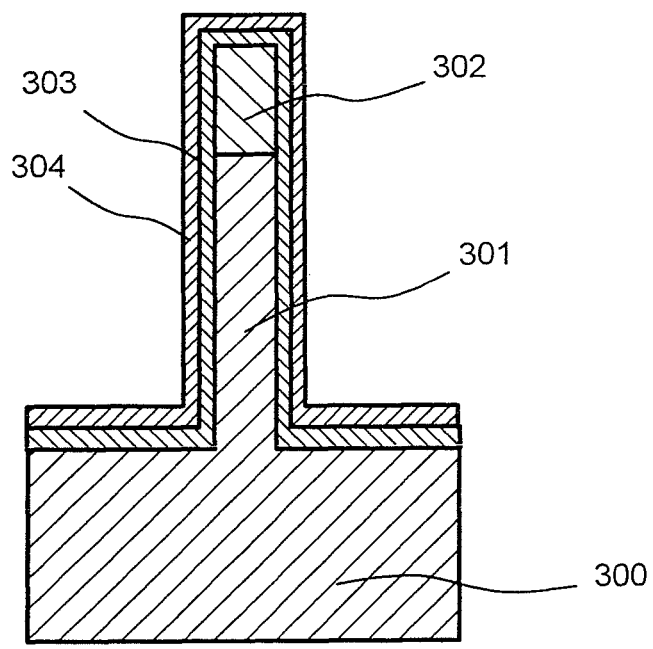
FIG. 40B shows a process step following that of FIG. 40A, showing the method of manufacturing rod-like light-emitting device.

Next, as shown in FIG. 40B, in a quantum well layer and semiconductor layer forming step, a quantum well layer 303 made of p-type InGaN is formed over the whole surface of the substrate 300 such that the rod-like semiconductor core 301 and the cap layer 302 are covered with the quantum well layer 303, and further a semiconductor layer 304 is formed over the whole surface of the substrate 300. After the semiconductor core of n-type GaN has been grown in the MOCVD device as described above, the set temperature is changed from 600° C. to 800° C. in accordance with the wavelength of emitted light, and nitrogen ($N_2$) is supplied to the carrier gas and TMG, $NH_3$ and trimethylindium (TMI) are supplied to the growth gas. In this way, the InGaN quantum well layer 303 can be formed on the semiconductor core 301 of n-type GaN and the cap layer 302. Thereafter, further, the set temperature is changed to 960° C., and TMG and $NH_3$ are used as the growth gases as mentioned above, and $Cp_2Mg$ is used for p-type impurity supply. In this way, the semiconductor layer 304 made of p-type GaN can be formed.

Note that the quantum well layer may have a p-type AlGaN layer as an electron block layer inserted between the InGaN layer and the p-type GaN layer. Also, the quantum well layer may have a multiple quantum well structure in which barrier layers of GaN and quantum well layers of InGaN are alternately laminated.

Figure 40C:
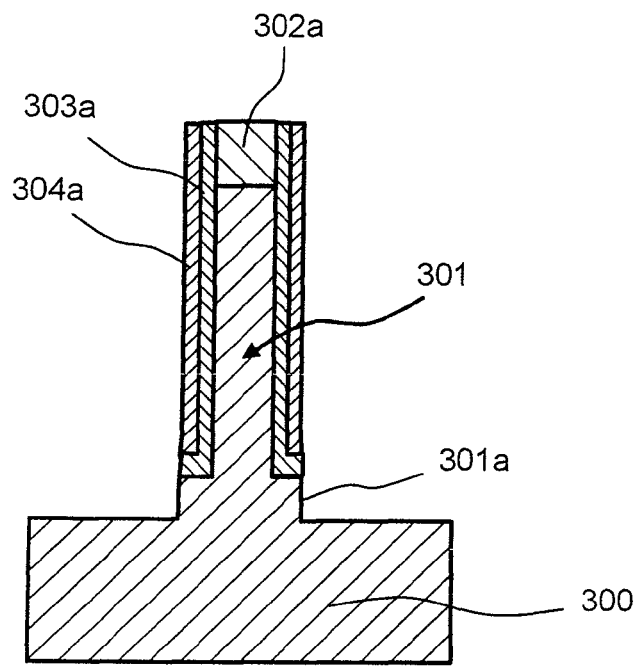
FIG. 40C shows a process step following that of FIG. 40B, showing the method of manufacturing rod-like light-emitting device.

Next, as shown in FIG. 40C, in an exposing step, all of the regions of the quantum well layer 303 and the semiconductor layer 304 except for portions thereof covering the semiconductor core 301 is removed by dry etching so as to expose the outer peripheral surface on the side of the substrate 300 of the rod-like semiconductor core 301, so that an exposed portion 301a is formed, and an upper part of the cap layer 302 is etched to expose the end surface of the cap layer 302a. In this case, use of $SiCl_4$ for RIE of dry etching allows GaN to be anisotropically etched with ease.

Here, the outer peripheral surface of a semiconductor layer 304a and the outer peripheral surface of an exposed portion 301a of the semiconductor core 301 are continuous with each other without a step (no step also exists between the exposed portion of the outer peripheral surface of the quantum well layer 303a and the outer peripheral surface of the exposed portion 301a of the semiconductor core 301). Thus, when a microscopic rod-like light-emitting device that has been separated is mounted on an insulating substrate having an electrode formed thereon in such a manner that the axial direction of the device is parallel to the plane of the substrate, the exposed portion 301a of the semiconductor core 301 can be reliably and easily connected with the electrode because no step exists between the outer peripheral surface of the semiconductor layer 304a and the outer peripheral surface of the exposed portion 301a of the semiconductor core 301.

In the above method of manufacturing a rod-like light-emitting device of Embodiment 17, switching the impurity gas allows the cap layer 302 to be grown immediately after the growth of the semiconductor core 301, and therefore the cap layer 302 can be easily formed.

In the exposing step shown in FIG. 40C, when the substrate 300 is engraved, the upper end of the semiconductor core 301 is not exposed because the cap layer 302 is formed at the edge of the semiconductor core 301.

Figure 40D:
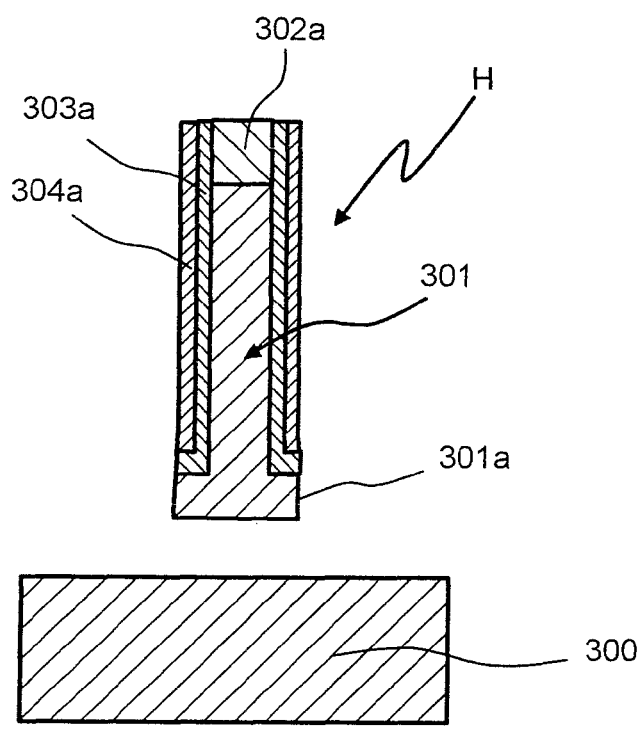
FIG. 40D shows a process step following that of FIG. 40C, showing the method of manufacturing rod-like light-emitting device.

Next, in a separating step, the substrate is immersed in an isopropyl alcohol (IPA) aqueous solution, and is vibrated along the plane of the substrate 300 using ultrasonic waves (e.g., several tens of kilo-hertz). This causes stress to act on the semiconductor core 301 covered with the quantum well layer 303a and the semiconductor layer 304a so as to bend the root close to the substrate 300 of the semiconductor core 301 that erects on the substrate 300. As a result, as shown in FIG. 40D, the semiconductor core 301 covered with the quantum well layer 303a and the semiconductor layer 304a is separated from the substrate 300.

In this way, a microscopic rod-like light-emitting device H that is separated from the substrate 300 can be manufactured. In this Embodiment 17, the rod-like light-emitting device H has a diameter of 1 μm and a length of 10 μm (in FIGS. 40A to 40D, the length of the rod-like light-emitting device H is drawn shorter for the sake of clarity).

According to the above method of manufacturing a rod-like light-emitting device of Embodiment 17, it is possible to implement the microscopic rod-like light-emitting device H that allows electrode connections to be easily made with a simple configuration and that has a high light emitting efficiency.

The microscopic rod-like light-emitting device as used herein is a device, for example, in micrometer order size with a diameter of 1 μm and a length in the range of from 10 μm to 30 μm, or in nanometer order size in which at least the diameter of the diameter and the length of 1 μm or less. The above rod-like light-emitting device can decrease the amount of semiconductors used, makes it possible to reduce the thickness and weight of an apparatus that uses the light-emitting device, and makes it possible to implement a light-emitting apparatus, a backlight, an illuminating device, a display device and the like that have high light-emitting efficiencies and achieve low power consumption.

According to the above manufacturing method, the rod-like light-emitting device H is not integral with the substrate, and therefore it is possible to manufacture the microscopic rod-like light-emitting device H having great freedom in installing into an apparatus. The above rod-like light-emitting device H can decrease the amount of semiconductors used and makes it possible to reduce the thickness and weight of an apparatus that uses the light-emitting device, and emits light from the whole periphery of the semiconductor core covered with the semiconductor layer, which expands the light emitting region. Therefore, a light-emitting apparatus, a backlight, an illuminating device, a display device and the like that have high light-emitting efficiencies and achieve low power consumption can be implemented.

(Embodiment 18)

FIGS. 41A to 41E are process drawings of a method of manufacturing a rod-like light-emitting device of Embodiment 18 of this invention. In this embodiment, n-type GaN doped with Si and p-type GaN doped with Mg are used. However, the impurity with which GaN is doped is not limited to this.

Figure 41A:
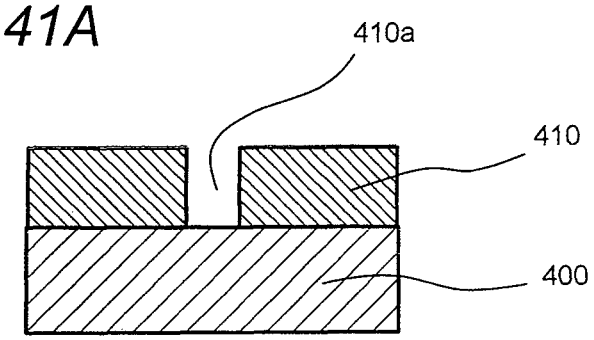
FIG. 41A shows a process step of a method of manufacturing rod-like light-emitting device of Embodiment 18 of this invention.

First, as shown in FIG. 41A, a mask 410 having a growth hole 429A is formed on a substrate 400 made of n-type GaN. A material capable of selectively etching a semiconductor core and a semiconductor layer, such as silicon oxide ($SiO_2$) or silicon nitride ($Si_3N_4$), can be used for the mask. To form a growth hole, a lithography method and a dry etching method, which are known and used for usual semiconductor processes, can be used. At this point, the diameter of a semiconductor core to be grown depends on the size of the above growth hole 429A of the mask 410.

Figure 41B:
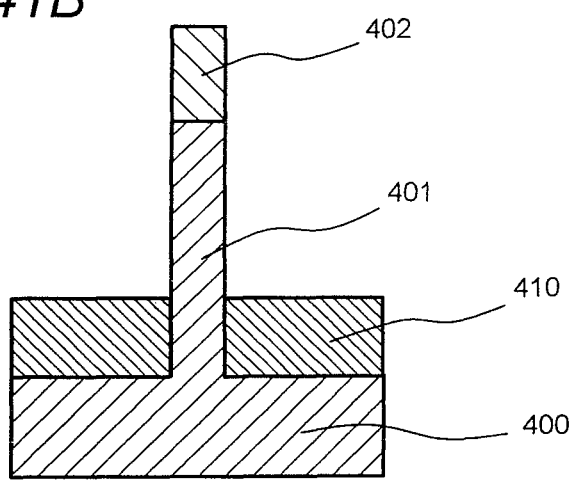
FIG. 41B shows a process step following that of FIG. 41A, showing the method of manufacturing rod-like light-emitting device.

Next, as shown in FIG. 41B, in a semiconductor core forming step, a rod-like semiconductor core 401 is formed on the substrate 400 exposed through the growth hole 429A of the mask 410 by crystal growth of n-type GaN using a MOCVD device. The growth temperature is set to about 950° C., trimethylgalium (TMG) and ammonia ($NH_3$) are used as growth gases, and silane ($SiH_4$) for n-type impurity supply and further hydrogen ($H_2$) as a carrier gas are supplied, so that the semiconductor core 401 of n-type GaN with Si used as the impurity can be grown. Here, n-type GaN results in hexagonal crystal growth, and a semiconductor core shaped like a rod of a hexagonal prism is obtained by growing the crystals under the condition where a direction perpendicular to the surface of the substrate 400 is the c-axis direction.

Then, after the semiconductor core forming step, TMG and $NH_3$ are used as growth gases, and $Cp_2Mg$ is used for p-type impurity supply. Thus, a cap layer 402 made of p-type GaN is formed on the semiconductor core 401. The cap layer 402 is adjusted so as to have a low impurity concentration by controlling the ratio of gases supplied, so that the cap layer 402 has a higher electric resistance than a semiconductor layer to be formed next.

Figure 41C:
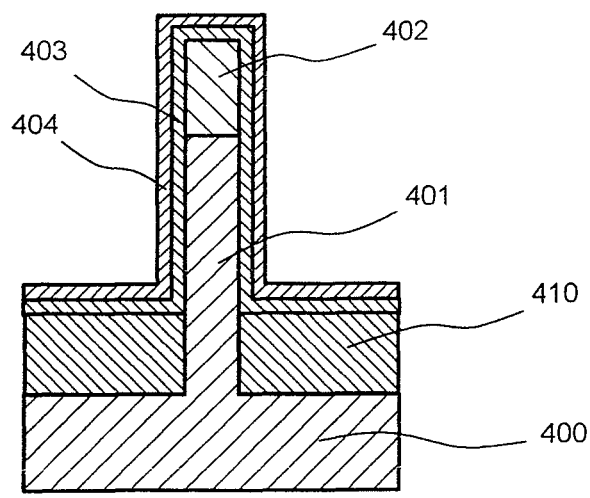
FIG. 41C shows a process step following that of FIG. 41B, showing the method of manufacturing rod-like light-emitting device.

Next, as shown in FIG. 41C, in a quantum well layer and semiconductor layer forming step, a quantum well layer 403 made of p-type InGaN is formed over the whole surface of the substrate 400 so as to cover the rod-like semiconductor core 401 and the cap layer 402, and further a semiconductor layer 404 is formed over the whole surface of the substrate 400. After the semiconductor core 401 of n-type GaN has been grown in the MOCVD device as described above, the set temperature is changed from 600° C. to 800° C. in accordance with the wavelength of emitted light, and nitrogen ($N_2$) is supplied to the carrier gas and TMG, $NH_3$ and trimethylindium (TMI) are supplied to the growth gas. In this way, the InGaN quantum well layer 403 can be formed on the semiconductor core 401 of n-type GaN. Thereafter, further, the set temperature is changed to 960° C., and TMG and $NH_3$ are used as the growth gases as mentioned above, and $Cp_2Mg$ is used for p-type impurity supply. In this way, the semiconductor layer 404 made of p-type GaN can be formed.

Note that the quantum well layer may have a p-type AlGaN layer as an electron block layer inserted between the InGaN layer and the p-type GaN layer. Also, the quantum well layer may have a multiple quantum well structure in which barrier layers of GaN and quantum well layers of InGaN are alternately laminated.

Figure 41D:
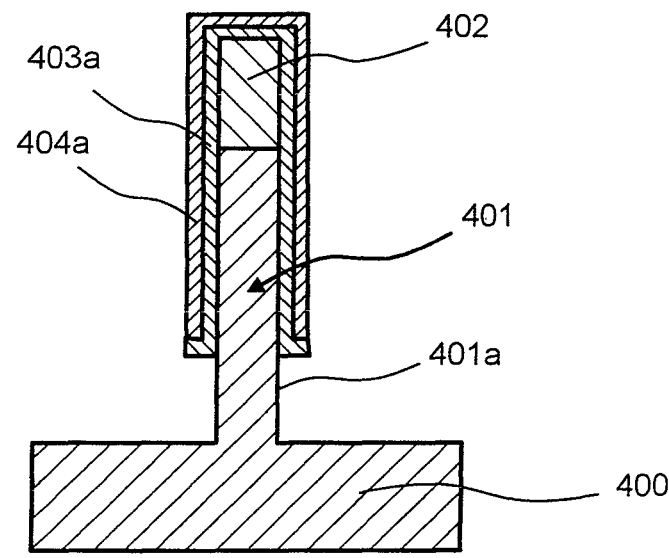
FIG. 41D shows a process step following that of FIG. 41C, showing the method of manufacturing rod-like light-emitting device.

Next, as shown in FIG. 41D, in an exposing step, all of the regions of the quantum well layer 403 and the semiconductor layer 404, except for portions thereof covering the semiconductor core 401, and the mask 410 (shown in FIG. 41C) are removed by etching so as to expose the outer peripheral surface on the side of the substrate 400 of the rod-like semiconductor core 401 to form an exposed portion 401a. In this state, the end surface of the above semiconductor core 401 opposite to the substrate 400 is covered with the quantum well layer 403a and the semiconductor layer 404a. In the case where a mask is made of silicon oxide ($SiO_2$) or silicon nitride ($Si_3N_4$), use of a solution containing hydrofluoric acid (HF) enables the mask to be easily etched without affecting the semiconductor core and the semiconductor layer portion covering the semiconductor core, and enables the mask together with the semiconductor layer on the mask (all of the region of the semiconductor layer except for a portion thereof covering the semiconductor core) to be removed by lift-off. In the exposing step of this embodiment, dry etching using $CF_4$ and $XeF_2$ enables the mask to be easily etched without affecting the semiconductor core and the semiconductor layer portion covering the semiconductor core, so that all of the region of the semiconductor layer, except for a portion thereof covering the semiconductor core, together with the mask can be removed.

In the exposing step shown in FIG. 41D, even when the quantum well layer 403 and the semiconductor layer 404 on the edge side of the semiconductor core 401 are removed by etching, the upper end of the semiconductor core 401 is not exposed because the cap layer 402 is formed.

Figure 41E:
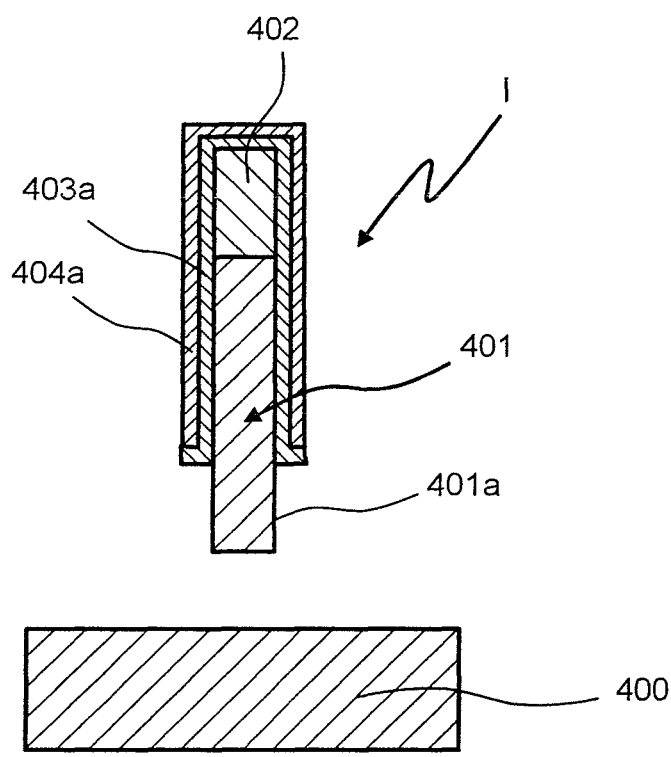
FIG. 41E shows a process step following that of FIG. 41D, showing the method of manufacturing rod-like light-emitting device.

Next, in a separating step, the substrate is immersed in an isopropyl alcohol (IPA) aqueous solution, and is vibrated along the plane of the substrate 400 using ultrasonic waves (e.g., several tens of kilo-hertz). This causes stress to act on the semiconductor core 401 covered with the quantum well layer 403a and the semiconductor layer 404a so as to bend the root close to the substrate 400 of the semiconductor core 401 that erects on the substrate 400. As a result, as shown in FIG. 41E, the semiconductor core 401 covered with the quantum well layer 403a and the semiconductor layer 404a is separated from the substrate 400.

In this way, a microscopic rod-like light-emitting device I that is separated from the substrate 400 can be manufactured. In this Embodiment 18, the rod-like light-emitting device I has a diameter of 1 μm and a length of 10 μm (in FIGS. 41A to 41E, the length of the rod-like light-emitting device I is drawn shorter for the sake of clarity).

According to the above method of manufacturing a rod-like light-emitting device, it is possible to manufacture the microscopic rod-like light-emitting device I having great freedom in installing into an apparatus. The above rod-like light-emitting device can decrease the amount of semiconductors used and makes it possible to reduce the thickness and weight of an apparatus that uses the light-emitting device, and emits light from the whole periphery of the semiconductor core 401, which expands the light emitting region. Therefore, it is possible to implement a light-emitting apparatus, a backlight, an illuminating device, a display device and the like that have high light-emitting efficiencies and achieve low power consumption.

(Embodiment 19)

FIGS. 42A to 42E are process drawings of a method of manufacturing a rod-like light-emitting device of Embodiment 19 of this invention. In this embodiment, n-type GaN doped with Si and p-type GaN doped with Mg are used. However, the impurity with which GaN is doped is not limited to this.

Figure 42A:
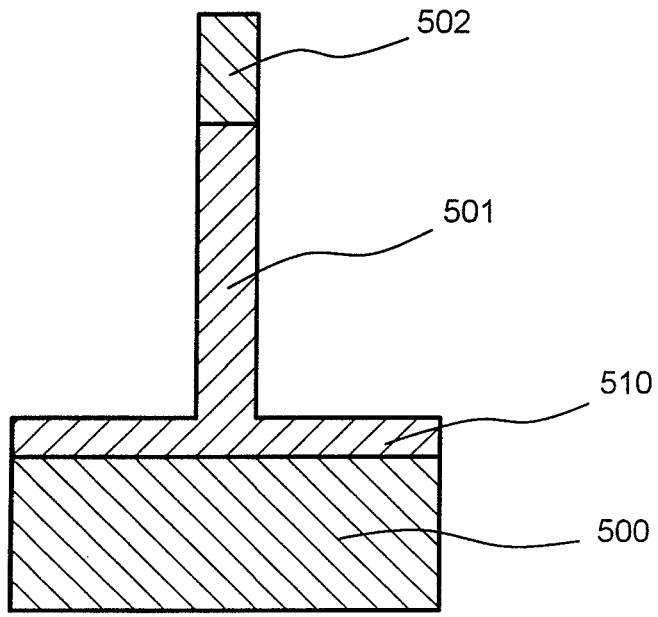
FIG. 42A shows a process step of a method of manufacturing rod-like light-emitting device of Embodiment 19 of this invention.

First, as shown in FIG. 42A, a semiconductor film 510 made of n-type GaN is formed on an underlying substrate 500, and a mask (not shown) having a growth hole is formed on the semiconductor film 510. A material capable of selectively etching a semiconductor core and a semiconductor layer, such as silicon oxide ($SiO_2$) or silicon nitride ($Si_3N_4$), can be used for the mask. To form a growth hole, a lithography method and a dry etching method, which are known and used for usual semiconductor processes, can be used. At this point, the diameter of the semiconductor core to be grown depends on the size of the above growth hole of the mask.

Next, in a semiconductor core forming step, a semiconductor core 501 shaped like a rod is formed on the semiconductor film 510 exposed through the growth hole of the mask by crystal growth of n-type GaN using a MOCVD device. The growth temperature is set to about 950° C., trimethylgalium (TMG) and ammonia ($NH_3$) are used as growth gases, and silane ($SiH_4$) for n-type impurity supply and further hydrogen ($H_2$) as a carrier gas are supplied, so that the semiconductor core 501 of n-type GaN with Si used as the impurity can be grown. Here, n-type GaN results in hexagonal crystal growth, and a semiconductor core in the shape of a hexagonal prism is obtained by growing the crystals under the condition where a direction perpendicular to the surface of the underlying substrate 500 is the c-axis direction.

Then, after the semiconductor core forming step, TMG and $NH_3$ are used as growth gases, and $Cp_2Mg$ is used for p-type impurity supply. Thus, a cap layer 502 made of p-type GaN is formed on the semiconductor core 501. The cap layer 502 is adjusted so as to have a low impurity concentration by controlling the ratio of gases supplied, so that the cap layer 502 has a higher electric resistance than a semiconductor layer to be formed next. Note that the cap layer 502 is not limited to that of p-type GaN, and may be made of another insulating material.

Figure 42B:
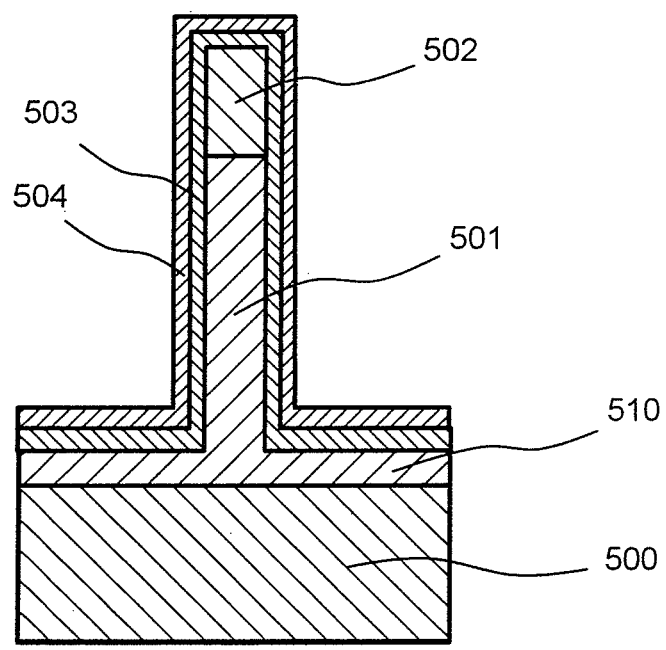
FIG. 42B shows a process step following that of FIG. 42A, showing the method of manufacturing rod-like light-emitting device.

Next, as shown in FIG. 42B, in a quantum well layer and semiconductor layer forming step, a quantum well layer 503 made of p-type InGaN is formed over the whole surface of the underlying substrate 500 such that the rod-like semiconductor core 501 and the cap layer 502 are covered with the quantum well layer 503, and further a semiconductor layer 504 is formed over the whole surface of the underlying substrate 500. After the semiconductor core 501 of n-type GaN has been grown in the MOCVD device as described above, the set temperature is changed from 600° C. to 800° C. in accordance with the wavelength of emitted light, and nitrogen ($N_2$) is supplied to the carrier gas and TMG, $NH_3$ and trimethylindium (TMI) are supplied to the growth gas. In this way, the InGaN quantum well layer 503 can be formed on the semiconductor core 501 of n-type GaN. Thereafter, further, the set temperature is changed to 960° C., and TMG and $NH_3$ are used as the growth gases as mentioned above, and $Cp_2Mg$ is used for p-type impurity supply. In this way, the semiconductor layer 504 made of p-type GaN can be formed.

Note that the quantum well layer may have a p-type AlGaN layer as an electron block layer inserted between the InGaN layer and the p-type GaN layer. Also, the quantum well layer may have a multiple quantum well structure in which barrier layers of GaN and quantum well layers of InGaN are alternately laminated.

Figure 42C:
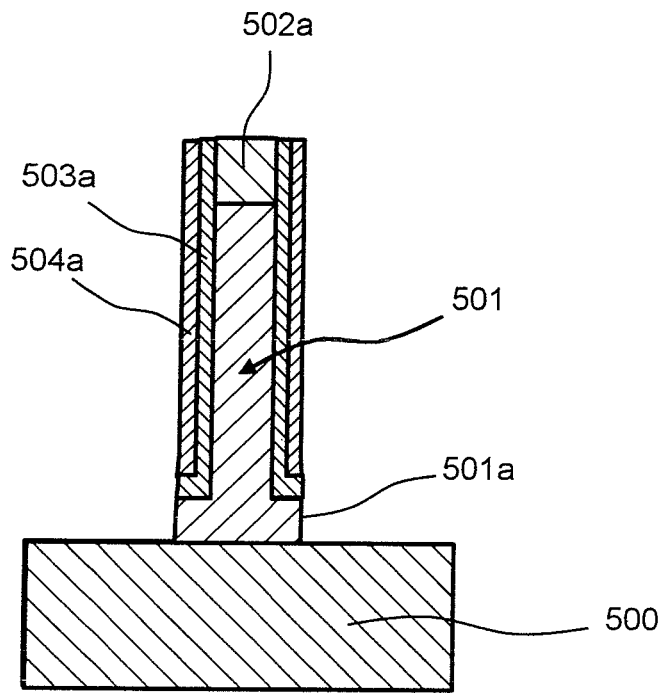
FIG. 42C shows a process step following that of FIG. 42B, showing the method of manufacturing rod-like light-emitting device.

Next, as shown in FIG. 42C, in an exposing step, all of the regions of the quantum well layer 503 and the semiconductor layer 504, except for portions thereof covering the semiconductor core 501, is removed by dry etching so as to expose the outer peripheral surface on the side of the underlying substrate 500 of the rod-like semiconductor core 501 to form an exposed portion 501a, and an upper part of the cap layer 502 is also etched to expose the end surface of the cap layer 502a. In this case, use of $SiCl_4$ for RIE of dry etching allows GaN to be anisotropically etched with ease.

Here, the outer peripheral surface of a semiconductor layer 504a and the outer peripheral surface of an exposed portion 501a of the semiconductor core 501 are continuous with each other without a step (no step also exists between an exposed portion of the outer peripheral surface of the quantum well layer 503a and the outer peripheral surface of the exposed portion 501a of the semiconductor core 501). Thus, when a microscopic rod-like light-emitting device that has been separated is mounted on an insulating substrate having an electrode formed thereon in such a manner that the axial direction of the device is parallel to the plane of the substrate, the exposed portion 501a of the semiconductor core 501 can be reliably and easily connected with the electrode because no step exists between the outer peripheral surface of the semiconductor layer 504a and the outer peripheral surface of the exposed portion 501a of the semiconductor core 501.

In the above method of manufacturing a rod-like light-emitting device of Embodiment 19, switching the impurity gas allows the cap layer 502 to be grown immediately after the growth of the semiconductor core 501, and therefore the cap layer 502 can be easily formed.

In the exposing step shown in FIG. 42C, when etching is performed until the underlying substrate 500 is exposed, the upper end of the semiconductor core 501 is not exposed because the cap layer 502 is formed at the edge of the semiconductor core 501.

Figure 42D:
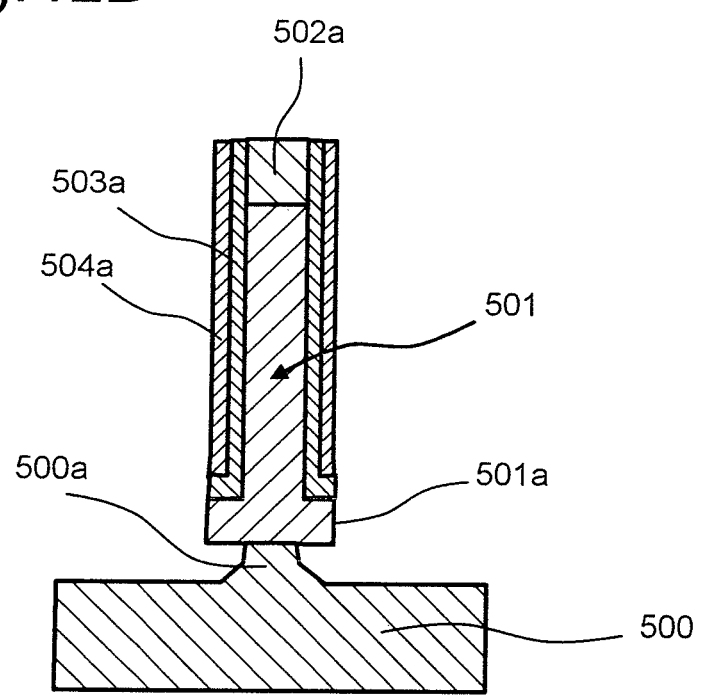
FIG. 42D shows a process step following that of FIG. 42C, showing the method of manufacturing rod-like light-emitting device.

Next, as shown in FIG. 42D, the underlying substrate 500 is isotropically etched to engrave the underlying substrate 500 up to the lower side of the semiconductor core 501 such that the diameter of edge of a protrusion 500a formed in the underlying substrate 500 is less than the diameter of the semiconductor core 501.

Figure 42E:
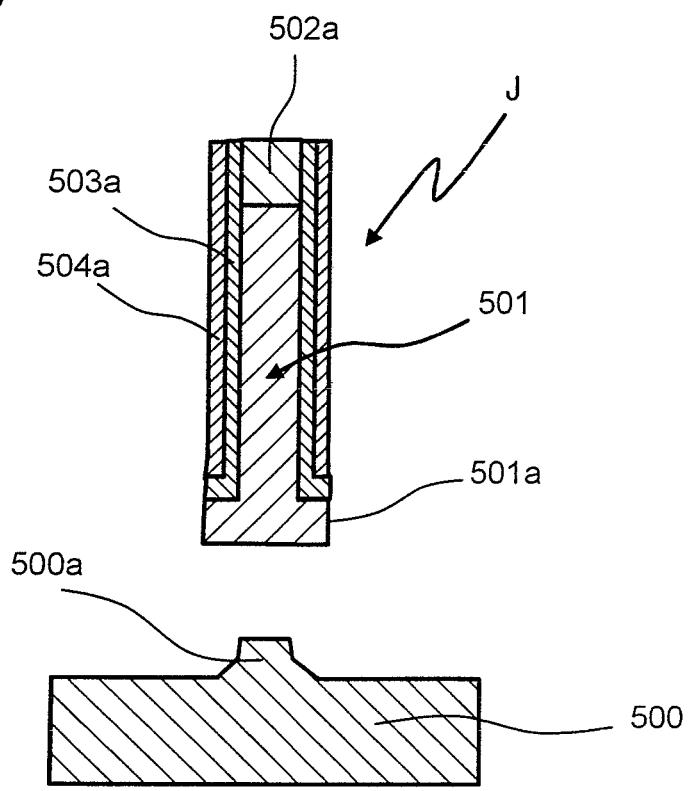
FIG. 42E shows a process step following that of FIG. 42D, showing the method of manufacturing rod-like light-emitting device.

Next, in a separating step, the substrate is immersed in an isopropyl alcohol (IPA) aqueous solution, and is vibrated along the plane of the underlying substrate 500 using ultrasonic waves (e.g., several tens of kilo-hertz). This causes stress to act on the semiconductor core 501 covered with the quantum well layer 503a and the semiconductor layer 504a so as to bend the semiconductor core 501 that erects on the protrusion 500a in the underlying substrate 500. As a result, as shown in FIG. 42E, the semiconductor core 501 covered with the quantum well layer 503a and the semiconductor layer 504a is separated from the substrate 500.

In this way, a microscopic rod-like light-emitting device J that is separated from the underlying substrate 500 can be manufactured. In Embodiment 19, the rod-like light-emitting device J has a diameter of 1 μm and a length of 10 μm (in FIGS. 42A to 42E, the length of the rod-like light-emitting device J is drawn shorter for the sake of clarity).

According to the above method of manufacturing a rod-like light-emitting device of Embodiment 19, it is possible to implement the microscopic rod-like light-emitting device J that allows electrode connections to be easily made with a simple configuration and has a high light emitting efficiency.

According to the above method of manufacturing a rod-like light-emitting device, it is possible to manufacture the microscopic rod-like light-emitting device J having great freedom in installing into an apparatus. The above rod-like light-emitting device J can decrease the amount of semiconductors used to make it possible to reduce the thickness and weight of an apparatus using the light-emitting device, and emits light from the whole periphery of the semiconductor core covered with the semiconductor layer, which expands the light emitting region. Therefore, a light-emitting apparatus, a backlight, an illuminating device, a display device and the like that have high light-emitting efficiencies and achieve low power consumption can be implemented.

According to the above method of manufacturing a rod-like light-emitting device, when the semiconductor core 501 is separated from the substrate 500, the position at which the semiconductor core 501 is broken is stable. This makes it possible to form rod-like light-emitting devices that are uniform in length.

In Embodiments 10 to 19 described above, semiconductors whose base materials are GaN are used for the semiconductor core, the cap layer and the semiconductor layer. However, this invention may be applied to light-emitting devices using semiconductors whose base materials are GaAs, AlGaAs, GaAsP, InGaN, AlGaN, GaP, ZnSe, AlGaInP and the like. While the semiconductor core is of n type and the semiconductor layer is of p type, this invention may be applied to a rod-like light-emitting device in which the conductivity types are reversed. The rod-like light-emitting devices having the semiconductor cores with hexagonal prism shapes have been described. However, the rod-like light-emitting device is not limited to this, and may have a rod shape whose cross section has a circle shape or an ellipse shape. This invention may be applied to a rod-like light-emitting device having a semiconductor core in a rod shape whose cross section has the shape of another polygon such as a triangle.

In Embodiments 10 to 19 described above, the rod-like light-emitting device has a size of the order of micrometers with a diameter of 1 μm and a length of from 10 μm to 30 μm. However, there may be used a device with the size in the order of nanometers in which at least the diameter of the diameter and the length is less than 1 μm. The diameter of the semiconductor core of the above rod-like light-emitting device is preferably 500 nm or more and 100 μm or less, which enables variations in diameter of the semiconductor core to be reduced compared to a rod-like light-emitting device having a semiconductor core whose diameter ranges from several tens of nanometers to several hundreds of nanometers. Therefore, variations in the light emitting region, that is, variations in light emission characteristics can be decreased. This can lead to improvement in yields.

In Embodiments 17 to 19 described above, crystal growth of the semiconductor cores 301, 401 and 501 and the cap layers 302, 402 and 502 are made using the MOCVD device. However, the semiconductor core and the cap layer may be formed using another crystal growth device, such as a molecular-beam epitaxy (MBE) device. The crystal growth of the semiconductor core is made on a substrate using a mask having a growth hole. However, metal species are placed on a substrate, and crystal growth of a semiconductor core may result from the metal species.

In Embodiments 17 to 19 described above, the semiconductor cores 301, 401 and 501 are separated from the substrate using ultrasonic waves. However, the way of separation is not limited to this, and the semiconductor core may be separated from the substrate by mechanically bending the semiconductor core with a cutting tool. In this case, a plurality of microscopic rod-like light-emitting devices provided on the substrate can be separated by a simple way for a short time.

(Embodiment 20)

Figure 43:
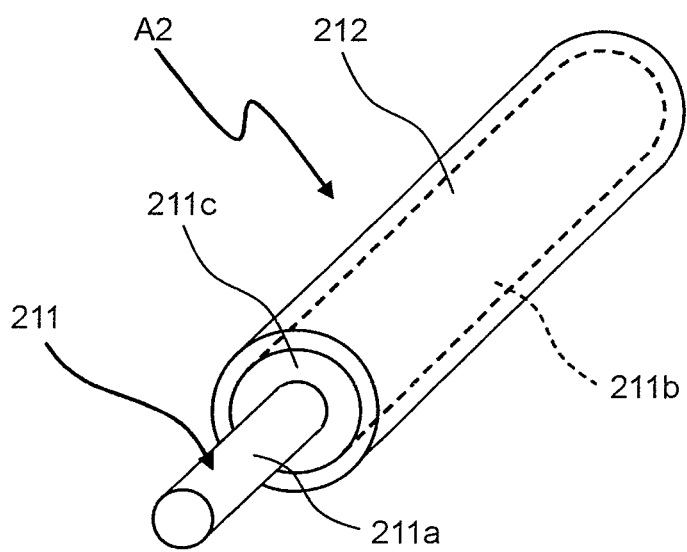
FIG. 43 is a perspective view of a rod-like light-emitting device of Embodiment 20 of this invention.
Figure 44:
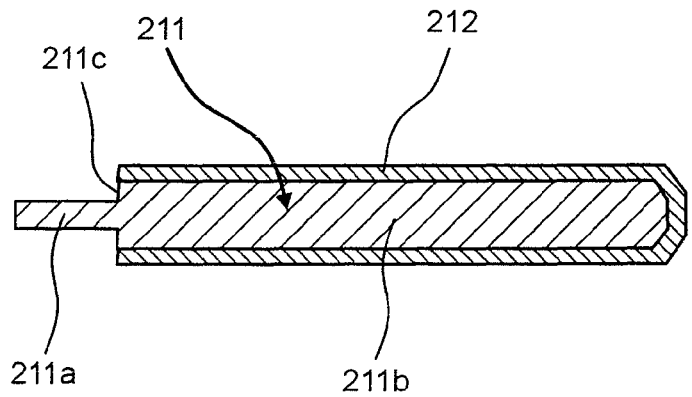
FIG. 44 is a cross-sectional view of the rod-like light-emitting device.

FIG. 43 is a perspective view of a rod-like light-emitting device of Embodiment 20 of this invention, and FIG. 44 is a cross-sectional view of the rod-like light-emitting device.

A rod-like light-emitting device A2 of this Embodiment 20, as shown in FIG. 43 and FIG. 44, includes a semiconductor core 211 made of n-type GaN and having a rod shape whose cross section is nearly circular, and a semiconductor layer 212 that is made of p-type GaN and that covers a covered portion 211b other than an end portion of the semiconductor core 211 such that the end portion not covered with the semiconductor layer 212 of the semiconductor core 211 provides an exposed portion 211a. In the semiconductor core 211, the exposed portion 211a has a smaller diameter than the covered portion 211b, and a step or riser portion 211c is provided between the outer peripheral surface of the exposed portion 211a and the outer peripheral surface of the covered portion 211b. The end surface of the other end of the semiconductor core 211 is covered with the semiconductor layer 212.

The above rod-like light-emitting device A2 is manufactured as follows.

First, a mask having a growth hole is formed on a substrate made of n-type GaN. Silicon oxide ($SiO_2$), silicon nitride ($Si_3N_4$) or another material that is selectively etchable with respect to the semiconductor core 211 and the semiconductor layer 212 is used as the material for the mask. To form a growth hole, a lithography method and a dry etching method, which are known and used for usual semiconductor processes, can be used.

Next, a catalyst metal layer is formed on a substrate exposed through a growth hole of the mask. This catalyst metal layer is formed in such a way that, with a resist that has been used at the time of forming the growth hole by way of a lithography method and a dry etching method remaining on the mask, a catalyst metal layer having a thickness of from about 200 nm to 400 nm is deposited on the resist and the substrate exposed from the growth hole (exposed region within the growth hole), and the catalyst metal layer on the resist as well as the resist are removed by a lift-off method. For the catalyst metal layer, materials, such as Ni, Fe and Au, can be used. These materials dissolve and take in compound semiconductor materials of Ga, N, In, Al and the like, and impurity materials of Si, Mg and the like, and do not form compounds with themselves.

Next, on the substrate on which the catalyst metal layer is formed in the growth hole of the mask, the rod-like semiconductor core 211 is formed by crystal growth of n-type GaN from an interface between the catalyst metal layer and the substrate using a metal organic chemical vapor deposition (MOCVD) device. The temperature of the MOCVD device is set to about 950° C., trimethylgalium (TMG) and ammonia ($NH_3$) are used as growth gases, and silane ($SiH_3$) for n-type impurity supply and further hydrogen ($H_3$) as a carrier gas are supplied, so that a semiconductor core of n-type GaN with Si used as the impurity can be grown. During the growing, when the semiconductor core 211 is being grown in the growth hole of the mask, the diameter of the semiconductor core 211 to be grown is determined depending on the internal diameter of the growth hole because the diameter of the catalyst metal layer does not extend beyond the internal diameter of the growth hole. However, after the diameter of the semiconductor core 211 being grown exceeds the height of the mask (the depth of the growth hole), the diameter of the semiconductor core 211 can be determined depending on the diameter of the catalyst metal layer that coagulates in the shape of an island. Accordingly, in the case of forming the catalyst metal layer in the above thickness, when the height of the semiconductor core 211 being grown exceeds the height of the mask (the depth of the growth hole), the catalyst metal layer coagulates in the shape of an island with a diameter larger than the inner diameter of the growth hole. Therefore, the covered portion 211b of the semiconductor core 211 can be grown with a diameter larger than the diameter of the exposed portion 211a of the semiconductor core 211 in the growth hole.

Next, with the catalyst metal island layer maintained at the edge of the semiconductor core 211, a semiconductor layer made of p-type GaN is formed over the whole surface of the substrate to cover the rod-like semiconductor core 211. The temperature of the MOCVD device is set to about 960° C., TMG and $NH_3$ are used as growth gases, and bis(cyclopentadienyl)magnesium ($Cp_2Mg$) is used for p-type impurity supply, so that p-type GaN with magnesium (Mg) used as the impurity can be grown.

Next, the above catalyst metal island layer is removed, and all of the region of the semiconductor layer, except for a portion thereof covering the semiconductor core, and the mask are removed by a lift-off method to expose the outer peripheral surface on the substrate side of the rod-like semiconductor core 211, so that an exposed portion is formed. In this state, the end surface of the above semiconductor core 211 opposite to the substrate is covered with the semiconductor layer 212, and the exposed portion 211a having a smaller diameter than the covered portion 211b of the semiconductor core 211 is formed.

In the case where the mask is made of silicon oxide ($SiO_2$) or silicon nitride ($Si_3N_4$), use of a solution containing hydrofluoric acid (HF) enables the mask to be easily etched without affecting the semiconductor core and the semiconductor layer portion that covers the semiconductor core, and enables all of the region of the semiconductor layer, except for a portion thereof covering the semiconductor core, together with the mask to be removed by lift-off. In this embodiment, the length of the exposed portion 211a of the semiconductor core 211 is determined depending on the thickness of the removed mask. The lift-off is used in the exposing step of this embodiment; however, part of the semiconductor core may be exposed by etching.

Next, the substrate is immersed in an isopropyl alcohol (IPA) aqueous solution, and is vibrated along the plane of the substrate using ultrasonic waves (e.g., several tens of kilohertz). This causes stress to act on the semiconductor core 211 covered with the semiconductor layer 212 so as to bend the root close to the substrate of the semiconductor core 211 that erects on the substrate. As a result, the semiconductor core 211 covered with the semiconductor layer 212 is separated from the substrate.

In this way, the microscopic rod-like light-emitting device that is separated from the substrate made of n-type GaN can be manufactured.

The above semiconductor core is separated from the substrate using ultrasonic waves. However, the way of separation is not limited to this, and the semiconductor core may be separated from the substrate by mechanically bending the semiconductor core with a cutting tool. In this case, a plurality of microscopic rod-like light-emitting devices provided on the substrate can be separated by a simple way for a short time.

Moreover, in the rod-like light-emitting device described above, crystal growth of the semiconductor layer 212 occurs radially outward from the outer peripheral surface of the semiconductor core 211. The growth distance in the radial direction is short and the defect deviates outward, and therefore the semiconductor core 211 can be covered with the semiconductor layer 212 having less crystal defects. Accordingly, a rod-like light-emitting device having good characteristics can be implemented.

According to the rod-like light-emitting device A2 having the above configuration, the covered portion 211b other than the exposed portion 211a of the semiconductor core 211 is covered with the p-type semiconductor layer 212 so as not to cover one end of the n-type semiconductor core 211 shaped like a rod, so that the exposed portion 211a is provided. As a result, even in cases where the rod-like light-emitting device is microscopic and has a size of the order of micrometers or of the order of nanometers, it becomes possible to connect the exposed portion 211a of the semiconductor core 211 to an n-side electrode and to connect a p-side electrode to a portion of the semiconductor layer 212 that covers the semiconductor core 211. In the rod-like light-emitting device A2, with the n-side electrode connected to the exposed portion 211a of the semiconductor core 211 and with the p-side electrode connected to the semiconductor layer 212, a current is caused to flow from the p-side electrode to the n-side electrode to result in recombination of electrons and holes in an interface (pn junction) between the outer peripheral surface of the semiconductor core 211 and the inner peripheral surface of the semiconductor layer 212. Thus, light is emitted. In the rod-like light-emitting device A2, light is emitted from the whole side surface of the semiconductor core 211 covered with the semiconductor layer 212. The light emitting region therefore becomes larger, which results in a high light emitting efficiency.

Accordingly, it is possible to implement the microscopic rod-like light-emitting device A2 that allows electrode connections to be easily made with a simple configuration and has a high light emitting efficiency. The above rod-like light-emitting device A2 is not integral with the substrate, which allows great freedom in installing into an apparatus.

The microscopic rod-like light-emitting device as used herein is a device, for example, in micrometer order size with a diameter of 1 μm and a length in the range of from 10 μm to 30 μm, or in nanometer order size in which at least the diameter of the diameter and the length of 1 μm or less. The above rod-like light-emitting device can decrease the amount of semiconductors used, makes it possible to reduce the thickness and weight of an apparatus that uses the light-emitting device, and makes it possible to implement a light-emitting apparatus, a backlight, an illuminating device, a display device and the like that have high light-emitting efficiencies and achieve low power consumption.

The outer peripheral surface of one end portion of the above semiconductor core 211 is exposed, for example, by about 1 μm to 5 μm. This makes it possible to connect one n-side electrode to the exposed portion 211a of the outer peripheral surface of the semiconductor core 211 and to connect the p-side electrode to the semiconductor layer 212 on the other end portion of the semiconductor core 211. Connections can be made with the electrodes separate at both ends. Thus, the p-side electrode connected to the semiconductor layer 212 and the exposed portion 211a of the semiconductor core 211 can easily be prevented from being short-circuited to each other.

Figure 45:
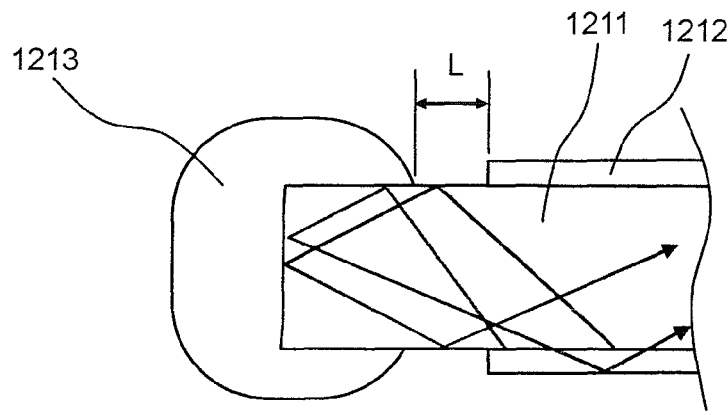
FIG. 45 is a schematic cross-sectional view of a rod-like light-emitting device of a comparative example.

FIG. 45 is a schematic cross-sectional view of the main part of a rod-like light-emitting device of a comparative example, but not a rod-like light-emitting device of this invention. The rod-like light-emitting device of FIG. 45 differs from the above rod-like light-emitting device A2 shown in FIG. 43 and FIG. 44 of Embodiment 20 in that no step, or no level difference, exists between the outer peripheral surface of an exposed portion of a semiconductor core 1211 and a covered portion covered with a semiconductor layer 1212 of the semiconductor core 1211.

In this rod-like light-emitting device, in the case where an n-side electrode is connected to the exposed portion of the semiconductor core 1211, because there exists no step portion, i.e., no difference in level, a distance L between an n-side electrode 1213 and the end surface of the semiconductor layer 1212 becomes shorter. As a result, there might be short-circuiting and a leakage current between the n-side electrode 1213 and the semiconductor layer 1212. In this rod-like light-emitting device, as shown in FIG. 45, light with a large angle of incidence from the inside of the semiconductor core 1211 to the outer peripheral surface of the exposed portion is reflected from the inside of the semiconductor core 1211 and therefore extracting the light to the outside is difficult.

Figure 46:
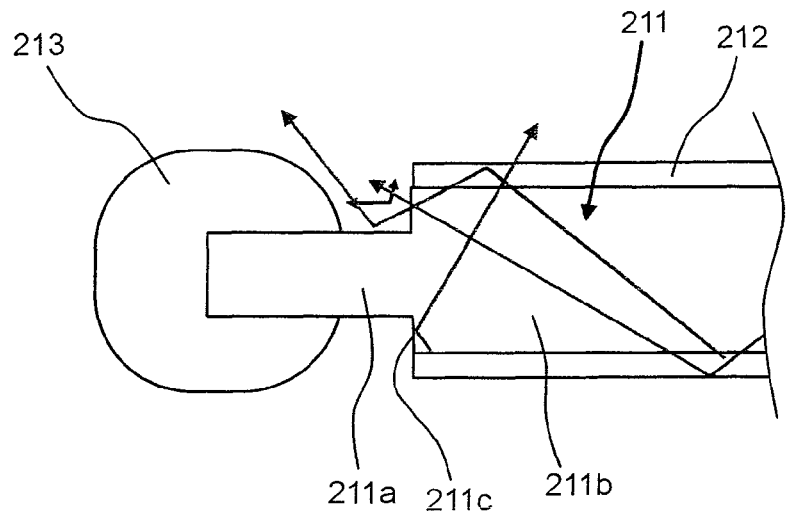
FIG. 46 is a schematic cross-sectional view of a main part of a rod-like light-emitting device of Embodiment 20.

In contrast, as shown in a schematic cross-sectional view of FIG. 46, in the above rod-like light-emitting device shown in FIG. 43 and FIG. 44 of Embodiment 20, as shown in FIG. 46, a step or riser portion (i.e., level difference) 211c is provided between the outer peripheral surface of the exposed portion 211a of the semiconductor core 211, which is not covered with the semiconductor layer 212, and the outer peripheral surface of a covered portion of the semiconductor core 211, which is covered with the semiconductor layer 212. Therefore, compared to the comparative example of FIG. 45 in which the outer peripheral surface of the exposed portion 211a of the semiconductor core 211 is coincident, or flush, with the outer peripheral surface of the covered portion 211b such that there exists no step, the position of the end surface of the semiconductor layer 212 is determined depending on the step portion 211c formed at the boundary between the exposed portion 211a of the semiconductor core 211 and the semiconductor layer 212. This can reduce or eliminate variations of the boundary position during manufacturing. In the case where, as the comparative example of FIG. 45, the outer peripheral surface of an exposed portion of a semiconductor core is coincident with the outer peripheral surface of a covered portion such that there exists no step, a clearance might be produced between the inner wall of a growth hole of a mask and the semiconductor core during growth of the semiconductor core. When a semiconductor layer is formed subsequently, the semiconductor layer can be formed in the clearance region between the inner wall of the growth hole of the mask and the semiconductor core. As a result, the boundary between the exposed portion of the semiconductor core and the covered portion, which is originally defined at the position of the top surface of the mask, can vary. In contrast, in the case where, as Embodiment 20 shown in FIG. 46, a step exists between the outer peripheral surface of an exposed portion of a semiconductor core and the outer peripheral surface of a covered portion, the semiconductor core is grown with a diameter larger than the internal diameter of a growth hole after the height of the semiconductor core exceeds the height of a mask during manufacturing. Therefore, if a clearance is produced between the inner wall of the growth hole of the mask and the semiconductor core, the semiconductor core is grown so as to close the clearance. Thus, during formation of a semiconductor layer, the semiconductor layer can be prevented from being formed in a clearance region between the inner wall of the growth hole of the mask and the semiconductor core. In FIG. 46, the distance in the longitudinal direction between the n-side electrode 213 and the end surface of the semiconductor layer 212 is the same as the comparative case; however, the distance expands in the radial direction by the length of the step portion 211c.

The step portion 211c provided between the outer peripheral surface of the exposed portion 211a of the semiconductor core 211 and the outer peripheral surface of the covered portion 211b allows the outer peripheral surface of the exposed portion 211a of the semiconductor core 211 and the semiconductor layer 212 to be more distant from each other. Therefore, when the n-side electrode is connected to the exposed portion 211a of the semiconductor core 211, short-circuiting and occurrence of a leakage current between the n-side electrode and the semiconductor layer 212 can be eliminated or reduced. Moreover, it becomes easier to extract light to the outside from the step portion 211c formed at the boundary between the outer peripheral surface of the exposed portion 211a of the semiconductor core 211 and the outer peripheral surface of the covered portion 211b, and therefore the light-extraction efficiency is improved.

Figure 47:
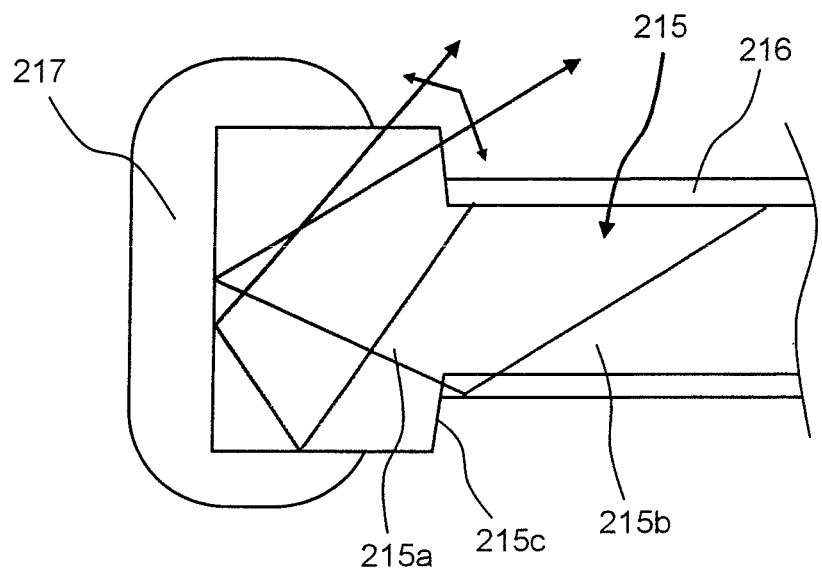
FIG. 47 is a schematic cross-sectional view of a modification of the rod-like light-emitting device of Embodiment 20.

FIG. 47 is a cross-sectional view of the main part of a modification of the above rod-like light-emitting device of Embodiment 20.

In a rod-like light-emitting device of this modification, an exposed portion 215a of the semiconductor core 215 is larger in diameter than a covered portion 215b, and a step portion 215c is provided between the outer peripheral surface of the exposed portion 215a and the outer peripheral surface of the covered portion 215b. An n-side electrode 217 is connected to the exposed portion 215a of the semiconductor core 215.

As shown in FIG. 47, the step portion 215c is formed at the boundary between the outer peripheral surface of the exposed portion 215a of the semiconductor core 215 and the outer peripheral surface of the covered portion 215b, and therefore the efficiency of extracting light to the outside is improved. In the semiconductor core 215, the diameter of the exposed portion 215a is larger than that of the covered portion 215b. This allows a large contact surface with the n-side electrode 217 connected to the exposed portion 215a of the semiconductor core 215 to be taken. Therefore, the contact resistance can be decreased.

According to the above rod-like light-emitting device A2 of Embodiment 20, the perimeter of a cross section perpendicular to the longitudinal direction of the exposed portion 211a of the semiconductor core 211 is made shorter than the perimeter of a cross section perpendicular to the longitudinal direction of the covered portion 211b of the semiconductor core 211, that is, the exposed portion 211a has a smaller diameter than the covered portion 211b of the semiconductor core 211. Therefore, in the manufacturing process, the exposed portion 211a of the semiconductor core 211 formed so as to erect on the substrate is provided on the substrate side. As a result, the semiconductor core 211 becomes more likely to be broken, which facilitates manufacturing. As has already been described, the semiconductor core 211 is separated from the substrate by vibrating the semiconductor core 211 in IPA using ultrasonic waves. The exposed portion 211a of the semiconductor core 211 is thin, which facilitates the separation.

The exposed portion 211a of the semiconductor core 211 is low in height relative to the step portion 211c (the semiconductor layer 212 is high). This can increase the distance between the outer peripheral surface of the exposed portion 211a of the semiconductor core 211 and the semiconductor layer 212. Therefore, when the n-side electrode is connected to the exposed portion 211a of the semiconductor core 211, short-circuiting and occurrence of a leakage current between the n-side electrode and the semiconductor layer 212 can be eliminated or reduced.

Note that the cross sections of the exposed portion 211a and the covered portion 211b of the semiconductor core 211 are not limited to being circular, and may have other polygonal shapes, such as hexagons. The cross sections of the exposed portion and the covered portion of the semiconductor core may have different shapes. Such cross sections have the same effects if the exposed portion 211a of the semiconductor core 211 has a smaller diameter than the covered portion 211b.

The cross section perpendicular to the longitudinal direction of the exposed portion 211a of the semiconductor core 211 is nearly circular. Therefore, the shape of a mask pattern for use in growth of the semiconductor core 211 in manufacturing processes may be a circle, limits of a mask layout aligned with the crystal orientation in the plane direction of the substrate are not imposed, and the alignment accuracy for aligning orientations is not required. Consequently, manufacturing can be facilitated.

Figure 48:
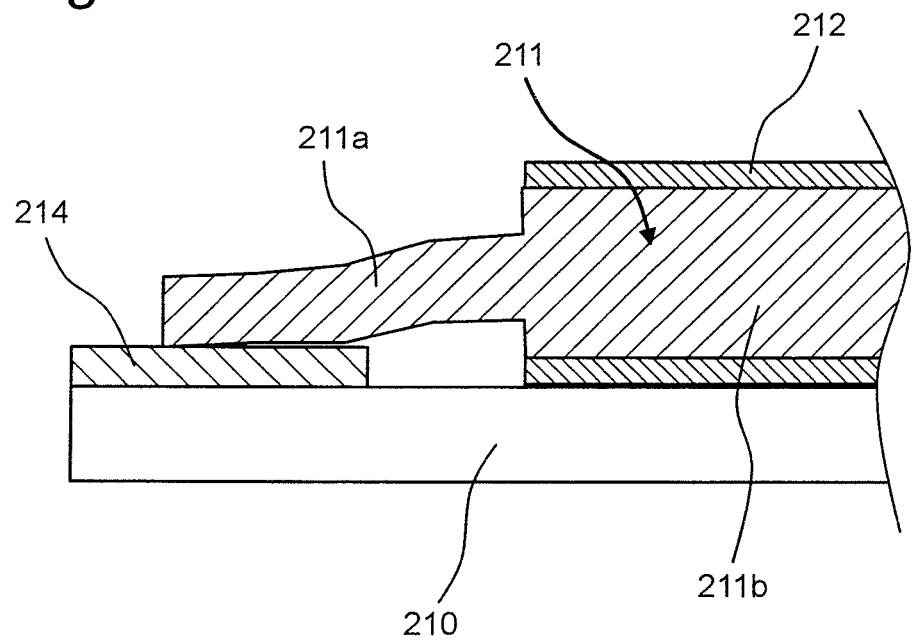
FIG. 48 is a cross-sectional view of the main part of the rod-like light-emitting device for illustration of an electrode connection of an exposed portion of a semiconductor core of the rod-like light-emitting device.

FIG. 48 is a cross-sectional view of the main part for illustration of an electrode connection of the exposed portion of the semiconductor core of the above rod-like light-emitting device A2. The rod-like light-emitting device A2 is mounted on a substrate 210 such that the longitudinal direction of the device A2 is parallel to a mounting surface, and the exposed portion 211a of the semiconductor core 211 is connected to an n-side electrode 214 formed on the substrate 210.

As shown in FIG. 48, in the covered portion 211b covered with the semiconductor layer 212 of the semiconductor core 211, the outer shape of the exposed portion 211a of the semiconductor core 211 is smaller than the outer shape of the semiconductor layer 212. Therefore, when the rod-like light-emitting device is mounted on the substrate 210 such that the longitudinal direction of the device is parallel to the plane of the substrate, contact between the outer peripheral surface of the semiconductor layer 212 and the substrate 210 becomes more likely to be made, which improves the heat dissipation efficiency. In other words, the exposed portion 211a of the semiconductor core 211 is thin and therefore can be deformed. The deformed exposed portion 211a is excellently connected to the n-side electrode 214. Therefore, the covered portion 211b covered with the semiconductor layer 212 of the semiconductor core 211 can be brought into intimate contact with the substrate 210, without deformation of the covered portion 211b. Thus, the rod-like light-emitting device is excellent in heat dissipation. On the other hand, in the case where the outer peripheral surface of the exposed portion 211a of the semiconductor core 211 is coincident with the outer peripheral surface of the covered portion 211b covered with the semiconductor layer 212, or in the case where the outer shape of the exposed portion 211a of the semiconductor core 211 is larger than the outer shape of the covered portion 211b covered with the semiconductor layer 212, the exposed portion 211a of the semiconductor core 211 is less likely to be deformed. Therefore, at the time when the exposed portion 211a of the semiconductor core 211 is connected to the n-side electrode 214, the covered portion 211b covered with the semiconductor layer 212 of the semiconductor core 211 is deformed not to be brought into intimate contact with the substrate 210. This deteriorates the heat dissipation.

Note that, in Embodiment 20 described above, a description has been given of the rod-like light-emitting device A2 in which the semiconductor core 211 having a rod shape whose cross section is nearly circular is covered with the semiconductor layer 212. However, this invention may be applied to a rod-like light-emitting device in which, for example, a semiconductor core shaped like a rod of a hexagon or another polygon is covered with a semiconductor layer, a quantum well layer and the like. N-type GaN results in hexagonal crystal growth, and a semiconductor core in the shape of approximately a hexagonal prism is obtained by growing the crystals under the condition where a direction perpendicular to the surface of the substrate is the c-axis direction. Depending on growth conditions such as a growth direction and a growth temperature, the shape of the cross section tends to be nearly circular in cases where the semiconductor core to be grown has a small diameter in the range of from several tens of nanometers to several hundreds of nanometers. In cases where the diameter is large in the range of from about 0.5 μm to several micrometers, it becomes easier to grow the semiconductor core whose cross section is nearly hexagonal.

(Embodiment 21)

Figure 49:
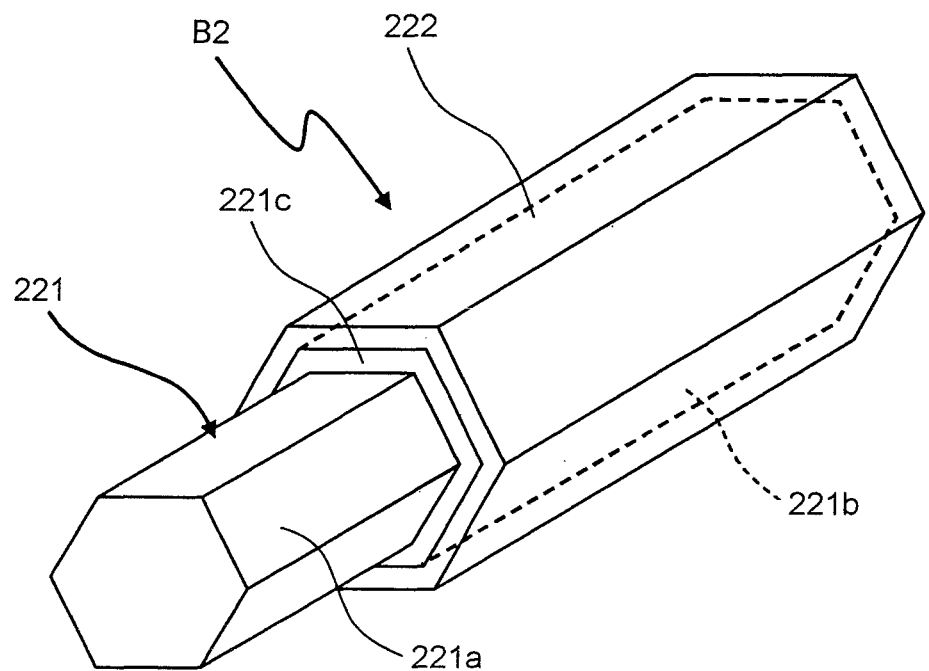
FIG. 49 is a perspective view of a rod-like light-emitting device of Embodiment 21 of this invention.

FIG. 49 is a perspective view of a rod-like light-emitting device of Embodiment 21 of this invention.

A rod-like light-emitting device B2 of this Embodiment 21, as shown in FIG. 49, includes a semiconductor core 221 made of n-type GaN and having a rod shape whose cross section is nearly hexagonal, and a semiconductor layer 222 that is made of p-type GaN and that covers a covered portion 221b other than an end portion of the semiconductor core 221 such that the end portion not covered with the semiconductor layer 222 of the semiconductor core 221 provides an exposed portion 221a. In the semiconductor core 221, the exposed portion 221a has a smaller diameter than the covered portion 221b, and a step portion 221c is provided between the outer peripheral surface of the exposed portion 221a and the outer peripheral surface of the covered portion 221b. The end surface of the other end of the semiconductor core 221 is covered with the semiconductor layer 222.

The rod-like light-emitting device B2 is manufactured in a similar method to that for the rod-like light-emitting device A2 of Embodiment 20.

Figure 50:
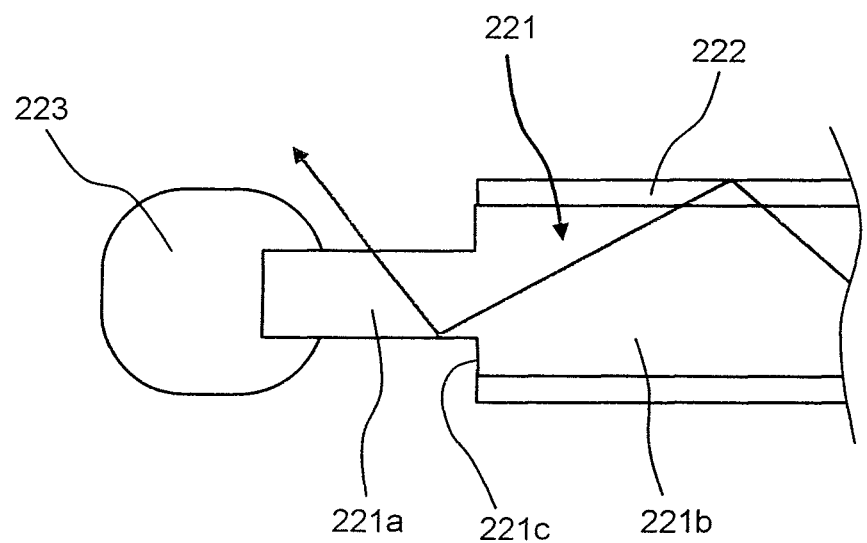
FIG. 50 is a schematic cross-sectional view of a main part of the rod-like light-emitting device of Embodiment 21.

FIG. 50 is a schematic cross-sectional view of the main part of the above rod-like light-emitting device of Embodiment 21, and, in FIG. 50, reference character 223 denotes an n-side electrode.

The rod-like light-emitting device B2 of this Embodiment 21 has effects similar to those of the rod-like light-emitting device A2 of Embodiment 20.

According to the above rod-like light-emitting device B2 of Embodiment 21, the cross section perpendicular to the longitudinal direction of the covered portion 221b of the semiconductor core 221 is hexagonal. Therefore, when this rod-like light-emitting device is mounted on the substrate such that the longitudinal direction of the device is parallel to the plane of the substrate, a contact surface between any outer peripheral surface of the semiconductor layer and the substrate can be easily produced. As a result, the efficiency of heat dissipation to the substrate is improved. Accordingly, it can be eliminated or reduced for the temperature of the device to increase during light emission to decrease the light emitting efficiency.

Figure 51A:
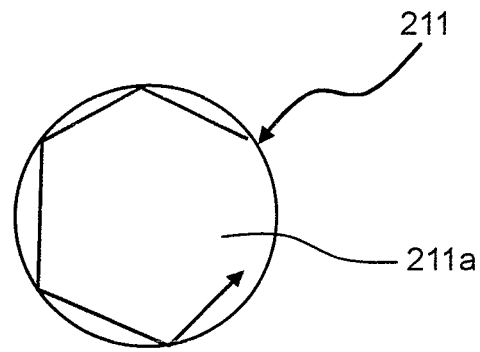
FIG. 51A is a schematic cross-sectional view of an exposed portion of a semiconductor core of the rod-like light-emitting device of Embodiment 20.
Figure 51B:
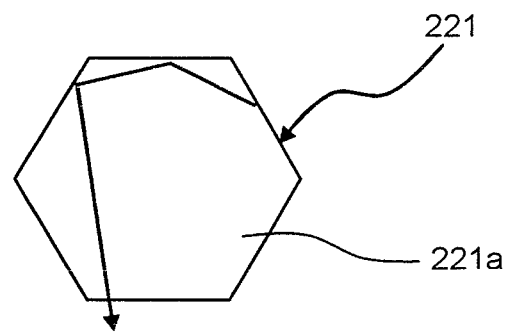
FIG. 51B is a schematic cross-sectional view of an exposed portion of a semiconductor core of the rod-like light-emitting device of Embodiment 21.

FIG. 51A is a schematic cross-sectional view of the exposed portion of the semiconductor core of the above rod-like light-emitting device A2 of Embodiment 20, and FIG. 51B is a schematic cross-sectional view of the exposed portion of the semiconductor core of the above rod-like light-emitting device B2 of Embodiment 21.

Figure 51C:
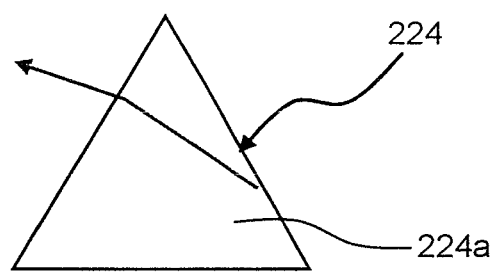
FIG. 51C is a schematic cross-sectional view of an exposed portion of a semiconductor core of a rod-like light-emitting device of a modification.

FIG. 51C is a schematic cross-sectional view of an exposed portion of a semiconductor core of a rod-like light-emitting device of a modification. In the rod-like light-emitting device of this modification, the cross section perpendicular to the longitudinal direction of the exposed portion 224a of the semiconductor core 224 has the shape of an equilateral triangle.

As such, a polygonal cross section (e.g., a regular hexagon shown in FIG. 51B and an equilateral triangle shown in FIG. 51C) perpendicular to the longitudinal direction of the exposed portion of the semiconductor core can improve the light-extraction efficiency more than a circular cross section shown in FIG. 51A can. The reason for this is that in the case where the cross section of the exposed portion of the semiconductor core has the shape of a polygon, in which the number of vertices is small, light is more likely to be emitted to the outside than in the case of a circular cross section.

(Embodiment 22)

Figure 52:
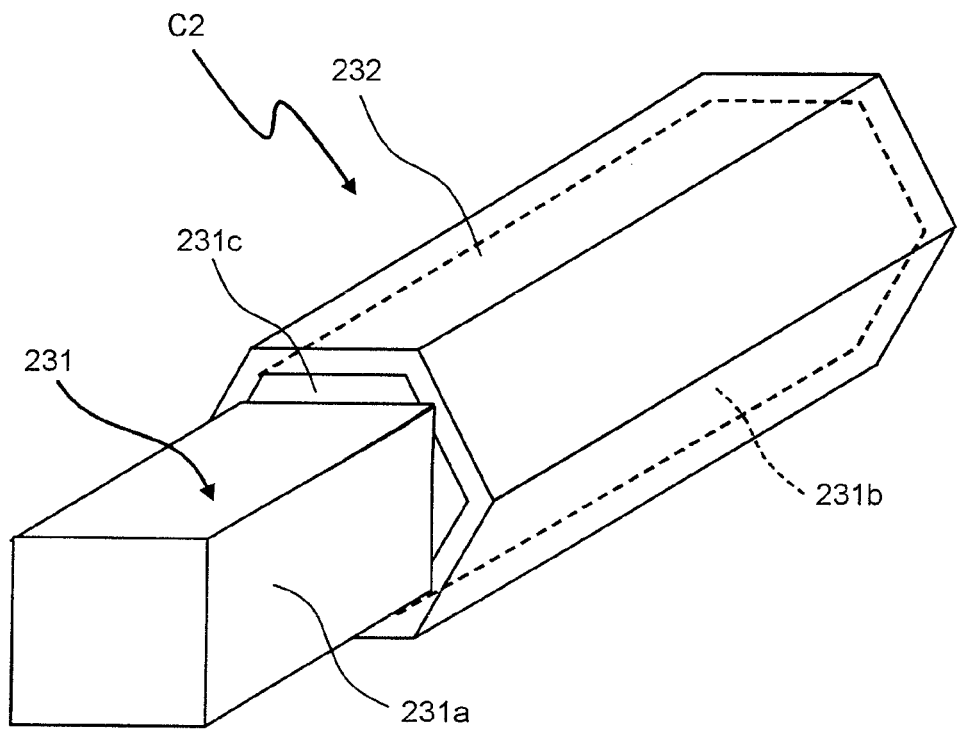
FIG. 52 is a perspective view of a rod-like light-emitting device of Embodiment 22 of this invention.

FIG. 52 is a perspective view of a rod-like light-emitting device of Embodiment 22 of this invention.

A rod-like light-emitting device C2 of this Embodiment 22, as shown in FIG. 52, includes a semiconductor core 231 made of n-type GaN and shaped like a rod, and a semiconductor layer 232 that is made of p-type GaN and that covers a covered portion 231b other than an end portion of the semiconductor core 231 such that the end portion not covered with the semiconductor layer 232 of the semiconductor core 231 provides an exposed portion 231a. In the exposed portion 231a of the semiconductor core 231, the cross section perpendicular to the longitudinal direction is nearly rectangular. In the covered portion 231b of the semiconductor core 231, the cross section perpendicular to the longitudinal direction is nearly hexagonal. A step portion 231c is provided between the outer peripheral surface of the exposed portion 231a of the semiconductor core 231 and the outer peripheral surface of the covered portion 231b. The end surface of the other end of the semiconductor core 231 is covered with the semiconductor layer 232.

The rod-like light-emitting device C2, except for the covered portion of the semiconductor core, is manufactured in a similar method to that for the rod-like light-emitting device A2 of Embodiment 20. Here, regarding the shape of the exposed portion 231a of the semiconductor core 231, as described above, before the height of the semiconductor core 231 being grown exceeds the height of the growth hole of the above-mentioned mask, the diameter and the shape of the semiconductor core 231 to be grown are determined depending on the diameter and the shape of the growth hole, and after the height of the semiconductor core 231 being grown exceeds the height of the mask, the diameter and the shape of the semiconductor core 231 to be grown are determined depending on the diameter of the catalyst metal layer that coagulates in the shape of an island. In this Embodiment 22, a rectangular growth hole is used.

The rod-like light-emitting device C2 of this Embodiment 22 has effects similar to those of the rod-like light-emitting device A2 of Embodiment 20.

Figure 53:
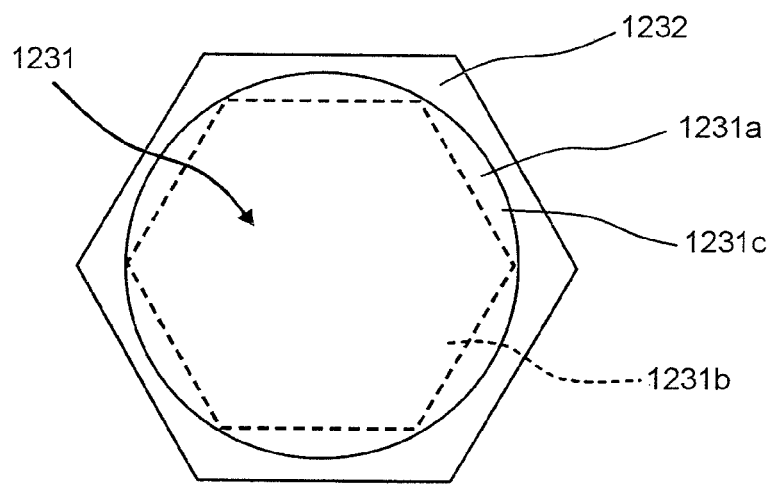
FIG. 53 is a schematic cross-sectional view of a first modification of the rod-like light-emitting device of Embodiment 22.

FIG. 53 is a schematic cross-sectional view of a first modification of the above rod-like light-emitting device of Embodiment 22. In the first modification, a semiconductor core 1231 has an exposed portion 1231a whose cross section perpendicular to the longitudinal direction thereof is nearly circular, and has a covered portion 1231b whose cross section perpendicular to the longitudinal direction thereof is nearly hexagonal. In the semiconductor core 1231, the cross-sectional shape of the exposed portion 1231a is larger than the cross-sectional shape of the covered portion 1231b. In the semiconductor core 1231, a step portion 1231c is provided between the outer peripheral surface of the exposed portion 1231a and the outer peripheral surface of the covered portion 1231b.

Figure 54:
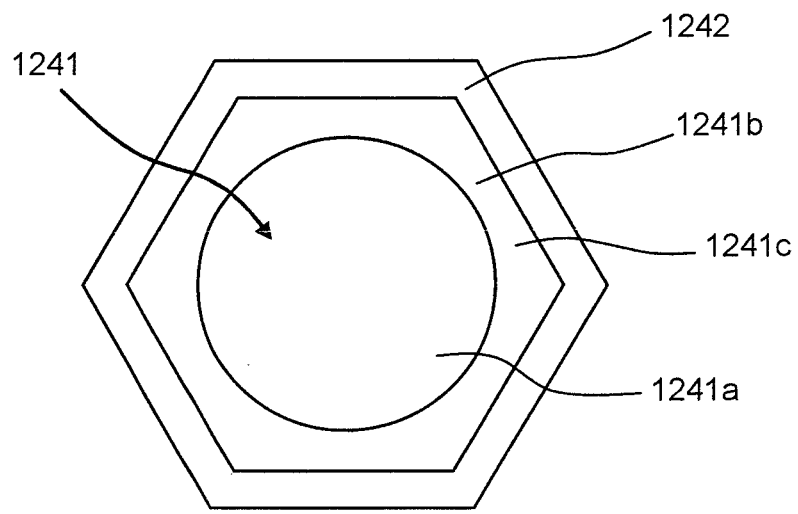
FIG. 54 is a schematic cross-sectional view of a second modification of the rod-like light-emitting device of Embodiment 22.

FIG. 54 is a schematic cross-sectional view of a second modification of the above rod-like light-emitting device of Embodiment 22. In the second modification, a semiconductor core 1241 has an exposed portion 1241a whose cross section perpendicular to the longitudinal direction thereof is nearly circular, and has a covered portion 1241b whose cross section perpendicular to the longitudinal direction thereof is nearly hexagonal. The perimeter of the cross section perpendicular to the longitudinal direction of the exposed portion 1241a of the semiconductor core 1241 is shorter than the perimeter of the cross section perpendicular to the longitudinal direction of the covered portion 1241b of the semiconductor core 1241. That is, the cross-sectional shape of the exposed portion 1241a of the semiconductor core 1241 is smaller than the cross-sectional shape of the covered portion 1241b. In the semiconductor core 1241, a step portion 1241c is provided between the outer peripheral surface of the exposed portion 1241a and the outer peripheral surface of the covered portion 1241b.

As such, in the rod-like light-emitting devices shown in FIGS. 52 to 54, the shapes of cross sections perpendicular to the longitudinal directions of the exposed portions 231a, 1231a and 1241a of the semiconductor cores 231, 1231 and 1241 differ from the shapes of cross sections perpendicular to the longitudinal directions of the covered portions 231b, 1231b and 1241b of the semiconductor cores 231, 1231 and 1241, respectively. As a result, the step portions 231c, 1231c and 1241c are formed at boundaries between the outer peripheral surfaces of the exposed portions 231a, 1231a and 1241a of the semiconductor cores 231, 1231 and 1241 and the outer peripheral surfaces of the covered portions 231*b*, 1231*b* and 1241*b*, respectively. Therefore, the efficiency of extracting light to the outside improves.

Compared to the case where the outer peripheral surface of the exposed portion of the semiconductor core is coincident with the outer peripheral surface of the covered portion such that there exists no step, the positions of the end surfaces of the semiconductor layers 232, 1232 and 1242 are determined depending on the step portions 231*c*, 1231*c* and 1241*c* formed at the boundaries between the exposed portions 231*a*, 1231*a* and 1241*a* of the semiconductor cores 231, 1231 and 1241 and the semiconductor layers 232, 1232 and 1242. This can eliminate or reduce variations of the boundary position during manufacturing. In the case where the outer peripheral surface of an exposed portion of a semiconductor core is coincident with the outer peripheral surface of a covered portion such that there exists no step, a clearance might be produced between the inner wall of a growth hole of a mask and the semiconductor core during growth of the semiconductor core. When a semiconductor layer is formed subsequently, the semiconductor layer can be formed in the inner wall of the growth hole of the mask and the region of the clearance of the semiconductor core. This sometimes leads to variations of the boundary between the exposed portion of the semiconductor core and the covered portion, which is originally defined at the position of the top surface of the mask. However, in the case where a step exists between the outer peripheral surface of an exposed portion of a semiconductor core and the outer peripheral surface of a covered portion, the semiconductor core is grown with a diameter larger than the internal diameter of a growth hole after the height of the semiconductor core exceeds the height of a mask during manufacturing. Therefore, if a clearance is produced between the inner wall of the growth hole of the mask and the semiconductor core, the semiconductor core is grown so as to close the clearance. Thus, when a semiconductor layer is formed, the semiconductor layer can be prevented from being formed in a clearance region between the inner wall of the growth hole of the mask and the semiconductor core.

(Embodiment 23)

Figure 55:
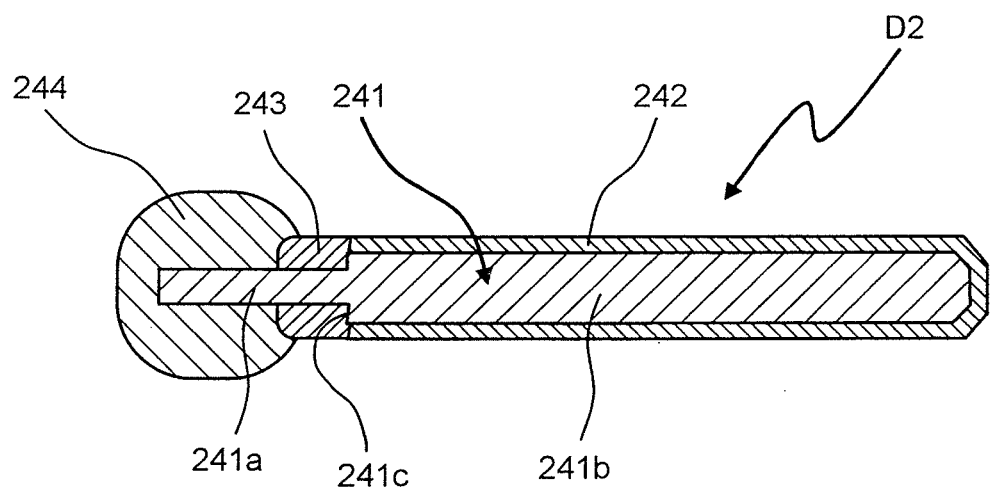
FIG. 55 is a cross-sectional view of a rod-like light-emitting device of Embodiment 23 of this invention.
Figure 56:
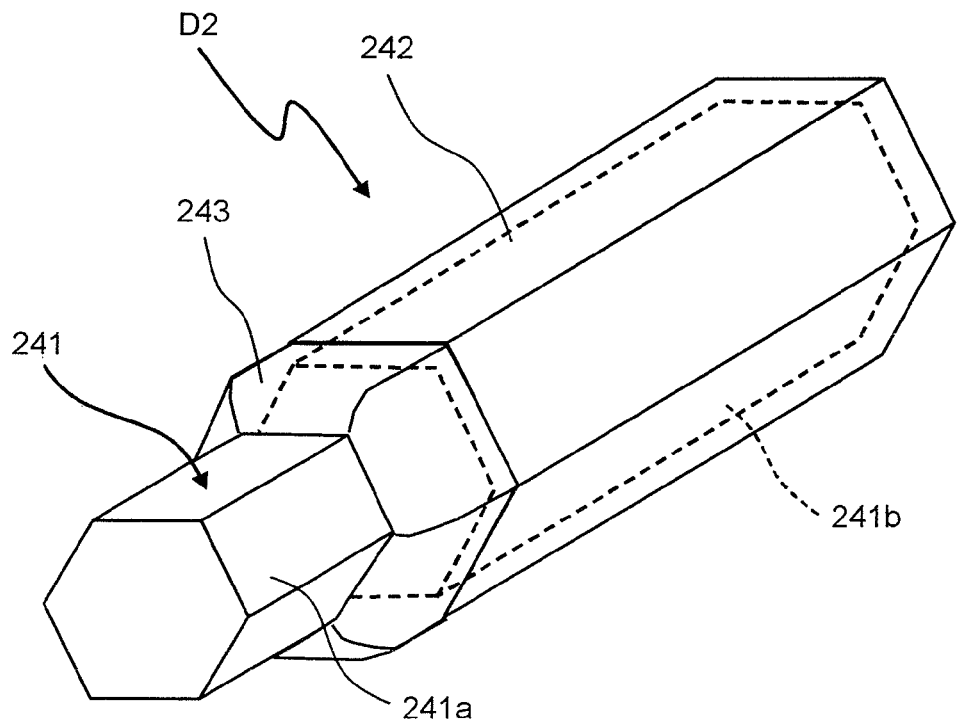
FIG. 56 is a perspective view of the rod-like light-emitting device.

FIG. 55 is a cross-sectional view of a rod-like light-emitting device of Embodiment 23 of this invention, and FIG. 56 is a perspective view of the rod-like light-emitting device.

A rod-like light-emitting device D2 of this Embodiment 23, as shown in FIG. 55 and FIG. 56, includes a semiconductor core 241 made of n-type GaN and having a rod shape whose cross section is nearly hexagonal, and a semiconductor layer 242 that is made of p-type GaN and that covers a covered portion 241*b* other than an end portion of the semiconductor core 241 such that the end portion not covered with the semiconductor layer 242 of the semiconductor core 241 provides an exposed portion 241*a*. In the semiconductor core 241, the exposed portion 241*a* has a smaller diameter than the covered portion 241*b*, and a step portion 241*c* is provided between the outer peripheral surface of the exposed portion 241*a* and the outer peripheral surface of the covered portion 241*b*. The end surface of the other end of the semiconductor core 241 is covered with the semiconductor layer 242.

An insulating layer 243 is formed to cover the step portion 241*c* of the semiconductor core 241 and the end surface of a step portion 241*c* side of the semiconductor layer 242, and to cover a step portion 241*c* side of the exposed portion 241*a* of the semiconductor core 241. An n-side electrode 244 is connected to the exposed portion 241*a* of the semiconductor core 241.

The rod-like light-emitting device D2, except for the covered portion of the semiconductor core, is manufactured in a similar method to that for the rod-like light-emitting device A2 of Embodiment 20. Here, regarding formation of the insulating layer 243 that covers the step portion 241*c* of the semiconductor core 241 and the end surface of the semiconductor layer 242 on the side of the step portion 241*c*, and that covers the exposed portion 241*a* of the semiconductor core 241 on the side of the step portion 241*c*, instead of removing all of the region of the semiconductor layer, except for the portion thereof covering the semiconductor core, and the mask in steps of manufacturing the rod-like light-emitting device A2 of Embodiment 20, first, anisotropic dry etching is performed, and then all of the region of the semiconductor layer, except for the portion thereof covering the semiconductor core, and the mask are etched. At a stage where the mask is etched halfway, the kind of etching is changed to isotropical dry etching and is performed. This enables the mask to partially remain as an insulating layer.

In the case where the mask is made of silicon oxide ($SiO_2$) or silicon nitride ($Si_3N_4$), reactive ion etching (RIE) using a chlorine-based gas such as $SiCl_4$ or a fluorine-based gas such as $CF_4$ or $CHF_3$ can be used for anisotropic dry etching, and etching can be performed by using plasma of a gas containing $CF_4$ for isotropic dry etching. In this embodiment, the length of the insulating layer 243 is determined depending on the thickness of the mask removed by dry etching. At the time of isotropic dry etching, a gas containing $SiCl_4$ is used, and etching proceeds while forming a protective film of a reaction product on the side wall of the mask. As shown in FIG. 55 and FIG. 56, processing can be performed such that the outer peripheral surface of the semiconductor layer 242 is nearly coincident with the outer peripheral surface of the insulating layer 243.

The rod-like light-emitting device D2 of this Embodiment 23 has effects similar to those of the rod-like light-emitting device A2 of Embodiment 20.

In the rod-like light-emitting device D2, the outer peripheral surface of the exposed portion 241*a* of the semiconductor core 241 is insulated from the semiconductor layer 242 by the insulating layer 243, and therefore, when the n-side electrode 244 is connected to the exposed portion 241*a* of the semiconductor core 241, short-circuiting and occurrence of a leakage current between the n-side electrode 244 and the semiconductor layer 242 can be eliminated or reduced with reliability.

(Embodiment 24)

Figure 57:
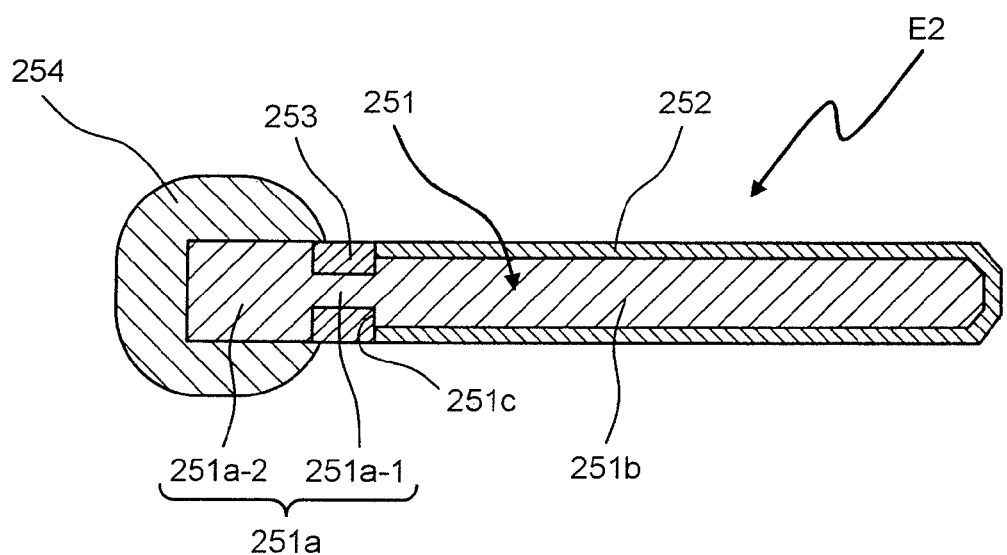
FIG. 57 is a cross-sectional view of a rod-like light-emitting device of Embodiment 24 of this invention.
Figure 58:
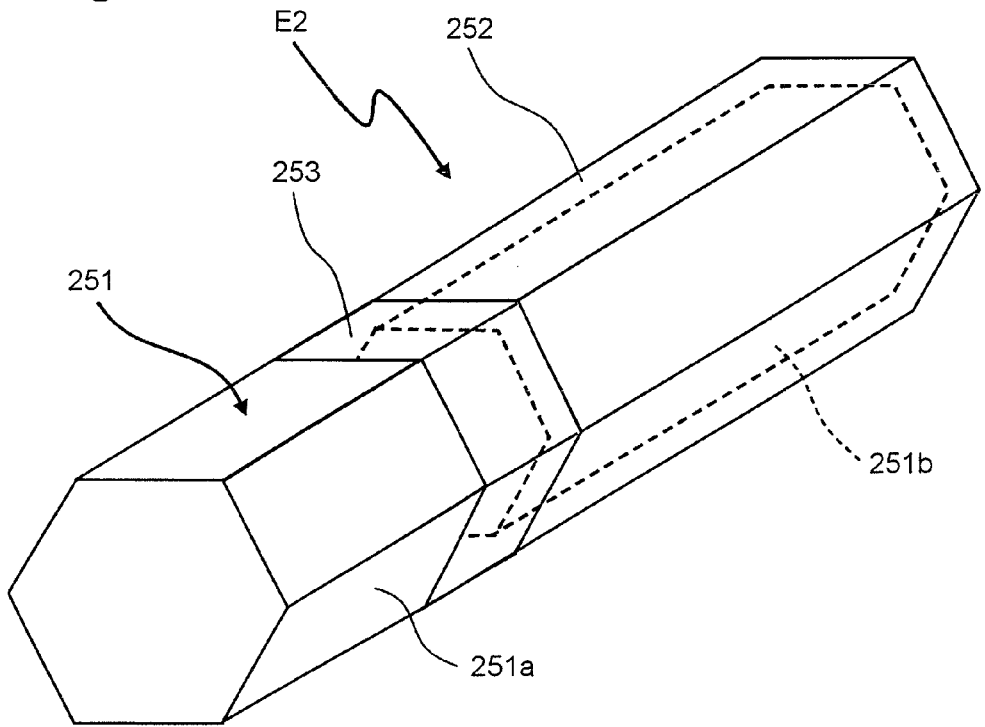
FIG. 58 is a perspective view of the rod-like light-emitting device.

FIG. 57 is a cross-sectional view of a rod-like light-emitting device of Embodiment 24 of this invention, and FIG. 58 is a perspective view of the rod-like light-emitting device.

A rod-like light-emitting device E2 of this Embodiment 24, as shown in FIG. 57 and FIG. 58, includes a semiconductor core 251 made of n-type GaN and having a rod shape whose cross section is nearly hexagonal, and a semiconductor layer 252 that is made of p-type GaN and that covers a covered portion 251*b* other than an end portion of the semiconductor core 251 such that the end portion not covered with the semiconductor layer 252 of the semiconductor core 251 provides an exposed portion 251*a*.

The exposed portion 251*a* of the semiconductor core 251 includes a small diameter portion 251*a*-1 that has a smaller diameter than the covered portion 251*b* and that is on the side of a step portion 251*c*, and a large diameter portion 251*a*-2 that is in line with the small diameter portion 251*a*-1 and that has a larger diameter than the covered portion 251*b* and has the same outer diameter as the semiconductor layer 252. In the semiconductor core 251, the small diameter portion 251*a*-1 of the exposed portion 251*a* has a smaller diameter than the covered portion 251*b*, and the step portion 251*c* is provided between the outer peripheral surface of the exposed portion 251a and the outer peripheral surface of the covered portion 251b. The end surface of the other end of the semiconductor core 251 is covered with the semiconductor layer 252.

An insulating layer 253 is formed to cover the step portion 251c of the semiconductor core 251 and the end surface of the semiconductor layer 252 on the side of the step portion 251c, and to cover the side of the small diameter portion 251a-1 of the exposed portion 251a of the semiconductor core 251. An n-side electrode 254 is connected to the large diameter portion 251a-2 of the exposed portion 251a of the semiconductor core 251.

The rod-like light-emitting device E2, except for the covered portion of the semiconductor core, is manufactured in a method similar to that for the rod-like light-emitting device A2 of Embodiment 20. For the rod-like light-emitting device E2, the shape of the exposed portion 251a of the semiconductor core 251, which includes the small diameter portion 251a-1 that is smaller in diameter than the covered portion 251b and is on the side of the step portion 251c and the large diameter portion 251a-2 that is in line with the small diameter portion 251a-1, and that is larger in diameter than the covered portion 251b, and has the same outer diameter as the semiconductor layer 252, and the insulating layer 253 that covers the step portion 251c of the semiconductor core 251 and the end surface of the semiconductor layer 252 on the side of the step portion 251c and that covers the side of the small diameter portion 251a-1 of the exposed portion 251a of the semiconductor core 251 can be formed in the following way. In the steps of manufacturing the rod-like light-emitting device A2 of Embodiment 20, anisotropic dry etching is performed instead of the step of removing all of the region of the semiconductor layer, except for a portion thereof covering the semiconductor core, and the mask by lift-off, so that all of the region of the semiconductor layer, except for a portion thereof covering the semiconductor core 251, the mask and even the substrate are etched.

The rod-like light-emitting device E2 of this Embodiment 24 has effects similar to those of the rod-like light-emitting device A2 of Embodiment 20.

The rod-like light-emitting device E2 includes the insulating layer 253 formed to cover the step portion 251c of the semiconductor core 251 and the end surface on the side of the step portion 251c of the semiconductor layer 252 and to cover the side of the step portion 251c of the exposed portion 251a of the semiconductor core 251. This allows the outer peripheral surface of the exposed portion 251a of the semiconductor core 251 to be insulated from the semiconductor layer 252 by the insulating layer 253. Therefore, in the case where the n-side electrode 254 is connected to the exposed portion 251a of the semiconductor core 251, short-circuiting and occurrence of a leakage current between the n-side electrode 254 and the semiconductor layer 252 can be eliminated or reduced with reliability.

Moreover, the large diameter portion 251a-2 of the exposed portion 251a has a larger diameter than the covered portion 251b of the semiconductor core 251. This allows a large contact surface with the n-side electrode 254 connected to the exposed portion 251a of the semiconductor core 251 to be taken. Thus, the contact resistance can be decreased.

(Embodiment 25)

Figure 59:
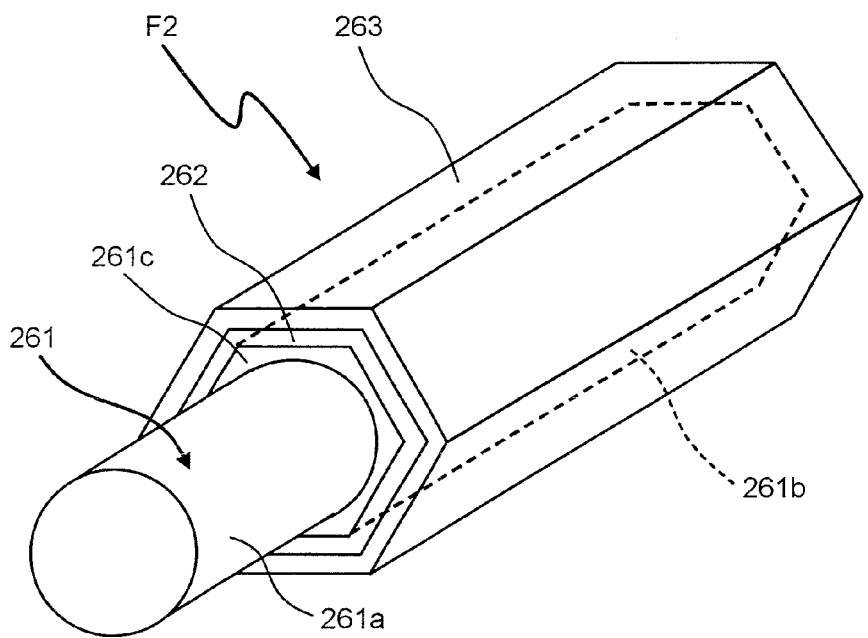
FIG. 59 is a perspective view of a rod-like light-emitting device of Embodiment 25 of this invention.

FIG. 59 is a cross-sectional view of a rod-like light-emitting device of Embodiment 25 of this invention.

A rod-like light-emitting device F2 of this Embodiment 25, as shown in FIG. 59, includes a semiconductor core 261 shaped like a rod and made of n-type GaN, a semiconductor layer 262 made of p-type GaN and covering a covered portion 261b other than an end portion of the semiconductor core 261 such that the end portion not covered with the semiconductor layer 262 of the semiconductor core 261 provides an exposed portion 261a, and a conductive layer 263 formed to cover the semiconductor layer 262 and made of a material having a lower electric resistance than the semiconductor layer 262.

The cross section perpendicular to the longitudinal direction of the exposed portion 261a of the semiconductor core 261 is nearly circular, and the cross section perpendicular to the longitudinal direction of the covered portion 261b of the semiconductor core 261 is nearly hexagonal. In the semiconductor core 261, the exposed portion 261a has a smaller diameter than the covered portion 261b, and a step portion 261c is provided between the outer peripheral surface of the exposed portion 261a and the outer peripheral surface of the covered portion 261b. The end surface of the other end of the semiconductor core 261 is covered with the semiconductor layer 262.

The conductive layer 263 is formed of ITO having a film thickness of 200 nm. For the deposition of ITO, a vapor-deposition method or a sputtering method can be used. After the ITO film is deposited, heat treatment is performed at a temperature of from 500° C. to 600° C., which makes it possible to decrease the contact resistance between the semiconductor layer 262 made of p-type GaN and the conductive layer 263 made of ITO. Note that the conductive layer 263 is not limited to this, and, for example, a translucent laminated metal film of Ag/Ni or Au/Ni having a thickness of 5 nm may be used for the conductive layer 263. For the deposition of the laminated metal film, a vapor-deposition method or a sputtering method can be used. Moreover, to further decrease the resistance of the conductive layer, a laminated metal film of Ag/Ni or Au/Ni may be deposited on the ITO film mentioned above.

The rod-like light-emitting device F2 is manufactured in a method similar to that for the rod-like light-emitting device A2 of Embodiment 20. The rod-like light-emitting device F2 can be formed in the following way. A catalyst metal layer is removed and then the semiconductor layer 262 covering the semiconductor core 261 is formed. Further, an ITO film as a conductive layer is formed to cover the semiconductor layer 262, and then all of the region of the ITO film, except for a portion thereof covering the semiconductor layer 262, is removed by isotropic dry etching. Subsequently, like Embodiment 20, all of the region of the semiconductor layer, except for a portion thereof covering the semiconductor core 261, and the mask are removed by lift-off.

The rod-like light-emitting device F2 of this Embodiment 25 has effects similar to those of the rod-like light-emitting device A2 of Embodiment 20.

According to the above rod-like light-emitting device F2 of Embodiment 25, the cross section perpendicular to the longitudinal direction of the covered portion 261b of the semiconductor core 261 is hexagonal. Therefore, when this rod-like light-emitting device is mounted on the substrate such that the longitudinal direction of the device is parallel to the plane of the substrate, a contact surface between any outer peripheral surface of the semiconductor layer and the substrate can be easily produced. As a result, the efficiency of heat dissipation to the substrate is improved. Accordingly, it can be eliminated or reduced for the temperature of the device to increase during light emission to decrease the light emitting efficiency.

The shape of the cross section perpendicular to the longitudinal direction of the exposed portion 261a of the semiconductor core 261 differs from the shape of the cross section perpendicular to the longitudinal direction of the covered portion 261b of the semiconductor core 261. As a result, the step portion 261c is formed at the boundary between the outer peripheral surface of the exposed portion 261a of the semiconductor core 261 and the outer peripheral surface of the covered portion 261b. Therefore, the efficiency of extracting light to the outside improves.

The semiconductor layer 262 is connected through the conductive layer 263, which is made of a material having a lower electric resistance than the semiconductor layer 262, to the p-side electrode. This allows a wide current path to be formed without a current being concentrated to an electrode connection portion and being unbalanced, so that light can be efficiently emitted from the whole side surface of the semiconductor core 261. Thus, the light emitting efficiency is further improved.

(Embodiment 26)

Figure 60:
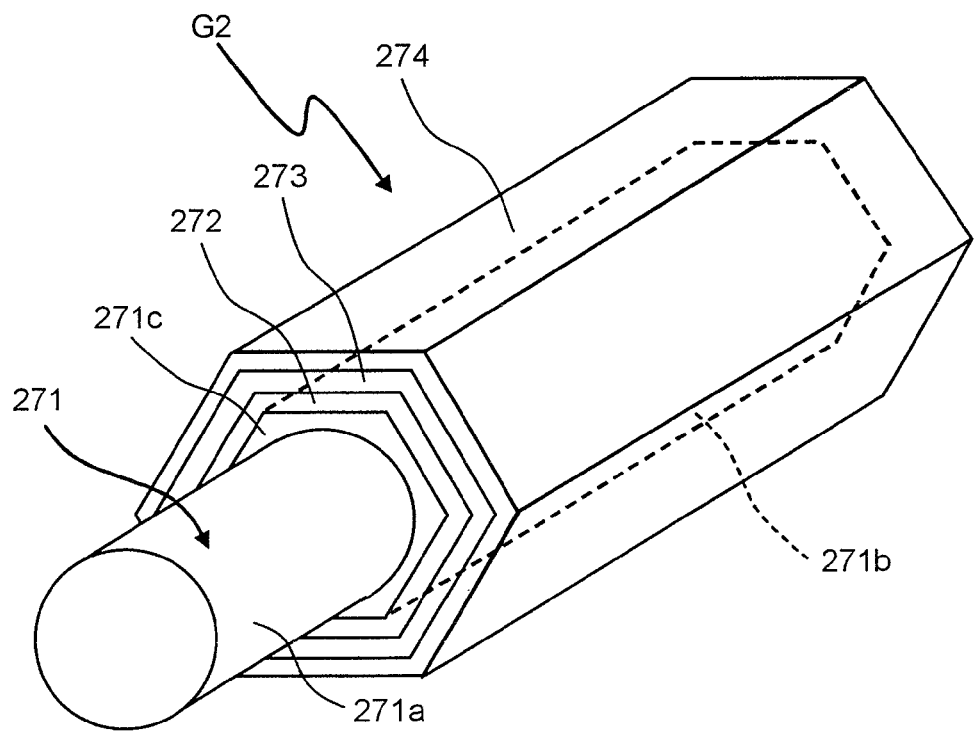
FIG. 60 is a perspective view of a rod-like light-emitting device of Embodiment 26 of this invention.

FIG. 60 is a cross-sectional view of a rod-like light-emitting device of Embodiment 26 of this invention.

A rod-like light-emitting device G2 of this Embodiment 26, as shown in FIG. 60, includes a semiconductor core 271 shaped like a rod and made of n-type GaN, a quantum well layer 272 made of p-type InGaN and covering a portion other than one end portion of the semiconductor core 271 such that the one end portion of the semiconductor core 271 not covered with the quantum well layer 272 provides an exposed portion 271a, a semiconductor layer 273 made of p-type GaN and covering the outer peripheral surface of the quantum well layer 272, and a conductive layer 274 formed to cover the semiconductor layer 273 and made of a material having a lower electric resistance than the semiconductor layer 273.

The cross section perpendicular to the longitudinal direction of the exposed portion 271a of the semiconductor core 271 is nearly circular, and the cross section perpendicular to the longitudinal direction of a covered portion 271b of the semiconductor core 271 is nearly hexagonal. In the semiconductor core 271, the exposed portion 271a has a smaller diameter than the covered portion 271b, and a step portion 271c is provided between the outer peripheral surface of the exposed portion 271a and the outer peripheral surface of the covered portion 271b. The end surface of the other end of the semiconductor core 271 is covered with the quantum well layer 272.

The conductive layer 274 is formed of ITO having a film thickness of 200 nm. For the deposition of ITO, a vapor-deposition method or a sputtering method can be used. After the ITO film is deposited, heat treatment is performed at a temperature of from 500° C. to 600° C., which makes it possible to decrease the contact resistance between the semiconductor layer 272 made of p-type GaN and the conductive layer 274 made of ITO. Note that the conductive layer 274 is not limited to this, and, for example, a translucent laminated metal film of Ag/Ni or Au/Ni having a thickness of 5 nm may be used for the conductive layer 274. For the deposition of the laminated metal film, a vapor-deposition method or a sputtering method can be used. Moreover, to further decrease the resistance of the conductive layer, a laminated metal film of Ag/Ni or Au/Ni may be deposited on the ITO film mentioned above.

The rod-like light-emitting device G2 is manufactured in a method similar to that for the rod-like light-emitting device A2 of Embodiment 20. The rod-like light-emitting device G2 can be formed in the following way. A catalyst metal layer is removed and then the quantum well layer 272 and the semiconductor layer 273 that cover the semiconductor core 271 are formed. Further, an ITO film as a conductive layer is formed to cover the semiconductor layer 273, and subsequently all of the region of the ITO film, except for a portion thereof covering the semiconductor layer 273, is removed by anisotropic dry etching. Thereafter, like Embodiment 20, all of the regions of the quantum well layer and the semiconductor layer, except for portions thereof covering the semiconductor core, and the mask are removed by lift-off.

The rod-like light-emitting device G2 of this Embodiment 26 has effects similar to those of the rod-like light-emitting device A2 of Embodiment 20.

According to the above rod-like light-emitting device G2 of Embodiment 26, the cross section perpendicular to the longitudinal direction of the covered portion 271b of the semiconductor core 271 is hexagonal. Therefore, when this rod-like light-emitting device is mounted on the substrate such that the longitudinal direction of the device is parallel to the plane of the substrate, a contact surface between any outer peripheral surface of the semiconductor layer and the substrate can be easily produced. As a result, the efficiency of heat dissipation to the substrate is improved. Accordingly, it can be eliminated or reduced for the temperature of the device to increase during light emission to decrease the light emitting efficiency.

The shape of the cross section perpendicular to the longitudinal direction of the exposed portion 271a of the semiconductor core 271 differs from the shape of the cross section perpendicular to the longitudinal direction of the covered portion 271b of the semiconductor core 271. As a result, the step portion 271c is formed at the boundary between the outer peripheral surface of the exposed portion 271a of the semiconductor core 271 and the outer peripheral surface of the covered portion 271b. Therefore, the efficiency of extracting light to the outside is improved.

The semiconductor layer 273 is connected through the conductive layer 274, which is made of a material having a lower electric resistance than the semiconductor layer 273, to the p-side electrode. This allows a wide current path to be formed without a current being concentrated to an electrode connection portion and being unbalanced, so that light can be efficiently emitted from the whole side surface of the semiconductor core 271. Thus, the light emitting efficiency is further improved.

The quantum well layer 272 is formed between the outer peripheral surface of the covered portion 271b of the semiconductor core 271 and the semiconductor layer 273. As a result, due to quantum confinement effects of the quantum well layer 272, the light emitting efficiency can be improved.

Note that the quantum well layer may have a multiple quantum well structure in which barrier layers of GaN and quantum well layers of InGaN are alternately laminated.

(Embodiment 27)

Figure 61:
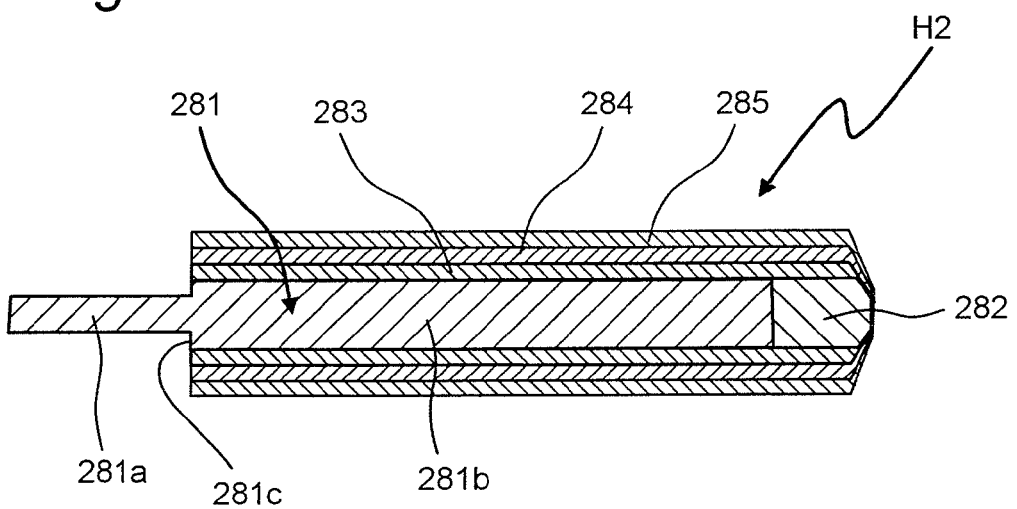
FIG. 61 is a cross-sectional view of a rod-like light-emitting device of Embodiment 27 of this invention.

FIG. 61 is a cross-sectional view of a rod-like light-emitting device of Embodiment 27 of this invention. The rod-like light-emitting device of this Embodiment 27 has the same configuration as the rod-like light-emitting device of Embodiment 26, except for the cap layer.

A rod-like light-emitting device H2 of this Embodiment 27, as shown in FIG. 61, includes a semiconductor core 281 having a rod shape whose cross section is nearly hexagonal and made of n-type GaN, a cap layer 282 covering one end surface of the semiconductor core 281, a quantum well layer 283 made of p-type InGaN and covering the outer peripheral surface of a covered portion 281b other than one end portion of the semiconductor core 281 such that the one end portion of the semiconductor core 281 not covered with the quantum well layer 282 provides an exposed portion 281a, a semiconductor layer 284 made of p-type GaN and covering the outer peripheral surface of the quantum well layer 283, and a conductive layer 285 covering the outer peripheral surface of the semiconductor layer 284.

In the semiconductor core 281, the exposed portion 281a has a smaller diameter than the covered portion 281b, and a step portion 281c is provided between the outer peripheral surface of the exposed portion 281a and the outer peripheral surface of the covered portion 281b. The outer peripheral surface of the above semiconductor core 281 and the outer peripheral surface of the cap layer 282 are covered with the quantum well layer 283 and the semiconductor layer 284 that are continuous with each other.

The conductive layer 285 is formed of ITO having a film thickness of 200 nm. For the deposition of ITO, a vapor-deposition method or a sputtering method can be used. After the ITO film is deposited, heat treatment is performed at a temperature of from 500° C. to 600° C., which makes it possible to decrease the contact resistance between the semiconductor layer 284 made of p-type GaN and the conductive layer 285 made of ITO. Note that the conductive layer 285 is not limited to this, and, for example, a translucent laminated metal film of Ag/Ni or Au/Ni having a thickness of 5 nm may be used for the conductive layer 285. For the deposition of the laminated metal film, a vapor-deposition method or a sputtering method can be used. Moreover, to further decrease the resistance of the conductive layer, a laminated metal film of Ag/Ni or Au/Ni may be deposited on the ITO film mentioned above.

Figure 62:
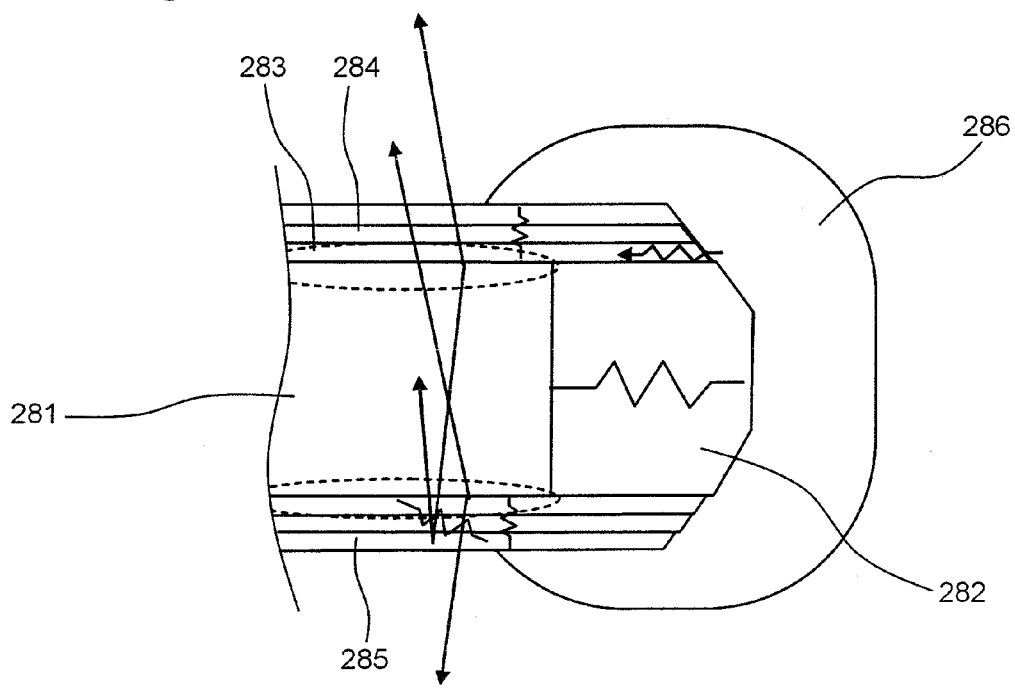
FIG. 62 is a schematic sectional view of a main part of the rod-like light-emitting device of Embodiment 27.

FIG. 62 is a schematic cross-sectional view of the main part of the rod-like light-emitting device H2. As shown in FIG. 62, in the rod-like light-emitting device H2 of this Embodiment 27, one end surface of the semiconductor core 281 is covered with the cap layer 282 made of a material having a higher electric resistance than the semiconductor layer 284. This prevents a current from flowing between a p-side electrode 286 connected to the side of the cap layer 282 of the semiconductor core 281 and the semiconductor core 281 through the cap layer 282 and, on the other hand, allows a current to flow between the p-side electrode 286 and the outer peripheral surface side of the semiconductor core 281 through the conductive layer 285 and the semiconductor layer 284 whose electric resistances are lower than that of the cap layer 282. This reduces current concentration to the end surface on the side having the cap layer 282 thereon of the semiconductor core 281 is provided. As a result, without concentration of light emission to the end surface of the semiconductor core 281, the efficiency of extracting light from the side surface of the semiconductor core 281 is improved.

The above rod-like light-emitting device H2 of Embodiment 27 has effects similar to those of the rod-like light-emitting device of Embodiment 26.

In the above rod-like light-emitting device, when an n-side electrode (not shown) is connected to the exposed portion 281a of the semiconductor core 281, and the p-side electrode 286 is connected to the side having the cap layer 282 thereon of the semiconductor core 281, one end surface of the semiconductor core 281 is not exposed owing to the cap layer 282, and, through the semiconductor layer 284 and the conductive layer 285 in the end, an electric connection between the semiconductor core 281 and the p-side electrode 286 can be easily made. This makes it possible to minimize the area of the side surface shielded with the p-side electrode 286 of the whole side surface of the semiconductor core 281 covered with the semiconductor layer 284 and the conductive layer 285. This makes it possible to improve the light-extraction efficiency. This also eliminates or reduces current concentration to the end surface on the side having the cap layer 282 thereon of the semiconductor core 281. As a result, without concentration of light emission to the end surface of the semiconductor core 281, the efficiency of extracting light from the side surface of the semiconductor core 281 is improved.

Note that, in the end on the side of the cap layer 282 of the semiconductor core 281, the p-side electrode 286 may be electrically connected only to the conductive layer 285, but not to the cap layer 282.

(Embodiment 28)

Figure 63:
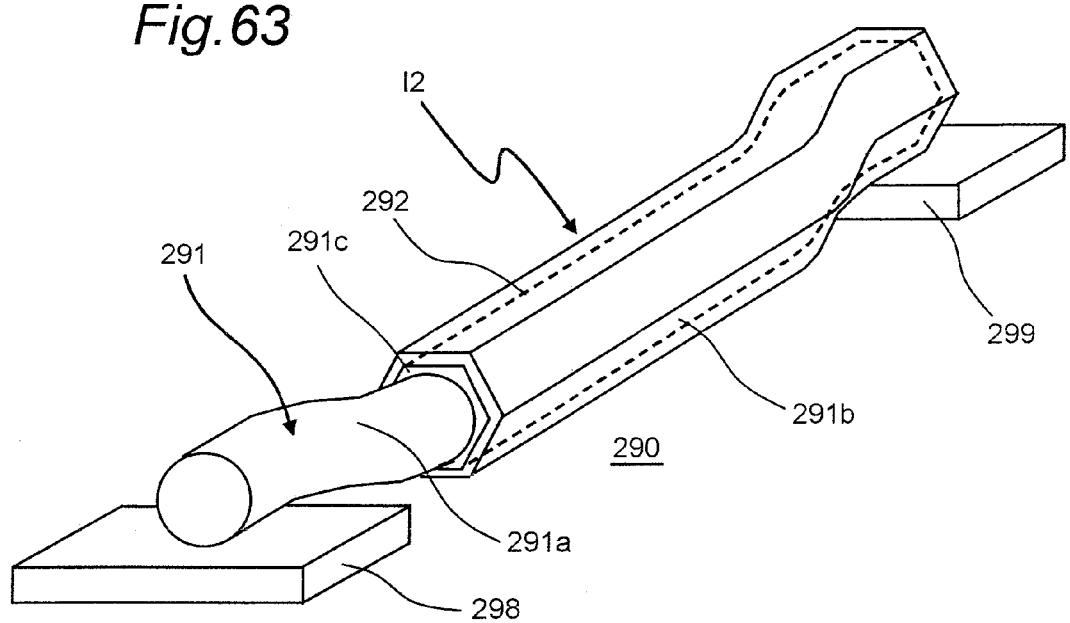
FIG. 63 is a perspective view of a light-emitting apparatus including a rod-like light-emitting device of Embodiment 28 of this invention.

FIG. 63 is a perspective view of a light-emitting apparatus including a rod-like light-emitting device of Embodiment 28 of this invention.

The light-emitting apparatus of this Embodiment 28, as shown in FIG. 63, includes an insulating substrate 290 having metal electrodes 298 and 299 formed on a mounting surface, and a rod-like light-emitting device I2 mounted on the insulating substrate 290 such that the longitudinal direction of the rod-like light-emitting device I2 is parallel to the mounting surface.

The rod-like light-emitting device I2 includes a semiconductor core 291 shaped like a rod and made of n-type GaN, a semiconductor layer 292 made of p-type GaN and covering a covered portion 291b other than one end portion 291a of the semiconductor core 291 such that the one end portion of the semiconductor core 291 not covered with the semiconductor layer 292 provides an exposed portion 291a.

The cross section perpendicular to the longitudinal direction of the exposed portion 291a of the semiconductor core 291 is nearly circular, and the cross section perpendicular to the longitudinal direction of the covered portion 291b of the semiconductor core 291 is nearly hexagonal. In the semiconductor core 291, the exposed portion 291a has a smaller diameter than the covered portion 291b, and a step portion 291c is provided between the outer peripheral surface of the exposed portion 291a and the outer peripheral surface of the covered portion 291b.

As shown in FIG. 63, the exposed portion 291a on the one end side of the rod-like light-emitting device is connected to the metal electrode 298, and the semiconductor layer 292 on the other side of the rod-like light-emitting device I2 is connected to the metal electrode 299.

Here, in the rod-like light-emitting device I2, its central portion is deformed to come in contact with the insulating substrate 290. This deformation is caused by stiction that occurs when a droplet contracts in a clearance between the substrate surface and the rod-like light-emitting device because of vaporization during drying of an IPA aqueous solution in a method of aligning the rod-like light-emitting devices of Embodiment 38 to be described later.

According to the above light-emitting apparatus of Embodiment 28, in the rod-like light-emitting device I2 mounted on the insulating substrate 290 such that the longitudinal direction of the rod-like light-emitting device I2 is parallel to the mounting surface of the insulating substrate 290, the outer peripheral surface of the semiconductor layer 292 and the mounting surface of the insulating substrate 290 are brought into contact with each other. Therefore, heat generated in the rod-like light-emitting device I2 can be dissipated with a good efficiency from the semiconductor layer 292 to the insulating substrate 290. Accordingly, it is possible to implement the light-emitting apparatus in which the light emitting efficiency is high and the heat dissipation is good. Note that, in a rod-like light-emitting device in which a conductive layer is formed to cover a semiconductor layer, the outer peripheral surface of the conductive layer and the mounting surface of an insulating substrate are brought into contact with each other, and therefore similar effects are obtained.

In the above light-emitting apparatus, the rod-like light-emitting device I2 is arranged to lie on its side on the insulating substrate 290. This allows the whole thickness of the rod-like light-emitting device I2 including the insulating substrate 290 to be decreased. In the above light-emitting apparatus, use of the microscopic rod-like light-emitting device I2, for example, with the size of the order of micrometers in which the diameter is 1 μm and the length is 10 μm, or with the size of the order of nanometers in which at least the diameter of the diameter and the length is less than 1 μm can decrease the amount of semiconductors used. Use of this light-emitting apparatus makes it possible to implement a backlight, an illuminating device, a display device and the like whose thicknesses and weights can be reduced.

Note that, as the rod-like light-emitting device in Embodiment 28 described above, any one of the rod-like light-emitting devices of Embodiments 20 to 28 may be used.

(Embodiment 29)

Figure 64:
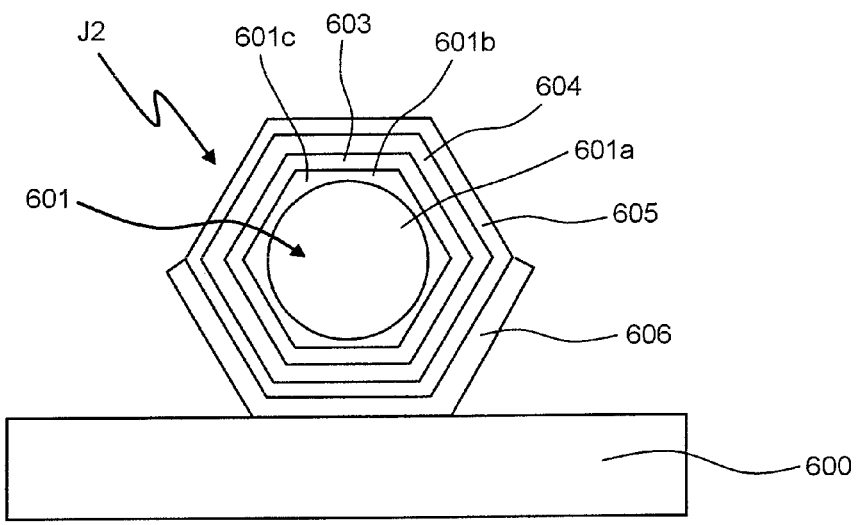
FIG. 64 is a side view of a light-emitting apparatus including a rod-like light-emitting device of Embodiment 29 of this invention.

FIG. 64 is a side view of a light-emitting apparatus including a rod-like light-emitting device of Embodiment 29 of this invention.

The light-emitting apparatus of this Embodiment 29, as shown in FIG. 64, includes an insulating substrate 600, a rod-like light-emitting device J2 mounted on the insulating substrate 600 such that the longitudinal direction of the rod-like light-emitting device J2 is parallel to the mounting surface of the insulating substrate 600.

The rod-like light-emitting device J2 includes a semiconductor core 601 shaped like a rod and made of n-type GaN; a cap layer 602 (shown in FIG. 65) that covers one end surface of the semiconductor core 601; a quantum well layer 603 that is made of p-type InGaN and that covers the outer peripheral surface of a covered portion 601b other than an exposed portion 601a of the semiconductor core 601 such that a portion opposite to a portion of the semiconductor core 601 covered with the cap layer 602, so that the exposed portion 601a is provided; a semiconductor layer 604 that is made of p-type GaN and that covers the outer peripheral surface of the quantum well layer 603; and a conductive layer 605 that covers the outer peripheral surface of the semiconductor layer 604.

The cross section perpendicular to the longitudinal direction of the exposed portion 601a of the semiconductor core 601 is nearly circular, and the cross section perpendicular to the longitudinal direction of the covered portion 601b of the semiconductor core 601 is nearly hexagonal. In the semiconductor core 601, the exposed portion 601a has a smaller diameter than the covered portion 601b, and a step portion 601c is provided between the outer peripheral surface of the exposed portion 601a and the outer peripheral surface of the covered portion 601b.

A metal layer 606 as one example of the second conductive layer is formed on the conductive layer 605 and on the side of the insulating substrate 600. About the lower half of the outer peripheral surface of the conductive layer 605 is covered with the metal layer 606. The conductive layer 605 is formed of ITO. Note that the conductive layer is not limited to this, and, for example, a translucent laminated metal film of Ag/Ni or Au/Ni having a thickness of 5 nm may be used. For the deposition of the laminated metal film, a vapor-deposition method or a sputtering method can be used. Moreover, to further decrease the resistance of the conductive layer, a laminated metal film of Ag/Ni or Au/Ni may be deposited on the ITO film mentioned above. The material used for the metal layer 606 is not limited to Al, and Cu, W, Ag, Au and the like may be used.

Figure 65:
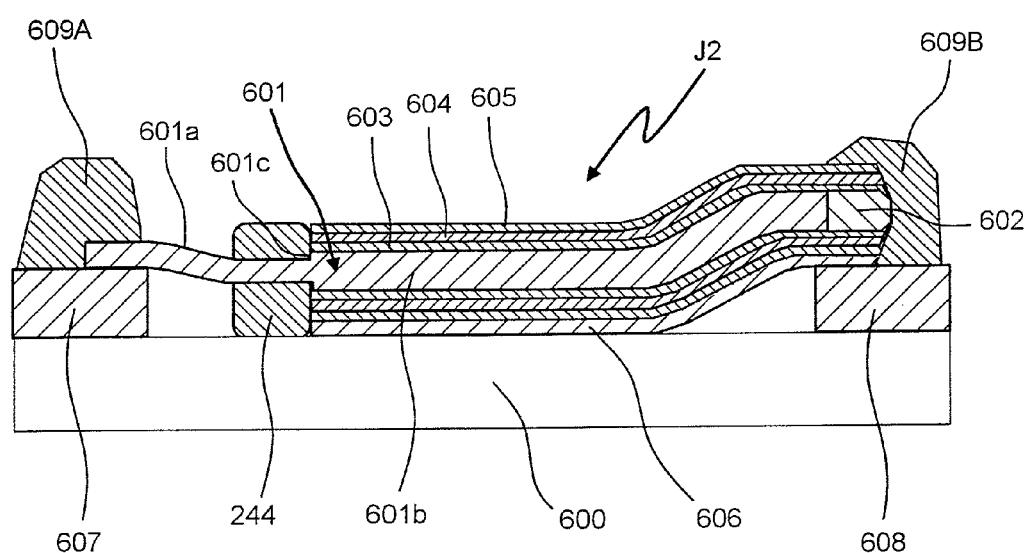
FIG. 65 is a cross-sectional view of the light-emitting apparatus.

The light-emitting apparatus of this Embodiment 29, as shown in FIG. 65, includes the insulating substrate 600 having metal electrodes 607 and 608 formed on a mounting surface, and the rod-like light-emitting device J2 that is mounted on the insulating substrate 600 such that the longitudinal direction of the rod-like light-emitting device J2 is parallel to the mounting surface of the insulating substrate 600.

The exposed portion 601a of one end of the rod-like light-emitting device J2 is connected to the metal electrode 607 by means of an adhesive joint 609A such as a conductive adhesive, and the metal layer 606 at the other end portion of the rod-like light-emitting device J2 is connected to the metal electrodes 608 by means of an adhesive joint 609B such as a conductive adhesive.

Here, in the rod-like light-emitting device J2, its central portion is deformed to come in contact with the insulating substrate 600. This deformation is caused by stiction that occurs when a droplet contracts in a clearance between the substrate surface and the rod-like light-emitting device because of vaporization during drying of an IPA aqueous solution in a method of aligning the rod-like light-emitting devices of Embodiment 38 to be described later.

According to the above light-emitting apparatus of Embodiment 29, the metal layer 606, as one example of the second conductive layer, made of a material having a lower resistance than the semiconductor layer 604 is formed on the conductive layer 605 of the rod-like light-emitting device J2 and on the side of the insulating substrate 600. On a side without the metal layer 606, which is opposite to the side of the insulating substrate 600 of the rod-like light-emitting device J2, the conductive layer 605 covering the outer peripheral surface of the semiconductor core 601 exists. Therefore, a lower resistance can be achieved by the metal layer 606 without sacrificing the ease of flow of a current to the whole semiconductor layer 604 having a high resistance. For the conductive layer 605 covering the outer peripheral surface of the semiconductor core 601, a material having a low transmittance cannot be used in consideration of the light emitting efficiency, and therefore a material having a low resistance cannot be used. However, for the metal layer 606, a conductive material for which a low resistance has precedence over the transmittance can be used. Moreover, in the rod-like light-emitting device J2 mounted on the insulating substrate 600 such that the longitudinal direction of the rod-like light-emitting device J2 is parallel to the mounting surface of the insulating substrate 600, the metal layer 606 is in contact with the mounting surface of the insulating substrate 600. Therefore, heat generated in the rod-like light-emitting device J2 can be dissipated with a good efficiency through the metal layer 606 to the insulating substrate 600.

(Embodiment 30)

Figure 66:
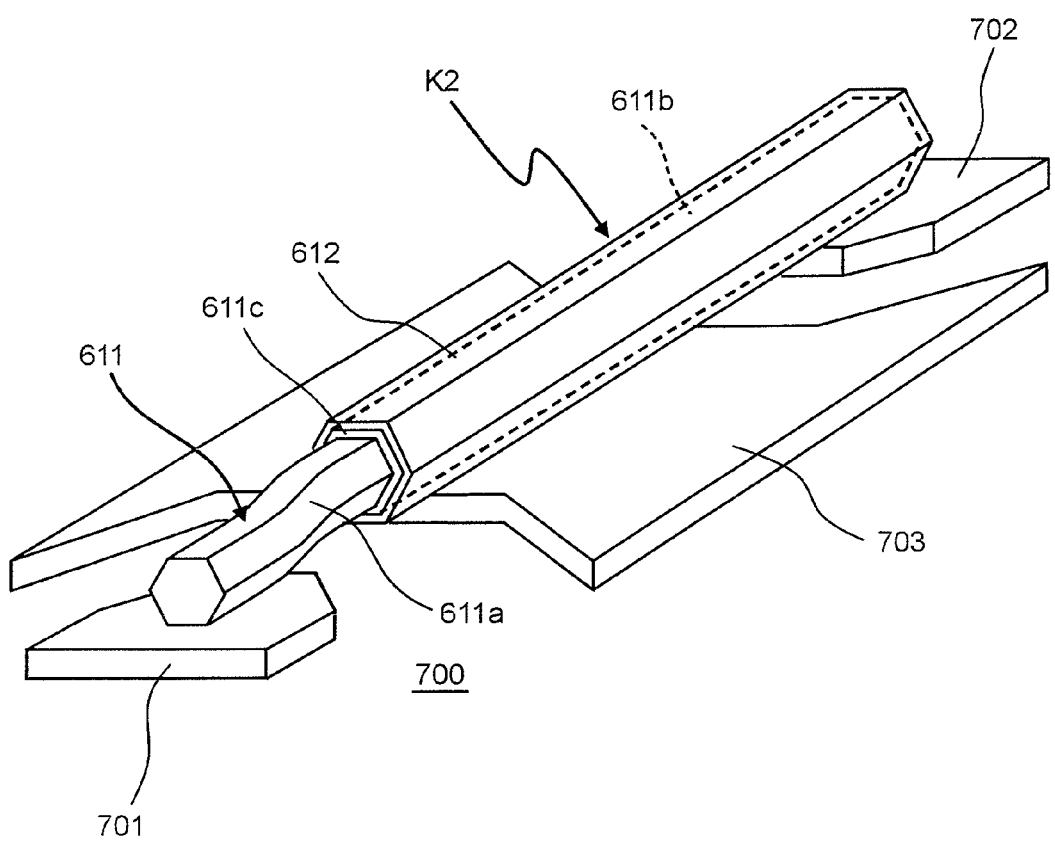
FIG. 66 is a perspective view of a light-emitting apparatus of Embodiment 30 of this invention.

FIG. 66 is a perspective view of a light-emitting apparatus of Embodiment 30 of this invention. In this Embodiment 30, a rod-like light-emitting device having the same configuration as the rod-like light-emitting device B2 of Embodiment 21 is used. Note that, as the rod-like light-emitting device, any one of the above rod-like light-emitting devices of Embodiments 20, and 22 to 29 may be used.

The light-emitting apparatus of this Embodiment 30, as shown in FIG. 66, includes an insulating substrate 700 having metal electrodes 701 and 702 formed on a mounting surface, and a rod-like light-emitting device K2 mounted on the insulating substrate 700 such that the longitudinal direction of the rod-like light-emitting device K2 is parallel to the mounting surface of the insulating substrate 700. On the insulating substrate 700, a third metal electrode 703, as one example of the metal portion, is formed between the metal electrodes 701 and 702 on the insulating substrate 700 and below the rod-like light-emitting device K2. FIG. 66 shows only parts of the metal electrodes 701, 702 and 703.

The rod-like light-emitting device K2 includes a semiconductor core 611 made of n-type GaN and having a rod shape whose cross section is nearly hexagonal, and a semiconductor layer 612 made of p-type GaN and covering the outer peripheral surface of a covered portion 611b other than one end portion 611a of the semiconductor core 611 such that the one end portion of the semiconductor core 611 not covered with the semiconductor layer 612 provides an exposed portion 611a. In the semiconductor core 611, the exposed portion 611a has a smaller diameter than the covered portion 611b, and a step portion 611c is provided between the outer peripheral surface of the exposed portion 611a and the outer peripheral surface of the covered portion 611b. The end surface of the other end of the semiconductor core 611 is covered with the semiconductor layer 612.

According to the above light-emitting apparatus of Embodiment 30, the metal electrode 703 is formed between the electrodes 701 and 702 and below the rod-like light-emitting device K2 on the insulating substrate 700, so that the central side of the rod-like light-emitting device K2 whose both ends are connected to the metal electrodes 701 and 702 is supported by bringing the central side into contact with the surface of the metal electrode 703. As a result, the rod-like light-emitting device K2, which is connected at both ends, is supported by the metal electrode 703, without being deformed, and heat generated in the rod-like light-emitting device K2 can be dissipated with a good efficiency from the semiconductor layer 612 through the metal electrode 703 to the insulating substrate 700.

Figure 67:
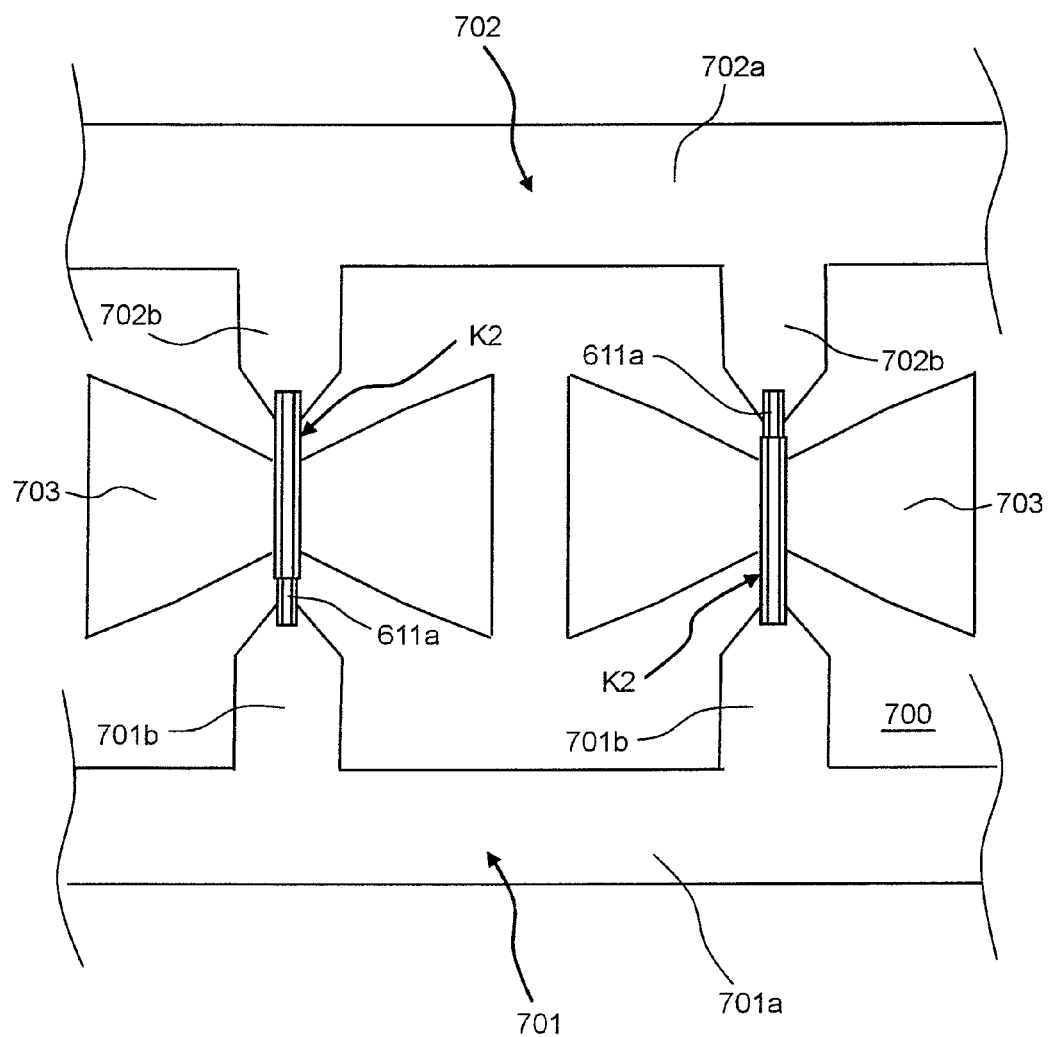
FIG. 67 is a plan view of a main part of the light-emitting apparatus in which rod-like light-emitting devices adjacent to each other are opposite in orientation.

Note that, as shown in FIG. 67, the metal electrodes 701 and 702 include base portions 701a and 702a that are nearly parallel to each other with a predetermined spacing therebetween, and pluralities of electrode portions 701b and 702b extending between the base portions 701a and 702a from positions facing each other in the base portions 701a and 702a, respectively. One rod-like light-emitting device K2 is aligned with the electrode portion 701b of the metal electrode 701 and the electrode portion 702b of the metal electrode 702 opposite thereto. Between the electrode portion 701b of the metal electrode 701 and the electrode portion 702b of the metal electrode 702 opposite thereto, the third metal electrode 703 in the shape of a butterfly whose central portion is narrow is formed on the insulating substrate 700.

The third metal electrodes 703 adjacent to one another are electrically separated from one another. As shown in FIG. 67, even when the orientations of the rod-like light-emitting devices K2 adjacent to each other are reversed, the metal electrode 701 and the metal electrode 702 can be prevented from becoming short-circuited to each other through the metal electrode 703.

In Embodiments 20 to 30 described above, semiconductors whose base materials are GaN are used for the semiconductor core, the cap layer and the semiconductor layer. However, this invention may be applied to light-emitting devices using semiconductors whose base materials are GaAs, AlGaAs, GaAsP, InGaN, AlGaN, GaP, ZnSe, AlGaInP and the like. While the semiconductor core is of n type and the semiconductor layer is of p type, this invention may be applied to a rod-like light-emitting device in which the conductivity types are reversed. A description has been given of the rod-like light-emitting device having the semiconductor core shaped like a rod in the shape of a circle or a hexagon. The rod-like light-emitting device is not limited to this, and may have a rod shape whose cross section is elliptical. This invention may be applied to a rod-like light-emitting device having a semiconductor core in a rod shape whose cross section is in the shape of another polygon such as a triangle.

In Embodiments 20 to 30 described above, the rod-like light-emitting device has a size of the order of micrometers with a diameter of 1 μm and a length of from 10 μm to 30 μm. However, there may be used a device with the size in the order of nanometers in which at least the diameter of the diameter and the length is less than 1 mm. The diameter of the semiconductor core of the above rod-like light-emitting device is preferably 500 nm or more and 100 μm or less, which enables variations in diameter of the semiconductor core to be reduced compared to a rod-like light-emitting device having a semiconductor core whose diameter ranges from several tens of nanometers to several hundreds of nanometers. Therefore, variations in the light emitting region, that is, variations in light emission characteristics can be decreased. This can lead to improvement in yields.

In Embodiments 20 to 30 described above, crystal growth of a semiconductor core is made using the MOCVD device. However, the semiconductor core and the cap layer may be formed using another crystal growth device such as a molecular-beam epitaxy (MBE) device. The crystal growth of the semiconductor core is made on a substrate using a mask having a growth hole. However, metal species are placed on a substrate, and crystal growth of a semiconductor core may result from the metal species.

(Embodiment 31)

FIGS. 68A to 68E are process drawings of a method of manufacturing a rod-like light-emitting device of Embodiment 31 of this invention. In this embodiment, n-type GaN doped with Si and p-type GaN doped with Mg are used. However, the impurity with which GaN is doped is not limited to this.

Figure 68A:
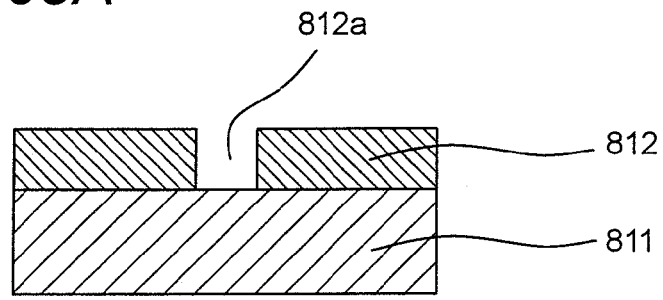
FIG. 68A shows a process step of a method of manufacturing rod-like light-emitting device of Embodiment 31 of this invention.

First, as shown in FIG. 68A, a mask 812 having a growth hole 812a is formed on a substrate 811 made of n-type GaN. The mask 812 is made of a substance of inhibiting the formation of the semiconductor layer 814, and covers part of the outer peripheral surface of the semiconductor core 813, which is a portion to be exposed. After the semiconductor layer forming step, the mask 812 is removed to allow the part of the outer peripheral surface of the semiconductor core 813 to be easily exposed. Here, a material that can selectively etch the semiconductor core and the semiconductor layer, such as silicon oxide ($SiO_2$) or silicon nitride ($Si_3N_4$), is used as the substance of inhibiting the formation of the semiconductor layer 814. However, the substance of inhibiting the formation of the semiconductor layer is not limited to this, and may be selected as appropriate in accordance with the composition of the semiconductor layer, and the like. To form a growth hole, a lithography method and a dry etching method, which are known and used for usual semiconductor processes, can be used. At this point, the diameter of the semiconductor core to be grown depends on the size of the above growth hole of the mask.

Figure 68B:
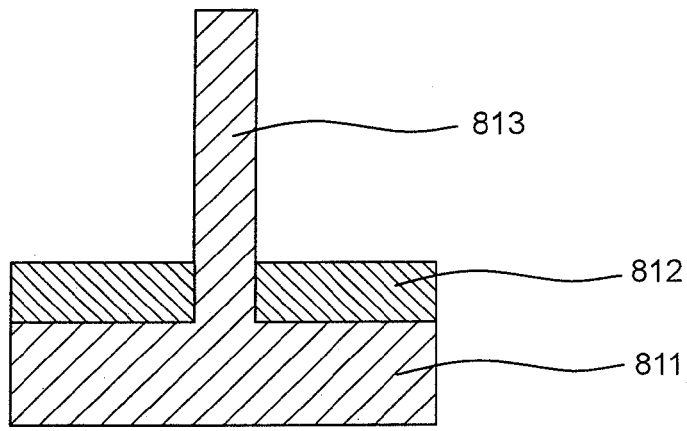
FIG. 68B shows a process step following that of FIG. 68A, showing the method of manufacturing rod-like light-emitting device.

Next, as shown in FIG. 68B, in a semiconductor core forming step, a rod-like semiconductor core 813 is formed on the substrate 811 exposed through the growth hole 812a of the mask 812 by crystal growth of n-type GaN using a MOCVD device. The growth temperature is set to about 950° C., trimethylgalium (TMG) and ammonia ($NH_3$) are used as growth gases, and silane ($SiH_4$) for n-type impurity supply and further hydrogen ($H_2$) as a carrier gas are supplied, so that the semiconductor core of n-type GaN with Si used as the impurity can be grown. Here, n-type GaN results in hexagonal crystal growth, and a semiconductor core in the shape of a hexagonal prism is obtained by growing the crystals under the condition where a direction perpendicular to the surface of the substrate 811 is the c-axis direction.

Figure 68C:
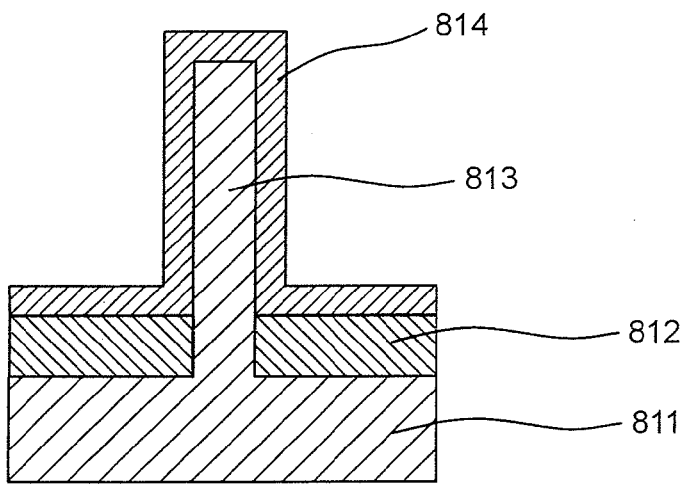
FIG. 68C shows a process step following that of FIG. 68B, showing the method of manufacturing rod-like light-emitting device.

Next, as shown in FIG. 68C, in a semiconductor layer forming step, a semiconductor layer 814 made of p-type GaN is formed over the whole surface of the substrate 811 such that the rod-like semiconductor core 813 is covered with the semiconductor layer 814. The formation temperature is set to about 960° C., and trimethylgalium (TMG) and ammonia (NH$_3$) as growth gases, and bis(cyclopentadienyl)magnesium (Cp$_2$Mg) for p-type impurity supply are used, so that p-type GaN with magnesium (Mg) used as the impurity can be grown.

Figure 68D:
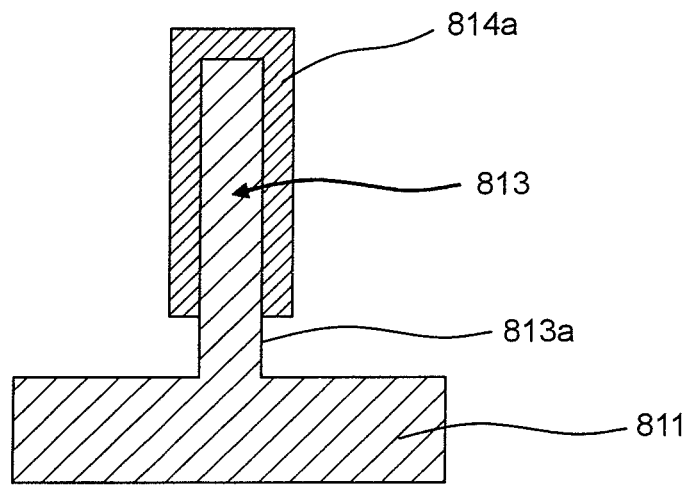
FIG. 68D shows a process step following that of FIG. 68C, showing the method of manufacturing rod-like light-emitting device.

Next, as shown in FIG. 68D, in an exposing step, all of the region of the semiconductor layer 814, except for a portion thereof covering the semiconductor core 813, and the mask 812 are removed by lift-off so as to expose the outer peripheral surface on the side of the substrate 811 of the rod-like semiconductor core 813, so that an exposed portion 813a is formed. In this state, the end surface of the semiconductor core 813 opposite to the substrate 811 is covered with a semiconductor layer 814a. In the case where a mask is made of silicon oxide (SiO$_2$), use of a solution containing hydrofluoric acid (HF) enables the mask to be easily etched without affecting the semiconductor core and the semiconductor layer portion covering the semiconductor core, and enables the mask together with the semiconductor layer on the mask (all of the region of the semiconductor layer except for a portion thereof covering the semiconductor core) to be removed by lift-off. The lift-off is used in the exposing step of this embodiment; however, part of the semiconductor core may be exposed by etching. In the case of dry etching, use of CF$_4$ and XeF$_2$ enables the mask to be easily etched without affecting the semiconductor core and the semiconductor layer portion covering the semiconductor core, and enables all of the region of the semiconductor layer, except for the portion thereof covering the semiconductor core, together with the mask to be removed.

Figure 68E:
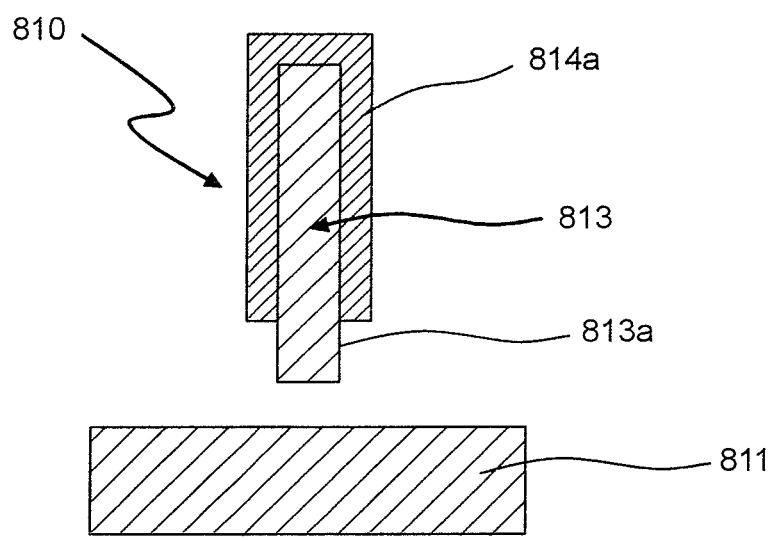
FIG. 68E shows a process step following that of FIG. 68D, showing the method of manufacturing rod-like light-emitting device.

Next, in a separating step, the substrate is immersed in an isopropyl alcohol (IPA) aqueous solution, and is vibrated along the plane of the substrate 811 using ultrasonic waves (e.g., several tens of kilo-hertz). This causes stress to act on the semiconductor core 813 covered with the semiconductor layer 814a so as to bend the root close to the substrate 811 of the semiconductor core 813 that erects on the substrate 811. As a result, as shown in FIG. 68E, the semiconductor core 813 covered with the semiconductor layer 814a is separated from the substrate 811.

In this way, a microscopic rod-like light-emitting device 810 that is separated from the substrate 811 can be manufactured. In this Embodiment 31, the rod-like light-emitting device 810 has a diameter of 1 μm and a length of 10 μm.

In the rod-like light-emitting device 810, with one electrode connected to the exposed portion 813a of the semiconductor core 813, and with the other electrode connected to the semiconductor layer 814a, a current is caused to flow from the p-type semiconductor layer 814a to the n-type semiconductor core 813 to result in recombination of electrons and holes in a pn junction between the outer peripheral surface of the n-type semiconductor core 813 and the inner peripheral surface of the p-type semiconductor layer 814a. Thus, light is emitted. Light is emitted from the whole periphery of the semiconductor core 813 covered with the semiconductor layer 814a. The light emitting region therefore becomes larger, which results in a high light emitting efficiency.

According to a method of manufacturing a rod-like light-emitting device having the above configuration, the microscopic rod-like light-emitting device 810 having great freedom in installing into an apparatus can be manufactured. The above rod-like light-emitting device is used as a microscopic structure separated from the substrate. This can decrease the amount of semiconductors used and makes it possible to reduce the thickness and weight of an apparatus that uses the light-emitting device, and emits light from the whole periphery of the semiconductor core 813 covered with the semiconductor layer 814a, which expands the light emitting region. Therefore, a backlight, an illuminating device, a display device and the like that have high light-emitting efficiencies and achieve low power consumption can be implemented.

In the exposing step for exposing part of the outer peripheral surface of the semiconductor core 813, the outer peripheral surface on the side of the substrate 811 of the semiconductor core 813 is exposed, and in the semiconductor layer forming step, the end surface of the semiconductor core 813 opposite to the substrate 811 is covered with the semiconductor layer 814. This enables the exposed portion 813a on the side of the substrate 811 of the semiconductor core 813 to be connected to the n-side electrode. The end surface of the semiconductor core 813 opposite to the substrate 811 is covered with the semiconductor layer 814a. This enables the p-side electrode to be connected to a portion of the semiconductor layer 814a covering the side opposite to the substrate 811 of the semiconductor core 813. In this way, electrodes can easily be connected to both ends of the microscopic rod-like light-emitting device.

In the above separating step, the substrate 811 is vibrated along the plane of the substrate 811 using ultrasonic waves. This causes stress to act on the semiconductor core 813 covered with the semiconductor layer 814a so as to bend the root close to the substrate 811 of the semiconductor core 813 that erects on the substrate 811. As a result, the semiconductor core 813 covered with the semiconductor layer 814a is separated from the substrate 811. Accordingly, a plurality of microscopic rod-like light-emitting devices provided on the substrate 811 can easily be separated in a simple way.

Note that, in the above separating step, the semiconductor core 813 may be mechanically separated from the substrate 811 using a cutting tool. The root close to the substrate 811 of the semiconductor core 813 that erects on the substrate 811 is bent using a cutting tool. As a result, stress acts on the semiconductor core 813 covered with the semiconductor layer 814a, so that the semiconductor core 813 covered with the semiconductor layer 814a is separated from the substrate 811. In this case, a plurality of microscopic rod-like light-emitting devices provided on the substrate 811 can be separated for a short time in a simple way.

In the above exposing step, dry etching may be used, which can easily expose part of the outer peripheral surface of the semiconductor core 813 made of a semiconductor whose base material is GaN. Wet etching is difficult for the semiconductor whose base material is GaN. Therefore, in cases where the semiconductor core 813 and the semiconductor layer 814a are made of the semiconductors whose base materials are GaN, exposing part of the outer peripheral surface of the semiconductor core 813 by dry etching prior to the separating step is particularly effective for implementing a microscopic rod-like light-emitting device that is easy to mount. In the case of manufacturing a microscopic rod-like light-emitting device by separating the semiconductor core 813 covered with the semiconductor layer 814a from the substrate 811 without the exposing step for exposing part of the outer peripheral surface of the semiconductor core 813, it is possible to easily expose part of the outer peripheral surface of the semiconductor core 813 by dry etching for the purpose of electrode connection after the microscopic rod-like light-emitting device is aligned on the insulating substrate 811.

In the above exposing step, the outer peripheral surface of the region covered with the semiconductor layer 814*a* of the semiconductor core 813 and the outer peripheral surface of the exposed region of the semiconductor core 813 are continuous with each other such that the exposed region of the semiconductor core 813 is thin. Therefore, in the above separating step, the side of the substrate 811 of the exposed region of the semiconductor core 813 becomes more likely to be broken on the substrate 811 side in the exposed region of the semiconductor core 813, which facilitates the separation.

Moreover, in a rod-like light-emitting device manufactured by the above method of manufacturing a rod-like light-emitting device, crystal growth of the semiconductor layer 814*a* occurs radially outward from the outer peripheral surface of the semiconductor core 813. The growth distance in the radial direction is short and the defect deviates outward, and therefore the semiconductor core 813 can be covered with the semiconductor layer 814*a* having less crystal defects. Accordingly, a rod-like light-emitting device having good characteristics can be implemented.

(Embodiment 32)

FIGS. 69A to 69E are process drawings of a method of manufacturing a rod-like light-emitting device of Embodiment 32 of this invention. A rod-like light-emitting device of this Embodiment 32 has the same configuration as the rod-like light-emitting device of Embodiment 31, except for the quantum well layer.

Figure 69A:
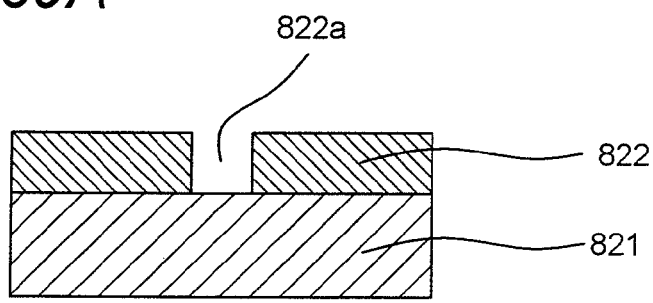
FIG. 69A shows a process step of a method of manufacturing rod-like light-emitting device of Embodiment 32 of this invention.

First, as shown in FIG. 69A, a mask 822 having a growth hole 822*a* is formed on a substrate 821 made of n-type GaN. A material capable of selectively etching a semiconductor core and a semiconductor layer, such as silicon oxide ($SiO_2$) or silicon nitride ($Si_3N_4$), can be used for the mask. To form a growth hole, a lithography method and a dry etching method, which are known and used for usual semiconductor processes, can be used. At this point, the diameter of the semiconductor core to be grown depends on the size of the above growth hole of the mask.

Figure 69B:
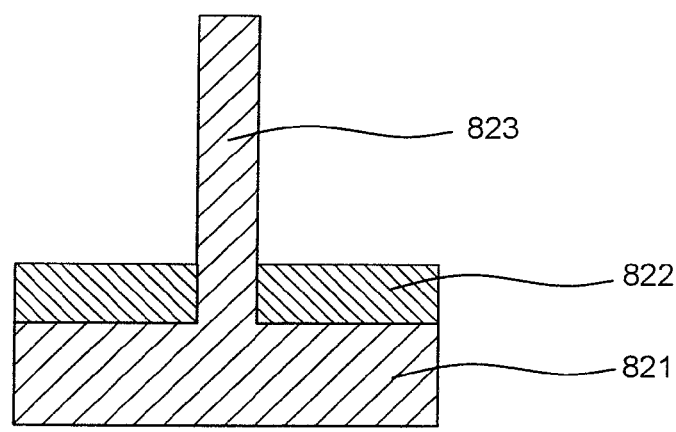
FIG. 69B shows a process step following that of FIG. 69A, showing the method of manufacturing rod-like light-emitting device.

Next, as shown in FIG. 69B, in a semiconductor core forming step, a semiconductor core 823 shaped like a rod is formed on the substrate 821 exposed through the growth hole 822*a* of the mask 822 by crystal growth of n-type GaN using a MOCVD device. The growth temperature is set to about 950° C., trimethylgalium (TMG) and ammonia ($NH_3$) are used as growth gases, and silane ($SiH_4$) for n-type impurity supply and further hydrogen ($H_2$) as a carrier gas are supplied, so that the semiconductor core of n-type GaN with Si used as the impurity can be grown. Here, n-type GaN results in hexagonal crystal growth, and a semiconductor core shaped like a rod of a hexagonal prism is obtained by growing the crystals under the condition where a direction perpendicular to the surface of the substrate 821 is the c-axis direction.

Figure 69C:
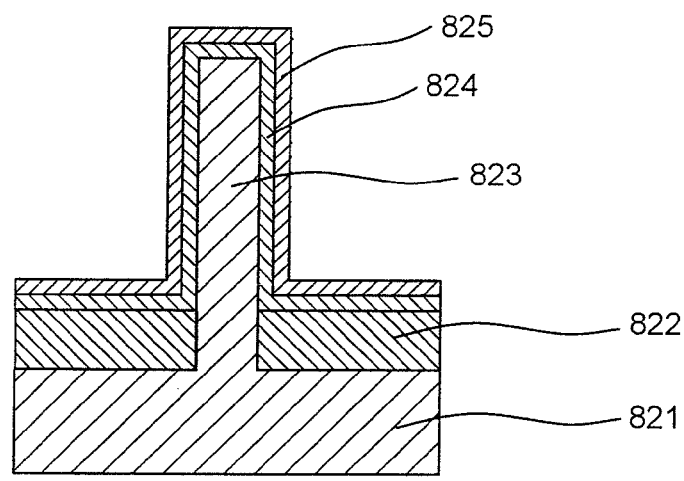
FIG. 69C shows a process step following that of FIG. 69B, showing the method of manufacturing rod-like light-emitting device.

Next, as shown in FIG. 69C, in a quantum well layer and semiconductor layer forming step, a quantum well layer 824 made of p-type InGaN is formed over the whole surface of the substrate 821 so as to cover the semiconductor core 823 shaped like a rod, and further a semiconductor layer 825 is formed over the whole surface of the substrate 821. After the semiconductor core of n-type GaN has been grown in the MOCVD device as described above, the set temperature is changed from 600° C. to 800° C. in accordance with the wavelength of emitted light, and nitrogen ($N_2$) is supplied to the carrier gas and TMG, $NH_3$ and trimethylindium (TMI) are supplied to the growth gas. In this way, the InGaN quantum well layer 824 can be formed on the semiconductor core 823 of n-type GaN. Thereafter, further, the set temperature is changed to 960° C., and TMG and $NH_3$ are used as the growth gases as mentioned above, and $Cp_2Mg$ is used for p-type impurity supply. In this way, the semiconductor layer 825 made of p-type GaN can be formed. Note that the quantum well layer may have a p-type AlGaN layer as an electron block layer inserted between the InGaN layer and the p-type GaN layer. Also, the quantum well layer may have a multiple quantum well structure in which barrier layers of GaN and quantum well layers of InGaN are alternately laminated.

Figure 69D:
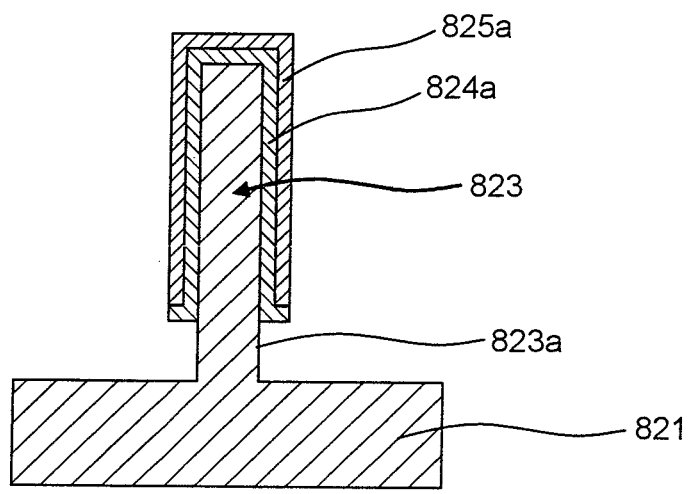
FIG. 69D shows a process step following that of FIG. 69C, showing the method of manufacturing rod-like light-emitting device.

Next, as shown in FIG. 69D, in an exposing step, all of the regions of the quantum well layer 824 and the semiconductor layer 825, except for portions thereof covering the semiconductor core 823, and the mask 822 are removed by lift-off so as to expose the outer peripheral surface on the side of the substrate 821 of the rod-like semiconductor core 823, so that an exposed portion 823*a* is formed. In this state, the end surface of the above semiconductor core 823 opposite to the substrate 821 is covered with the quantum well layer 824*a* and the semiconductor layer 825*a*. In the case where a mask is made of silicon oxide ($SiO_2$) or silicon nitride ($Si_3N_4$), use of a solution containing hydrofluoric acid (HF) enables the mask to be easily etched without affecting the semiconductor core and the semiconductor layer portion covering the semiconductor core, and enables the mask together with the semiconductor layer on the mask (all of the region of the semiconductor layer except for a portion thereof covering the semiconductor core) to be removed by lift-off. The lift-off is used in the exposing step of this embodiment; however, part of the semiconductor core may be exposed by etching. In the case of dry etching, use of $CF_4$ and $XeF_2$ enables the mask to be easily etched without affecting the semiconductor core and the semiconductor layer portion covering the semiconductor core, and enables all of the region of the semiconductor layer, except for the portion thereof covering the semiconductor core, together with the mask to be removed.

Figure 69E:
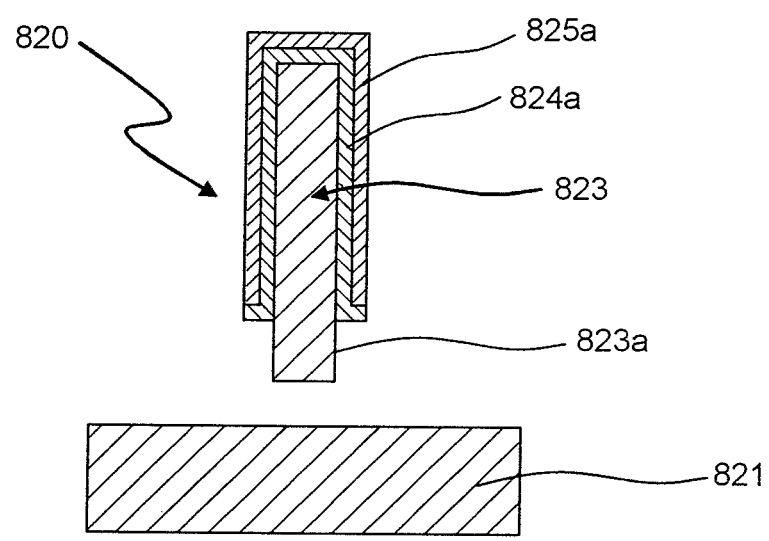
FIG. 69E shows a process step following that of FIG. 69D, showing the method of manufacturing rod-like light-emitting device.

Next, in a separating step, the substrate is immersed in an isopropyl alcohol (IPA) aqueous solution, and is vibrated along the plane of the substrate 821 using ultrasonic waves (e.g., several tens of kilo-hertz). This causes stress to act on the semiconductor core 823 covered with the quantum well layer 824 and the semiconductor layer 825*a* so as to bend the root close to the substrate 821 of the semiconductor core 823 that erects on the substrate 821. As a result, as shown in FIG. 69E, the semiconductor core 823 covered with the quantum well layer 824 and the semiconductor layer 825*a* is separated from the substrate 821.

In this way, a microscopic rod-like light-emitting device 820 that is separated from the substrate 821 can be manufactured. In this Embodiment 32, the rod-like light-emitting device 820 has a diameter of 1 μm and a length of 10 μm.

In the rod-like light-emitting device 820, with the n-side electrode connected to the exposed portion 823*a* of the semiconductor core 823 and with the p-side electrode connected to the semiconductor layer 825*a*, a current is caused to flow from the p-type semiconductor layer 825*a* to the n-type semiconductor core 823 to result in recombination of electrons and holes in the quantum well layer 824*a*. Thus, light is emitted. Light is emitted from the whole periphery of the semiconductor core 823 covered with the semiconductor layer 825*a*. The light emitting region therefore becomes larger, which results in a high light emitting efficiency.

According to a method of manufacturing a rod-like light-emitting device having the above configuration, the microscopic rod-like light-emitting device 820 having great freedom in installing into an apparatus can be manufactured. The above rod-like light-emitting device can decrease the amount of semiconductors used and makes it possible to reduce the thickness and weight of an apparatus that uses the light-emitting device, and emits light from the whole periphery of the semiconductor core 823, which makes the light emitting region larger. Therefore, a backlight, an illuminating device, a display device and the like that have high light-emitting efficiencies and achieve low power consumption can be implemented.

The above method of manufacturing a rod-like light-emitting device of Embodiment 32 has effects similar to those of the rod-like light-emitting device of Embodiment 31.

Electrons and holes recombine with each other to emit light in the quantum well layer 824*a* formed between the n-type semiconductor core 823 and the p-type semiconductor layer 825*a*. This can result in a more increased light emitting efficiency, which is due to quantum confinement effects of the quantum well layer 824*a*, than Embodiment 31.

(Embodiment 33)

FIGS. 70A to 70D are process drawings of a method of manufacturing a rod-like light-emitting device of Embodiment 33 of this invention. The rod-like light-emitting device of this Embodiment 33 has the same configuration as the rod-like light-emitting device of Embodiment 31, except for the exposed portion of the semiconductor core.

Figure 70A:
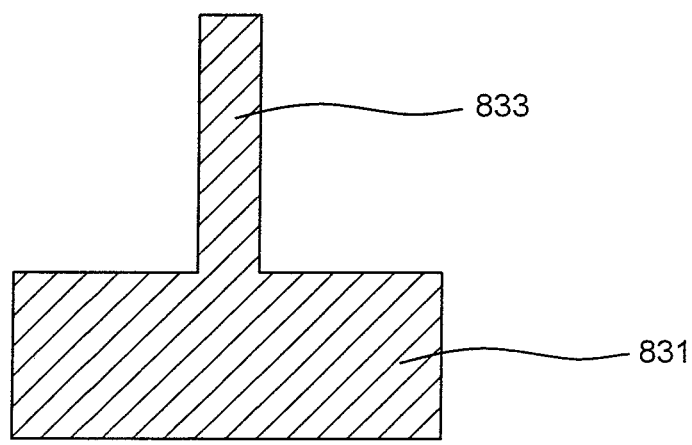
FIG. 70A shows a process step of a method of manufacturing rod-like light-emitting device of Embodiment 33 of this invention.

First, as shown in FIG. 70A, in a semiconductor core forming step, a rod-like semiconductor core 833 is formed on an n-type GaN substrate 831 by crystal growth of n-type GaN. This step of forming the semiconductor core 833 is performed in a similar manner to that of Embodiment 31 to remove a mask.

Figure 70B:
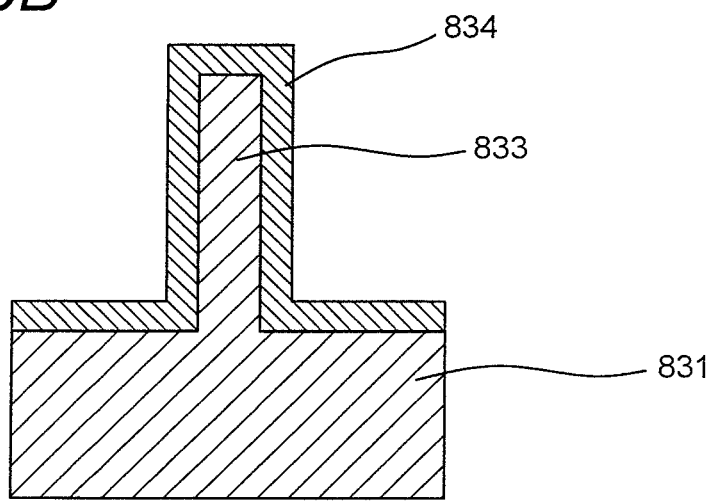
FIG. 70B shows a process step following that of FIG. 70A, showing the method of manufacturing rod-like light-emitting device.

Next, as shown in FIG. 70B, in the semiconductor layer forming step, a semiconductor layer 834 made of p-type GaN is formed over the whole surface of the substrate 831 to cover the semiconductor core 833 shaped like a rod.

Figure 70C:
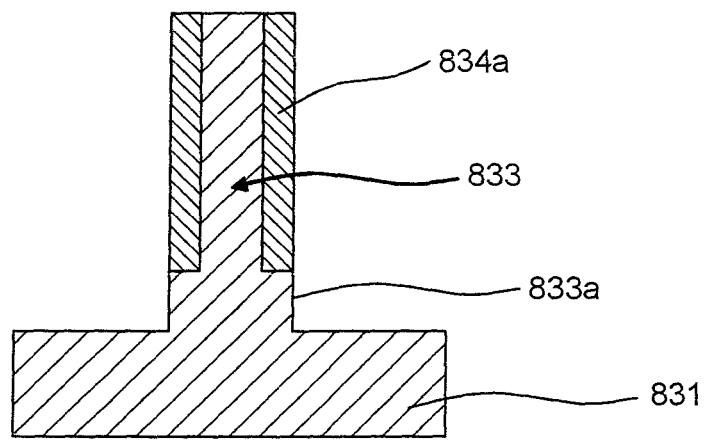
FIG. 70C shows a process step following that of FIG. 70B, showing the method of manufacturing rod-like light-emitting device.

Next, as shown in FIG. 70C, in an exposing step, all of the region of the semiconductor layer 834, except for a portion thereof covering the semiconductor core 833, is removed by dry etching to expose the outer peripheral surface on the side of the substrate 831 of the rod-like semiconductor core 833, so that an exposed portion 833*a* is formed. In this case, use of $SiCl_4$ for RIE of dry etching allows GaN to be anisotropically etched with ease. In this state, the end surface of the semiconductor core 833 opposite to the substrate 831 is exposed by dry etching.

Here, the outer peripheral surface of the semiconductor layer 834*a* and the outer peripheral surface of the exposed portion 833*a* of the semiconductor core 833 are continuous with each other without a step. Thus, when a microscopic rod-like light-emitting device that has been separated is mounted on an insulating substrate having an electrode formed thereon in such a manner that the axial direction of the device is parallel to the plane of the substrate, the exposed portion 833*a* of the semiconductor core 833 can be reliably and easily connected with the electrode because no step exists between the outer peripheral surface of the semiconductor layer 834*a* and the outer peripheral surface of the exposed portion 833*a* of the semiconductor core 833.

Next, in a separating step, the substrate is immersed in an isopropyl alcohol (IPA) aqueous solution, and is vibrated along the plane of the substrate 831 using ultrasonic waves (e.g., several tens of kilo-hertz). This causes stress to act on the semiconductor core 833 covered with the semiconductor layer 834*a* so as to bend the root close to the substrate 831 of the semiconductor core 833 that erects on the substrate 831.

Figure 70D:
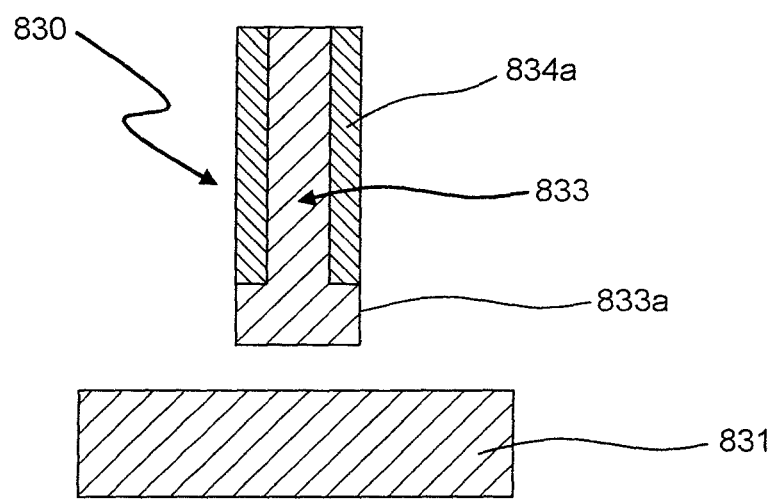
FIG. 70D shows a process step following that of FIG. 70C, showing the method of manufacturing rod-like light-emitting device.

As a result, as shown in FIG. 70D, the semiconductor core 833 covered with the semiconductor layer 834*a* is separated from the substrate 831.

In this way, a microscopic rod-like light-emitting device 830 that is separated from the substrate 831 can be manufactured. In this Embodiment 33, the rod-like light-emitting device 830 has a diameter of 1 μm and a length of 10 μm.

In the rod-like light-emitting device 830, with the n-side electrode connected to the exposed portion 833*a* of the semiconductor core 833 and with the p-side electrode connected to the semiconductor layer 834*a*, a current is caused to flow from the p-type semiconductor layer 834*a* to the n-type semiconductor core 833 to result in recombination of electrons and holes in a pn junction between the outer peripheral surface of the n-type semiconductor core 833 and the inner peripheral surface of p-type semiconductor layer 834*a*. Thus, light is emitted. Light is emitted from the whole periphery of the semiconductor core 833 covered with the semiconductor layer 834*a*. The light emitting region therefore becomes larger, which results in a high light emitting efficiency.

According to a method of manufacturing a rod-like light-emitting device having the above configuration, the microscopic rod-like light-emitting device 830 having great freedom in installing into an apparatus can be manufactured. The above rod-like light-emitting device can decrease the amount of semiconductors used and makes it possible to reduce the thickness and weight of an apparatus that uses the light-emitting device, and emits light from the whole periphery of the semiconductor core covered with the semiconductor layer, which makes the light emitting region larger. Therefore, a backlight, an illuminating device, a display device and the like that have high light-emitting efficiencies and achieve low power consumption can be implemented.

The above method of manufacturing a rod-like light-emitting device of Embodiment 33 has effects similar to those of the rod-like light-emitting device of Embodiment 31.

As shown in FIG. 70C, after the semiconductor layer forming step and before the separating step, all of the region of the semiconductor layer 834, except for a portion thereof covering the surface of the semiconductor core 833, and the part corresponding to the region in the thickness direction of the upper region of the n-type GaN substrate 831 are removed by etching to expose part of the outer peripheral surface of the semiconductor core 833. This can result in no step between the outer peripheral surface of the semiconductor layer 834*a* and the exposed portion 833*a* of the outer peripheral surface of the semiconductor core 833. Thus, when the microscopic rod-like light-emitting device that has been separated is mounted on an insulating substrate having an electrode formed thereon in such a manner that the axial direction of the device is parallel to the plane of the substrate, the exposed portion 833*a* of the semiconductor core 833 can be reliably and easily connected with the electrode.

(Embodiment 34)

FIGS. 71A to 71D are process drawings of a method of manufacturing a rod-like light-emitting device of Embodiment 34 of this invention. The rod-like light-emitting device of this Embodiment 34 has the same configuration as the rod-like light-emitting device of Embodiment 32, except for the exposed portion of the semiconductor core.

Figure 71A:
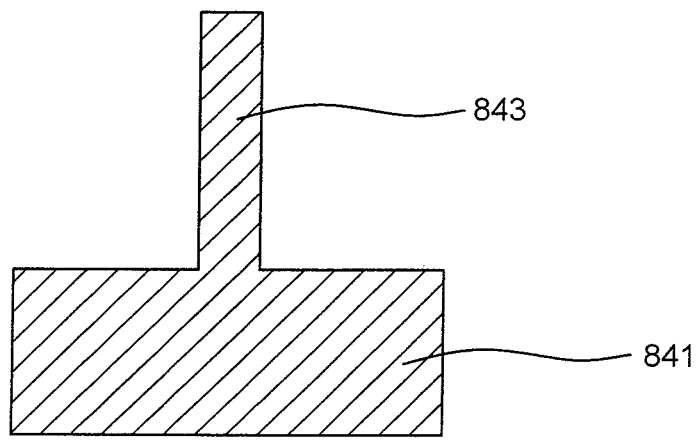
FIG. 71A shows a process step of a method of manufacturing rod-like light-emitting device of Embodiment 34 of this invention.

First, as shown in FIG. 71A, in a semiconductor core forming step, a rod-like semiconductor core 843 is formed on an n-type GaN substrate 841 by crystal growth of n-type GaN. This step of forming the semiconductor core 843 is performed in a similar manner to that of Embodiment 31 to remove a mask.

Figure 71B:
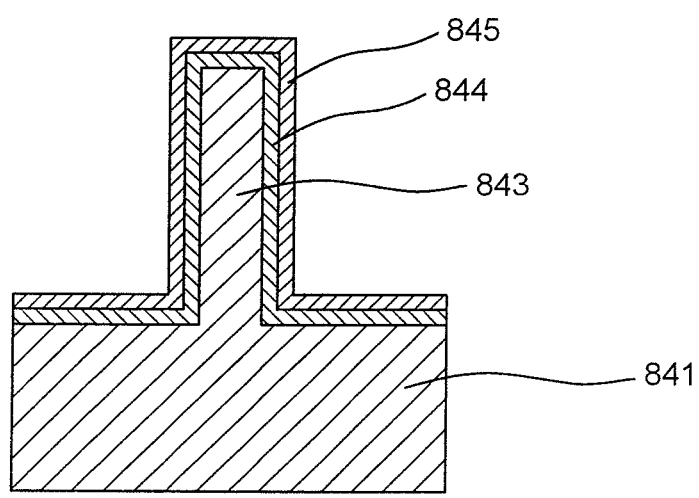
FIG. 71B shows a process step following that of FIG. 71A, showing the method of manufacturing rod-like light-emitting device.

Next, as shown in FIG. 71B, in a quantum well layer and semiconductor layer forming step, a quantum well layer 844 made of p-type InGaN is formed over the whole surface of the substrate 841 to cover the rod-like semiconductor core 843, and further a semiconductor layer 845 is formed over the whole surface of the substrate 841. Note that this quantum well layer may have a multiple quantum well structure in which a barrier layer and a quantum well layer are laminated.

Figure 71C:
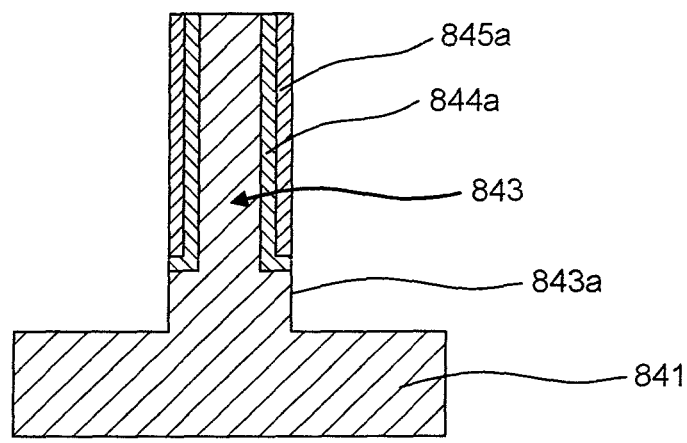
FIG. 71C shows a process step following that of FIG. 71B, showing the method of manufacturing rod-like light-emitting device.

Next, as shown in FIG. 71C, in an exposing step, all of the regions of the quantum well layer 844 and the semiconductor layer 845, except for portions thereof covering the semiconductor core 843, is removed by dry etching to expose the outer peripheral surface on the side of the substrate 841 of the rod-like semiconductor core 843, so that an exposed portion 843a is formed. In this case, use of $SiCl_4$ for RIE of dry etching allows GaN to be anisotropically etched with ease. In this state, the end surface of the semiconductor core 843 opposite to the substrate 841 is exposed by dry etching.

Here, the outer peripheral surface of a semiconductor layer 845a and the outer peripheral surface of an exposed portion 843a of the semiconductor core 843 are continuous with each other without a step (no step also exists between an exposed portion of the outer peripheral surface of the quantum well layer 844a and the outer peripheral surface of the exposed portion 843a of the semiconductor core 843). Thus, when a microscopic rod-like light-emitting device that has been separated is mounted on an insulating substrate having an electrode formed thereon in such a manner that the axial direction of the device is parallel to the plane of the substrate, the exposed portion 843a of the semiconductor core 843 can be reliably and easily connected with the electrode because no step exists between the outer peripheral surface of the semiconductor layer 845a and the outer peripheral surface of the exposed portion 843a of the semiconductor core 843.

Figure 71D:
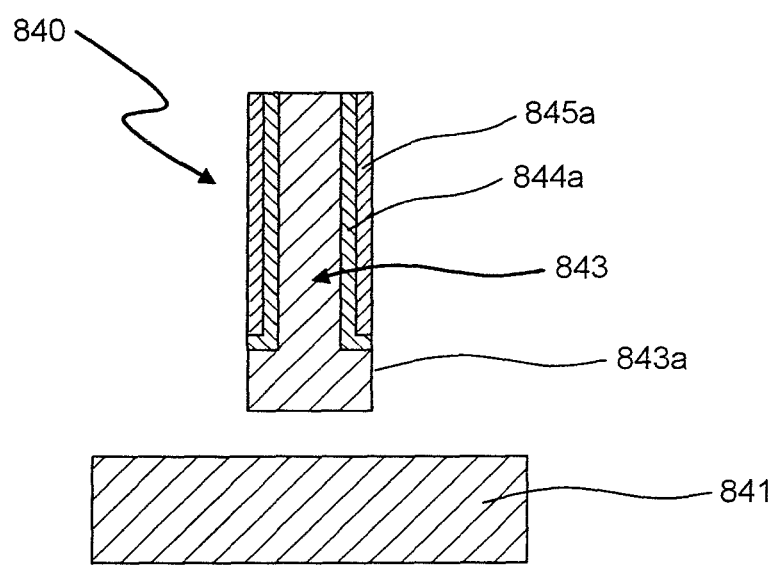
FIG. 71D shows a process step following that of FIG. 71C, showing the method of manufacturing rod-like light-emitting device.

Next, in a separating step, the substrate is immersed in an isopropyl alcohol (IPA) aqueous solution, and is vibrated along the plane of the substrate 841 using ultrasonic waves (e.g., several tens of kilo-hertz). This causes stress to act on the semiconductor core 843 covered with the semiconductor layer 845a so as to bend the root close to the substrate 841 of the semiconductor core 843 that erects on the substrate 841. As a result, as shown in FIG. 71D, the semiconductor core 843 covered with the semiconductor layer 845a is separated from the substrate 841.

In this way, a microscopic rod-like light-emitting device 840 that is separated from the substrate 841 can be manufactured. In this Embodiment 34, the rod-like light-emitting device 840 has a diameter of 1 μm and a length of 10 μm.

In the rod-like light-emitting device 840, with the n-side electrode connected to the exposed portion 843a of the semiconductor core 843 and with the p-side electrode connected to the semiconductor layer 845a, a current is caused to flow from the p-type semiconductor layer 845a to the n-type semiconductor core 843 to result in recombination of electrons and holes in the quantum well layer 844a. Thus, light is emitted. Light is emitted from the whole periphery of the semiconductor core 843 covered with the semiconductor layer 845a. The light emitting region therefore becomes larger, which results in a high light emitting efficiency.

According to a method of manufacturing a rod-like light-emitting device having the above configuration, the microscopic rod-like light-emitting device 840 having great freedom in installing into an apparatus can be manufactured. The above rod-like light-emitting device can decrease the amount of semiconductors used and makes it possible to reduce the thickness and weight of an apparatus that uses the light-emitting device, and emits light from the whole periphery of the semiconductor core covered with the semiconductor layer, which makes the light emitting region larger. Therefore, a backlight, an illuminating device, a display device and the like that have high light-emitting efficiencies and achieve low power consumption can be implemented.

The above method of manufacturing a rod-like light-emitting device of Embodiment 34 has effects similar to those of the rod-like light-emitting device of Embodiment 31.

Electrons and holes recombine with each other to emit light in the quantum well layer 844a formed between the n-type semiconductor core 843 and the p-type semiconductor layer 845a. This can result in a more increased light emitting efficiency, which is due to quantum confinement effects of the quantum well layer 844a, than Embodiment 33.

As shown in FIG. 71C, after the semiconductor layer forming step and before the separating step, all of the regions of the quantum well layer 844 and the semiconductor layer 845, except for portions thereof covering the surface of the semiconductor core 843, and the part corresponding to the above regions in the thickness direction of the upper region of the n-type GaN substrate 841 are removed by etching to expose part of the outer peripheral surface of the semiconductor core 843. This can result in no step between the outer peripheral surface of the semiconductor layer 844a and the exposed portion 843a of the outer peripheral surface of the semiconductor core 843. Thus, when the microscopic rod-like light-emitting device that has been separated is mounted on an insulating substrate having an electrode formed thereon in such a manner that the axial direction of the device is parallel to the plane of the substrate, the exposed portion 843a of the semiconductor core 843 can be reliably and easily connected with the electrode.

(Embodiment 35)

FIGS. 72 to 94 are process drawings of a method of manufacturing a rod-like light-emitting device of Embodiment 35 of this invention. In this Embodiment 35, n-type GaN doped with Si and p-type GaN doped with Mg are used. However, the impurity with which GaN is doped is not limited to this case.

Figure 72:
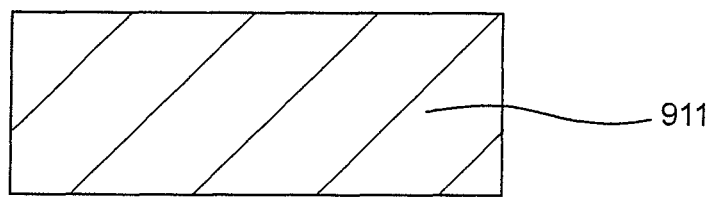
FIG. 72 shows a process step of a method of manufacturing rod-like light-emitting device of Embodiment 34 of this invention.

First, the surface of a substrate 911 shown in FIG. 72 is cleaned. As the substrate, substrates that allow growth of GaN, such as Si, SiC and sapphire can be used.

Figure 73:
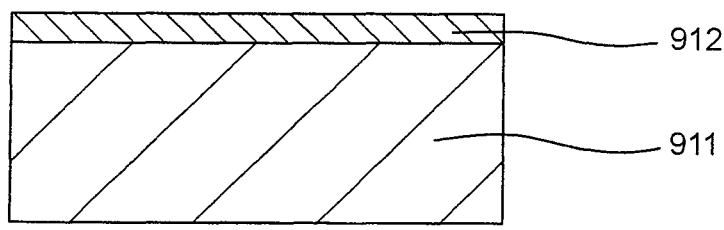
FIG. 73 shows a process step following that of FIG. 72, showing the method of manufacturing rod-like light-emitting device.

Next, as shown in FIG. 73, a growth-mask layer (hereinbelow referred to as a "mask") 912 is formed on the substrate 911. A material that is selectively etchable with respect to a semiconductor core and a semiconductor layer of silicon oxide ($SiO_2$) and the like can be used for the mask.

Figure 74:
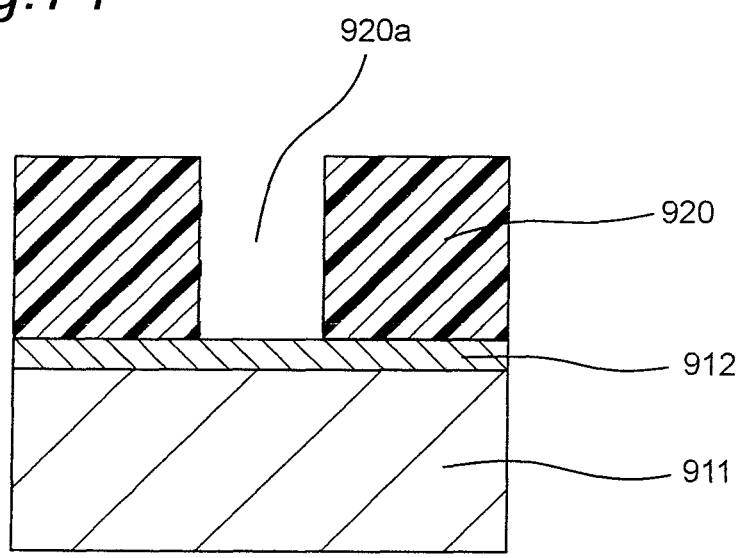
FIG. 74 shows a process step following that of FIG. 73, showing the method of manufacturing rod-like light-emitting device.

Next, as shown in FIG. 74, a hole 920a is formed on a resist 920 applied onto the substrate 911 by patterning using a known lithography method for use in usual semiconductor processes.

Figure 75:
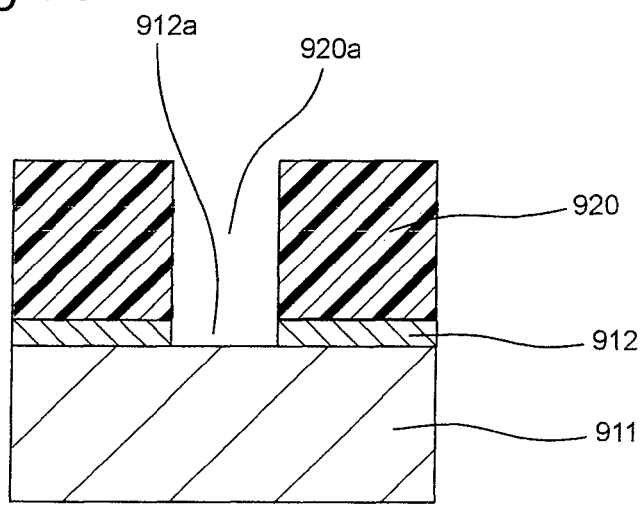
FIG. 75 shows a process step following that of FIG. 74, showing the method of manufacturing rod-like light-emitting device.

Next, as shown in FIG. 75, a growth hole 912a is formed in the mask 912 using the hole 920a of the patterned resist 920. A dry etching method can be utilized for the growth hole formation.

Figure 76:
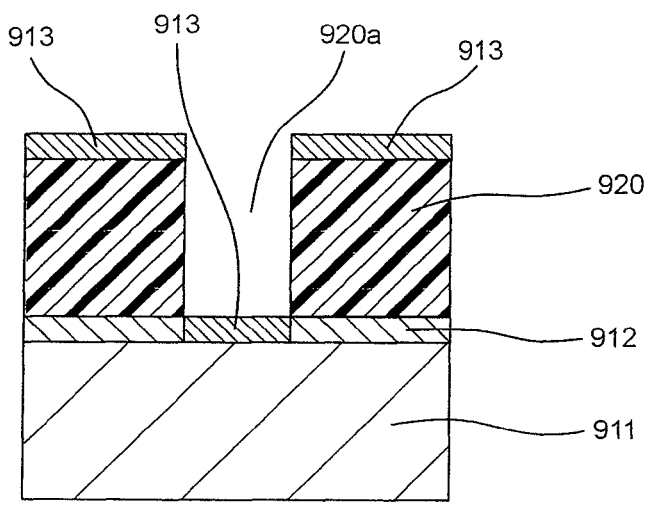

Next, as shown in FIG. 76, catalyst metal 913 for semiconductor core growth is deposited. A material, such as Ni, Fe or Au, can be used for promoting the growth of the semiconductor of a semiconductor core.

Figure 77:
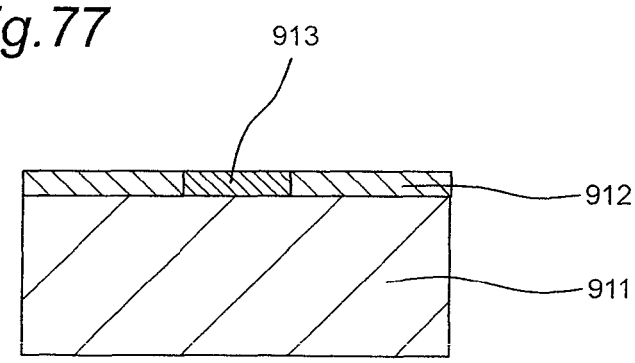

Next, as shown in FIG. 77, the region of the catalyst metal 913 deposited on the region other than the growth hole 912a (shown in FIG. 75) and the resist 920 are removed. The lift-off is used here. However, a lithography method and etching may be used.

At this point, the diameter of the semiconductor core to be grown depends on the size of the growth hole of the mask and the volume of the catalyst metal.

Figure 78:
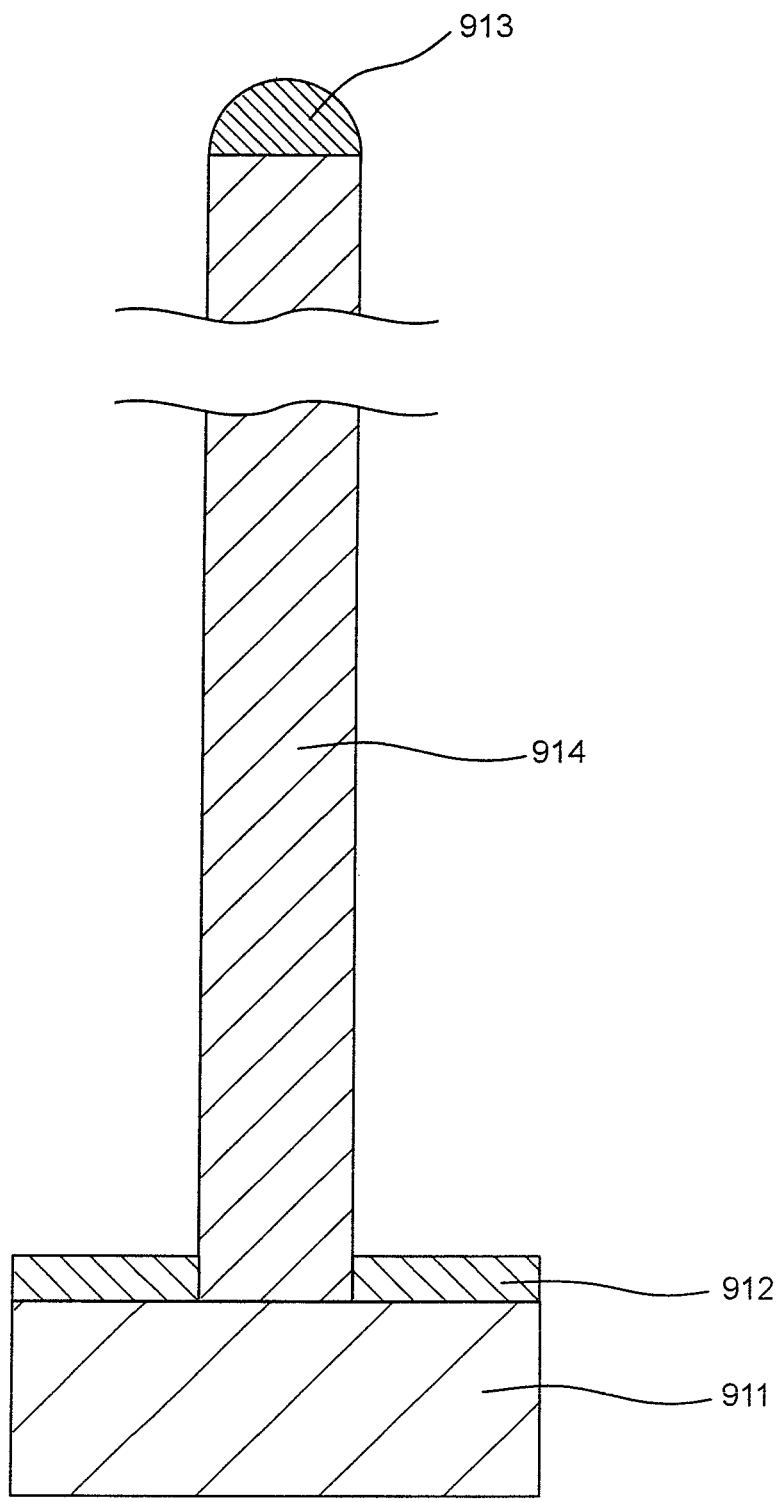

Next, as shown in FIG. 78, in a semiconductor core forming step, on the substrate 911 within the growth hole 912a of the mask layer 912 having the catalyst metal 913, a rod-like semiconductor core 914 is formed by crystal growth of n-type GaN using a MOCVD device. The growth temperature is set to about 950° C., trimethylgalium (TMG) and ammonia ($NH_3$) are used as growth gases, and silane ($SiH_4$) for n-type impurity supply and further hydrogen ($H_2$) as a carrier gas are supplied, so that the semiconductor core of n-type GaN with Si used as the impurity can be grown. Here, n-type GaN is grown under the condition where a direction perpendicular to the surface of the substrate 911 is the c-axis direction. As a result, a semiconductor core having many non-polar surfaces or semi-polar surfaces is obtained.

Figure 79:
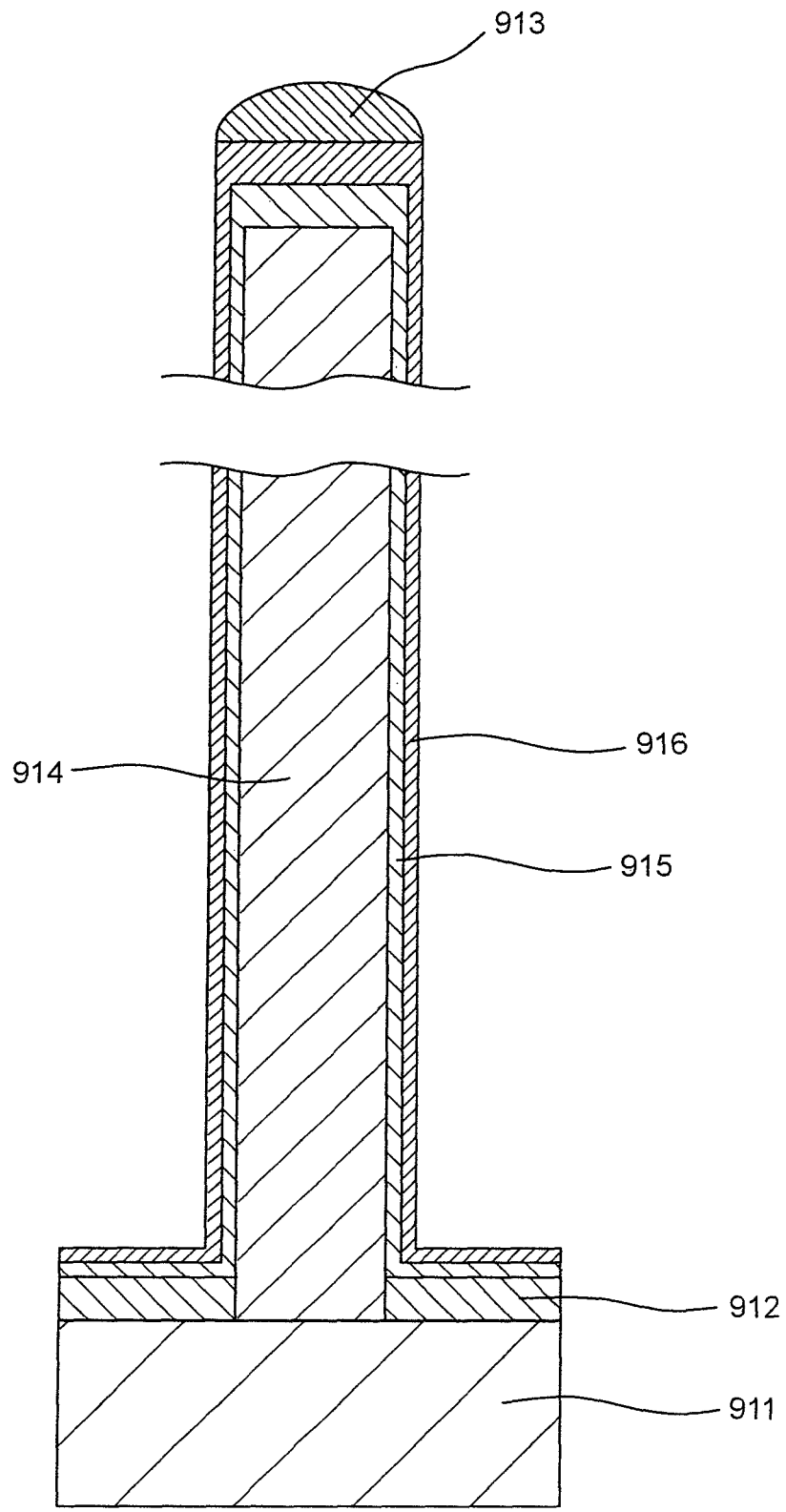

Next, as shown in FIG. 79, in a quantum well layer and semiconductor layer forming step, a quantum well layer 915 made of p-type InGaN is formed over the whole surface of the substrate 911 so as to cover the rod-like semiconductor core 914, and further a semiconductor layer 916 is formed over the whole surface of the substrate 911. After the semiconductor core of n-type GaN has been grown in the MOCVD device as described above, the set temperature is changed from 600° C. to 800° C. in accordance with the wavelength of emitted light, and nitrogen ($N_2$) is supplied to the carrier gas and TMG, $NH_3$ and trimethylindium (TMI) are supplied to the growth gas. In this way, the InGaN quantum well layer 915 can be formed on the semiconductor core 914 of n-type GaN. Thereafter, further, the set temperature is changed to 960° C., and TMG and $NH_3$ are used as the growth gases as mentioned above, and $Cp_2Mg$ is used for p-type impurity supply. In this way, the semiconductor layer 916 made of p-type GaN can be formed. Note that the quantum well layer may have a p-type AlGaN layer as an electron block layer inserted between the InGaN layer and the p-type GaN layer. Also, the quantum well layer may have a multiple quantum well structure in which barrier layers of GaN and quantum well layers of InGaN are alternately laminated.

Figure 80:
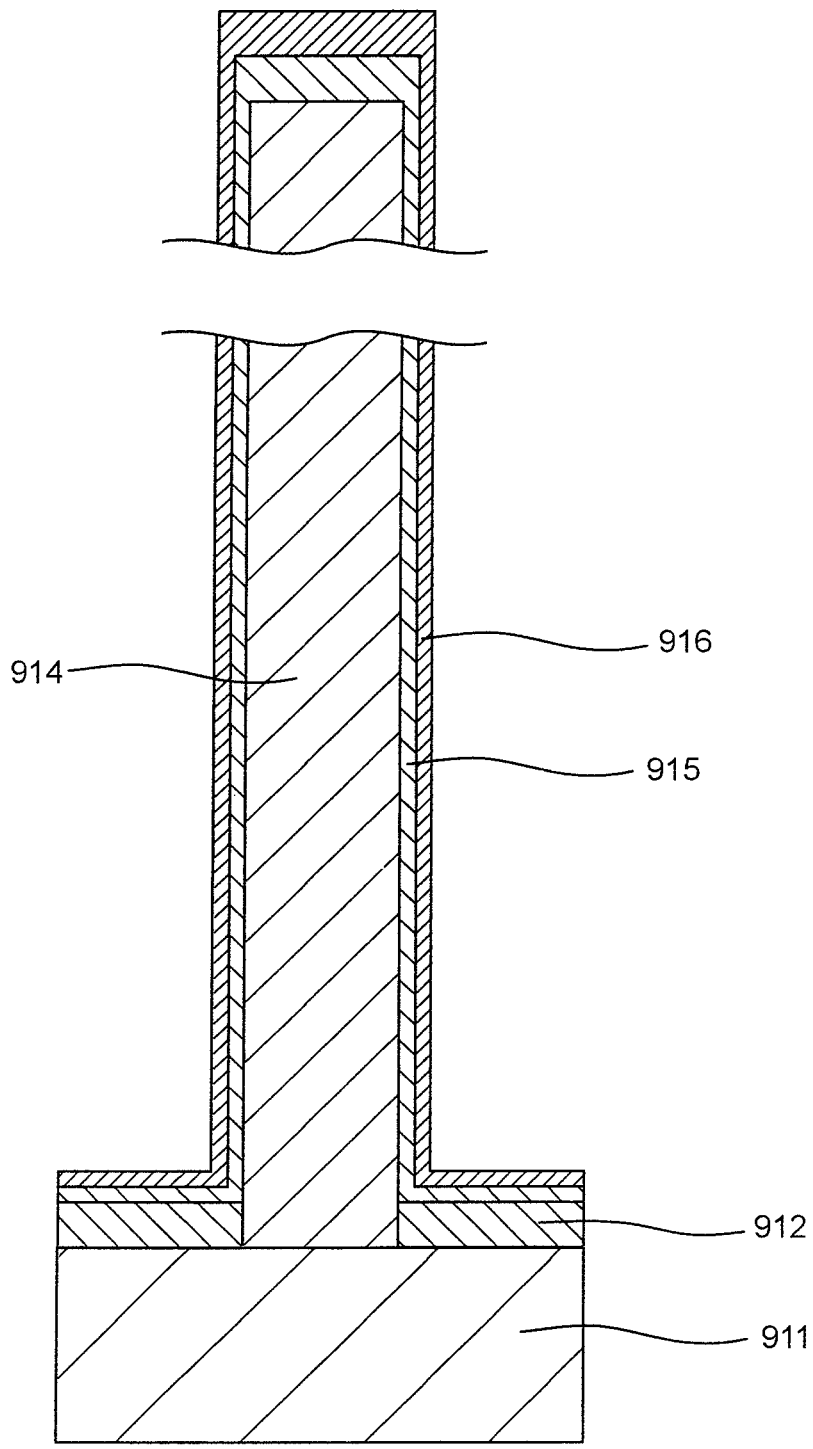
Figure 81:
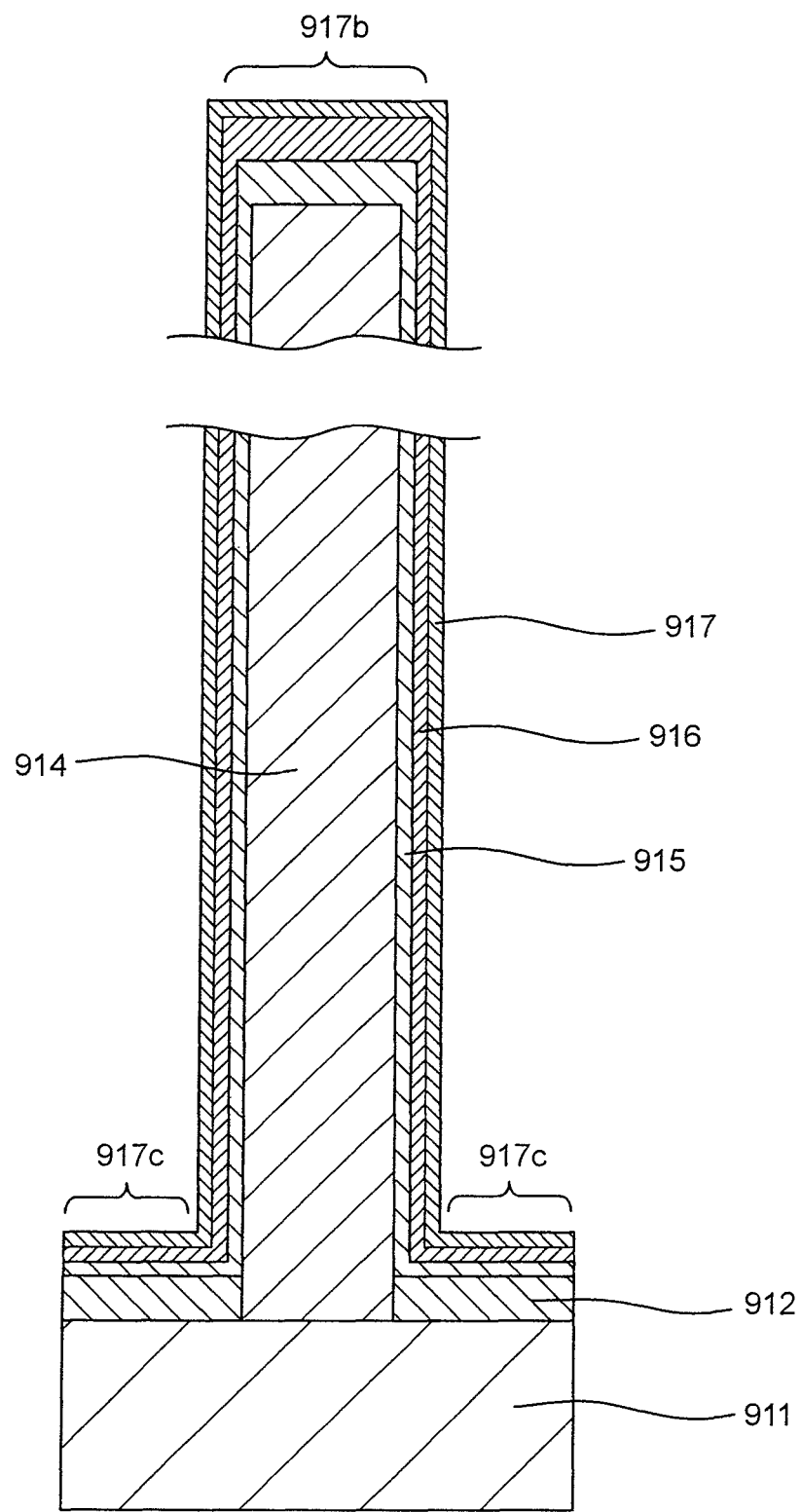

Next, as shown in FIG. 80, the catalyst metal 913 (shown in FIG. 79) is removed by wet etching, and then, as shown in FIG. 81, a conductive film 917 is formed on the surface of the semiconductor layer 916.

Figure 82:
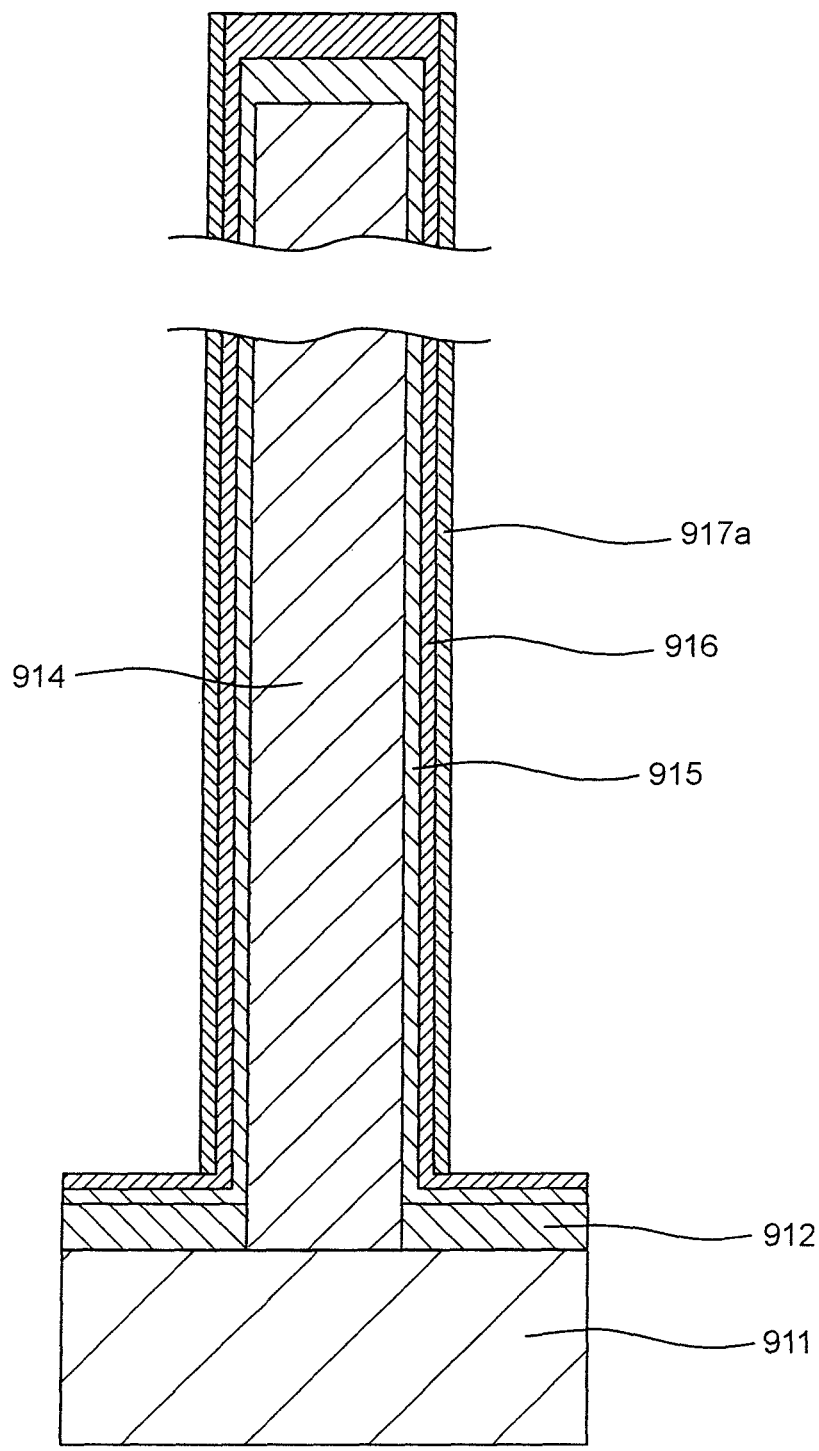

Next, as shown in FIG. 82, an edge portion 917b (shown in FIG. 81) and a substrate side portion 917c (shown in FIG. 81), which correspond to all of the region except for a cylindrical portion 917 of the conductive film 917, are removed by anisotropic dry etching (RIE).

Figure 83:
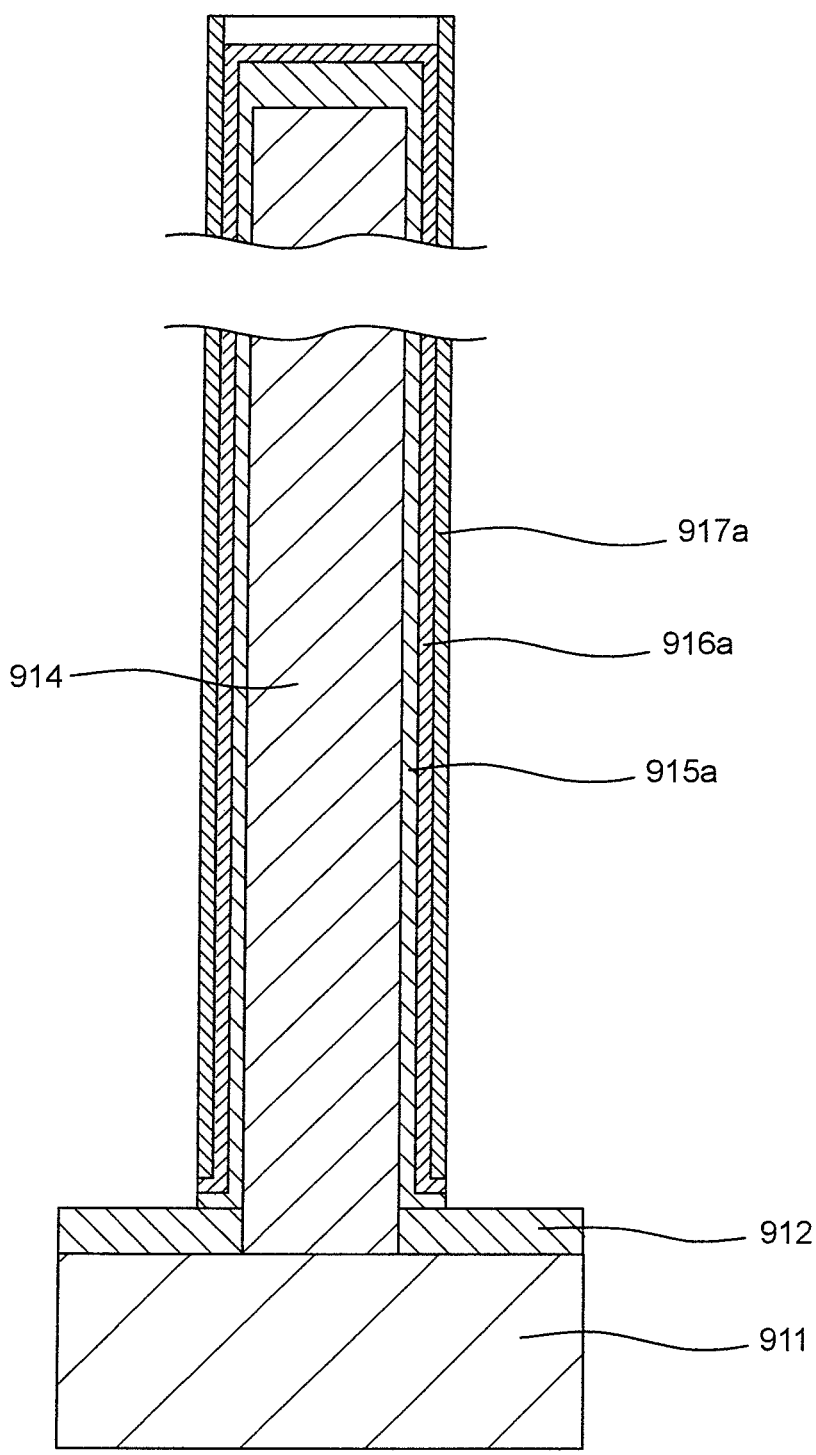

Next, as shown in FIG. 83, all of the region of the semiconductor layer 916 and the quantum well layer 915, except for portions thereof covering the semiconductor core 914, is removed by dry etching. With reference to FIG. 83, the semiconductor core 914 is covered with the quantum well layer 915a, the semiconductor layer 916a and the conductive film 917a.

Figure 84:
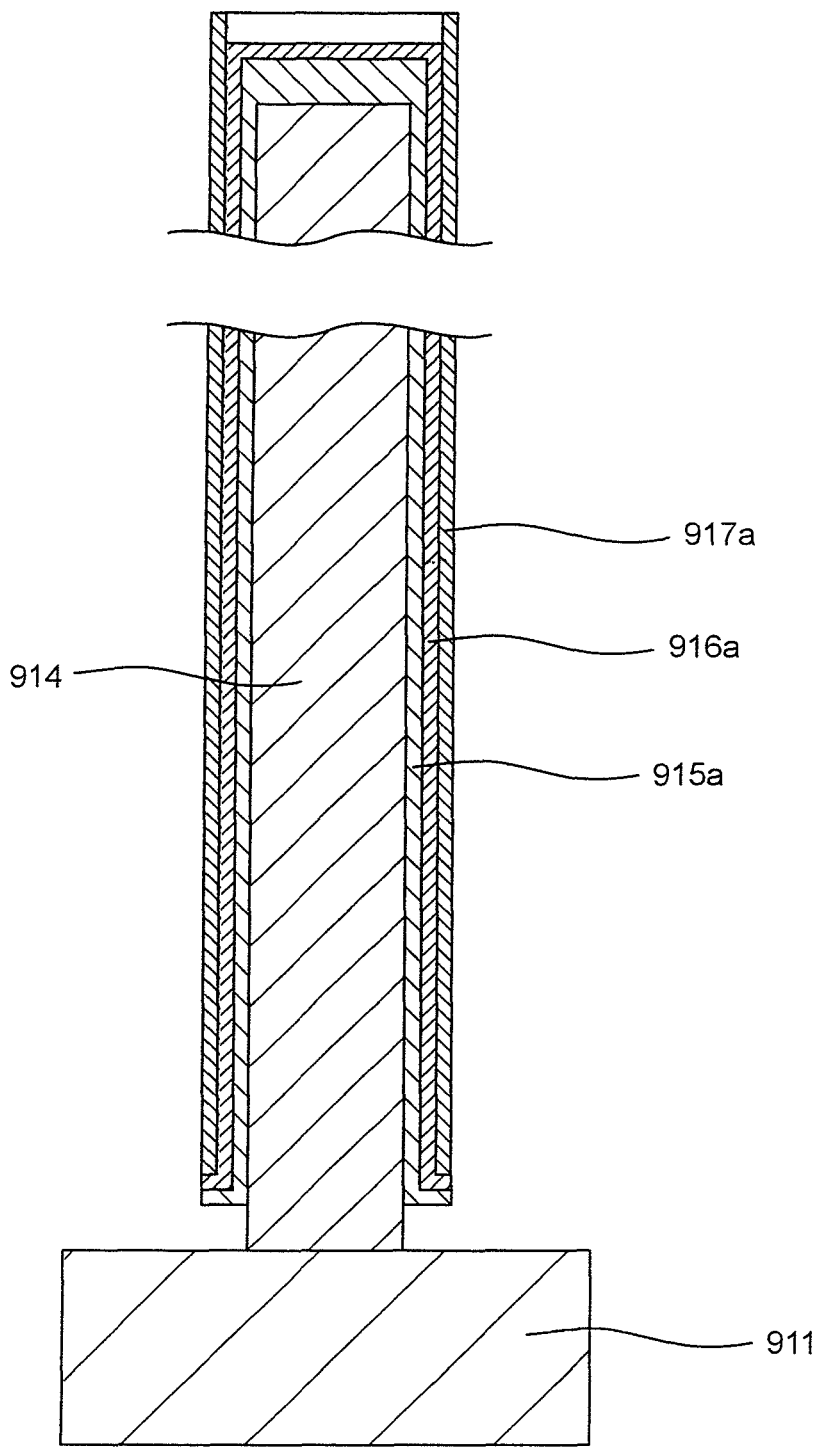

Next, as shown in FIG. 84, the mask 912 (shown in FIG. 83) is removed by wet etching. In the case where the mask is made of silicon oxide ($SiO_2$), use of a solution containing hydrofluoric acid (HF) enables the mask to be easily etched without affecting the semiconductor core and the semiconductor layer portion covering the semiconductor core.

Figure 85:
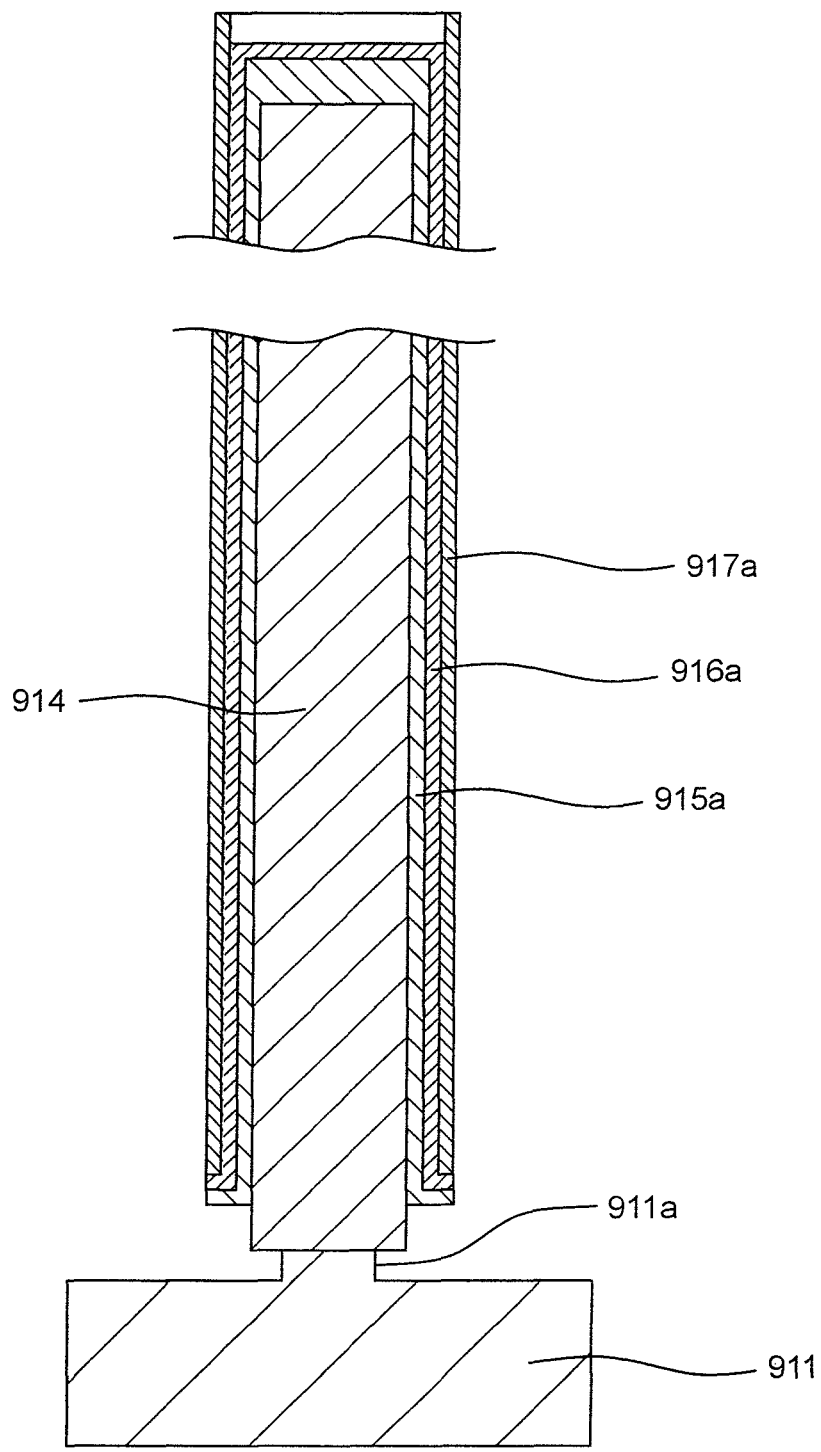

Next, as shown in FIG. 85, the substrate 911 is etched by dry etching. In this case, use of $CF_4$ and $XeF_2$ enables the substrate 911 to be easily etched without affecting the semiconductor core and the semiconductor layer portion covering the semiconductor core. Thus, a protrusion 911a is formed in a region of the substrate 911 directly under the semiconductor core 914.

Figure 86:
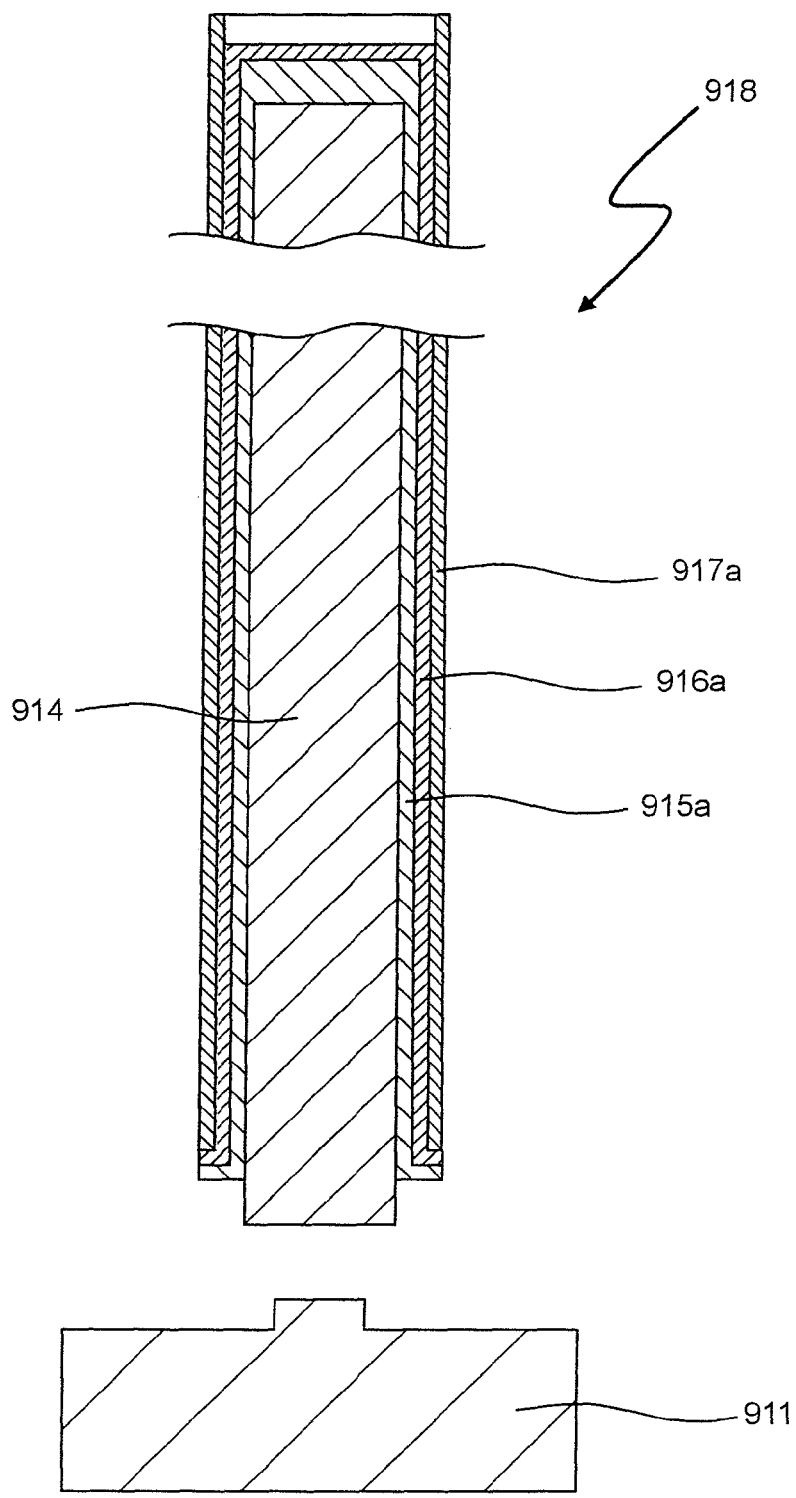

Next, in a separating step, the substrate is immersed in an isopropyl alcohol (IPA) aqueous solution, and is vibrated along the plane of the substrate 911 using ultrasonic waves (e.g., several tens of kilo-hertz). This causes stress to act on the semiconductor core 914 covered with the quantum well layer 915a, the semiconductor layer 916a and the conductive film 917a so as to bend the root close to the substrate 911 of the semiconductor core 914 that erects on the substrate 911. As a result, as shown in FIG. 86, the semiconductor core 914 covered with the conductive film 917a, the semiconductor layer 916a and the quantum well layer 915a is separated from the substrate 911.

In this way, a microscopic rod-like light-emitting device 918 that is separated from the substrate 911 can be manufactured. In this Embodiment 35, the rod-like light-emitting device 918 has a diameter of 1.5 μm and a length of 25 μm. Note that the cross section of the rod-like light-emitting device 918 is in the shape of an equilateral triangle as shown in FIG. 87C and FIG. 87D to be referred to later.

Next, the rod-like light-emitting device 918 manufactured by the above method of manufacturing a rod-like light-emitting device is aligned on an insulating substrate. The alignment of the rod-like light-emitting device 918 is made using the method of manufacturing a display device of Embodiment 38 to be described later, and will be described below with reference to FIGS. 87A to 94D. Note that, in FIGS. 87A to 94D, the same elements as those of the rod-like light-emitting device 918 shown in FIG. 86 are denoted by the same reference characters.

In addition, while the cross section of the rod-like light-emitting device 918 is in the shape of an equilateral triangle, the cross-sectional shape of the rod-like light-emitting device is not limited to this. The rod shape may have a cross section that is hexagonal, circular or ellipsoidal. This invention may be applied to a method of manufacturing a rod-like light-emitting device having a semiconductor core in a rod shape whose cross section is in the shape of another polygon.

FIG. 87A is a plan view showing a step of a method of manufacturing a display device that uses the rod-like light-emitting device 918 shown in FIG. 86, FIG. 87B is a cross-sectional view of the display device as taken along the line F27B-F27B of FIG. 87A, FIG. 87C is a cross-sectional view of the display device taken along the line F27C-F27C of FIG. 87A, and FIG. 87D is a cross-sectional view of the display device as taken along the line F27D-F27D of FIG. 87A.

First, as shown in FIGS. 87A to 87D, the rod-like light-emitting device 918 is aligned on an insulating substrate 930 formed thereon with an alignment region having as a unit at least two electrodes to which independent potentials are respectively to be provided, and then cleaning is carried out. The method of aligning the rod-like light-emitting device 918 at a predetermined position in a predetermined orientation on the insulating substrate 930 has been described in detail in Embodiment 5, and the detailed description thereof is omitted here.

As shown in FIG. 87B, metal electrodes 931 and 932 are formed with a predetermined spacing therebetween on the surface of the insulating substrate 930, and an insulating film 133 is formed to cover the metal electrodes 931 and 932. The insulating substrate 930 is such that a silicon oxide film is formed on the surface of an insulator, such as glass, ceramic, aluminum oxide or resin, or a semiconductor such as silicon, and the surface has insulating properties. In the case of using a glass substrate, it is desirable that an underlying insulating film such as a silicon oxide film or a silicon nitride film be formed on the surface. The insulating film that covers metal electrodes need not be provided.

The metal electrodes 931 and 932 are formed in desired electrode shapes using a printing technique. Note that a metal film and a photosensitive film may be formed by depositing the films all at once, exposing them in a desired electrode pattern, and etching them.

Here, portions of 3 μm in length at both ends of the rod-like light-emitting device 918 overlap the metal electrodes 931 and 932, respectively.

Note that pads, which are omitted in FIGS. 87A to 87D, are formed on the metal electrodes 931 and 932 so as to allow potentials to be provided from the outside. In FIGS. 87A to 87D, one alignment region in which rod-like light-emitting devices are aligned is shown. However, any number of alignment regions may be arranged.

Note that the rod-like light-emitting device 918 is aligned to establish a bridge between two metal electrodes 931 and 932 on the insulating substrate 930. As will be described later, two options are available for the orientation of the rod-like light-emitting device 918. One is the orientation of the rod-like light-emitting device 918 depicted in FIGS. 87A to 87D, and the other is the orientation in which the left and right sides of the rod-like light-emitting device 918 are reversed. In fact, both the orientations are not distinguishable from each other in the light-emitting device 918 of this Embodiment 35. With the method of manufacturing a display device of Embodiment 38, the two orientations cannot be intentionally determined, and therefore the two orientations each have a 50% probability of occurrence.

Next, FIG. 88A is a plan view showing a step subsequent to steps shown in FIGS. 87A to 87D of the method of manufacturing a display device. FIG. 88B is a cross-sectional view of a display device as taken along the line F28B-F28B of FIG. 88A, FIG. 88C is a cross-sectional view of the display device as taken along the line F28C-F28C of FIG. 88A, and FIG. 88D is a cross-sectional view of the display device as taken along the line F28D-F28D of FIG. 88A.

As shown in FIGS. 88A to 88D, after a resist 940 is applied onto the insulating substrate 930, patterning is performed by way of a lithography method to expose one end (left end in FIG. 88A) of the rod-like light-emitting device 918.

Next, FIG. 89A is a plan view showing a step subsequent to the steps shown in FIGS. 88A to 88D of the method of manufacturing a display device. FIG. 89B is a cross-sectional view of a display device as taken along the line F29B-F29B of FIG. 89A, FIG. 89C is a cross-sectional view of the display device as taken along the line F29C-F29C of FIG. 89A, and FIG. 89D is a cross-sectional view of the display device as taken along the line F29D-F29D of FIG. 89A.

As shown in FIGS. 89A to 89D, after the conductive film 917a is removed by wet etching using the patterned resist 94, part of the semiconductor layer 916a and part of the quantum well layer 915a are removed by dry etching to obtain an exposed portion 914a of the semiconductor core 914. In this way, the semiconductor core 914 at one end of the rod-like light-emitting device 918 can be exposed.

As described above, with reference to FIGS. 87A to 87D, at the time of aligning the rod-like light-emitting device 918 on the insulating substrate 930, the orientation can be taken in two ways. Here, the reason why two ways of the orientation are issued is the fact that the orientations between which left and right sides of the rod-like light-emitting device 918 are reversed are distinguished from each other in FIGS. 87A to 87D. In fact, the rod-like light-emitting device 918 is symmetric even when the left and right sides are reversed, and therefore both the orientations are not distinguishable. However, for example, the rod-like light-emitting devices of Embodiments 31 to 34 are distinguishable when such reversal is made. In the method of manufacturing a rod-like light-emitting device of this Embodiment 35, after the rod-like light-emitting device 918 is aligned on the insulating substrate 930 (FIGS. 87A to 87D), an exposing step (FIGS. 89A to 89D) for exposing part of the outer peripheral surface of the semiconductor 914 of the rod-like light-emitting device 918 is performed. Therefore, even when the rod-like light-emitting device 918 is aligned in any orientation at the time of alignment, part of the outer peripheral surface of the semiconductor core 914 on a predetermined side of the rod-like light-emitting device 918 aligned on the insulating substrate 930 can be exposed. Therefore, at the time of aligning the rod-like light-emitting devices 918 on the insulating substrate 930, the orientations of rod-like light-emitting devices 918 need not be made uniform. The rod-like light-emitting devices 918 are diodes having anode and cathode electrodes, and it is important to make uniform the orientations of the rod-like light-emitting devices 918. According to this Embodiment 35, such a step of making the orientations uniform becomes unnecessary, which allows processes to be simplified.

Next, FIG. 90A is a plan view showing a step subsequent to the steps shown in FIGS. 89A to 89D of the method of manufacturing a display device. FIG. 90B is a cross-sectional view of a display device as taken along the line F30B-F30B of FIG. 90A, FIG. 90C is a cross-sectional view of the display device as taken along the line F30C-F30C of FIG. 90A, and FIG. 90D is a cross-sectional view of the display device as taken along the line F30D-F30D of FIG. 90A. Also, FIG. 91A is a plan view showing a step subsequent to the steps shown in FIGS. 90A to 90D of the method of manufacturing a display device. FIG. 91B is a cross-sectional view of a display device as taken along the line F31B-F31B of FIG. 91A, FIG. 91C is a cross-sectional view of the display device as taken along the line F31C-F31C of FIG. 91A, and FIG. 91D is a cross-sectional view of the display device as taken along the line F31D-F31D of FIG. 91A.

As shown in FIGS. 90A to 90D, an insulating film 941 made of $SiO_2$ is deposited on the insulating substrate 930, and then, as shown in FIGS. 91A to 91D, the insulating film 941 made of $SiO_2$ is etched by way of dry etching. At this point, all of the insulating film 941 made of $SiO_2$ is not removed, etching is performed such that the quantum well layer 915a and the semiconductor layer 916a between the semiconductor core 914 and the insulating substrate 930 are not exposed, and are wrapped in $SiO_2$ of the insulating film 941, and such that the exposed region 914a of the semiconductor core 914 is exposed (see FIG. 91C).

Next, FIG. 92A is a plan view showing a step subsequent to the steps shown in FIGS. 91A to 91D of the method of manufacturing a display device. FIG. 92B is a cross-sectional view of a display device as taken along the line F32B-F32B of FIG. 92A, FIG. 92C is a cross-sectional view of the display device as taken along the line F32C-F32C of FIG. 92A, and FIG. 92D is a cross-sectional view of the display device as taken along the line F32D-F32D of FIG. 92A.

After the resist 940 used for etching is stripped, as shown in FIGS. 92A to 92D, a resist 942 is applied as the second resist application and then patterning is performed by way of a lithography method to expose the exposed region 914a of the semiconductor core 914 at an end of the rod-like light-emitting device 918 and to expose the conductive film 917a at the other end of the rod-like light-emitting device 918.

Next, FIG. 93A is a plan view showing a step subsequent to the steps shown in FIGS. 92A to 92D of the method of manufacturing a display device. FIG. 93B is a cross-sectional view of a display device as taken along the line F33B-F33B of FIG. 93A, FIG. 93C is a cross-sectional view of the display device as taken along the line F33C-F33C of FIG. 93A, and FIG. 93D is a cross-sectional view of the display device as taken along the line F33D-F33D of FIG. 93A. Also, FIG. 94A is a plan view showing a step subsequent to the steps shown in FIGS. 93A to 93D of the method of manufacturing a display device. FIG. 94B is a cross-sectional view of a display device as taken along the line F34B-F34B of FIG. 94A, FIG. 94C is a cross-sectional view of the display device as taken along the line F34C-F34C of FIG. 94A, and FIG. 94D is a cross-sectional view of the display device as taken along the line F34D-F34D of FIG. 94A.

As shown in FIGS. 93A to 93D, metal is deposited by a vapor-deposition method and a sputtering method to form a metal layer 943, and then, as shown in FIGS. 94A to 94D, lift-off is performed.

Thus, in the rod-like light-emitting device 918, with one electrode 943A connected to the exposed portion 914a of the semiconductor core 914 and with the other electrode 943B connected to the conductive film 917a, a current is caused to flow from the p-type semiconductor layer 916a through the conductive film 917a to the n-type semiconductor core 914 to result in recombination of electrons and holes in a pn junction between the outer peripheral surface of the n-type semiconductor core 914 and the inner peripheral side of the p-type semiconductor layer 916a. As a result, light is emitted. Light is emitted from the whole periphery of the semiconductor core 914 covered with the semiconductor layer 916a. The light emitting region therefore becomes larger, which results in a high light emitting efficiency.

In Embodiment 35 described above, ITO is used for the conductive film 917a formed on the semiconductor layer 916a to connect the semiconductor layer through transparent conductive film to an electrode. This allows a wide current path to be formed without a current being concentrated to an electrode connection portion and being unbalanced, so that light can be efficiently emitted from the whole element. Thus, the light emitting efficiency is further improved. Note that the conductive film is not limited to this, and, for example, a laminated metal film of Ag/Ni having a thickness of 5 nm may be used.

According to a method of manufacturing a rod-like light-emitting device having the above configuration, the microscopic rod-like light-emitting device 918 having great freedom in installing into an apparatus can be manufactured. The rod-like light-emitting device 918 is used as a microscopic structure separated from the substrate. This can decrease the amount of semiconductors used and makes it possible to reduce the thickness and weight of an apparatus using the light-emitting device. Light is emitted from the whole periphery of the semiconductor core 914 covered with the semiconductor layer 916a. This makes the light emitting region larger. Therefore, a backlight, an illuminating device, a display device and the like that have high light-emitting efficiencies and achieve low power consumption can be implemented.

The above exposing step is performed after the separating step, and therefore a small number of steps is required until the rod-like light-emitting device 918 is separated from the substrate. The rod-like light-emitting device 918 can be produced in high yields.

In the above semiconductor layer forming step, the mask 912 made of a substance of inhibiting the formation of the semiconductor layer 916 covers part of the outer peripheral surface of the semiconductor core 914, which is a portion to be exposed. After the semiconductor layer forming step, the mask 912 is removed to allow the part of the outer peripheral surface of the semiconductor core 914 to be easily exposed.

Here, a material that can selectively etch the semiconductor core and the semiconductor layer, such as silicon oxide ($SiO_2$) and the like, is used as the substance of inhibiting the formation of the semiconductor layer 916. However, the substance of inhibiting the formation of the semiconductor layer is not limited to this, and may be selected as appropriate in accordance with the composition of the semiconductor layer.

In the above separating step, the substrate 911 is vibrated along the plane of the substrate 911 using ultrasonic waves. This causes stress to act on the semiconductor core 914 covered with the semiconductor layer 916a so as to bend the root close to the substrate 911 of the semiconductor core 914 that erects on the substrate 911. As a result, the semiconductor core 914 covered with the semiconductor layer 916a is separated from the substrate 911. Accordingly, a plurality of microscopic rod-like light-emitting devices 918 provided on the substrate 911 can easily be separated in a simple way.

Note that, in the above separating step, the semiconductor core 914 may be mechanically separated from the substrate 911 using a cutting tool. The root close to the substrate 911 of the semiconductor core 914 that erects on the substrate 911 is bent using a cutting tool. As a result, stress acts on the semiconductor core 914 covered with the semiconductor layer 916a, so that the semiconductor core 914 covered with the semiconductor layer 916a is separated from the substrate 911. In this case, a plurality of microscopic rod-like light-emitting devices 918 provided on the substrate 911 can be separated for a short time in a simple way.

The rod-like light-emitting device 918 has a structure in which both sides are nearly symmetrical with respect to a linear line that passes through the midpoint of the longitudinal direction and is perpendicular to the longitudinal direction. Therefore, the rod-like light-emitting devices 918 can be more easily aligned. Thus, alignment with high yields can be made more reliably.

In the exposing step for exposing part of the outer peripheral surface of the semiconductor core 914 after the rod-like light-emitting device 918 is aligned on the arrangement substrate (insulating substrate 930), the rod-like light-emitting device 918 has a nearly symmetrical structure in the longitudinal direction and allows the quantum well layer 915a, the semiconductor layer 916a and the conductive film 917a at desired locations to be removed to expose the outer peripheral surface of an end of the semiconductor core 914. Therefore, a plurality of rod-like light-emitting devices (light emitting diodes) need not be aligned with their polarities aligned. The step of aligning the polarities (orientations) of a plurality of rod-like light-emitting devices (light emitting diodes) during manufacturing becomes unnecessary, which allows the steps to be simplified. To identify the polarity (orientation) of a rod-like light-emitting device (light emitting diode), a mark need not be attached to the rod-like light-emitting device. The need to produce the rod-like light-emitting device in a special shape is eliminated. Therefore, manufacturing processes of a rod-like light-emitting device can be simplified, and the manufacturing costs can be reduced. Note that, in the case of a small-sized light emitting diode, and in the case of a large number of light emitting diodes, the above manufacturing processes can be remarkably simplified compared to those in which light emitting diodes are aligned with their polarities made uniform.

Moreover, after the above exposing step, the exposed portion 914a of the semiconductor core 914 is connected to the n-side electrode, and the other end of the semiconductor core 914 is covered with the quantum well layer, the semiconductor layer and the conductive film, which allows the p-side electrode to be connected to a portion of the conductive film.

In this way, electrodes can easily be connected to both ends of the microscopic rod-like light-emitting device.

Moreover, in a rod-like light-emitting device manufactured by the above method of manufacturing a rod-like light-emitting device, crystal growth of the semiconductor layer 916 occurs radially outward from the outer peripheral surface of the semiconductor core 914. The growth distance in the radial direction is short and the defect deviates outward, and therefore the semiconductor core 914 can be covered with the semiconductor layer 916 having less crystal defects. Accordingly, a rod-like light-emitting device having good characteristics can be implemented.

In Embodiments 31 to 35 described above, semiconductors whose base materials are GaN is used for the substrates 811, 821, 831 and 841, the semiconductor cores 813, 823, 833, 843 and 914, and the semiconductor layers 814a, 825a, 834a, 845a and 916a. However, this invention may be applied to light-emitting devices using semiconductors whose base materials are GaAs, AlGaAs, GaAsP, InGaN, AlGaN, GaP, ZnSe, AlGaInP and the like. While the substrate and the semiconductor core are of n type and the semiconductor layer is of p type, this invention may be applied to a rod-like light-emitting device in which the conductivity types are reversed. A description has been given of the method of manufacturing a rod-like light-emitting device having a semiconductor core in the shape of a hexagonal prism or a triangular prism. However, the rod-like light-emitting device is not limited to this, and may have a rod shape whose cross section is in the shape of a circle or an ellipse. This invention may be applied to a method of manufacturing a rod-like light-emitting device having a semiconductor core in a rod shape whose cross section is in the shape of another polygon, such as a triangle.

In Embodiments 1 to 35 described above, the rod-like light-emitting device has a size of the order of micrometers with a diameter of 1 μm or 1.5 μm and a length of from 10 μm to 30 μm. However, there may be used a device with the size of the order of nanometers in which at least the diameter of the diameter and the length is less than 1 μm. The diameter of the semiconductor core of the above rod-like light-emitting device is preferably 500 nm or more and 50 μm or less, which enables variations in diameter of the semiconductor core to be reduced compared to a rod-like light-emitting device having a semiconductor core whose diameter ranges from several tens of nanometers to several hundreds of nanometers. Therefore, variations in the light emitting region, that is, variations in light emission characteristics can be decreased. This can lead to improvement in yields.

In Embodiments 1 to 35 described above, crystal growth of the semiconductor cores 813, 823, 833, 843 and 914 is made using the MOCVD device. However, the semiconductor cores may be formed using other crystal growth devices such as a molecular-beam epitaxy (MBE) device. In Embodiments 1 to 34 described above, crystal growth of the semiconductor core is made on a substrate using a mask having a growth hole. However, as in Embodiment 35, metal species are placed on a substrate, and crystal growth of the semiconductor core may be made from the metal species.

In Embodiments 31 to 35 described above, the semiconductor cores 813, 823, 833, 843 and 914 covered with the semiconductor layers 814a, 825a, 834a, 845a and 916a are separated from the substrates 811, 821, 831, 841 and 911 using ultrasonic waves. However, the way of separation is not limited to this, and the semiconductor core may be separated from the substrate by mechanically bending the semiconductor core with a cutting tool. In this case, a plurality of microscopic rod-like light-emitting devices provided on the substrate can be separated by a simple way for a short time.

In Embodiments 31 to 35 described above, transparent electrodes made of tin-doped indium oxide (ITO) may be formed on the semiconductor layers 814a, 825a, 834a, 845a and 916a. This causes the semiconductor layer to be connected through the transparent electrode to an electrode, which allows a wide current path to be formed without a current being concentrated to an electrode connection portion and being unbalanced, so that light can be efficiently emitted from the whole element. Thus, the light emitting efficiency is further improved. Note that the transparent electrode is not limited to this, and a laminated metal film of, for example, Ag/Ni having a thickness of 5 nm may be used.

In Embodiment 35 described above, a potential difference is provided to the two metal electrodes 931 and 932 formed on the surface of the insulating substrate 930, and the rod-like light-emitting devices 918 are aligned between the metal electrodes 931 and 932. However, the alignment is not limited to this. Rod-like light-emitting devices may be aligned at positions defined by the electrodes by forming a third electrode formed between two electrodes formed on the surface of the insulating substrate, and applying independent voltages to the three electrodes, respectively.

In Embodiment 35 described above, a description has been given of the display device including a rod-like light-emitting device. However, a rod-like light-emitting device manufactured by a method of manufacturing a rod-like light-emitting device of this invention is not limited to this application, and may be applied to other devices such as a backlight and an illuminating device.

A method of manufacturing a rod-like light-emitting device of this invention includes the steps of forming a semiconductor core of a first conductivity type having a rod shape on a substrate, forming a semiconductor layer of a second conductivity type having a cylindrical shape covering the semiconductor core, exposing part of an outer peripheral surface of the semiconductor core, and separating from the substrate the semiconductor core including an exposed portion exposed in the exposing step.

According to the above configuration, the semiconductor core of the first conductivity type having a rod shape is formed on the substrate, and then the semiconductor layer of the second conductivity type having a cylindrical shape is formed to cover the surface of the semiconductor core. Here, the end surface of the semiconductor core opposite to the substrate may be covered with the semiconductor layer or may be exposed. Next, part of the outer peripheral surface of the semiconductor core is exposed, and then the semiconductor core including the exposed portion is separated from the substrate, for example, by vibrating the substrate by means of ultrasonic waves, or by the use of a cutting tool. In the rod-like light-emitting device separated from the substrate in such a way, with one electrode connected to the exposed portion of the semiconductor core, and with the other electrode connected to the semiconductor layer, a current is caused to flow between the electrodes, so that electrons and holes recombine in a pn junction between the outer peripheral surface of the semiconductor core and the inner peripheral surface of the semiconductor layer. Thus, light is emitted from the pn junction. In this way, a microscopic rod-like light-emitting device having great freedom in installing into an apparatus can be manufactured. The term "microscopic rod-like light-emitting device" as used herein refers to a device, for example, with the size of the order of micrometers in which the diameter is 1 μm and the length is 10 μm, or with the size in the order of nanometers in which at least the diameter of the diameter and the length is less than 1 µm. The above rod-like light-emitting device can decrease the amount of semiconductors used and makes it possible to reduce the thickness and weight of an apparatus that uses the light-emitting device, and emits light from the whole periphery of the semiconductor core covered with the semiconductor layer, which makes the light emitting region larger. Therefore, a backlight, an illuminating device, a display device and the like that have high light-emitting efficiencies and achieve low power consumption can be implemented.

With a method of manufacturing a rod-like light-emitting device of an embodiment, in the exposing step, the outer peripheral surface on the side of the substrate of the semiconductor core is exposed, and in the semiconductor layer forming step, the end surface of the semiconductor core opposite to the substrate is covered with the semiconductor layer.

According to the embodiment, exposing the outer peripheral surface on the substrate side of the semiconductor core in the exposing step and covering the end surface of the semiconductor core opposite to the substrate with the semiconductor layer in the semiconductor layer forming step causes the exposed portion on the substrate side of the semiconductor core to be connected to one electrode, and the end surface of the semiconductor core opposite to the substrate to be covered with the semiconductor layer. This allows the other electrode to be connected to a portion of the semiconductor layer covering a side of the semiconductor core opposite to the substrate. In this way, electrodes can easily be connected to both ends of the microscopic rod-like light-emitting device.

With the method of manufacturing a rod-like light-emitting device of an embodiment, in the separating step, the semiconductor core covered with the semiconductor layer is separated from the substrate using ultrasonic waves.

According to the embodiment, in the separating step, the semiconductor core covered with the semiconductor layer is separated from the substrate using ultrasonic waves. For example, vibrating the substrate along the plane of the substrate using ultrasonic waves causes stress to act so as to bend the root close to the substrate of the semiconductor core that erects on the substrate, so that the semiconductor core covered with the semiconductor layer is separated from the substrate. Accordingly, a plurality of microscopic rod-like light-emitting devices provided on the substrate can be easily separated in a simple way.

With the method of manufacturing a rod-like light-emitting device of an embodiment, in the separating step, the semiconductor core is mechanically separated from the substrate using a cutting tool.

According to the embodiment, in the separating step, mechanically separating the semiconductor core from the substrate using a cutting tool allows a plurality of microscopic rod-like light-emitting devices provided on the substrate to be separated for a short time in a simple way.

With the method of manufacturing a rod-like light-emitting device of an embodiment, the semiconductor core and the semiconductor layer are made of the semiconductors whose base materials are GaN, and dry etching is used in the exposing step.

According to the embodiment, using dry etching in the exposing step allows part of the outer peripheral surface of the semiconductor core made of the semiconductor whose base material is GaN to be easily exposed. Wet etching is difficult for the semiconductor whose base material is GaN. Therefore, in cases where the semiconductor core and the semiconductor layer are made of the semiconductors whose base materials are GaN, exposing part of the outer peripheral surface of the semiconductor core by dry etching before the separating step is particularly effective for achieving a microscopic rod-like light-emitting device that is easy to mount.

With the method of manufacturing a rod-like light-emitting device of an embodiment, in the exposing step, the outer peripheral surface of the semiconductor core is exposed so as to be continuous with the outer peripheral surface of the semiconductor layer without a step.

According to the embodiment, in the exposing step, the outer peripheral surface of the semiconductor core is exposed so as to be continuous with the outer peripheral surface of the semiconductor layer without a step. As a result, when the microscopic rod-like light-emitting device after the separation is mounted on the insulating substrate having electrodes formed thereon in such a manner that the axial direction is parallel to the plane of the substrate, the exposed portion of the semiconductor core and the electrode can be connected reliably and easily because no step exists between the outer peripheral surface of the semiconductor layer and the exposed portion of the outer peripheral surface of the semiconductor core.

With the method of manufacturing a rod-like light-emitting device of an embodiment, in the exposing step, the outer peripheral surface of a region covered with the semiconductor layer of the semiconductor core and the outer peripheral surface of an exposed region of the semiconductor core are continuous with each other.

According to the embodiment, in the exposing step, the outer peripheral surface of the region covered with the semiconductor layer of the semiconductor core and the outer peripheral surface of the exposed region of the semiconductor core are continuous with each other such that the exposed region of the semiconductor core is thin. Therefore, in the separating step, the side of the substrate of the exposed region of the semiconductor core becomes more likely to be broken on the substrate side in the exposed region of the semiconductor core, which facilitates the separation.

With a method of manufacturing a display device of this invention, a method of manufacturing a display device including the rod-like light-emitting devices manufactured by any one of the methods of manufacturing rod-like light-emitting devices includes the steps of producing an insulating substrate formed thereon with an alignment region having as a unit at least two electrodes to which independent potentials are respectively to be provided, applying a liquid containing the rod-like light-emitting devices in nanometer order size or micrometer order size onto the insulating substrate, and applying the independent potentials respectively to the at least two electrodes to align the rod-like light-emitting devices at positions defined by the at least two electrodes.

According to the above configuration, the insulating substrate where an alignment region having as a unit at least two electrodes to which independent potentials are respectively to be provided is produced, and a liquid containing the rod-like light-emitting devices with the size of the order of nanometers or of the order of micrometers is applied onto the insulating substrate. Thereafter, independent voltages are respectively applied to the at least two electrodes to align the microscopic rod-like light-emitting devices at positions defined by the at least two electrodes. Thus, the above rod-like light-emitting devices can be easily aligned on the predetermined insulating substrate.

With the above method of manufacturing the display device, the use of only microscopic rod-like light-emitting devices can decrease the amount of semiconductors used and can manufacture a display device whose thickness and weight can be reduced. In the above rod-like light-emitting device, light is emitted from the whole periphery of the semiconductor core covered with the semiconductor layer to expand the light emitting region. Therefore, it is possible to implement a display device that has a high light-emitting efficiency and achieves low power consumption.

(Embodiment 36)

FIG. 95 is a schematic cross-sectional view showing a rod-like light-emitting device 2001 of Embodiment 36 of this invention.

The rod-like light-emitting device 2001 includes a semiconductor core 2011 made of n-type GaN (gallium nitride) and having a rod shape whose cross section is nearly circular, a quantum well layer 2012 made of p-type InGaN and covering the outer peripheral surface and axial-direction end surface of one end portion of the semiconductor core 2011, a semiconductor layer 2013 made of p-type GaN and covering the quantum well layer 2012, and an insulator 2014 made of $SiO_2$ (silicon oxide) or $Si_3N_4$ (silicon nitride) and covering the outer peripheral surface of the other end portion of the semiconductor core 2011. Note that the semiconductor core 2011 is one example of the semiconductor layer of the first conductivity type, the quantum well layer 2012 is one example of the quantum well layer, and the semiconductor layer 2013 is one example of the semiconductor layer of the second conductivity type.

The outer peripheral surface on the other side of the semiconductor core 2011 is covered with the insulator 2014. However, an axial-direction end surface 2011a on the other side of the semiconductor core 2011 is not covered with the insulator 2014 and is exposed. Here, the insulator 2014 covers the whole outer peripheral surface on the other side of the semiconductor core 2011. Note that, instead of the insulator 2014, as indicated by a chain double-dashed line in FIG. 95, an insulator 2014' may be formed that covers only a portion near the outer peripheral surface covered with the semiconductor layer 2013 of the semiconductor core 2011, of the outer peripheral surface not covered with the semiconductor layer 2013 of the semiconductor core 2011.

The semiconductor core 2011 is doped with Si as the donor impurity whereas the quantum well layer 2012 and the semiconductor layer 2013 are doped with Mg as the acceptor impurity. However, the donor impurity is not limited to Si, and the acceptor impurity is not limited to Mg.

On the outer peripheral surface of the semiconductor layer 2013, a conductive film 2015 made of polysilicon or tin-doped indium oxide (ITO) is formed. The conductive film 2015 is a film through which light from the quantum well layer 2012 is transmitted. The conductive film 2015 may be formed such that the outer peripheral surface thereof is continuous with the outer peripheral surface of the insulator 2014 without a step. That is, the outer peripheral surface of the conductive film 2015 may be flush with the outer peripheral surface of the insulator 2014.

Hereinbelow, with reference to FIGS. 96A to 96K, a description is given of a method of manufacturing the above rod-like light-emitting device 2001.

First, as shown in FIG. 96A, a substrate 2101 made of n-type GaN is prepared. The substrate 2101 may be subjected to substrate cleaning with a detergent, pure water or the like, and subjected to substrate processing such as marking, as appropriate.

Next, as shown in FIG. 96B, after a mask layer 2014A made of an insulator is formed on the substrate 2101, as shown in FIG. 96C, a mask layer 2014B having a growth hole 2016 is formed on the substrate 2101 by a lithography method and a dry etching method that are known (insulator forming step). Note that the growth hole 2016 is one example of the through-hole, and the mask layer 2014B is one example of the insulator.

More specifically, after a resist is applied onto the surface of the mask layer 2014A, and then exposure and development are performed, so that a resist pattern 2017 is formed. With the resist pattern 2017 used as a mask, dry etching is performed until part of the surface of the substrate 2101 is exposed. In this way, the mask layer 2014B having the growth hole 2016 is formed on the substrate 2101. At this point, $SiO_2$, silicon nitride ($Si_3N_4$) or another material that is selectively etchable with respect to the material for the quantum well layer 2012 is used as the material for the mask layer 2014A or the mask layer 2014B.

Next, deposition of a catalyst metal of Ni or Fe is carried out to form an island-like catalyst metal portion 2018 made of Ni or Fe on the surface of the substrate 2101 exposed from the growth hole 2016 as shown in FIG. 96D (catalyst portion forming step). Together with this, a catalyst metal layer 2019 made of Ni or Fe is formed on the resist pattern 2017. The volume of the catalyst metal portion 2018 is increased to the extent that the cross-sectional shape of the catalyst metal portion 2018 is nearly rectangular.

Next, as shown in FIG. 96E, the resist pattern 2017 is removed to lift off the catalyst metal layer 2019, and then cleaning is carried out with, for example, pure water.

Next, as shown in FIG. 96F, on the surface of the substrate 2101 on which the island-like catalyst metal portion 2018 is formed, that is, on the surface of the substrate 2101 overlapping the growth hole 2016, a semiconductor core 2011A made of n-type GaN and shaped like a rod is formed by crystal growth of n-type GaN from an interface between the substrate 2101 and the island-like catalyst metal portion 2018 using a metal organic chemical vapor deposition (MOCVD) device (semiconductor core forming step). At this point, the growth temperature is set to about 800° C., trimethylgalium (TMG) and ammonia ($NH_3$) are used as growth gases, and silane ($SiH_4$) for n-type impurity supply and further $H_2$ as a carrier gas are supplied, so that the semiconductor core 2011A of n-type GaN with Si used as the donor impurity can be grown.

Next, under the condition where the island-like catalyst metal portion 2018 is held in one end of the semiconductor core 2011A, a quantum well layer 2012A made of p-type InGaN and a semiconductor layer 2013A made of p-type GaN are formed, as shown in FIG. 96G, by crystal growth from the outer peripheral surface of the semiconductor core 2011A and crystal growth from an interface between the catalyst metal portion 2018 and the semiconductor core 2011 (semiconductor layer forming step). At this point, the growth temperature is set within the range of from 750° C. to 800° C., TMG, NH3 and trimethylindium (TMI) are used as the growth gases, $Cp_2Mg$ (bis(cyclopentadienyl)magnesium) is supplied for p-type impurity supply, and further $H_2$ is supplied as the carrier gas, so that p-type InGaN with Mg used as the impurity can be grown. Also, the growth temperature is set to about 900° C., TMG and $NH_3$ are used as growth gases, $Cp_2Mg$ is supplied for p-type impurity supply, and further $H_2$ is supplied as the carrier gas, so that p-type GaN with Mg used as the impurity can be grown. The quantum well layer 2012A and the semiconductor layer 2013A are formed to cover the semiconductor core 2011 protruding from the growth hole 2016. The structure of the quantum well layer 2012A may be a single quantum well structure having one well layer, and may also be a multiple quantum well structure having a plurality of well layers.

Next, as shown in FIG. 96H, the island-like catalyst metal portion 2018 in one end of the semiconductor core 2011A is selectively removed by wet etching, and then cleaning is carried out with, for example, pure water. The island-like catalyst metal portion 2018 may be removed by reactive ion etching (RIE) of dry etching. At this point, use of $SiCl_4$ for RIE allows GaN to be anisotropically etched with ease.

Next, annealing is carried out for activation of p-type GaN, and then, as shown in FIG. 96I, a conductive film 2015A made of polysilicon or ITO is formed on the semiconductor layer 2013A. Further, an annealing process is performed to decrease the resistance between the semiconductor layer 2013A and the conductive film 2015A.

Next, the conductive film 2015A, the semiconductor layer 2013A, the quantum well layer 2012A and the mask layer 2014B are anisotropically etched in sequence, on the one hand, to cause the quantum well layer 2012, the semiconductor layer 2013 and the conductive film 2015 to remain on one side of the semiconductor core 2011, and on the other hand, to cause the insulator 2014 to remain on the other side of the semiconductor core 2011, as shown FIG. 96J (insulator etching step). At this point, part of the semiconductor layer 2013A and part of the conductive film 2015A are removed. In the quantum well layer 2012A and the semiconductor layer 2013A, the thickness in the axial direction of a portion covering the axial-direction end surface of the semiconductor core 2011 is larger than the thickness in the radial direction of a portion covering the outer peripheral surface of the semiconductor core 2011, which makes it difficult to expose the axial-direction end surface of the semiconductor core 2011. Note that when the conductive film 2015A, the semiconductor layer 2013A, the quantum well layer 2012A and the mask layer 2014B are anisotropically etched in sequence, reducing the anisotropy at the time of etching the mask layer 2014B enables the insulator 2014' to be formed as indicated by a chain double-dashed line in FIG. 96J. Of the outer peripheral surface not covered with the semiconductor layer 2013 of the semiconductor core 2011, only a portion near the outer peripheral surface covered with the semiconductor layer 2013 of the semiconductor core 2011 is covered with the insulator 2014'. The insulator 2014 or the insulator 2014' is part of the mask layer 2014B remaining on the substrate 2101. While FIG. 96J shows that one rod-like light-emitting device 2001 seems to be formed, a plurality of rod-like light-emitting devices 2001 are actually formed.

Next, the substrate 2101 is immersed in an isopropyl alcohol (IPA) aqueous solution, and is vibrated along the plane of the substrate using ultrasonic waves of, for example, several tens of kilo-hertz. This causes stress to act on the semiconductor core 2011 and the insulator 2014 so as to bend the root close to the substrate 2101 of the semiconductor core 2011 that erects on the substrate 2101. As a result, as shown in FIG. 96K, the semiconductor core 2011 is separated from the substrate 2101 (separating step).

In this way, a plurality of microscopic rod-like light-emitting devices 2001 that are separated from the substrate 2101 can be manufactured. The microscopic rod-like light-emitting device as used herein refers to, for example, a device that has such dimensions that the diameter is within the range of from 10 nm to 5 μm and the length is within the range of from 100 nm to 200 μm, and more preferably a device that has such dimensions that the diameter is within the range of from 100 nm to 2 μm and the length is within the range of from 1 μm to 50 μm.

According to a method of manufacturing a rod-like light-emitting device with the above configuration, the microscopic rod-like light-emitting device 2001 is separated from the substrate 2101, which makes it possible to increase the freedom in installing into an apparatus of the microscopic rod-like light-emitting device 2001.

On the surface of the substrate 2101 overlapping the substrate 2101 mentioned above, a semiconductor core of the first conductivity type shaped like a rod is formed to protrude from the substrate 2101. This enables the thickness of the semiconductor core to be uniform.

The substrate 2101 is separated from the microscopic rod-like light-emitting device 2001, and therefore need not be used at the time of light emission of the microscopic rod-like light-emitting device 2001. Accordingly, substrate options that are available at the time of light emission of the microscopic rod-like light-emitting device 2001 are expanded. This can increase the freedom in selecting the form of the apparatus on which the microscopic rod-like light-emitting devices 2001 are to be mounted.

In the above separating step, vibrating the substrate 2101 along the plane of the substrate using ultrasonic waves causes stress to act on the semiconductor core 2011 and the insulator 2014 so as to bend the root close to the substrate 2101 of the semiconductor core 2011 that erects on the substrate 2101, so that the semiconductor core 2011 and the insulator 2014 are separated from the substrate 2101. Accordingly, a plurality of microscopic rod-like light-emitting devices 2001 provided on the substrate 2101 can be easily separated in a simple way.

If the above rod-like light-emitting device 2001 is not provided with the insulator 2014, stress concentrates at a portion where a step is formed in the outer peripheral surface of the semiconductor core 2011. The semiconductor core 2011 tends to be broken near this portion. When the semiconductor core 2011 is broken at the portion, it causes a problem of the device. Accordingly, the rod-like light-emitting device 2001 includes the insulator 2014. The insulator 2014 covers the outer peripheral surface of the vicinity of the above-mentioned portion of the semiconductor core 2011, and therefore the semiconductor core 2011 can be prevented from being broken near the above-mentioned portion. As a result, even in cases where a plurality of microscopic rod-like light-emitting devices 2001 are manufactured, the lengths of the microscopic rod-like light-emitting devices 2001 can be made uniform. Note that, as shown in FIG. 95, the insulator 2014 completely covers the entire outer peripheral surface on the other side of the semiconductor core 2011, and therefore its effect to prevent the semiconductor core 2011 from being broken at some midpoint upon separation is higher than that of the insulator 2014'. As a result, the lengths of the plurality of microscopic rod-like light-emitting devices 2001 can be made uniform with reliability.

The substrate 2101 can be reused for manufacturing the microscopic rod-like light-emitting device 2001 after the microscopic rod-like light-emitting device 2001 has been separated. This can reduce the manufacturing cost.

The rod-like light-emitting device 2001 is microscopic, and therefore the amount of semiconductors used can be decreased. Accordingly, it becomes possible to reduce the thicknesses and weights of apparatuses on which the rod-like light-emitting devices 2001 are to be mounted, which allows loads to the environment to be reduced.

In the above catalyst portion forming step, the volume of the island-like catalyst metal portion 2018 formed in the growth hole 2016 is increased so that the cross-sectional shape of the catalyst metal portion 2018 is nearly rectangular. Therefore, in the subsequent semiconductor core forming step, the diameter of a portion outside the growth hole 2016 of the semiconductor core 2011A shaped like a rod is larger than the diameter of a portion inside the growth hole 2016 of the semiconductor core 2011A having the rod shape. Accordingly, it is possible to expand the pn junction to obtain a large light emitting region.

In the above semiconductor layer forming step, under the condition where the island-like catalyst metal portion 2018 is held in one end of the semiconductor core 2011A, without removing the island-like catalyst metal portion 2018, the quantum well layer 2012A made of p-type InGaN and the semiconductor layer 2013A made of p-type GaN are formed. Therefore, crystal growth from an interface between the catalyst metal portion 2018 and the semiconductor core 2011 is promoted more than crystal growth from the outer peripheral surface of the semiconductor core 2011A. In other words, the speed of crystal growth from the interface between the catalyst metal portion 2018 and the semiconductor core 2011 is 10 to 100 times the speed of crystal growth from the outer peripheral surface of the semiconductor core 2011A. Accordingly, in the quantum well layer 2012A and the semiconductor layer 2013A, it is easy to make the thickness in the axial direction of the portion covering the axial-direction end surface on one side of the semiconductor core 2011 larger than the thickness in the radial direction of the portion covering the outer peripheral surface of the semiconductor core 2011. As a result, the axial-direction end surface on one side of the semiconductor core 2011 is less likely to be exposed. Therefore, it is possible to prevent the p-side electrode from being connected to the axial-direction end surface on one side of the n-type semiconductor core 2011.

In the microscopic rod-like light-emitting device 2001 manufactured by the above method of manufacturing a rod-like light-emitting device, with the n-side electrode connected to the axial-direction end surface 2011a of the semiconductor core 2011 not covered with the insulator 2014, and with the p-side electrode connected to the conductive film 2015 or the surface of the semiconductor layer 2013 exposed from the conductive film 2015, a current is caused to flow from the p-type semiconductor layer 2013 to the n-type semiconductor core 2011 to result in recombination of electrons and holes in the quantum well layer 2012. Thus, light is emitted. At this point, because the quantum well layer 2012 and the semiconductor layer 2013 cover the whole peripheral surface and the axial-direction end surface on one side of the semiconductor core 2011, light is emitted from nearly all of the quantum well layer 2012 to result in expansion of the light emitting region. Accordingly, the amount of emitted light can be increased, and the light emitting efficiency can be raised.

The light emitting efficiency of the rod-like light-emitting device 2001 can be increased. Therefore, using the rod-like light-emitting device 2001, a backlight, an illuminating device, a display device and the like that have high light-emitting efficiencies and achieve low power consumption can be implemented.

The quantum well layer 2012 is formed between the semiconductor core 2011 and the semiconductor layer 2013. Therefore, due to quantum confinement effects of the quantum well layer 2012, the amount of emitted light can be more increased, and the light emitting efficiency can be more increased.

The axial-direction end surface 2011a of the semiconductor core 2011 is exposed, and therefore the n-side electrode can be easily connected to the axial-direction end surface 2011a.

Of all the outer peripheral surface not covered with the semiconductor layer 2013 of the semiconductor core 2011, a portion near the outer peripheral surface covered with the semiconductor layer 2013 of the semiconductor core 2011 is covered with the insulator 2014. As a result, the n-side electrode becomes less likely to be short-circuited to the p-side electrode, which facilitates formation of the n-side electrode and the p-side electrode. That is, even in the case where the p-side electrode to be connected to the semiconductor layer 2013 is formed near the step of the outer peripheral surface of the semiconductor core 2011, the p-side electrode can be prevented from coming in contact with the semiconductor core 2011, and therefore forming the n-side electrode and the p-side electrode is easy. Such an effect can be obtained even in the case of forming the insulator 2014' instead of the insulator 2014.

Moreover, in the microscopic rod-like light-emitting device 2001 manufactured by the above method of manufacturing a rod-like light-emitting device, crystal growth of the quantum well layer 2012A and the semiconductor layer 2013A occurs radially outward from the outer peripheral surface of the semiconductor core 2011A. The growth distance in the radial direction is short, and the defect deviates outward. Accordingly, one side of the semiconductor core 2011 can be covered with the quantum well layer 2012 and the semiconductor layer 2013 having less crystal defects. This can make good the characteristics of the microscopic rod-like light-emitting device 2001.

In cases where the rod-like light-emitting devices 2001 are aligned on the substrate in such a manner that the axial direction of the rod-like light-emitting device 2001 is parallel to the surface of the substrate, the conductive film 2015 is formed such that the outer peripheral surface thereof is continuous with the outer peripheral surface of the insulator 2014 without a step. This can prevent the rod-like light-emitting device 2001 from being broken, and can prevent the rod-like light-emitting device 2001 from being inclined with respect to the surface of the substrate to be unstable.

By preventing the rod-like light-emitting device 2001 from being inclined with respect to the surface of the substrate, the contact area of the rod-like light-emitting device 2001 with the surface of the substrate is increased. This makes it easier for the heat of the rod-like light-emitting device 2001 to diffuse to the substrate.

(Embodiment 37)

FIG. 97 is a schematic cross-sectional view showing a rod-like light-emitting device 2002 of Embodiment 37 of this invention.

The rod-like light-emitting device 2002 includes a semiconductor core 2021 made of n-type GaN (gallium nitride) and having a rod shape whose cross section is nearly circular, a quantum well layer 2022 made of p-type InGaN and covering the outer peripheral surface and axial-direction end surface of one end of the semiconductor core 2021, a semiconductor layer 2023 made of p-type GaN and covering the quantum well layer 2022, an insulator 2024 made of $SiO_2$ (silicon oxide) or $Si_3N_4$ (silicon nitride) and covering the outer peripheral surface of the other end of the semiconductor core 2021, and an underlying layer 2030 adjoining the other end of the semiconductor core 2021. Note that the semiconductor core 2021 is one example of the semiconductor layer of the first conductivity type, the quantum well layer 2022 is one example of the quantum well layer, the semiconductor layer 2023 is one example of the semiconductor layer of the second conductivity type, and the underlying layer 2030 is one example of an underlying layer of the first conductivity type.

The surface of the semiconductor core 2021 is covered with the quantum well layer 2022 or the insulator 2024. Here, the insulator 2024 covers the whole outer peripheral surface on the other side of the semiconductor core 2021. Note that, instead of the insulator 2024, as indicated by a chain double-dashed line in FIG. 97, an insulator 2024' may be formed that covers only an outer peripheral portion near the outer peripheral surface covered with the semiconductor layer 2023 of the semiconductor core 2021, of all the outer peripheral surface not covered with the semiconductor layer 2023 of the semiconductor core 2021.

An axial-direction end surface 2030a of the underlying layer 2030 opposite to the semiconductor core 2021 is not covered with the insulator 2024 to be exposed. A peripheral surface 2030b of the underlying layer 2030 is not covered with the insulator 2024 and is exposed.

The semiconductor core 2021 is doped with Si as the donor impurity whereas the quantum well layer 2022 and the semiconductor layer 2023 are doped with Mg as the acceptor impurity. However, the donor impurity is not limited to Si, and the acceptor impurity is not limited to Mg.

On the outer peripheral surface of the semiconductor layer 2023, a conductive film 2025 made of polysilicon or tin-doped indium oxide (ITO) is formed. The conductive film 2025 is a film through which light from the quantum well layer 2022 is transmitted. The conductive film 2025 may be formed such that the outer peripheral surface thereof is continuous with the outer peripheral surface of the insulator 2024 without a step. That is, the outer peripheral surface of the conductive film 2025 may be flush with the outer peripheral surface of the insulator 2024.

Hereinbelow, with reference to FIGS. 98A to 98M, a description is given of a method of manufacturing the rod-like light-emitting device 2002 mentioned above.

First, as shown in FIG. 98A, a substrate 2201 made of, for example, Si is prepared. The substrate 2201 may be subjected to substrate cleaning with a detergent, pure water or the like, and subjected to substrate processing such as marking, as appropriate.

Next, as shown in FIG. 98B, an underlying layer 2030A made of n-type GaN is formed on the substrate 2201 using a MOCVD device (underlying layer forming step). At this point, the growth temperature is set to about 950° C., TMG and $NH_3$ are used as growth gases, $SiH_4$ for n-type impurity supply is supplied, and further $H_2$ as a carrier gas is supplied, so that the underlying layer 2030A of n-type GaN with Si used as the donor impurity can be grown.

Next, as shown in FIG. 98C, after a mask layer 2024A made of an insulator is formed on the substrate 2201, as shown in FIG. 98D, a mask layer 2024B having a growth hole 2026 is formed on the substrate 2201 by a lithography method and a dry etching method that are known (insulator forming step). Note that the growth hole 2026 is one example of the through-hole, and the mask layer 2024B is one example of the insulator.

More specifically, after a resist is applied onto the surface of the mask layer 2024A, and then exposure and development are performed, so that a resist pattern 2027 is formed. With the resist pattern 2027 used as a mask, dry etching is performed until part of the surface of the underlying layer 2030A is exposed. In this way, the mask layer 2024B having the growth hole 2026 is formed on the underlying layer 2030A. At this point, SiO2, silicon nitride ($Si_3N_4$) or another material that is selectively etchable with respect to the material for the quantum well layer 2022 is used as the material for the mask layer 2024A or the mask layer 2024B.

Next, deposition of a catalyst metal of Ni or Fe is carried out to form an island-like catalyst metal portion 2028 made of Ni or Fe on the surface of the underlying layer 2030A exposed from the growth hole 2026 as shown in FIG. 98E (catalyst portion forming step). Together with this, a catalyst metal layer 2029 made of Ni or Fe is formed on the resist pattern 2027. The volume of the catalyst metal portion 2028 is increased to the extent that the cross-sectional shape of the catalyst metal portion 2028 is nearly rectangular.

Next, as shown in FIG. 98F, the resist pattern 2027 is removed to lift off the catalyst metal layer 2029, and then cleaning is carried out with, for example, pure water.

Next, as shown in FIG. 98G, on the surface of the underlying layer 2030A on which the island-like catalyst metal portion 2028 is formed, that is, on the surface of the underlying layer 2030A overlapping the growth hole 2026, a semiconductor core 2021A made of n-type GaN and shaped like a rod is formed by crystal growth of n-type GaN from an interface between the island-like catalyst metal portion 2028 and the underlying layer 2030A using a MOCVD device (semiconductor core forming step). At this point, the growth temperature is set to about 800° C., TMG and $NH_3$ are used as growth gases, $SiH_4$ for n-type impurity supply, and further $H_2$ is supplied as a carrier gas, so that the semiconductor core 2021A of n-type GaN with Si used as the donor impurity can be grown.

Next, under the condition where the island-like catalyst metal portion 2028 is held in one end of the semiconductor core 2021A, a quantum well layer 2022A made of p-type InGaN and a semiconductor layer 2023A made of p-type GaN are formed, as shown in FIG. 98H, by crystal growth from the outer peripheral surface of the semiconductor core 2021A and crystal growth from an interface between the catalyst metal portion 2028 and the semiconductor core 2021 (semiconductor layer forming step). At this point, the growth temperature is set within the range of from 750° C. to 800° C., TMG, $NH_3$ and TMI are used as the growth gases, $Cp_2Mg$ is supplied for p-type impurity supply, and further $H_2$ is supplied as the carrier gas, so that p-type InGaN with Mg used as the impurity can be grown. Also, the growth temperature is set to about 900° C., TMG and $NH_3$ are used as growth gases, $Cp_2Mg$ is supplied for p-type impurity supply, and further $H_2$ is supplied as the carrier gas, so that p-type GaN with Mg used as the impurity can be grown. The quantum well layer 2022A and the semiconductor layer 2023A are formed to cover the semiconductor core 2021 protruding from the growth hole 2026. The structure of the quantum well layer 2022A may be a single quantum well structure having one well layer, and may also be a multiple quantum well structure having a plurality of well layers.

Next, as shown in FIG. 98I, the island-like catalyst metal portion 2028 in one end of the semiconductor core 2021A is selectively removed by wet etching, and then cleaning is carried out with, for example, pure water. The island-like catalyst metal portion 2028 may be removed by RIE of dry etching. At this point, use of $SiCl_4$ for RIE allows GaN to be anisotropically etched with ease.

Next, annealing is carried out for activation of p-type GaN, and then, as shown in FIG. 98J, a conductive film 2025A made of polysilicon or ITO is formed on the semiconductor layer 2023A. Further, an annealing process is performed to decrease the resistance between the semiconductor layer 2023A and the conductive film 2025A.

Next, the conductive film 2025A, the semiconductor layer 2023A, the quantum well layer 2022A and the mask layer 2024B are anisotropically etched in sequence, on the one hand, to cause the quantum well layer 2022, the semiconductor layer 2023 and the conductive film 2025 to remain on one side of the semiconductor core 2021, and on the other hand, to cause the insulator 2024 remain on the other side of the semiconductor core 2011, as shown FIG. 98K (insulator etching step). At this point, part of the semiconductor layer 2023A and part of the conductive film 2025A are removed. In the quantum well layer 2022A and the semiconductor layer 2023A, the thickness in the axial direction of the portion covering the axial-direction end surface on one side of the semiconductor core 2021 is larger than the thickness in the radial direction of the portion covering the outer peripheral surface of the semiconductor core 2021, which makes it difficult to expose the axial-direction end surface on one side of the semiconductor core 2021. Note that when the conductive film 2025A, the semiconductor layer 2023A, the quantum well layer 2022A and the mask layer 2024B are anisotropically etched in sequence, reducing the anisotropy at the time of etching the mask layer 2024B enables the insulator 2024' to be formed as indicated by a chain double-dashed line in FIG. 98K. Of the outer peripheral surface not covered with the semiconductor layer 2023 on the other side of the semiconductor core 2021, only a portion near the outer peripheral surface covered with the semiconductor layer 2023 on one side of the semiconductor core 2021 is covered with the insulator 2024'. The insulator 2024 or the insulator 2024' is part of the mask layer 2024B remaining on the substrate 2201. While FIG. 98K shows that one rod-like light-emitting device 2002 seems to be formed, a plurality of rod-like light-emitting devices 2002 are actually formed. Note that the insulator etching step mentioned above is one example of the etching step.

Next, RIE of the underlying layer 2030A is carried out to form the underlying layer 2030 adjoining the other end of the semiconductor core 2021 as shown in FIG. 98L (underlying layer etching step). Note that the underlying layer etching step is one example of the etching step.

Next, the substrate 2201 is immersed in an IPA aqueous solution, and is vibrated along the plane of the substrate 2201 using ultrasonic waves of, for example, several tens of kilohertz. This causes stress to act on the semiconductor core 2021 and the insulator 2024 so as to bend the root close to the substrate 2201 of the semiconductor core 2021 that erects on the substrate 2201. As a result, as shown in FIG. 98M, the underlying layer 2030 is separated from the substrate 2201 (separating step).

In this way, a plurality of microscopic rod-like light-emitting devices 2002 that are separated from the substrate 2201 can be manufactured. The microscopic rod-like light-emitting device as used herein refers to, for example, a device that has such dimensions that the diameter is within the range of from 10 nm to 5 µm, inclusive, and the length is within the range of from 100 nm to 200 µm, inclusive, and more preferably a device that has such dimensions that the diameter is within the range of from 100 nm to 2 µm and the length is within the range of from 1 µm to 50 µm inclusive.

According to a method of manufacturing a rod-like light-emitting device with the above configuration, the microscopic rod-like light-emitting device 2002 is separated from the substrate 2201, which makes it possible to increase the freedom in installing into an apparatus of the microscopic rod-like light-emitting device 2002.

On the surface of the substrate 2201 overlapping the substrate 2201 mentioned above, a semiconductor core of the first conductivity type shaped like a rod is formed to protrude from the substrate 2201. This enables the thickness of the semiconductor core to be uniform.

The substrate 2101 is separated from the microscopic rod-like light-emitting device 2002, and therefore need not be used at the time of light emission of the microscopic rod-like light-emitting device 2002. That is, a connection of an electrode to the substrate 2201 becomes unnecessary. Accordingly, substrate options that are available at the time of light emission of the microscopic rod-like light-emitting device 2002 are expanded. This can increase the freedom in selecting the form of the apparatus on which the microscopic rod-like light-emitting devices 2002 are to be mounted.

In the above separating step, vibrating the substrate 2201 along the plane of the substrate using ultrasonic waves causes stress to act on the semiconductor core 2021 and the insulator 2024 so as to bend the root close to the substrate 2201 of the semiconductor core 2021 that erects on the substrate 2201, so that the semiconductor core 2021 and the insulator 2024 are separated from the substrate 2201. Accordingly, a plurality of microscopic rod-like light-emitting devices 2002 provided on the substrate 2201 can be easily separated in a simple way.

If the above rod-like light-emitting device 2002 is not provided with the insulator 2024, stress concentrates at a portion where a step is formed in the outer peripheral surface of the semiconductor core 2021. The semiconductor core 2011 tends to be broken near this portion. When the semiconductor core 2021 is broken at the portion, it causes a problem of the device. Accordingly, the rod-like light-emitting device 2002 includes the insulator 2024. The insulator 2024 covers the outer peripheral surface of the vicinity of the above-mentioned portion of the semiconductor core 2021, and therefore the semiconductor core 2021 can be prevented from being broken near the above-mentioned portion. As a result, even in cases where a plurality of microscopic rod-like light-emitting devices 2002 are manufactured, the lengths of the microscopic rod-like light-emitting devices 2002 can be made uniform. Note that, as shown in FIG. 97, the insulator 2024 completely covers the entire outer peripheral surface on the other side of the semiconductor core 2021, and therefore its effect to prevent the semiconductor core 2021 from being broken at some midpoint upon separation is higher than that of the insulator 2024'. As a result, the lengths of the plurality of microscopic rod-like light-emitting devices 2002 can be made uniform with reliability.

The substrate 2201 can be reused for manufacturing the microscopic rod-like light-emitting device 2002 after the microscopic rod-like light-emitting device 2002 has been separated. This can reduce the manufacturing cost.

The rod-like light-emitting device 2002 is microscopic, and therefore the amount of semiconductors used can be decreased. Accordingly, it becomes possible to reduce the thicknesses and weights of apparatuses on which the rod-like light-emitting devices 2002 are to be mounted, which allows loads to the environment to be reduced.

In the above catalyst portion forming step, the volume of the island-like catalyst metal portion 2028 formed in the growth hole 2026 is increased so that the cross-sectional shape of the catalyst metal portion 2028 is nearly rectangular. Therefore, in the subsequent semiconductor core forming step, the diameter of a portion outside the growth hole 2026 of the semiconductor core 2021A shaped like a rod is larger than the diameter of a portion inside the growth hole 2026 of the semiconductor core 2021A having the rod shape. Accordingly, it is possible to expand the pn junction to obtain a large light emitting region.

In the above semiconductor core forming step, crystal growth of the semiconductor core 2021A made of n-type GaN occurs on the underlying layer 2030A made of n-type GaN. Therefore, crystal growth of the semiconductor core 2021A can easily occur, and variations in the initial crystal growth of the semiconductor core 2021A can be reduced.

In the above semiconductor layer forming step, under the condition where the island-like catalyst metal portion 2028 is held in one end of the semiconductor core 2021A, without removing the island-like catalyst metal portion 2028, the quantum well layer 2022A made of p-type InGaN and the semiconductor layer 2023A made of p-type GaN are formed. Therefore, crystal growth from the interface between the catalyst metal portion 2028 and the semiconductor core 2021 is promoted more than crystal growth from the outer peripheral surface of the semiconductor core 2021A. In other words, the speed of crystal growth from the interface between the catalyst metal portion 2028 and the semiconductor core 2021 is 10 to 100 times the speed of crystal growth from the outer peripheral surface of the semiconductor core 2021A. Accordingly, in the quantum well layer 2022A and the semiconductor layer 2023A, it is easy to make the thickness in the axial direction of the portion covering the axial-direction end surface on one side of the semiconductor core 2021 larger than the thickness in the radial direction of the portion covering the outer peripheral surface of the semiconductor core 2021. As a result, the axial-direction end surface on one side of the semiconductor core 2021 is less likely to be exposed. Therefore, it is possible to prevent the p-side electrode from being connected to the axial-direction end surface on one side of the n-type semiconductor core 2021.

In the microscopic rod-like light-emitting device 2002 manufactured by the above method of manufacturing a rod-like light-emitting device, with the n-side electrode connected to at least one of the axial-direction end surface 2030a of the underlying layer 2030 not covered with the insulator 2024 and the peripheral surface 2030b of the underlying layer 2030 not covered with the insulator 2024, and with the p-side electrode connected to the conductive film 2025 or the surface of the semiconductor layer 2023 exposed from the conductive film 2025, a current is caused to flow from the p-type semiconductor layer 2023 to the n-type semiconductor core 2021 to result in recombination of electrons and holes in the quantum well layer 2022. Thus, light is emitted. At this point, the quantum well layer 2022 and the semiconductor layer 2023 are formed to cover the whole peripheral surface and the axial-direction end surface on one side of the semiconductor core 2021, and therefore light is emitted from nearly all of the quantum well layer 2022 to result in expansion of the light emitting region. Accordingly, the amount of emitted light can be increased, and the light emitting efficiency can be raised.

The light emitting efficiency of the rod-like light-emitting device 2002 can be increased. Therefore, using the rod-like light-emitting device 2002, a backlight, an illuminating device, a display device and the like that have high light-emitting efficiencies and achieve low power consumption can be implemented.

The quantum well layer 2022 is formed between the semiconductor core 2021 and the semiconductor layer 2023. Therefore, due to quantum confinement effects of the quantum well layer 2022, the amount of emitted light can be more increased, and the light emitting efficiency can be more increased.

The axial-direction end surface 2030a and the peripheral surface 2030b of the underlying layer 2030 are exposed, and therefore the n-side electrode can be easily connected to at least one of the axial-direction end surface 2030a and the peripheral surface 2030b.

Of the outer peripheral surface not covered with the semiconductor layer 2023 on the other side of the semiconductor core 2021, the portion near the outer peripheral surface covered with the semiconductor layer 2023 on one side of the semiconductor core 2021 is covered with the insulator 2024. As a result, the n-side electrode becomes less likely to be short-circuited to the p-side electrode, which facilitates formation of the n-side electrode and the p-side electrode. That is, even in the case where the p-side electrode to be connected to the semiconductor layer 2023 is formed near the step of the outer peripheral surface of the semiconductor core 2021, the p-side electrode can be prevented from coming in contact with the semiconductor core 2021, and therefore forming the n-side electrode and the p-side electrode is easy. Such an effect can be obtained even in the case of forming the insulator 2024' instead of the insulator 2024.

Moreover, in the rod-like light-emitting device 2002 manufactured by the above method of manufacturing a rod-like light-emitting device, crystal growth of the quantum well layer 2022A and the semiconductor layer 2023A occurs radially outward from the outer peripheral surface of the semiconductor core 2021A. The growth distance in the radial direction is short, and the defect deviates outward. Accordingly, one side of the semiconductor core 2021 can be covered with the quantum well layer 2022 and the semiconductor layer 2023 having less crystal defects. This can make good the characteristics of the microscopic rod-like light-emitting device 2002.

In cases where the rod-like light-emitting devices 2002 are aligned on the substrate in such a manner that the axial direction of the rod-like light-emitting device 2002 is parallel to the surface of the substrate, the conductive film 2025 is formed such that the outer peripheral surface thereof is continuous with the outer peripheral surface of the insulator 2024 without a step. This can prevent the rod-like light-emitting device 2002 from being broken, and can prevent the rod-like light-emitting device 2002 from being inclined with respect to the surface of the substrate to be unstable.

By preventing the rod-like light-emitting device 2002 from being inclined with respect to the surface of the substrate, the contact area of the rod-like light-emitting device 2002 with the surface of the substrate is increased. This makes it easier for the heat of the rod-like light-emitting device 2002 to diffuse to the substrate.

In Embodiments 36 and 37 described above, a microscopic rod-like light-emitting device may be manufactured using a semiconductor whose base material is GaAs, AlGaAs, GaAsP, InGaN, AlGaN, GaP, ZnSe, AlGaInP or the like.

In Embodiments 36 and 37, the n-type semiconductor cores 2011 and 2021, the p-type quantum well layers 2012 and 2022, the p-type semiconductor layers 2013 and 2023, and the n-type underlying layer 2030 are used. However, a p-type semiconductor core, an n-type quantum well layer, an n-type semiconductor layer and a p-type underlying layer may be used. That is, the conductivity types in Embodiments 36 and 37 may be reversed.

In Embodiments 36 and 37 described above, when the diameters of the semiconductor cores 2011 and 2021 are 300 nm or more and 50 μm or less, variations in the diameters of the semiconductor cores 2011 and 2021 can be reduced compared to the case of the semiconductor core having a diameter ranging from several tens of nanometers to several hundreds of nanometers. Variations in the light emitting region, that is, variations in light emission characteristics can be reduced, and yields can be improved.

In Embodiments 36 and 37, descriptions have been given of the rod-like light-emitting devices 2001 and 2002 in which one sides of the semiconductor cores 2011 and 2021 having rod shapes whose cross sections are nearly circular are covered with the quantum well layers 2012 and 2022 and the semiconductor layers 2013 and 2023. However, this invention may be applied to, for example, a rod-like light-emitting device in which one side of a semiconductor core having a rod shape whose cross section is nearly elliptical is covered with a quantum well layer, a semiconductor layer and the like, and a rod-like light-emitting device in which one side of a semiconductor core having a rod shape whose cross section is nearly hexagonal or has another polygon is covered with a quantum well layer, a semiconductor layer and the like. N-type GaN results in hexagonal crystal growth, and a semiconductor core in the shape that is approximately a hexagonal prism is obtained by growing the crystals under the condition where a direction perpendicular to the surface of the substrate is the c-axis direction. Depending on growth conditions such as a growth direction and a growth temperature, there is a tendency to form semiconductor cores whose cross sections have shapes that are nearly circular in cases where the diameters of the growth holes 2016 and 2026 are small in the range of from several tens of nanometers to several hundreds of nanometers. In cases where the diameters are large in the range of from about 0.5 µm to several hundreds of micrometers, there is a tendency to form semiconductor cores whose cross sections are nearly hexagonal.

In Embodiments 36 and 37, the semiconductor cores 2011 and 2021 are formed in which the diameter on one side is larger than that on the other side. However, a semiconductor core in which the diameter on one side is the same as that on the other side may be formed. Such a semiconductor core can be easily formed by decreasing the volume of the island-like metal portion formed in the growth hole 2016 so that the cross-sectional shape of the catalyst metal portion is nearly semi-circular.

In Embodiments 36 and 37, under the condition where the island-like catalyst metal portions 2018 and 2028 are held in one ends of the semiconductor cores 2011A and 2021A, the quantum well layers 2012A and 2022A made of p-type InGaN and the semiconductor layers 2013A and 2023A made of p-type GaN are formed. However, only semiconductor layers may be formed. That is, the quantum well layers 2012A and 2022A need not be formed.

In Embodiments 36 and 37, the conductive films 2015 and 2025 are formed such that their outer peripheral surfaces are continuous with the outer peripheral surfaces of the insulators 2014 and 2024 without any steps. However, the conductive films 2015 and 2025 need not be formed, and the semiconductor layers may be formed such that their outer peripheral surfaces are continuous with the outer peripheral surfaces of the insulators 2014 and 2024 without any steps.

In Embodiments 36 and 37, the semiconductor cores 2011A and 2021A, the quantum well layers 2012A and 2022A, and the semiconductor layers 2013A and 2023A are formed using the catalyst metal portions 2018 and 2028. However, the semiconductor cores, the quantum well layers and the semiconductor layers may be formed without using the catalyst metal portions 2018 and 2028.

In the above case where the semiconductor cores, the quantum well layers and the semiconductor layers are formed without using the catalyst metal portions 2018 and 2028, in the quantum well layers and the semiconductor layers, the thickness in the axial direction of the portion covering the axial-direction end surface on one side of the semiconductor core is nearly the same as the thickness in the radial direction of the portion covering the outer peripheral surface of the semiconductor core. For this reason, in the insulator etching step, the axial-direction end surface on one side of the semiconductor core becomes likely to be exposed. The axial-direction end surface on one side of the semiconductor core is allowed to be exposed.

In the separating steps of Embodiments 36 and 37, the semiconductor core 2011 and 2021 may be mechanically separated from the substrate 2101 and 2201 using a cutting tool. Using the cutting tool, the root close to the substrate 2101 of the semiconductor core 2011 that erects on the substrate 2101 is bent to cause stress to act on the semiconductor core 2011 covered with the semiconductor layer 2013, so that the semiconductor core 2011 covered with the semiconductor layer 2013 is separated from the substrate 2101. In this case, a plurality of microscopic rod-like light-emitting devices provided on the substrate 2101 can be separated for a short time in a simple way.

In the insulator etching steps of Embodiments 36 and 37, by etching the mask layers 2014B and 2024B to cause parts of the mask layers 2014B and 2024B to remain around ends on the other side of the semiconductor cores 2011 and 2021, the conductive films 2015A and 2025A, the semiconductor layers 2013A and 2023A and the quantum well layers 2012A and 2022A may be lifted off all at once.

In Embodiments 36 and 37, instead of a MOCVD device, other crystal growth devices such as a molecular-beam epitaxy (MBE) device may be used.

(Embodiment 38)

Next, a backlight, an illuminating device and a display device that include a rod-like light-emitting device of Embodiment 38 of this invention are described. In this Embodiment 38, rod-like light-emitting devices described in any one of Embodiments 1 to 37 or modifications thereof are aligned on an insulating substrate. The rod-like light-emitting devices are aligned using a technique according to an invention entitled "Method for aligning microscopic structures and substrate having microscopic structures aligned, as well as integrated circuit apparatus and display element", for which Japanese Patent Application No. 2007-102848 (as published under JP 2008-260073 A) was filed by the Assignee of the present invention.

FIG. 99 is a plan view of an insulating substrate for use in a backlight, an illuminating device and a display device of this Embodiment 38. As shown in FIG. 99, the metal electrodes 2351 and 2352 are formed on the surface of an insulating substrate 2350. The insulating substrate 2350 may be formed of an insulator, such as glass, ceramic, aluminum oxide or resin, or may be a substrate wherein a silicon oxide film is formed on a surface of a semiconductor such as silicon so that the surface of the substrate has insulating properties. In the case of using a glass substrate, it is desirable that an underlying insulating film such as a silicon oxide film or a silicon nitride film be formed on the surface of the substrate.

The metal electrodes 2351 and 2352 are formed in desired electrode shapes utilizing a printing technique. Note that the metal electrodes 2351 and 2352 may be formed by depositing a metal film and a photosensitive film over the substrate, then exposing the photosensitive film in a desired electrode pattern, and etching the films.

Pads, which are omitted in FIG. 99, are formed for the metal electrodes 2351 and 2352 so that potentials can be provided from the outside. The rod-like light-emitting devices are aligned in portions where the metal electrodes 2351 and 2352 face each other (alignment regions). While 2 by 2 alignment regions in which the rod-like light-emitting devices are to be aligned are shown in FIG. 99, any number of regions may be arranged.

FIG. 100 is a schematic cross-sectional view as taken along the line 100-100 in FIG. 99.

First, as shown in FIG. 100, isopropyl alcohol (IPA) 361 containing the rod-like light-emitting devices 2360 is thinly applied onto the insulating substrate 2350. Instead of the IPA 361, ethylene glycol, propylene glycol, methanol, ethanol and acetone or a mixture thereof may be used. Alternatively, instead of the IPA 361, a liquid made of another organic substance, water and the like can be used. Note that the rod-like light-emitting device 2360 is a rod-like light-emitting device described in any one of Embodiments 1 to 37, or a modification thereof.

However, if a large current flows between the metal electrodes 2351 and 2352 through the liquid, a desired voltage difference cannot be applied across the metal electrodes 2351 and 2352. In such a case, the whole surface of the insulating substrate 2350 may be coated with an insulating film of from about 10 to 30 nm so that the metal electrodes 2351 and 2352 are covered.

The thickness at which the IPA 361 containing the rod-like light-emitting devices 2360 is applied is a thickness that allows movement of the rod-like light-emitting devices 2360 in the liquid so that the rod-like light-emitting devices 2360 can be aligned in the subsequent step of aligning the rod-like light-emitting devices 2360. Accordingly, the thickness of the applied IPA 361 is equal to or larger than the thickness of the rod-like light-emitting device 2360, and ranges, for example, from several micrometers to several millimeters. In cases where the thickness of the applied IPA is too small, it becomes difficult for the rod-like light-emitting devices 2360 to move, whereas in cases where the thickness is too large, time for drying the liquid becomes long. The amount of the rod-like light-emitting device 2360 relative to the amount of IPA is preferably in the range of from $1\times10^4/cm^3$ to $1\times10^7/cm^3$.

In order to apply the IPA 361 containing the rod-like light-emitting devices 2360, a frame is formed in the outer periphery of the metal electrodes where the rod-like light-emitting devices 2360 are to be aligned, and the frame may be filled with the IPA 361 containing the rod-like light-emitting devices 2360 so that the applied IPA has a desired thickness. However, in cases where the IPA 361 containing the rod-like light-emitting devices 2360 has viscosity, the IPA 361 can be applied to a desired thickness without requiring the frame.

It is desirable for the aligning step for the rod-like light-emitting devices 2360 that a liquid such as IPA, ethylene glycol, propylene glycol, . . . , or a mixture thereof, or a liquid made of another organic substance or water have a viscosity as low as possible, and be likely to be evaporated by heat.

Next, a potential difference is applied across the metal electrodes 2351 and 2352. In this Embodiment 38, a potential difference of 1 V is appropriate. A potential difference in the range of from 0.1 to 10 V may be applied across the metal electrodes 2351 and 2352. However, in the case of a potential difference of 0.1 V or less, the alignment of rod-like light-emitting devices 2360 is poor. In the case of a potential difference of 10 V or more, insulation between the metal electrodes becomes problematic. Accordingly, the potential difference is preferably in the range of from 1 V to 5 V, and more preferably about 1 V.

FIG. 101 shows the principle of aligning the rod-like light-emitting devices 2360 on the metal electrodes 2351 and 2352. As shown in FIG. 101, when a potential $V_L$ is applied to the metal electrode 2351, and a potential $V_R$ ($V_L<V_R$) is applied to the metal electrode 2352, negative charge is induced on the metal electrode 2351, and positive charge is induced on the metal electrode 2352. As the rod-like light-emitting device 2360 approaches the electrodes, positive charge is induced on a side close to the metal electrode 2351 of the rod-like light-emitting device 2360, and negative charge is induced on a side close to the metal electrode 2352 of the rod-like light-emitting device 2360. This induction of charges in the rod-like light-emitting device 2360 is due to electrostatic induction. That is, in the rod-like light-emitting device 2360 placed in an electric field, charges are induced on its surface until the electric field inside the device is zero. As a result, attraction due to the electrostatic force acts between the electrodes and the rod-like light-emitting devices 2360, and therefore the rod-like light-emitting devices 2360 are aligned along the line of electric force between the metal electrodes 2351 and 2352. Charges induced on the rod-like light-emitting devices 2360 are nearly the same, and therefore the rod-like light-emitting devices 2360 are regularly aligned in a fixed direction at nearly regular intervals because of repulsive forces due to charges. However, for example, with the rod-like light-emitting devices 2001 shown in FIG. 95 of Embodiment 36, the orientations of the axial-direction end surfaces 2011*a* are not fixed, but in a random fashion (This is true with the rod-like light-emitting devices in other embodiments and modifications).

As described above, charges are generated in the rod-like light-emitting device 2360 by an external electric field generated between the metal electrodes 2351 and 2352, and the force of attraction of charges causes the rod-like light-emitting device 2360 to be adsorbed to the metal electrodes 2351 and 2352. Therefore, the size of the rod-like light-emitting device 2360 need be large enough to allow the rod-like light-emitting device 2360 to move or migrate in the liquid. Accordingly, the size of the rod-like light-emitting device 2360 should be selected in accordance with the amount (thickness) of the applied liquid. In cases where the amount of applied liquid is small, the rod-like light-emitting device 2360 needs to have a size in the order of nanometers. In contrast, in cases where the amount of applied liquid is large, the rod-like light-emitting device 2360 may have a size of the order of micrometers.

In cases where the rod-like light-emitting devices 2360 are not electrically neutral but positively or negatively charged, just applying a static potential difference (DC) across the metal electrodes 2351 and 2352 would not make it possible to stably align the rod-like light-emitting devices 2360. For example, in cases where the rod-like light-emitting devices 2360 are positively charged as a whole, attraction between the devices and the metal electrode 2352 on which positive charge is induced becomes relatively weak. Therefore, the alignment of the rod-like light-emitting devices 2360 becomes asymmetrical.

In such a case, as shown in FIG. 102, it is preferable that an AC voltage be applied across the metal electrodes 2351 and 2352. In FIG. 102, a reference potential is applied to the metal electrode 2352, and an alternating current (AC) voltage with an amplitude of $V_{PPL}/2$ is applied to the metal electrode 2351. In this way, even in cases where the rod-like light-emitting devices 2360 are charged, the alignment can be kept symmetrical. Note that the frequency of the AC voltage applied to the metal electrode 2352 in this case is preferably in the range of from 10 Hz to 1 MHz, and more preferably in the range of from 50 Hz to 1 kHz in which the alignment is most stable. Moreover, the AC voltage applied across the metal electrodes 2351 and 2352 is not limited to being a sine wave, and may be a periodically varying wave, such as a rectangular wave, a triangular wave or a saw wave. Note that $V_{PPL}$ is preferably about 1 V.

Next, the rod-like light-emitting devices 2360 are aligned and arranged on the metal electrodes 2351 and 2352, and then the insulating substrate 2350 is heated, so that the liquid is evaporated and dried. The rod-like light-emitting devices 2360 are aligned and adhered along the line of electric force between the metal electrodes 2351 and 2352 at regular intervals.

FIG. 103 is a plan view of the insulating substrate 2350 on which the rod-like light-emitting devices 2360 are aligned. The insulating substrate 2350 on which the rod-like light-emitting devices 2360 are aligned is used for a backlight of a liquid crystal display device or the like. This makes it possible to implement a backlight whose thickness and weight can be reduced and that has a high light emitting efficiency and achieves low power consumption. Also, using as an illuminating device the insulating substrate 2350 having the rod-like light-emitting devices 2360 aligned thereon makes it possible to implement an illuminating device whose thickness and weight can be reduced and that has a high light emitting efficiency and achieves low power consumption.

FIG. 104 is a plan view of a display device that uses an insulating substrate on which the rod-like light-emitting devices 2360 are aligned. As shown in FIG. 104, a display device 2300 has a display unit 2301, a logic circuit unit 2302, a logic circuit unit 2303, a logic circuit unit 2304 and a logic circuit unit 2305 which are formed on the insulating substrate 2310. In the display unit 2301, the rod-like light-emitting devices 2360 are aligned at pixels arranged in a matrix.

FIG. 105 is a circuit diagram of a main part of the display unit 2301 of the display device 2300. The display unit 2301 of the display device 2300, as shown in FIG. 105, includes a plurality of scanning signal lines GL (just one line of which is shown in FIG. 105) intersecting with a plurality of data signal lines SL (just one line of which is shown in FIG. 105). The pixels are arranged in a matrix form, with one pixel placed in a portion enclosed by two adjacent scanning signal lines GL and two adjacent data signal lines SL. The pixel includes a switching element Q1 whose gate is connected to a scanning signal line GL and whose source is connected to a data signal line SL, a switching element Q2 whose gate is connected to the drain of the switching element Q1, a pixel capacitor C of which one end is connected to the gate of the switching element Q2, and a plurality of light emitting diodes D1 to Dn (rod-like light-emitting devices 2360) driven by the switching element Q2.

Polarities of p and n of the rod-like light-emitting devices 2360 are not aligned, but arranged at random. Therefore, at the time of driving, the rod-like light-emitting devices 2360 with different polarities alternately emit light when driven by an AC voltage.

According to the above-described method of manufacturing a display device, the insulating substrate 2350 is produced where an alignment region are formed having as a unit the two electrodes 2351 and 2352 to which independent potentials are respectively to be provided, and a liquid containing the rod-like light-emitting devices 2360 with the size of the order of nanometers or of the order of micrometers is applied onto the insulating substrate 2350. Thereafter, independent voltages are respectively applied to the two electrodes 2351 and 2352 to align the microscopic rod-like light-emitting devices 2360 at positions defined by the two electrodes 2351 and 2352. Thus, the rod-like light-emitting devices 2360 can be easily aligned on the predetermined insulating substrate 2350.

With the above-described method of manufacturing a display device, the amount of semiconductors used can be decreased, and a display device whose thickness and weight can be reduced can be manufactured. The rod-like light-emitting device 2360 emits light from the whole periphery of the semiconductor core covered with the semiconductor layer. As a result, the light emitting region becomes larger. Therefore, a display device that has a high light-emitting efficiency and achieves low power consumption can be implemented.

In Embodiment 38, a potential difference is provided between the two metal electrodes 2351 and 2352 formed on the surface of the insulating substrate 2350, and the rod-like light-emitting devices 2360 are aligned between the metal electrodes 2351 and 2352. However, the alignment is not limited to this. Rod-like light-emitting devices may be aligned at positions defined by the electrodes by forming a third electrode between two electrodes formed on the surface of the insulating substrate, and applying independent voltages to the three electrodes, respectively.

In Embodiment 38, a description has been given of a display device including rod-like light-emitting devices. However, the rod-like light-emitting devices manufactured by the method of manufacturing a rod-like light-emitting device of this invention is not limited to this application, and may be applied other apparatuses such as a backlight and an illuminating device.

(Embodiment 39)

FIG. 106 is a perspective view of a light-emitting apparatus of Embodiment 39 of this invention. The light-emitting apparatus of this Embodiment 39, as shown in FIG. 106, includes an insulating substrate 316, and a rod-like light-emitting device 310 mounted on the insulating substrate 316 such that the longitudinal direction of the rod-like light-emitting device 360 is parallel to the mounting surface of the insulating substrate 316. The rod-like light-emitting device 310 includes a semiconductor core 311 made of n-type GaN having a rod shape whose cross section is nearly hexagonal, a semiconductor layer 312 made of p-type GaN and formed to cover part of the semiconductor core 311. The semiconductor core 311 has, at one end thereof, an exposed portion 311a in which the outer peripheral surface of the semiconductor core 311 is exposed. The end surface of the other end of the semiconductor core 311 is covered with the semiconductor layer 312.

In the rod-like light-emitting device 310 mounted on the insulating substrate 316 such that the longitudinal direction of the rod-like light-emitting device 310 is parallel to the mounting surface of the insulating substrate 316, the outer peripheral surface of the semiconductor layer 312 is in contact with the mounting surface of the insulating substrate 316. Therefore, heat generated in the rod-like light-emitting device 310 can be dissipated with a good efficiency from the semiconductor layer 312 to the insulating substrate 316. Accordingly, even in cases where a plurality of rod-like light-emitting devices are arranged, heat is less likely to be absorbed to the adjacent rod-like light-emitting devices. Therefore, it is possible to implement a light-emitting apparatus having a high light-extraction efficiency and good heat dissipation compared to traditional techniques. In the above-mentioned light-emitting apparatus, the rod-like light-emitting device 310 is arranged to lie on its side on the insulating substrate 316. This allows the whole thickness of the rod-like light-emitting device 310 including the insulating substrate 316 to be decreased.

The rod-like light-emitting device 310 is manufactured as follows.

First, a mask having a growth hole is formed on a substrate made of n-type GaN. Silicon oxide ($SiO_2$), silicon nitride ($Si_3N_4$) or another material that is selectively etchable with respect to the semiconductor core 311 and the semiconductor layer 312 is used as the material for the mask. To form a growth hole, a lithography method and a dry etching method, which are known and used for usual semiconductor processes, can be used.

Next, the semiconductor core 311 shaped like a rod is formed by crystal growth of n-type GaN on the substrate exposed through a growth hole of the mask using a metal organic chemical vapor deposition (MOCVD) device. The temperature of the MOCVD device is set to about 950° C., trimethylgalium (TMG) and ammonia ($NH_3$) are used as growth gases, and silane ($SiH_3$) for n-type impurity supply and further hydrogen ($H_2$) as a carrier gas are supplied, so that the semiconductor core of n-type GaN with Si used as the impurity can be grown. At this point, the diameter of the semiconductor core 311 to be grown can be determined depending on the diameter of the growth hole of the mask. The grown n-type GaN results in a hexagonal crystal growth, and the semiconductor core in the shape of a hexagonal prism is obtained by growing n-type GaN under the condition where a direction perpendicular to the surface of the substrate is the c-axis direction.

Next, a semiconductor layer made of p-type GaN is formed over the whole substrate so that the rod-like semiconductor core 311 is covered with the semiconductor layer. The temperature of the MOCVD device is set to about 960° C., TMG and $NH_3$ are used as growth gases, and bis(cyclopentadienyl) magnesium ($Cp_2Mg$) is used for p-type impurity supply, so that p-type GaN with magnesium (Mg) used as the impurity can be grown.

Next, all of the region except for a portion covering the semiconductor core of the semiconductor layer, and the mask are removed by lift-off to expose the outer peripheral surface on the substrate side of the rod-like semiconductor core 311, so that the exposed portion 311a is formed. In this state, the end surface of the semiconductor core 311 opposite to the substrate is covered with the semiconductor layer 312. In the case where a mask is made of silicon oxide ($SiO_2$) or silicon nitride ($Si_3N_4$), use of a solution containing hydrofluoric acid (HF) enables the mask to be easily etched without affecting the semiconductor core and the semiconductor layer portion covering the semiconductor core, and enables the mask together with the semiconductor layer on the mask (all of the region of the semiconductor layer except for a portion thereof covering the semiconductor core) to be removed by lift-off. In this embodiment, the length of the exposed portion 311a of the semiconductor core 311 is determined depending on the thickness of the removed mask. The lift-off is used in the exposing step of this embodiment; however, part of the semiconductor core may be exposed by etching.

Next, the substrate is immersed in an isopropyl alcohol (IPA) aqueous solution, and is vibrated along the plane of the substrate using ultrasonic waves (e.g., several tens of kilohertz). This causes stress to act on the semiconductor core 311 covered with the semiconductor layer 312 so as to bend the root close to the substrate of the semiconductor core 311 that erects on the substrate. As a result, the semiconductor core 311 covered with the semiconductor layer 312 is separated from the substrate.

In this way, the microscopic rod-like light-emitting device that is separated from the substrate made of n-type GaN can be manufactured. The rod-like light-emitting devices separated from the substrate made of n-type GaN are obtained in a state in which the devices are dispersed in an IPA aqueous solution. This dispersion liquid is applied onto the mounting surface of the insulating substrate 316 and then is dried, so that the rod-like light-emitting devices can be arranged in parallel to the mounting surface of the insulating substrate 316.

Moreover, in the rod-like light-emitting device described above, crystal growth of the semiconductor layer 312 occurs radially outward from the outer peripheral surface of the semiconductor core 311. The growth distance in the radial direction is short and the defect deviates outward, and therefore the semiconductor core 311 can be covered with the semiconductor layer 312 having less crystal defects. Accordingly, a rod-like light-emitting device having good characteristics can be implemented.

According to a rod-like light-emitting device having the above configuration, the semiconductor layer 312 made of p-type GaN is formed to cover the semiconductor core 11 shaped like a rod and made of n-type GaN, and to expose the outer peripheral surface of part of the semiconductor core 311. This makes it possible to connect the exposed portion 311a of the semiconductor core 311 to an n-side electrode and to connect a p-side electrode to a portion of the semiconductor layer 312 with which the semiconductor core 311 is covered, even when the rod-like light-emitting device is microscopic and has a size of the order of micrometers or of the order of nanometers. In the rod-like light-emitting device, with the n-side electrode connected to the exposed portion 311a of the semiconductor core 311 and with the p-side electrode connected to the semiconductor layer 312, a current is caused to flow from the p-side electrode to the n-side electrode to result in recombination of electrons and holes in a pn junction between the outer peripheral surface of the semiconductor core 311 and the inner peripheral surface of the semiconductor layer 312. Thus, light is emitted from the pn junction. In this rod-like light-emitting device, light is emitted from the whole periphery of the semiconductor core 311 covered with the semiconductor layer 312. The light emitting region therefore becomes larger, which results in a high light emitting efficiency. Accordingly, it is possible to implement a microscopic rod-like light-emitting device that allows electrode connections to be easily made with a simple configuration and has a high light emitting efficiency. The above rod-like light-emitting device is not integral with the substrate, which allows great freedom in installing into an apparatus.

The microscopic rod-like light-emitting device as used herein is a device, for example, in micrometer order size with a diameter of 1 μm and a length in the range of from 10 μm to 30 μm, or in nanometer order size in which at least the diameter of the diameter and the length of 1 μm or less. The rod-like light-emitting device mentioned above allows a decrease in the amount of semiconductors used. This makes it possible to reduce the thickness and weight of an apparatus using the light-emitting device, and to implement a backlight, an illuminating device and a display device that have high light emitting efficiencies and achieve low power consumption.

The outer peripheral surface of the region covered with the semiconductor layer 312 of the semiconductor core 311 and the outer peripheral surface of the exposed region of the semiconductor core 311 are continuous with each other such that the exposed region of the semiconductor core 311 is thinner than the outer diameter of the semiconductor layer 312, and therefore, in the manufacturing step, the side of the substrate of the exposed region of the semiconductor core 311 becomes more likely to be broken on the substrate side in the exposed region of the semiconductor core 311, which facilitates manufacturing.

The outer peripheral surface on one side of the above semiconductor core 311 is exposed, for example, by about 5 μm. This makes it possible to easily connect one electrode (interconnection) to the exposed portion 311a of the outer peripheral surface of the semiconductor core 311 and connect the electrode (interconnection) to the semiconductor layer 312 on the other side of the semiconductor core 311 using known semiconductor processes having normal processing accuracy, such as a lift-off method and a nanoimprint method. Therefore, connections can be made with the electrodes separate from each other in both ends. Thus, the electrode connected to the semiconductor layer 312 and the exposed portion of the semiconductor core 311 can easily be prevented from becoming short-circuited to each other.

The end surface of the other end of the semiconductor core 311 is covered with the semiconductor layer 312. This makes it possible to easily connect the electrode to the portion of the semiconductor layer 312 covering the end surface of the semiconductor core 311 opposite to the exposed portion 311a, without causing the electrode to be short-circuited to the semiconductor core 311. In this way, electrodes can easily be connected to both ends of the microscopic rod-like light-emitting device.

The outer peripheral surface of the region covered with the semiconductor layer 312 of the semiconductor core 311 and the outer peripheral surface of the exposed region of the semiconductor core 311 are continuous with each other such that the exposed region of the semiconductor core 311 is thinner than the outer diameter of the semiconductor layer 312, and therefore, in the manufacturing step, the side of the substrate of the exposed region of the semiconductor core 311 becomes more likely to be broken on the substrate side in the exposed region of the semiconductor core 311 that erects on the substrate, which facilitates manufacturing.

(Embodiment 40)

FIG. 107 is a perspective view of a light-emitting apparatus of Embodiment 40 of this invention. The light-emitting apparatus of this Embodiment 40, as shown in FIG. 107, includes an insulating substrate 326, and a rod-like light-emitting device 320 mounted on the insulating substrate 326 such that the longitudinal direction of the rod-like light-emitting device 320 is parallel to the mounting surface of the insulating substrate 326. The rod-like light-emitting device 320 includes a semiconductor core 321 made of n-type GaN having a rod shape whose cross section is nearly hexagonal, a quantum well layer 322 made of p-type InGaN and formed to cover part of the semiconductor core 321, and a semiconductor layer 323 made of p-type GaN and formed to cover the quantum well layer 322. The semiconductor core 321 has, at one end thereof, an exposed portion 321a in which the outer peripheral surface of the semiconductor core 311 is exposed. The end surface of the other end of the semiconductor core 321 is covered with the quantum well layer 322 and the semiconductor layer 323.

In the above-described light-emitting apparatus of Embodiment 40, like the rod-like light-emitting device of the light-emitting apparatus of Embodiment 39, the semiconductor core 321 shaped like a rod is formed by crystal growth of n-type GaN on the substrate made of n-type GaN using a MOCVD device.

The above-described light-emitting apparatus of Embodiment 40 has effects similar to those of the light-emitting apparatus of Embodiment 39.

The quantum well layer 322 is formed between the semiconductor core 321 and the semiconductor layer 323. As a result, due to quantum confinement effects of the quantum well layer 322, the light emitting efficiency can further be improved. After the semiconductor core 321 of n-type GaN has been grown in the MOCVD device as described above, the set temperature is changed from 600° C. to 800° C. in accordance with the wavelength of emitted light, and nitrogen ($N_2$) is supplied to the carrier gas and TMG, $NH_3$ and trimethylindium (TMI) are supplied to the growth gas. In this way, the InGaN quantum well layer 322 can be formed on the semiconductor core 321 of n-type GaN. Thereafter, further, the set temperature is changed to 960° C., and TMG and $NH_3$ are used as the growth gases as mentioned above, and $Cp_2Mg$ is used for p-type impurity supply. In this way, the semiconductor layer 323 made of p-type GaN can be formed. Note that the quantum well layer may have a p-type AlGaN layer as an electron block layer inserted between the InGaN layer and the p-type GaN layer, and may also have a multiple quantum well structure in which barrier layers of GaN and quantum well layers of InGaN are alternately laminated.

(Embodiment 41)

FIG. 108 is a perspective view of a light-emitting apparatus of Embodiment 41 of this invention. The light-emitting apparatus of this Embodiment 41, as shown in FIG. 108, includes an insulating substrate 336, and a rod-like light-emitting device 330 mounted on the insulating substrate 336 such that the longitudinal direction of the rod-like light-emitting device 360 is parallel to the mounting surface of the insulating substrate 336. The rod-like light-emitting device 330 includes a semiconductor core 331 made of n-type GaN and having a rod shape whose cross section is nearly hexagonal, a semiconductor layer 332 made of p-type GaN and formed to cover part of the semiconductor core 331, and a transparent electrode 333 formed to cover the semiconductor layer 332. The semiconductor core 331 has, at one end thereof, an exposed portion 331a in which the outer peripheral surface of the semiconductor core 331 is exposed. The end surface of the other end of the semiconductor core 331 is covered with the semiconductor layer 332 and the transparent electrode 333. The transparent electrode 333 is formed of tin-doped indium oxide (ITO) having a thickness of 200 nm. After the formation up to the semiconductor layer 332 made of p-type GaN using the MOCVD device, the rod-like light-emitting device 330 together with the substrate made of n-type GaN is transferred from the MOCVD device to a vapor deposition device or a sputtering device, and an ITO film is deposited to cover the semiconductor layer 332. After the deposition of the ITO film, heat treatment is performed at a temperature of from 500° C. to 600° C., which makes it possible to decrease the resistance between the semiconductor layer 332 made of p-type GaN and the transparent electrode 333 made of ITO. Note that the transparent electrode is not limited to this, and a laminated metal film of, for example, Ag/Ni having a thickness of 5 nm. For the deposition of the laminated metal film Ag/Ni, a vapor-deposition method or a sputtering method can be used. In order to further decrease the resistance of the electrode layers, a laminated metal film of Ag/Ni may be formed after the deposition of the ITO film.

Connecting an electrode (or interconnection) to an end of the transparent electrode 333 far from the exposed portion 331a of the semiconductor core 331 can easily prevent short-circuiting between the electrode and the semiconductor core 331, and the electrode (or interconnection) connected to the transparent electrode 333 can be thick to enable heat to be dissipated with a good efficiency through the electrode (or interconnection).

In the rod-like light-emitting device 330, an n-side electrode (not shown) is connected to the exposed portion 331a of the semiconductor core 331, and a p-side electrode (not shown) is connected to the transparent electrode 334 on the other side. The p-side electrode is connected to an end of the transparent electrode 333, and therefore the area obtained by shielding the light emitting region by the electrodes can be minimized to increase the light-extraction efficiency.

In the above rod-like light-emitting device of Embodiment 41, like the rod-like light-emitting device of the light-emitting apparatus of Embodiment 39, the semiconductor core 331 shaped like a rod is formed by crystal growth of n-type GaN on the substrate made of n-type GaN using a MOCVD device.

The above-described light-emitting apparatus of Embodiment 41 has effects similar to those of the light-emitting apparatus of Embodiment 39.

Forming the transparent electrode 333 to cover the semiconductor layer 332 causes the semiconductor layer 332 to be connected through the transparent electrode 333 to the electrode. This allows a wide current path to be formed without a current being concentrated to an electrode connection portion and being unbalanced, so that the whole device can emit light. Thus, the light emitting efficiency is further improved. In particular, with a configuration of a semiconductor core made of an n-type semiconductor and a semiconductor layer made of a p-type semiconductor, the semiconductor layer made of the p-type semiconductor is less likely to increase the impurity concentration, and the resistance is high. Therefore, a current is likely to be concentrated to the electrode connection portion. However, the transparent electrode allows a wide current path to be formed. This enables the whole device to emit light. Thus, the light emitting efficiency is further improved.

(Embodiment 42)

FIG. 109 is a perspective view of a light-emitting apparatus of Embodiment 42 of this invention. The light-emitting apparatus of this Embodiment 42, as shown in FIG. 109, includes an insulating substrate 346, and a rod-like light-emitting device 340 mounted on the insulating substrate 346 such that the longitudinal direction of the rod-like light-emitting device 340 is parallel to the mounting surface of the insulating substrate 346. The rod-like light-emitting device 340 includes a semiconductor core 341 made of n-type GaN and having a rod shape whose cross section is nearly hexagonal, a quantum well layer 342 made of p-type InGaN and formed to cover part of the semiconductor core 341, a semiconductor layer 343 made of p-type GaN and formed to cover the quantum well layer 342, and a transparent electrode 344 formed to cover the semiconductor layer 343. The semiconductor core 341 has, at one end thereof, an exposed portion 341a in which the outer peripheral surface of the semiconductor core 341 is exposed. The end surface of the other end of the semiconductor core 341 is covered with the quantum well layer 342, the semiconductor layer 343 and the transparent electrode 344. The transparent electrode 344 is formed of tin-doped indium oxide (ITO). Note that the transparent electrode is not limited to this, and a laminated metal film of, for example, Ag/Ni having a thickness of 5 nm.

Connecting an electrode (or interconnection) to an end of the transparent electrode 344 far from the exposed portion 341a of the semiconductor core 341 can easily prevent the electrode from being short-circuited to the side of the semiconductor core 341, and the electrode (or interconnection) connected to the transparent electrode 344 can be made thick or the cross-sectional area of the electrode can be increased. Therefore, heat can be dissipated with a good efficiency through the electrode (or interconnection).

In the rod-like light-emitting device 340, an n-side electrode (not shown) is connected to the exposed portion 341a of the semiconductor core 341, and a p-side electrode (not shown) is connected to the transparent electrode 344 on the other side. The p-side electrode is connected to an end of the transparent electrode, and therefore the area obtained by shielding the light emitting region by the electrodes can be minimized. As a result, the light-extraction efficiency can be increased.

In the above rod-like light-emitting device of Embodiment 42, like the rod-like light-emitting device of the light-emitting apparatus of Embodiment 39, the semiconductor core 341 shaped like a rod is formed by crystal growth of n-type GaN on the substrate made of n-type GaN using a MOCVD device.

The above-described light-emitting apparatus of Embodiment 42 has effects similar to those of the light-emitting apparatus of Embodiment 40.

Forming the transparent electrode 344 to cover the semiconductor layer 343 allows the semiconductor layer 343 to be connected through the transparent electrode 344 to the p-side electrode. This allows a wide current path to be formed without a current being concentrated to an electrode connection portion and being unbalanced, so that the whole device can emit light. Thus, the light emitting efficiency is further improved. In particular, with a configuration of a semiconductor core made of an n-type semiconductor and a semiconductor layer made of a p-type semiconductor, the semiconductor layer made of the p-type semiconductor is less likely to increase the impurity concentration, and the resistance is high. Therefore, a current is likely to be concentrated to the electrode connection portion. However, the transparent electrode allows a wide current path to be formed. This enables the whole device to emit light. Thus, the light emitting efficiency is further improved.

(Embodiment 43)

FIG. 110 is a side view of a light-emitting apparatus of Embodiment 43 of this invention. The light-emitting apparatus of this Embodiment 43, as shown in FIG. 110, includes an insulating substrate 356, and a rod-like light-emitting device 350 mounted on the insulating substrate 356 such that the longitudinal direction of the rod-like light-emitting device 350 is parallel to the mounting surface of the insulating substrate 356. The rod-like light-emitting device 350 includes a semiconductor core 351 made of n-type GaN and having a rod shape whose cross section is nearly hexagonal, a semiconductor layer 352 made of p-type GaN and formed to cover part of the semiconductor core 351, and a transparent electrode 353 formed to cover the semiconductor layer 352. The semiconductor core 351 has, at one end thereof, an exposed portion 351a in which the outer peripheral surface of the semiconductor core 351 is exposed. A metal layer 354 made of Al is formed on the transparent electrode 353 and on the side of the insulating substrate 356. The metal layer 354 covers about the lower half of the outer peripheral surface of the transparent electrode 353. The end surface of the other end of the semiconductor core 351 is covered with the semiconductor layer 352 and the transparent electrode 353. The transparent electrode 353 is formed of ITO. Note that the transparent electrode is not limited to this, and a laminated metal film of, for example, Ag/Ni having a thickness of 5 nm. The material used for the metal layer 354 is not limited to Al, and Cu, W, Ag, Au and the like may be used. In the above-described light-emitting apparatus of Embodiment 43, like the rod-like light-emitting device of the light-emitting apparatus of Embodiment 41, the semiconductor core 351 shaped like a rod is formed by crystal growth of n-type GaN on the substrate made of n-type GaN using a MOCVD device. After the formation up to the semiconductor layer 352 made of p-type GaN in the MOCVD device, the rod-like light-emitting device is transferred to a vapor deposition device, and the transparent electrode 353 made of ITO is formed to cover the semiconductor layer 352. Heat treatment is performed at a temperature of from 500° C. to 600° C. after the deposition of the ITO film. Then, the transfer to a vapor deposition device is made, and an Al film is deposited to cover the transparent electrode 353. Subsequently, like Embodiment 39, the semiconductor layer, the transparent electrode and the Al layer that cover the semiconductor core, and a mask are removed by lift-off to expose part of the semiconductor core 351, and then the rod-like light-emitting device is separated from the substrate made of n-type GaN utilizing ultrasonic waves. The longitudinal direction of the rod-like light-emitting device is arranged in parallel to the mounting surface of the insulating substrate 356. Further, of the metal layer made of Al, a portion that is on the transparent electrode 353 and is not on the side of the insulating substrate 356 is etched back by isotropic dry etching, so that the metal layer 354 covering about the lower half of the outer peripheral surface of the transparent electrode 353 can be formed. As the etch-back of the metal layer made of Al, a known Al dry etching method for use in semiconductor processes can be used.

The above-described light-emitting apparatus of Embodiment 43 has effects similar to those of the light-emitting apparatus of Embodiment 41.

Due to the metal layer 354 formed on the transparent electrode 353 and on the side of the insulating substrate 356, light emitted from the rod-like light-emitting device 350 toward the insulating substrate 356 is reflected from the metal layer 354. Therefore, the light-extraction efficiency is improved.

(Embodiment 44)

FIG. 111 is a side view of a light-emitting apparatus of Embodiment 44 of this invention. The light-emitting apparatus of this Embodiment 44, as shown in FIG. 111, includes an insulating substrate 366, and a rod-like light-emitting device 360 mounted on the insulating substrate 366 such that the longitudinal direction of the rod-like light-emitting device 360 is parallel to the mounting surface of the insulating substrate 366. The rod-like light-emitting device 360 includes a semiconductor core 361 made of n-type GaN and having a rod shape whose cross section is nearly hexagonal, a quantum well layer 362 made of p-type InGaN and formed to cover part of the semiconductor core 361, a semiconductor layer 363 made of p-type GaN and formed to cover the quantum well layer 362, and a transparent electrode 364 formed to cover the semiconductor layer 363. The semiconductor core 361 has, at one end thereof, an exposed portion 361a in which the outer peripheral surface of the semiconductor core 361 is exposed. A metal layer 365 made of Al is formed on the transparent electrode 364 and on the side of the insulating substrate 366. The metal layer 365 covers about the lower half of the outer peripheral surface of the transparent electrode 364. The transparent electrode 364 is formed of ITO. Note that the transparent electrode is not limited to this, and a laminated metal film of, for example, Ag/Ni having a thickness of 5 nm. The material used for the metal layer 365 is not limited to Al, and Cu, W, Ag, Au and the like may be used.

FIG. 112 is a cross-sectional view of the above-described light-emitting apparatus, in which the end surface of the other end of the semiconductor core 361 is covered with the quantum well layer 362, the semiconductor layer 363 and the transparent electrode 364.

The above-described light-emitting apparatus of Embodiment 44 has effects similar to those of the light-emitting apparatus of Embodiment 42.

Due to the metal layer 365 formed on the transparent electrode 364 and on the side of the insulating substrate 366, light emitted from the rod-like light-emitting device 360 toward the insulating substrate 366 is reflected from the metal layer 365. Therefore, the light-extraction efficiency is improved.

While n-type GaN doped with Si and p-type GaN doped with Mg are used in Embodiments 39 to 44 described above, impurities for doping GaN are not limited to this case. For the n type, Ge and the like can be used, and for the p type, Zn and the like can be used.

In Embodiments 39 to 44, descriptions have been given of a rod-like light-emitting device that includes a semiconductor core having a rod shape whose cross section is nearly hexagonal. This invention is not limited to this. The cross section of the rod shape may be circular or ellipsoidal, and this invention may be applied to a rod-like light-emitting device that includes a semiconductor core having a rod shape whose cross section is in the shape of another polygon such as a triangle. Depending on growth conditions such as a growth direction and a growth temperature, the shape of the cross section tends to be nearly circular in cases where the semiconductor core to be grown has a small diameter in the range of from several tens of nanometers to several hundreds of nanometers. In cases where the diameter is large in the range of from about 0.5 μm to several hundreds of micrometers, it becomes easier to grow the semiconductor core whose cross section is nearly hexagonal.

For example, as shown in FIG. 113, a rod-like light-emitting device 370 includes a semiconductor core 371 made of n-type GaN and having a rod shape whose cross section is nearly circular, and a semiconductor layer 372 made of p-type GaN and formed to cover part of the semiconductor core 371, and a transparent electrode 373 formed to cover the semiconductor layer 372. The semiconductor core 371 has, at one end thereof, an exposed portion 371a in which the outer peripheral surface of the semiconductor core 371 is exposed. A metal layer 374 made of Al is formed on the transparent electrode 373 and on the side of a substrate 376. The end surface of the other end of the semiconductor core 371 is covered with the semiconductor layer 372 and the transparent electrode 373.

As shown in FIG. 114, a rod-like light-emitting device 380 includes a semiconductor core 381 made of n-type GaN and having a rod shape whose cross section is nearly circular, a quantum well layer 382 made of p-type InGaN and formed to cover part of the semiconductor core 381, a semiconductor layer 383 made of p-type GaN and formed to cover the quantum well layer 382, and a transparent electrode 384 formed to cover the semiconductor layer 383. The semiconductor core 381 has, at one end thereof, an exposed portion 381a in which the outer peripheral surface of the semiconductor core 381 is exposed. A metal layer 385 made of Al is formed on the transparent electrode 384 and on the side of a substrate 386. The end surface of the other end of the semiconductor core 381 is covered with the quantum well layer 382, the semiconductor layer 383 and the transparent electrode 384.

(Embodiment 45)

FIG. 115 is a side view of a light-emitting apparatus of Embodiment 45 of this invention, and FIG. 116 is a perspective view of the light-emitting apparatus. In this Embodiment 45, any one of the rod-like light-emitting devices of the light-emitting apparatuses of Embodiments 1 to 44 described above is used. FIG. 116 shows a rod-like light-emitting device having the same configuration as the rod-like light-emitting device of the light-emitting apparatus of Embodiment 40.

The light-emitting apparatus of this Embodiment 45, as shown in FIGS. 115 and 116, includes an insulating substrate 450 on which metal electrodes 451 and 452 are formed on a mounting surface, and a rod-like light-emitting devices 460 mounted on the insulating substrate 450 such that the longitudinal direction of the rod-like light-emitting device 460 is parallel to a mounting surface of the insulating substrate 450.

The rod-like light-emitting device 460, as shown in FIG. 116, includes a semiconductor core 471 made of n-type GaN and having a rod shape whose cross section is nearly hexagonal, a quantum well layer 472 made of p-type InGaN and formed to cover part of the semiconductor core 471, and a semiconductor layer 473 made of p-type GaN and formed to cover the quantum well layer 472. In the semiconductor core 471, an exposed portion 471a is formed. In the exposed portion 471a, the outer peripheral surface of the semiconductor core 471 is exposed. The end surface of the other end of the semiconductor core 471 is covered with the quantum well layer 472 and the semiconductor layer 473.

As shown in FIG. 115 and FIG. 116, the exposed portion 471a on one side of the rod-like light-emitting device 460 is connected to the metal electrode 451, and the semiconductor layer 473 on the other side of the rod-like light-emitting device 460 is connected to the metal electrode 452. Here, in the rod-like light-emitting device 460, its central portion is deformed to come in contact with the insulating substrate 450. This deformation is caused by stiction that occurs when a droplet contracts in a clearance between the substrate surface and the rod-like light-emitting device because of vaporization during drying of an IPA aqueous solution.

Next, a backlight, an illuminating device and a display device including light-emitting apparatuses in which the rod-like light-emitting devices 460 are aligned on the insulating substrate 450 are described. The rod-like light-emitting devices are aligned using a technique according to an invention entitled "Method for aligning microscopic structures and substrate having microscopic structures aligned, as well as integrated circuit apparatus and display element", for which Japanese Patent Application No. 2007-102848 (as published under JP 2008-260073 A) was filed by the Assignee of the present invention.

FIG. 117 is a plan view of an insulating substrate for use in a backlight, an illuminating device and a display device of this Embodiment 45. As shown in FIG. 117, metal electrodes 451 and 452 are formed on the surface of an insulating substrate 450. The insulating substrate 450 may be formed of an insulator, such as glass, ceramic, aluminum oxide or resin, or may be a substrate wherein a silicon oxide film is formed on a surface of a semiconductor such as silicon so that the surface of the substrate has insulating properties. In the case of using a glass substrate, it is desirable that an underlying insulating film such as a silicon oxide film or a silicon nitride film be formed on the surface of the substrate.

The metal electrodes 451 and 452 are formed in desired electrode shapes utilizing a printing technique. Note that the metal electrodes 451 and 452 may be formed by depositing a metal film and a photosensitive film over the substrate, then exposing the photosensitive film in a desired electrode pattern, and etching the films.

Pads, which are omitted in FIG. 117, are formed for the metal electrodes 451 and 452 so that potentials can be provided from the outside. The rod-like light-emitting devices are aligned in portions where the metal electrodes 451 and 452 face each other (alignment regions). While 2 by 2 alignment regions in which the rod-like light-emitting devices are to be aligned are shown in FIG. 117, any number of regions may be arranged.

FIG. 118 is a schematic cross-sectional view as taken along the line 118-118 in FIG. 117.

First, as shown in FIG. 118, isopropyl alcohol (IPA) 161 containing the rod-like light-emitting devices 460 is thinly applied onto the insulating substrate 450. Instead of the IPA 361, ethylene glycol, propylene glycol, methanol, ethanol and acetone or a mixture thereof may be used. Alternatively, instead of the IPA 361, a liquid made of another organic substance, water and the like can be used.

However, if a large current flows between the metal electrodes 451 and 452 through the liquid, a desired voltage difference cannot be applied across the metal electrodes 451 and 452. In such a case, the whole surface of the insulating substrate 450 may be coated with an insulating film of from about 10 to 30 nm so that the metal electrodes 451 and 452 are covered.

The thickness at which the IPA 161 containing the rod-like light-emitting devices 460 is applied is a thickness that allows movement of the rod-like light-emitting devices 460 in the liquid so that the rod-like light-emitting devices 460 can be aligned in the subsequent step of aligning the rod-like light-emitting devices 460. Accordingly, the thickness of the applied IPA 161 is equal to or larger than the thickness of the rod-like light-emitting device 460, and ranges, for example, from several micrometers to several millimeters. In cases where the thickness of the applied IPA is too small, it becomes difficult for the rod-like light-emitting devices 460 to move, whereas in cases where the thickness is too large, time for drying the liquid becomes long. The amount of the rod-like light-emitting device 460 relative to the amount of IPA is preferably in the range of from $1\times10^4/\text{cm}^3$ to $1\times10^7/\text{cm}^3$.

In order to apply the IPA 161 containing the rod-like light-emitting devices 460, a frame is formed in the outer periphery of the metal electrodes where the rod-like light-emitting devices 460 are to be aligned, and the frame may be filled with the IPA 161 containing the rod-like light-emitting devices 460 so that the applied IPA has a desired thickness. However, in cases where the IPA 161 containing the rod-like light-emitting devices 460 has viscosity, the IPA 161 can be applied to a desired thickness without requiring the frame.

It is desirable for the aligning step for the rod-like light-emitting devices 460 that a liquid such as IPA, ethylene glycol, propylene glycol, . . . , or a mixture thereof, or a liquid made of another organic substance or water have a viscosity as low as possible, and be likely to be evaporated by heat.

Next, a potential difference is applied across the metal electrodes 451 and 452. In this Embodiment 38, a potential difference of 1 V is appropriate. A potential difference in the range of from 0.1 to 10 V may be applied across the metal electrodes 451 and 452. However, in the case of a potential difference of 0.1 V or less, the alignment of rod-like light-emitting devices 460 is poor. In the case of a potential difference of 10 V or more, insulation between the metal electrodes becomes problematic. Accordingly, the potential difference is preferably in the range of from 1 V to 5 V, and more preferably about 1 V.

FIG. 119 shows the principle of aligning the rod-like light-emitting devices 460 on the metal electrodes 451 and 452. As shown in FIG. 119, when a potential $V_L$ is applied to the metal electrode 451, and a potential $V_R$ ($V_L<V_R$) is applied to the metal electrode 452, negative charge is induced on the metal electrode 451, and positive charge is induced on the metal electrode 452. As the rod-like light-emitting device 460 approaches the electrodes, positive charge is induced on a side close to the metal electrode 451 of the rod-like light-emitting device 460, and negative charge is induced on a side close to the metal electrode 2352 of the rod-like light-emitting device 460. This induction of charges in the rod-like light-emitting device 2360 is due to electrostatic induction. That is, in the rod-like light-emitting device 460 placed in an electric field, charges are induced on its surface until the electric field inside the device is zero. As a result, attraction due to the electrostatic force acts between the electrodes and the rod-like light-emitting devices 460, and therefore the rod-like light-emitting devices 460 are aligned along the line of electric force between the metal electrodes 451 and 452. Charges induced on the rod-like light-emitting devices 460 are nearly the same, and therefore the rod-like light-emitting devices 460 are regularly aligned in a fixed direction at nearly regular intervals because of repulsive forces due to charges. However, regarding the rod-like light-emitting devices shown in FIG. 106 of Embodiment 39, for example, the orientations of the exposed portions 311a of the semiconductor cores 311 are not fixed, but in a random fashion (This is true with the rod-like light-emitting devices in other embodiments and modifications).

As described above, charges are generated in the rod-like light-emitting device 2360 by an external electric field generated between the metal electrodes 2351 and 2352, and the force of attraction of charges causes the rod-like light-emitting device 2360 to be adsorbed to the metal electrodes 2351 and 2352. Therefore, the size of the rod-like light-emitting device 2360 need be large enough to allow the rod-like light-emitting device 2360 to move or migrate in the liquid. Accordingly, the size of the rod-like light-emitting device 2360 should be selected in accordance with the amount (thickness) of the applied liquid. In cases where the amount of applied liquid is small, the rod-like light-emitting device 2360 needs to have a size in the order of nanometers. In contrast, in cases where the amount of applied liquid is large, the rod-like light-emitting device 2360 may have a size of the order of micrometers.

In cases where the rod-like light-emitting devices 460 are not electrically neutral but positively or negatively charged, just applying a static potential difference (DC) across the metal electrodes 451 and 452 would not make it possible to stably align the rod-like light-emitting devices 460. For example, in cases where the rod-like light-emitting devices 460 are positively charged as a whole, attraction between the devices and the metal electrode 2352 on which positive charge is induced becomes relatively weak. Therefore, the alignment of the rod-like light-emitting devices 460 becomes asymmetrical.

In such a case, as shown in FIG. 120, it is preferable that an AC voltage be applied across the metal electrodes 451 and 452. In FIG. 120, a reference potential is applied to the metal electrode 451, and an alternating current (AC) voltage with an amplitude of $V_{PPL}/2$ is applied to the metal electrode 452. In this way, even in cases where the rod-like light-emitting devices 460 are charged, the alignment can be kept symmetrical. Note that the frequency of the AC voltage applied to the metal electrode 452 in this case is preferably in the range of from 10 Hz to 1 MHz, and more preferably in the range of from 50 Hz to 1 kHz in which the alignment is most stable. Moreover, the AC voltage applied across the metal electrodes 2351 and 2352 is not limited to being a sine wave, and may be a periodically varying wave, such as a rectangular wave, a triangular wave or a saw wave. Note that $V_{PPL}$ is preferably about 1 V.

Next, the rod-like light-emitting devices 460 are aligned and arranged on the metal electrodes 451 and 452, and then the insulating substrate 450 is heated, so that the liquid is evaporated and dried. The rod-like light-emitting devices 460 are aligned and arranged and adhered along the lines of electric force between the metal electrodes 451 and 452 at regular intervals.

According to the above-described method of manufacturing a light-emitting apparatus, the insulating substrate 450 is produced where an alignment region are formed having as a unit the two electrode 451 and 452 to which independent potentials are respectively to be provided, and a liquid containing the rod-like light-emitting devices 460 in a size of the order of nanometers or micrometers is applied on the insulating substrate 450. Thereafter, independent voltages are respectively applied to the two electrodes 451 and 452 to align the microscopic rod-like light-emitting devices 460 at positions defined by the two electrodes 451 and 452. Thus, the rod-like light-emitting devices 460 can be easily aligned on the predetermined insulating substrate 450.

With the above-described method of manufacturing a light-emitting apparatus, the amount of semiconductors used can be decreased, and a light-emitting apparatus whose thickness and weight can be reduced can be manufactured. In the rod-like light-emitting device 460, light is emitted from the whole periphery of the semiconductor core covered with the semiconductor layer to result in expansion of the light emitting region. Therefore, a light-emitting apparatus that has a high light-emitting efficiency, achieves low power consumption, and has a good heat dissipation can be implemented.

FIG. 121 is a plan view of the insulating substrate 450 on which the rod-like light-emitting devices 460 are aligned. The insulating substrate 450 on which the rod-like light-emitting devices 460 are aligned is used for a backlight of a liquid crystal display device or the like. This makes it possible to implement a backlight whose thickness and weight can be reduced and that has a high light emitting efficiency and achieves low power consumption. Also, using as an illuminating device the insulating substrate 450 having the rod-like light-emitting devices 460 aligned thereon makes it possible to implement an illuminating device whose thickness and weight can be reduced and that has a high light emitting efficiency and achieves low power consumption.

FIG. 122 is a plan view of a display device that uses an insulating substrate on which the rod-like light-emitting devices 460 are aligned. As shown in FIG. 122, a display device 3300 has a display unit 2301, a logic circuit unit 3302, a logic circuit unit 3303, a logic circuit unit 3304 and a logic circuit unit 3305 which are formed on the insulating substrate 3310. In the display unit 3301, the rod-like light-emitting devices 460 are aligned at pixels arranged in a matrix.

FIG. 123 is a circuit diagram of a main part of the display unit 3301 of the display device 3300. The display unit 3301 of the display device 3300, as shown in FIG. 123, includes a plurality of scanning signal lines GL (just one line of which is shown in FIG. 123) intersecting with a plurality of data signal lines SL (just one line of which is shown in FIG. 123). The pixels are arranged in a matrix form, with one pixel placed in a portion enclosed by two adjacent scanning signal lines GL and two adjacent data signal lines SL. The pixel includes a switching element Q1 whose gate is connected to a scanning signal line GL and whose source is connected to a data signal line SL, a switching element Q2 whose gate is connected to the drain of the switching element Q1, a pixel capacitor C of which one end is connected to the gate of the switching element Q2, and a plurality of light emitting diodes D1 to Dn (rod-like light-emitting devices 460) driven by the switching element Q2.

Polarities of p and n of the rod-like light-emitting devices 460 are not aligned, but arranged at random. Therefore, at the time of driving, the rod-like light-emitting devices 460 with different polarities alternately emit light when driven by an AC voltage.

(Embodiment 46)

FIG. 124 is a side view of a light-emitting apparatus of Embodiment 46 of this invention, and FIG. 125 is a perspective view of the light-emitting apparatus. In this Embodiment 46, any one of the rod-like light-emitting devices of the light-emitting apparatuses of Embodiments 39 to 45 described above is used. FIG. 125 shows a rod-like light-emitting device having the same configuration as the rod-like light-emitting device of the light-emitting apparatus of Embodiment 40.

The light-emitting apparatus of this Embodiment 46, as shown in FIG. 124 and FIG. 125, includes an insulating substrate 450 having metal electrodes 461 and 462 formed on a mounting surface thereof, and a rod-like light-emitting device 460 mounted on the insulating substrate 450 such that the longitudinal direction of the rod-like light-emitting device 460 is parallel to a mounting surface of the insulating substrate 450. On the insulating substrate 450, a third metal electrode 463, as one example of the metal portion, is formed between the metal electrodes 461 and 462 on the insulating substrate 450 and below the rod-like light-emitting device 460. FIG. 125 shows only parts of the metal electrodes 461, 462 and 463.

The rod-like light-emitting device 460, as shown in FIG. 125, includes a semiconductor core 471 made of n-type GaN and having a rod shape whose cross section is nearly hexagonal, a quantum well layer 472 made of p-type InGaN and formed to cover part of the semiconductor core 471, and a semiconductor layer 473 made of p-type GaN and formed to cover the quantum well layer 472. In the semiconductor core 471, an exposed portion 471a is formed. In the exposed portion 471a, the outer peripheral surface of the semiconductor core 471 is exposed. The end surface of the other end of the semiconductor core 471 is covered with the quantum well layer 472 and the semiconductor layer 473.

As shown in FIG. 124 and FIG. 125, the exposed portion 471a on one side of the rod-like light-emitting device 460 is connected to the metal electrode 461, and the semiconductor layer 473 on the other side of the rod-like light-emitting device 460 is connected to the metal electrode 462. Here, a central portion of the rod-like light-emitting device 460 is connected to the metal electrode 463.

Both ends of the rod-like light-emitting device 460 are connected to the metal electrodes 461 and 462 that are formed with a predetermined spacing therebetween on the insulating substrate 450, and the metal portion is formed between the metal electrodes 461 and 462 and below the rod-like light-emitting device 460 on the insulating substrate 450, so that the central side of the rod-like light-emitting device 460 whose both ends are connected to the metal electrodes 461 and 462 is supported by bringing the central side into contact with the surface of the third metal electrode 463. As a result, the rod-like light-emitting device 460, which is connected at both ends, is supported by the metal electrode 463, without being deformed, and heat generated in the rod-like light-emitting device 460 can be dissipated with a good efficiency from the semiconductor layer 473 through the metal electrode 463 to the insulating substrate 450.

Note that, as shown in FIG. 126, the metal electrodes 461 and 462 have base portions 461a and 462a that are nearly parallel to each other with a predetermined spacing therebetween, and a plurality of electrode portions 461b and 462b extending between the base portions 461a and 462a from positions facing each other of the base portions 461a and 462a, respectively. One rod-like light-emitting device 460 is aligned with the electrode portion 461b of the metal electrode 461 and the electrode portion 462b of the metal electrode 462 opposite thereto. Between the electrode portion 461b of the metal electrode 461 and the electrode portion 462b of the metal electrode 462 opposite thereto, the third metal electrode 463 in the shape of a butterfly whose central portion is narrow is formed on the insulating substrate 450.

The third metal electrodes 463 adjacent to one another are electrically separated. As shown in FIG. 126, even in the case where the orientations of the rod-like light-emitting devices 460 adjacent to each other are reversed, the metal electrode 461 and the metal electrode 462 can be prevented from becoming short-circuited to each other through the metal electrode 463.

In Embodiments 39 to 46 described above, descriptions have been given of the rod-like light-emitting devices having the exposed portions 311a, 321a, 331a, 341a, 351a, 361a, 371a, 381a and 471a where the outer peripheral surfaces on one side of the semiconductor cores 311, 321, 331, 341, 351, 361, 371, 381 and 471 are exposed. However, the rod-like light-emitting device is not limited to these devices, and may have an exposed portion where the outer peripheral surfaces on both ends of a semiconductor core are exposed, and may have an exposed portion where the outer peripheral surface of a central portion of the semiconductor core is exposed.

In Embodiments 39 to 46 described above, semiconductors whose base materials are GaN are used for the semiconductor cores 311, 321, 331, 341, 351, 361, 371, 381 and 471 and the semiconductor layers 312, 323, 332, 343, 352, 363, 372, 383 and 473. However, this invention may be applied to light-emitting devices that use semiconductors whose base materials are GaAs, AlGaAs, GaAsP, InGaN, AlGaN, GaP, ZnSe, AlGaInP and the like. While the semiconductor core is of n type and the semiconductor layer is of p type, this invention may be applied to a rod-like light-emitting device in which the conductivity types are reversed.

In Embodiments 39 to 42 described above, the rod-like light-emitting device with the size of the order of micrometers in which the diameter is 1 µm and the length is 20 µm is used. However, there may be a device with the size of the order of nanometers in which at least the diameter of the diameter and the length is less than 1 µm. The diameter of the semiconductor core of the above rod-like light-emitting device is preferably 500 nm or more and 50 µm or less, which enables variations in diameter of the semiconductor core to be reduced compared to a rod-like light-emitting device having a semiconductor core whose diameter ranges from several tens of nanometers to several hundreds of nanometers. Therefore, variations in the light emitting region, that is, variations in light emission characteristics can be decreased. This can lead to improvement in yields.

In Embodiments 39 to 46 described above, crystal growth of the semiconductor cores 311, 321, 331, 341, 351, 361, 371, 381 and 471 is made using the MOCVD device. However, the semiconductor cores may be formed using other crystal growth devices such as a molecular-beam epitaxy (MBE) device. The crystal growth of the semiconductor core is made on a substrate using a mask having a growth hole. Alternatively, metal species may be placed on a substrate, and crystal growth of a semiconductor core may result from the metal species.

In the above-described rod-like light-emitting devices 310, 320, 330, 340, 350, 360, 370, 380 and 460 of Embodiments 38 to 46, the semiconductor cores 311, 321, 331, 341, 351, 361, 371, 381 and 471 covered with the semiconductor layers 312, 323, 332, 343, 352, 363, 372, 383 and 473 are separated from the substrates using ultrasonic waves. However, the way of separation is not limited to this, and the semiconductor core may be separated from the substrate by mechanically bending the semiconductor core with a cutting tool. In this case, a plurality of microscopic rod-like light-emitting devices provided on the substrate can be separated by a simple way for a short time.

In Embodiment 45 described above, a potential difference is provided to the two metal electrodes 451 and 452 formed on the surface of the insulating substrate 450 to align the rod-like light-emitting devices 460 between the metal electrodes 451 and 452. However, alignment is not limited to this. Rod-like light-emitting devices may be aligned at positions defined by the electrodes by forming a third electrode as in Embodiment 46 between two electrodes formed on the surface of the insulating substrate, and applying independent voltages to the three electrodes, respectively.

In Embodiment 45 described above, the backlight, the illuminating device and the display device each including the light-emitting apparatuses have been described. However, the invention is not limited to these and may be applied to other apparatuses.

Embodiments of the invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

Citation List

Patent Literature

Patent Literature 1: JP 2008-235443 A
Patent Literature 2: JP 2006-332650 A

What is claimed is:

1. A rod-like light-emitting device comprising:
a semiconductor core of a first conductivity type having a rod shape, the rod shape having a length and a circumference;
a semiconductor layer of a second conductivity type covering the semiconductor core so as to form a pn junction between the semiconductor core and the semiconductor layer coaxially with respect to the semiconductor core; and
a transparent electrode formed so as to cover substantially a whole of the semiconductor layer,
wherein the semiconductor core comprises an n-type semiconductor and the semiconductor layer comprises a p-type semiconductor,
wherein an outer peripheral surface of a part of the semiconductor core is exposed along the entire circumference of the rod shape, the exposed part having a part of the length of the rod shape, and
wherein the rod-like light-emitting device has a diameter within a range of from 10 nm to 5 μm, inclusive, and a length within a range of from 100 nm to 200 μm, inclusive.

2. A rod-like light-emitting device comprising:
a semiconductor core of a first conductivity type having a rod shape;
a cap layer covering only one of two longitudinal ends of the rod shape of the semiconductor core; and
a semiconductor layer of a second conductivity type covering an outer peripheral surface of a portion of the semiconductor core other than an exposed portion, the exposed portion of the semiconductor core being a portion opposite from a portion covered with the cap layer of the semiconductor core,
wherein the cap layer is made of a material having a higher electric resistance than the semiconductor layer.

3. The rod-like light-emitting device according to claim 2, wherein a conductive layer having a lower resistance than the semiconductor layer is formed to cover the semiconductor layer.

4. A light-emitting apparatus comprising:
at least one rod-like light-emitting device according to claim 2; and
a substrate on which the rod-like light-emitting device is mounted such that a longitudinal direction of the rod-like light-emitting device is parallel to a mounting surface of the substrate,
wherein electrodes are formed, with a predetermined spacing therebetween, on the substrate, and
wherein the exposed portion at the one end of the semiconductor core of the rod-like light-emitting device is connected to one of the electrodes on the substrate, and the semiconductor layer at the other end of the semiconductor core on which the cap layer is provided is connected to another one of the electrodes on the substrate.

5. A light-emitting apparatus comprising:
at least one rod-like light-emitting device according to claim 3; and
a substrate on which the rod-like light-emitting device is mounted such that a longitudinal direction of the rod-like light-emitting device is parallel to a mounting surface of the substrate,
wherein electrodes are formed, with a predetermined spacing therebetween, on the substrate, and
wherein the exposed portion at the one end of the semiconductor core of the rod-like light-emitting device is connected to one of the electrodes on the substrate, and the conductive layer on the other side of the semiconductor core on which the cap layer is provided is connected to another one of the electrodes on the substrate.

6. A rod-like light-emitting device comprising:
a semiconductor core of a first conductivity type having a rod shape; and
a semiconductor layer of a second conductivity type covering an outer peripheral surface of a portion of the semiconductor core other than an exposed portion, the exposed portion of the semiconductor core being one end portion of the semiconductor core,
wherein a step portion is provided between an outer peripheral surface of the exposed portion not covered with the semiconductor layer of the semiconductor core and an outer peripheral surface of a covered portion covered with the semiconductor layer of the semiconductor core.

7. The rod-like light-emitting device according to claim 6, further comprising a conductive layer formed to cover the semiconductor layer and made of a material having a lower electric resistance than the semiconductor layer.

8. A light-emitting apparatus comprising:
at least one rod-like light-emitting device according to claim 6; and
a substrate on which the rod-like light-emitting device is mounted such that a longitudinal direction of the rod-like light-emitting device is parallel to a mounting surface of the substrate,
wherein electrodes are formed, with a predetermined spacing therebetween, on the substrate, and
wherein the exposed portion at the one end of the semiconductor core of the rod-like light-emitting device is connected to one of the electrodes on the substrate, and the semiconductor layer at the other end of the semiconductor core is connected to another one of the electrodes on the substrate.

9. A light-emitting apparatus comprising:
at least one rod-like light-emitting device according to claim 7; and
a substrate on which the rod-like light-emitting device is mounted such that a longitudinal direction of the rod-like light-emitting device is parallel to a mounting surface of the substrate,
wherein electrodes are formed, with a predetermined spacing therebetween, on the substrate, and
wherein the exposed portion at the one end of the semiconductor core of the rod-like light-emitting device is connected to one of the electrodes on the substrate, and the conductive layer on the other side of the semiconductor core is connected to another one of the electrodes on the substrate.

10. A rod-like light-emitting device comprising:
a semiconductor core of a first conductivity type having a rod shape;
a semiconductor layer of a second conductivity type covering one of two ends of the semiconductor core;

an insulator covering an outer peripheral surface, not covered with the semiconductor layer, of the semiconductor core; and an underlying layer of the first conductivity type adjoining the other end of the semiconductor core, wherein an end surface of the underlying layer axially opposite from the semiconductor core and a peripheral surface of the underlying layer are exposed.

11. A light-emitting apparatus comprising:

a rod-like light-emitting device including a semiconductor core of a first conductivity type having a rod shape, the rod shape having a length and a circumference, a semiconductor layer of a second conductivity type formed to cover the semiconductor core so as to form a pn junction between the semiconductor core and the semiconductor layer coaxially with respect to the semiconductor core, and a transparent electrode formed so as to cover substantially a whole of the semiconductor layer, wherein the semiconductor core comprises an n-type semiconductor and the semiconductor layer comprises a p-type semiconductor, an outer peripheral surface of a part of the semiconductor core is exposed along the entire circumference of the rod shape, the exposed part having a part of the length of the rod shape, and the rod-like light-emitting device has a diameter within a range of from 10 nm to 5 μm, inclusive, and a length within a range of from 100 nm to 200 μm, inclusive; and a substrate on which the rod-like light-emitting device is mounted such that a longitudinal direction of the rod-like light-emitting device is parallel to a mounting surface of the substrate.

12. A rod-like light-emitting device comprising:

a semiconductor core of a first conductivity type having a rod shape, the rod shape having a length and a circumference;

a semiconductor layer of a second conductivity type covering the semiconductor core so as to form a pn junction between the semiconductor core and the semiconductor layer coaxially with respect to the semiconductor core; and a transparent electrode formed so as to cover substantially a whole of the semiconductor layer, wherein the semiconductor core comprises an n-type semiconductor and the semiconductor layer comprises a p-type semiconductor, wherein the semiconductor core has, along the length of the rod shape, a first portion having an outer peripheral surface which is entirely covered with the semiconductor layer of the second conductivity type along the entire circumference of the rod shape, and a second portion having an outer peripheral surface which is at least partially exposed along at least part of the circumference of the rod shape without being covered with the semiconductor layer of the second conductivity type, and wherein the rod-like light-emitting device has a diameter within a range of from 10 nm to 5 μm, inclusive, and a length within a range of from 100 nm to 200 μm, inclusive.

13. A rod-like light-emitting device comprising:

a semiconductor core of a first conductivity type having a rod shape, the rod shape having a length and a circumference; and a semiconductor layer of a second conductivity type covering the semiconductor core, wherein an outer peripheral surface of a part of the semiconductor core is exposed along the entire circumference of the rod shape, the exposed part having a part of the length of the rod shape, wherein an outer peripheral surface of one of two longitudinal end portions of the semiconductor core is exposed, and wherein an end surface of the other of the two longitudinal end portions of the semiconductor core is covered with the semiconductor layer.

14. The rod-like light-emitting device according to claim 13, a thickness of the semiconductor layer in a longitudinal, or axial direction of the rod shape at a part covering the end surface of the other of the two longitudinal end portions of the semiconductor core is larger than a thickness thereof in a radial direction of the rod shape at a part covering the outer peripheral surface of the semiconductor core.

15. An illuminating device including the rod-like light-emitting device according to claim 1.

16. A display device including the rod-like light-emitting device according to claim 1.